(12) United States Patent
Nakajima et al.

(10) Patent No.: US 8,742,499 B2
(45) Date of Patent: Jun. 3, 2014

(54) SEMICONDUCTOR DEVICE AND MANUFACTURING METHOD THEREOF

(75) Inventors: Shizuki Nakajima, Tokyo (JP); Hiroyuki Nagai, Tokyo (JP); Yuji Shirai, Tokyo (JP); Hirokazu Nakajima, Tokyo (JP); Chushiro Kusano, Tokyo (JP); Yu Hasegawa, Tokyo (JP); Chiko Yorita, Fujisawa (JP); Yasuo Osone, Tsuchiura (JP)

(73) Assignee: Murata Manufacturing Co., Ltd., Nagaokakyo-shi, Kyoto (JP)

( * ) Notice: Subject to any disclaimer, the term of this patent is extended or adjusted under 35 U.S.C. 154(b) by 803 days.

(21) Appl. No.: 12/608,751

(22) Filed: Oct. 29, 2009

(65) Prior Publication Data

US 2010/0109052 A1  May 6, 2010

(30) Foreign Application Priority Data

Nov. 5, 2008 (JP) ................................ 2008-283810
Apr. 13, 2009 (JP) ................................ 2009-097248
Aug. 28, 2009 (JP) ................................ 2009-198360

(51) Int. Cl.
*H01L 27/082* (2006.01)
*H01L 27/088* (2006.01)
*H01L 21/8222* (2006.01)
*H01L 29/78* (2006.01)

(52) U.S. Cl.
USPC ...... 257/341; 257/197; 257/337; 257/E27.06; 257/E29.256; 257/E27.053; 257/E21.608; 438/312

(58) Field of Classification Search
USPC .......................................................... 257/341
See application file for complete search history.

(56) References Cited

U.S. PATENT DOCUMENTS

| 2005/0258452 | A1 | 11/2005 | Konishi et al. |
| 2007/0210866 | A1* | 9/2007 | Sato et al. .................... 330/126 |
| 2009/0194792 | A1 | 8/2009 | Konishi et al. |

FOREIGN PATENT DOCUMENTS

| JP | 2001-244274 A | | 9/2001 |
| JP | 2003-273520 A | | 9/2003 |
| JP | 2005-327805 | | 11/2005 |
| JP | 2008-042038 A | | 2/2008 |
| JP | 2008042038 A | * | 2/2008 |

OTHER PUBLICATIONS

Office Action issued Jul. 23, 2013, in Japanese Patent Application No. 2009-198360, with English translation.

* cited by examiner

*Primary Examiner* — Zandra Smith
*Assistant Examiner* — Lawrence Tynes, Jr.
(74) *Attorney, Agent, or Firm* — Miles & Stockbridge P.C.

(57) ABSTRACT

In a semiconductor chip in which LDMOSFET elements for power amplifier circuits used for a power amplifier module are formed, a source bump electrode is disposed on an LDMOSFET formation region in which a plurality of source regions, a plurality of drain regions and a plurality of gate electrodes for the LDMOSFET elements are formed. The source bump electrode is formed on a source pad mainly made of aluminum via a source conductor layer which is thicker than the source pad and mainly made of copper. No resin film is interposed between the source bump electrode and the source conductor layer.

18 Claims, 63 Drawing Sheets

SEMICONDUCTOR DEVICE AND MANUFACTURING METHOD THEREOF

CROSS-REFERENCE TO RELATED APPLICATION

The present application claims priority from Japanese Patent Application No. JP 2008-283810 filed on Nov. 5, 2008, Japanese Patent Application No. JP 2009-97248 filed on Apr. 13, 2009, and Japanese Patent Application No. JP 2009-198360 filed on Aug. 28, 2009, the contents of which are hereby incorporated by reference into this application.

TECHNICAL FIELD OF THE INVENTION

The present invention relates to a semiconductor device and a manufacturing method thereof, and more particularly to a technique effectively applied to a power amplifier module mounted on a mobile communication system, a semiconductor device used therein and a manufacturing method thereof.

BACKGROUND OF THE INVENTION

In recent years, mobile communication systems represented by such communication systems as GSM system, PCS system, PDC system and CDMA system (so-called mobile phone) have spread worldwide.

In general, the mobile communication system of this type is made up of an antenna which emits and receives radio waves, a radio-frequency power amplifier (RF power module) which amplifies a power-modulated radio-frequency signal and supplies the amplified signal to the antenna, a receiver which processes the radio-frequency signal received by the antenna, a control unit which controls these components and a battery which supplies power supply voltage to these components.

Japanese Patent Application Laid-Open Publication No. 2008-42038 (Patent Document 1) describes a technique in which a semiconductor chip in which an LDMOSFET making up a power amplifier circuit of an RF power module is formed is flip-chip mounted on an upper surface of a wiring board.

Japanese Patent Application Laid-Open Publication No. 2003-273520 (Patent Document 2) describes a technique relating to a via of a PA stacked module.

Japanese Patent Application Laid-Open Publication No. 2001-244274 (Patent Document 3) describes a technique for improving the reliability of a semiconductor device by reducing the pressure applied to an electrode of an HBT when mounting a semiconductor chip having the HBT formed therein on a wiring board and also by surely contacting a lead-out electrode and a package base substrate (wiring board).

Concretely, an emitter lead-out electrode which commonly connects the emitter electrodes of a plurality of HBTs is formed. Further, a dent is provided in a region of the emitter lead-out electrode located on each emitter electrode. By this means, in the flip-chip mounting in which the emitter lead-out electrode is contacted to the package base substrate, the application of the bonding pressure to the emitter electrode is prevented by the dent.

SUMMARY OF THE INVENTION

According to the studies by the inventors of the present invention, the following has been revealed.

Recently, with the increasing demand for the size reduction, the thickness reduction and the performance improvement of a mobile communication device, the size reduction, the thickness reduction and the performance improvement are demanded also for an RF power module mounted therein. The RF power module has a structure in which electronic components such as a semiconductor amplifier element chip and passive components are mounted on a wiring board, and the size reduction and the thickness reduction of the electronic components are desired. However, there is a limitation on the size reduction of the electronic components mounted on the wiring board, and it is not efficient to try to achieve the size reduction of the RF power module only by the size reduction of the electronic components.

In such circumstances, the structure of an RF power module in which a semiconductor amplifier element chip is flip-chip mounted on a wiring board has been developed. In this case, since the mounting area of the semiconductor amplifier element chip is reduced compared with the case where a semiconductor amplifier element chip is face-up bonded on a wiring board and electrodes of the semiconductor amplifier element chip and terminals of the wiring board are wire-bonded, the planar dimensions of the wiring board can be reduced, so that the size reduction of the RF power module can be achieved.

However, the case where a semiconductor amplifier element chip is flip-chip mounted on a wiring board is disadvantageous in the heat dissipation properties compared with the case where a semiconductor amplifier element chip is face-up bonded on a wiring board. This is because an entire rear surface of a semiconductor amplifier element chip is bonded to a wiring board when the semiconductor amplifier element chip is face-up bonded and the heat can be dissipated from the entire rear surface of the semiconductor amplifier element chip to the wiring board side, whereas the heat generated in the semiconductor amplifier element chip is dissipated to the wiring board side via bump electrodes of the semiconductor amplifier element chip when the semiconductor amplifier element chip is flip-chip mounted. When an LDMOSFET element making up a power amplifier circuit is formed in a semiconductor amplifier element chip, the considerably large amount of heat is generated from the LDMOSFET element. Therefore, it is extremely important to improve the heat dissipation properties when a semiconductor amplifier element chip is flip-chip mounted on a wiring board, thereby improving the performance and reliability of the RF power module.

An object of the present invention is to provide a technique capable of reducing the size of a semiconductor device.

Also, another object of the present invention is to provide a technique capable of improving the properties of a semiconductor device, in particular, heat dissipation properties.

The above and other objects and novel characteristics of the present invention will be apparent from the description of this specification and the accompanying drawings.

The typical ones of the inventions disclosed in this application will be briefly described as follows.

(1) A semiconductor device according to a typical embodiment is a semiconductor device in which an LDMOSFET element for a power amplifier circuit is formed and a plurality of bump electrodes including a source bump electrode, a drain bump electrode and a gate bump electrode of the LDMOSFET element are provided. Also, it is characterized in that the source bump electrode is disposed on an LDMOSFET formation region, and a resin film serving as a surface protection film is not formed between the source bump electrode and a source conductor layer, between the drain bump electrode and a drain conductor layer and between the gate bump electrode and a gate conductor layer.

(2) Further, a semiconductor device according to another typical embodiment includes an LDMOSFET for a power amplifier circuit, and a semiconductor chip having a bump electrode formed therein is mounted on a multilayer wiring board in a face-down manner. Also, this multilayer wiring board is characterized in that a first via formed in a core layer and a second via formed in a prepreg layer are disposed on the same straight line so as to be planarly overlapped with each other.

(3) Further, a semiconductor device according to another typical embodiment is a semiconductor device in which an LDMOSFET element for a power amplifier circuit is formed and a plurality of bump electrodes including a source bump electrode, a drain bump electrode and a gate bump electrode of the LDMOSFET element are provided, and it is characterized in that a plane area of the source bump electrode is larger than a sum of plane areas of the two drain bump electrodes.

(4) Further, a semiconductor device according to another typical embodiment comprises: a plurality of heterojunction bipolar transistors; an emitter common wiring layer which commonly connects emitter electrodes of a heterojunction bipolar transistor group including two or more heterojunction bipolar transistors out of the plurality of heterojunction bipolar transistors to one surface; a semiconductor chip having an emitter bump electrode connected to the emitter common wiring layer and disposed at an arbitrary position; and a wiring board on which the semiconductor chip is mounted, wherein the emitter bump electrode is connected to a plurality of vias provided so as to penetrate through the wiring board.

The effects obtained by typical embodiments of the inventions disclosed in this application will be briefly described below.

According to the typical embodiments of the present invention, it is possible to improve the properties of a semiconductor device, in particular, the heat dissipation properties.

Also, it is possible to achieve the cost reduction, the size reduction and the improved heat dissipation of a semiconductor device.

BRIEF DESCRIPTIONS OF THE DRAWINGS

Figure 12:
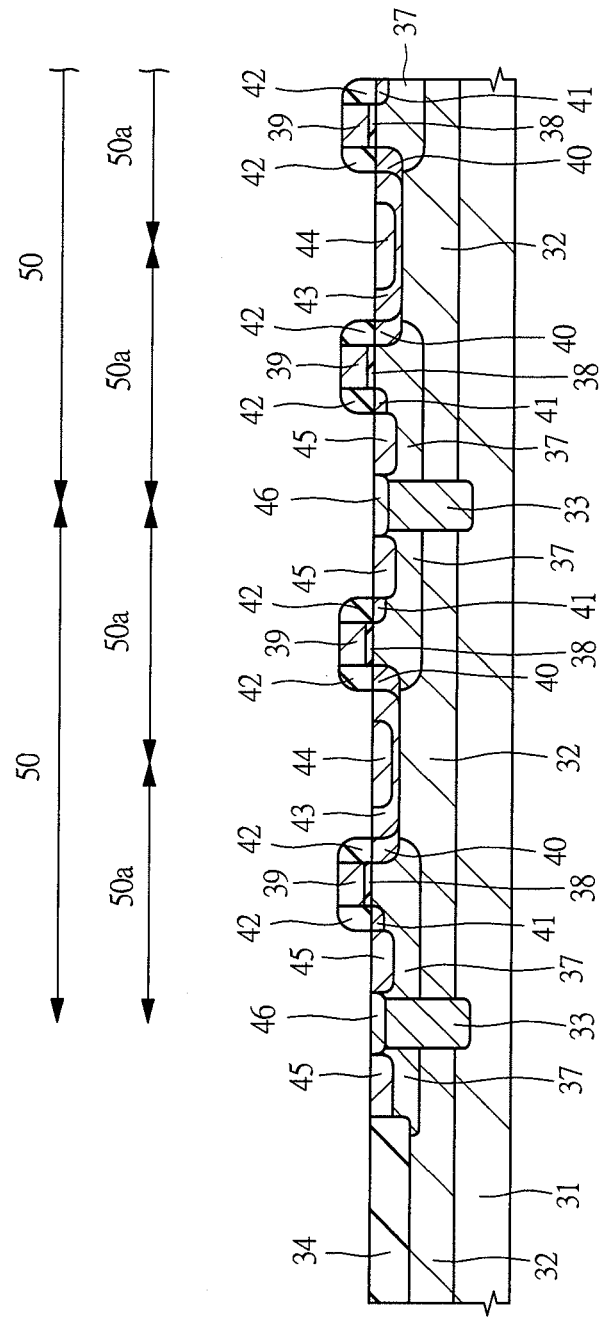
FIG. 12 is a cross-sectional view of the principal part in the manufacturing process of the semiconductor device continued from FIG. 9.
Figure 13:
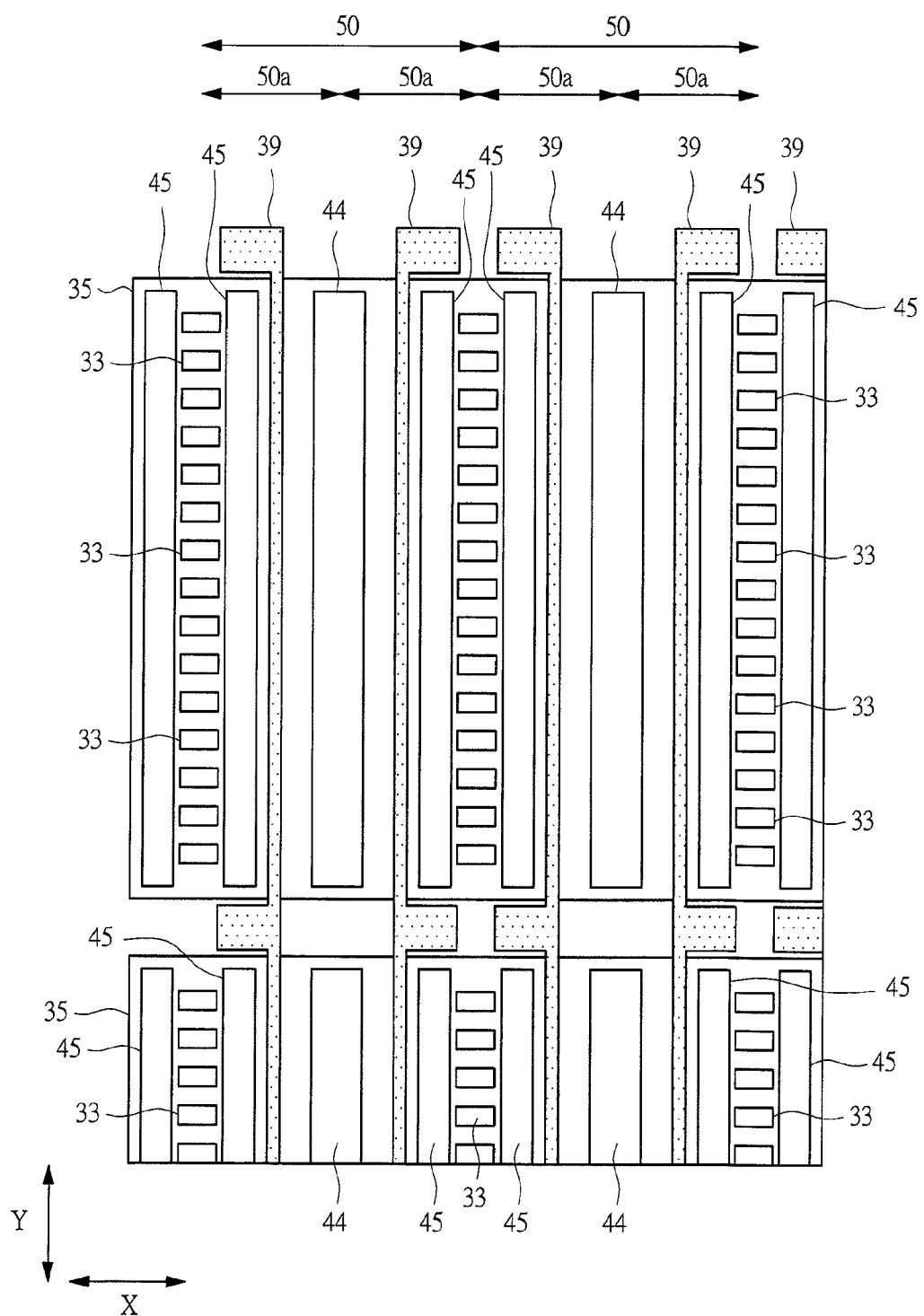
Figure 14:
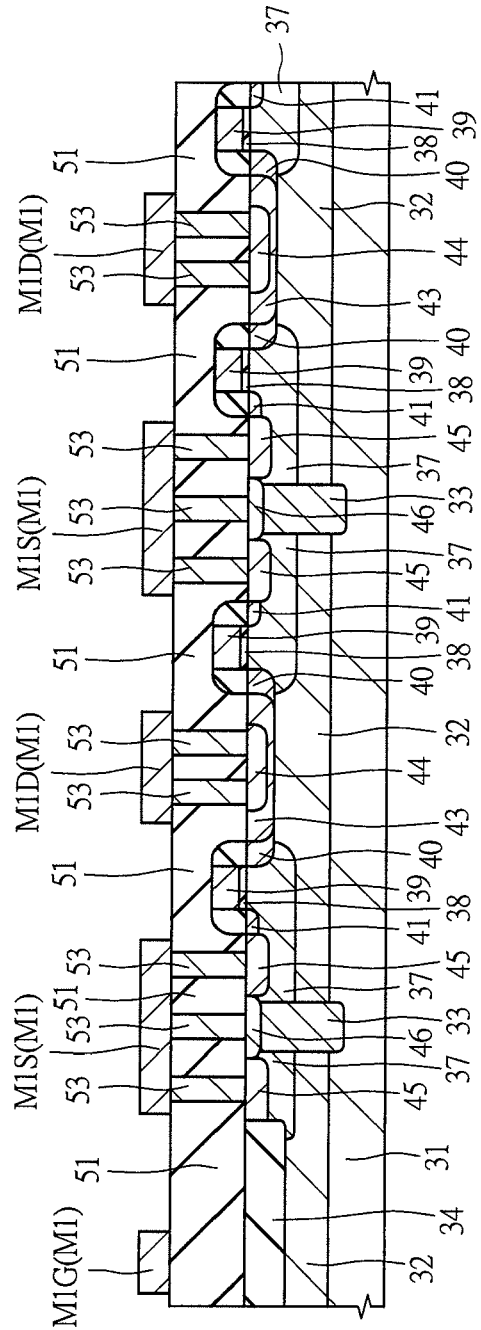
Figure 15:
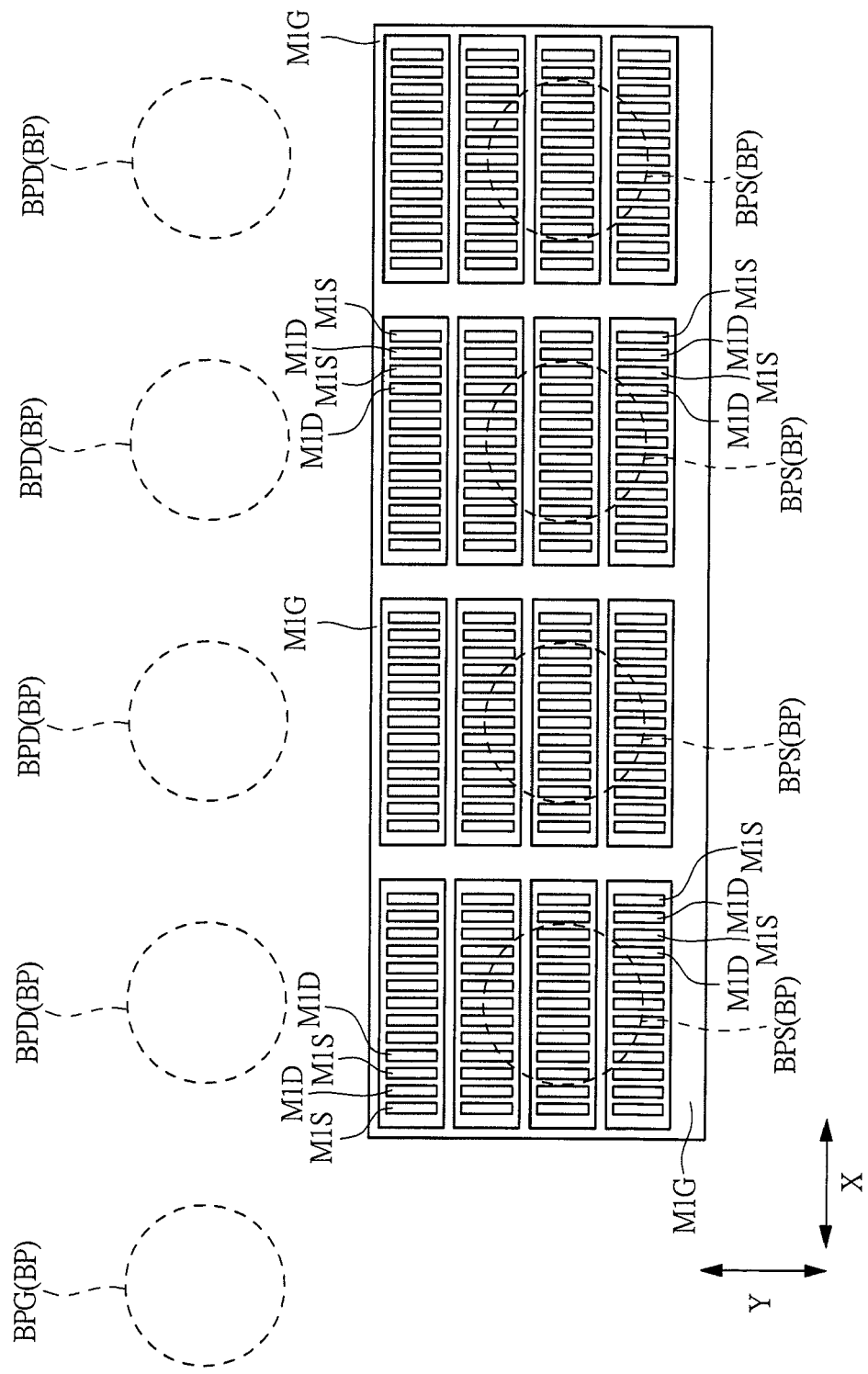
Figure 16:
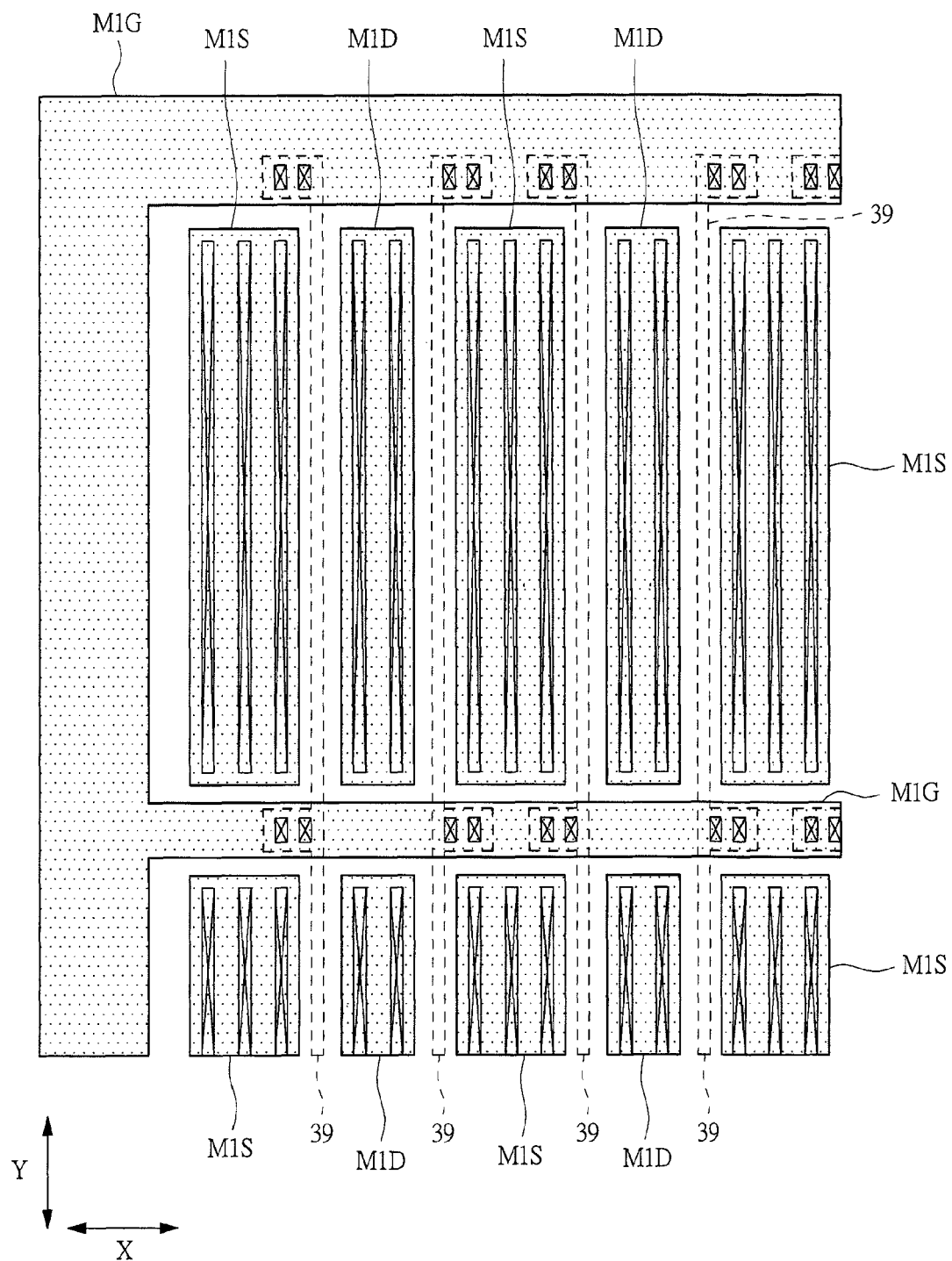
Figure 17:
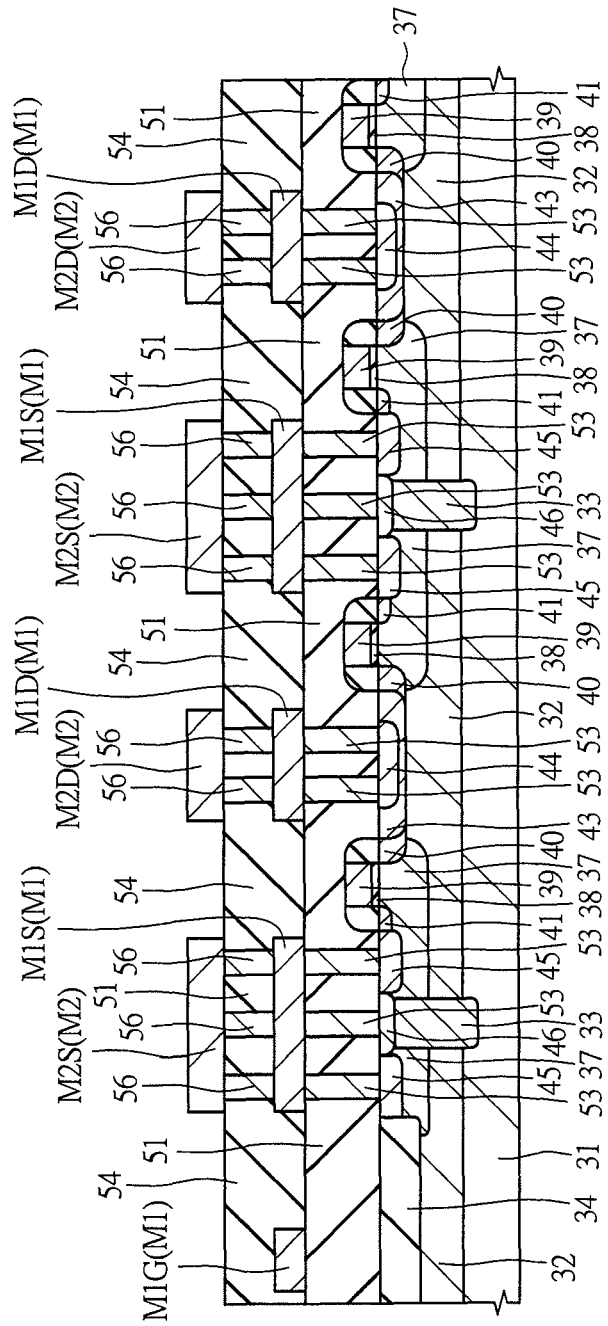
Figure 18:
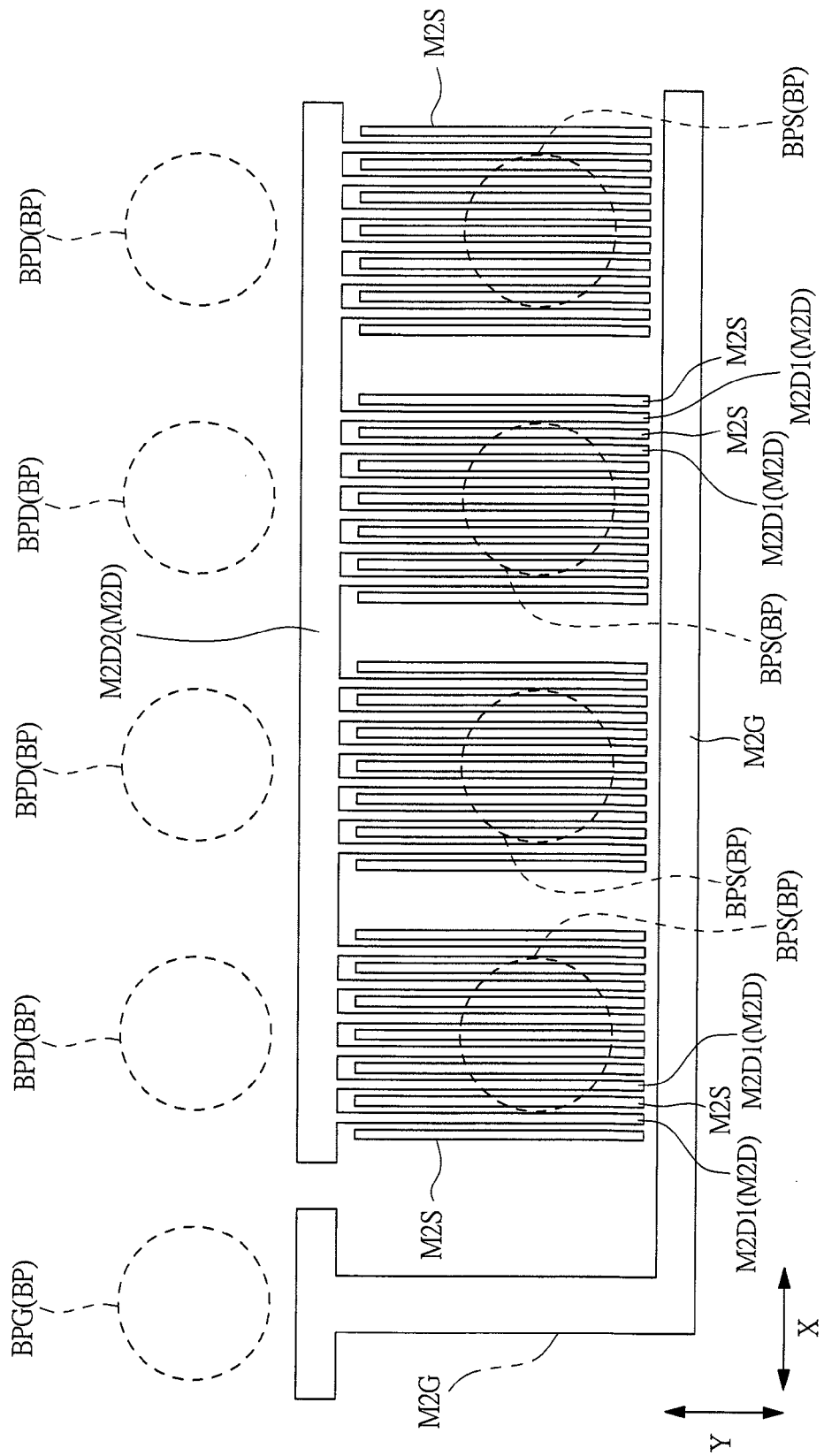
Figure 19:
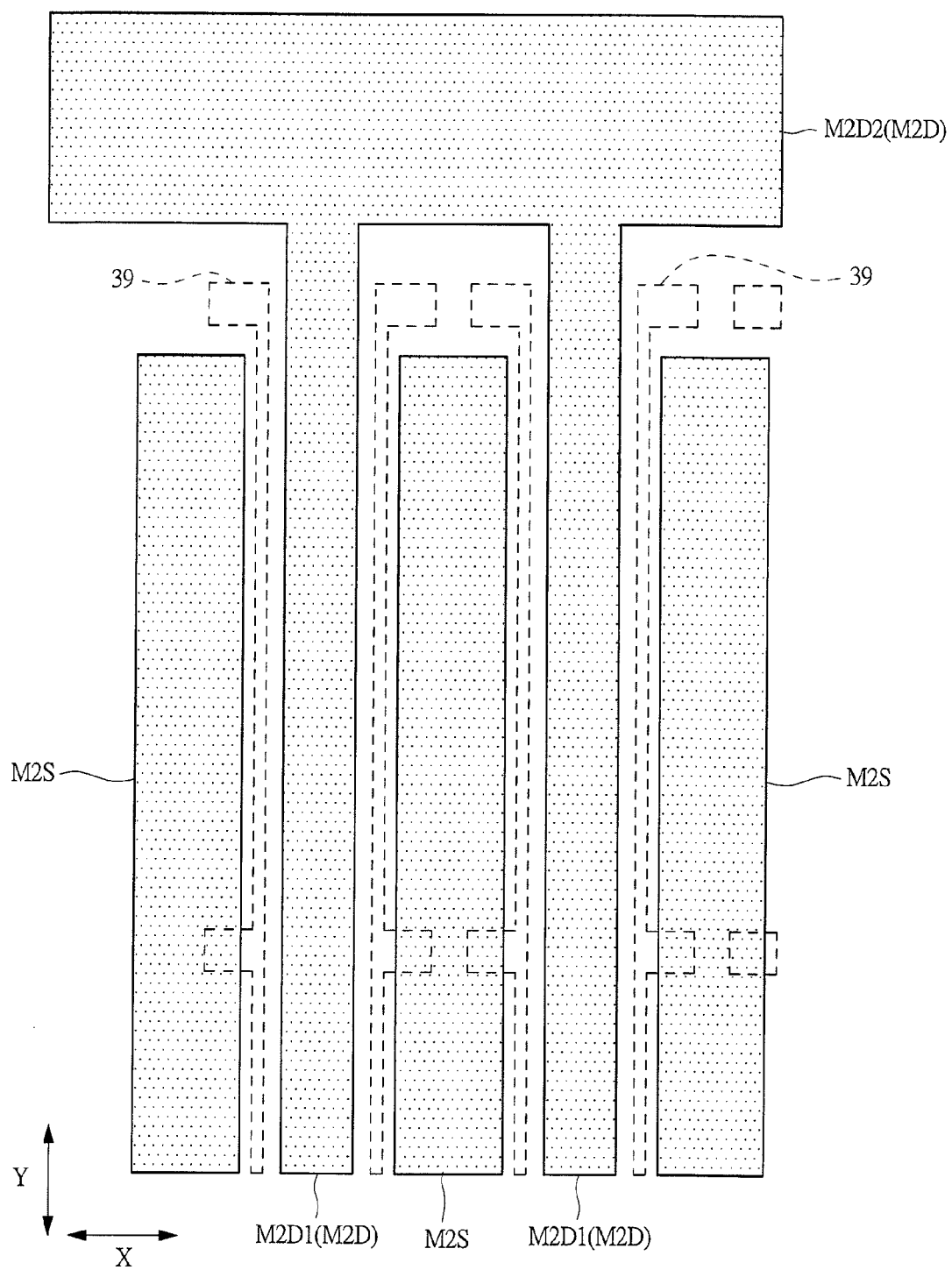
Figure 20:
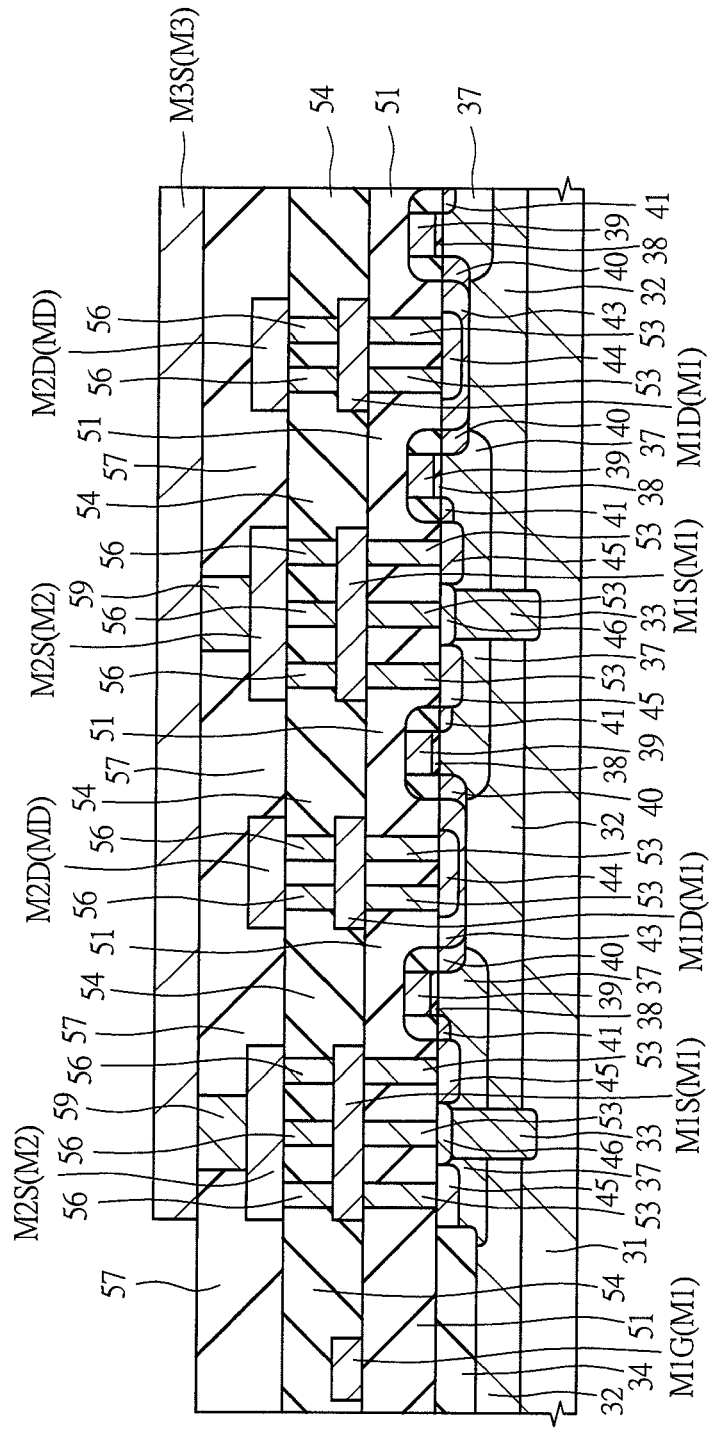
Figure 21:
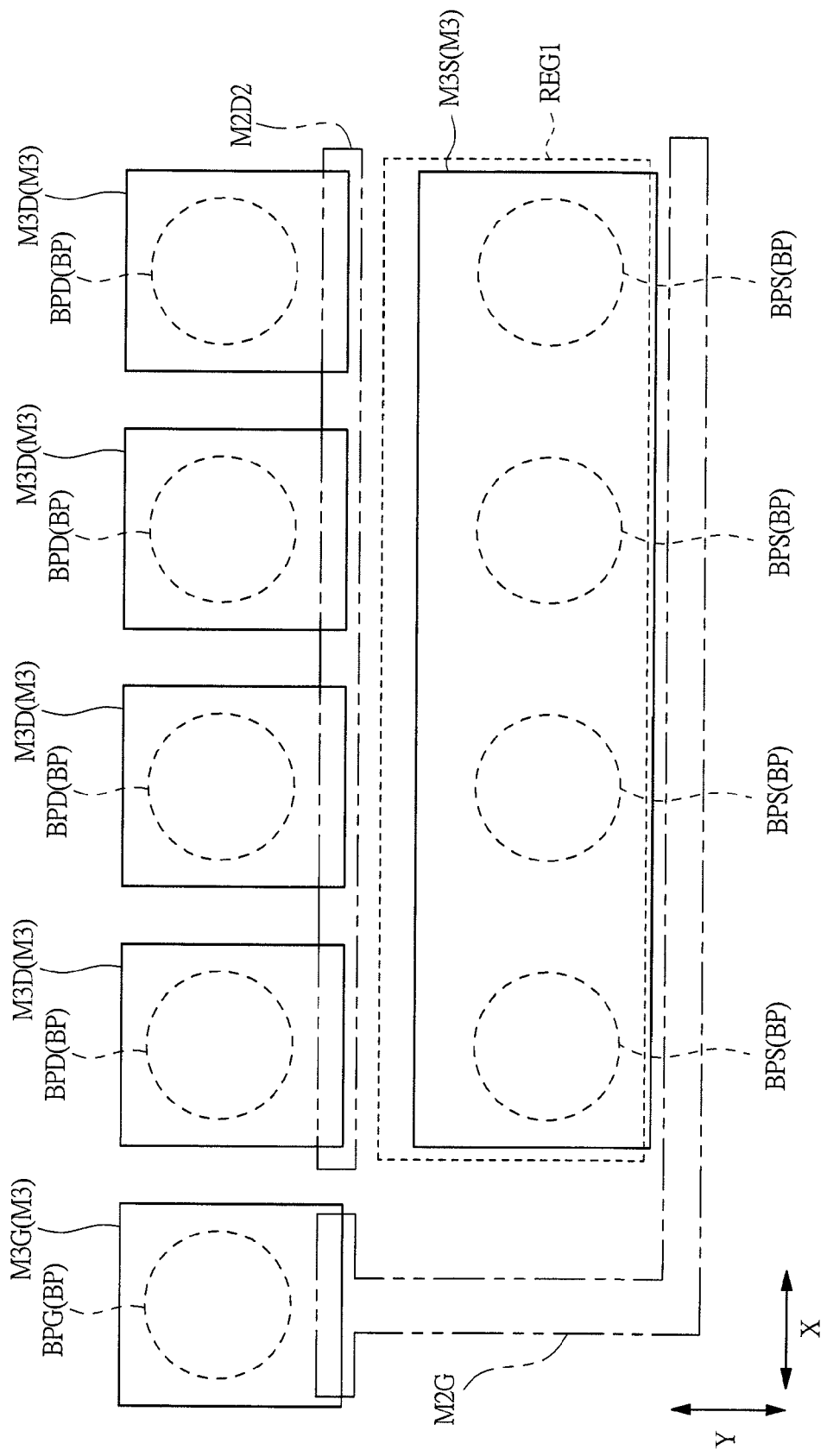
Figure 22:
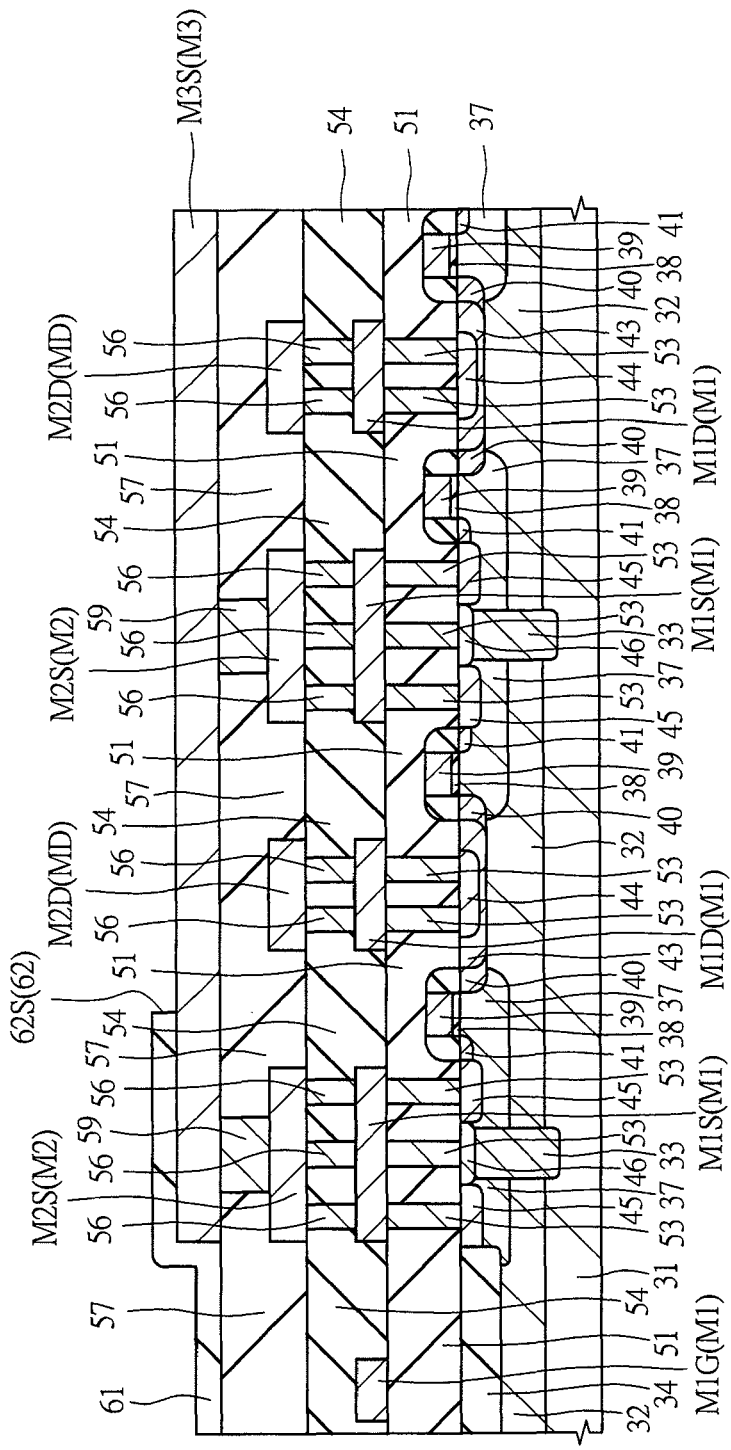
Figure 23:
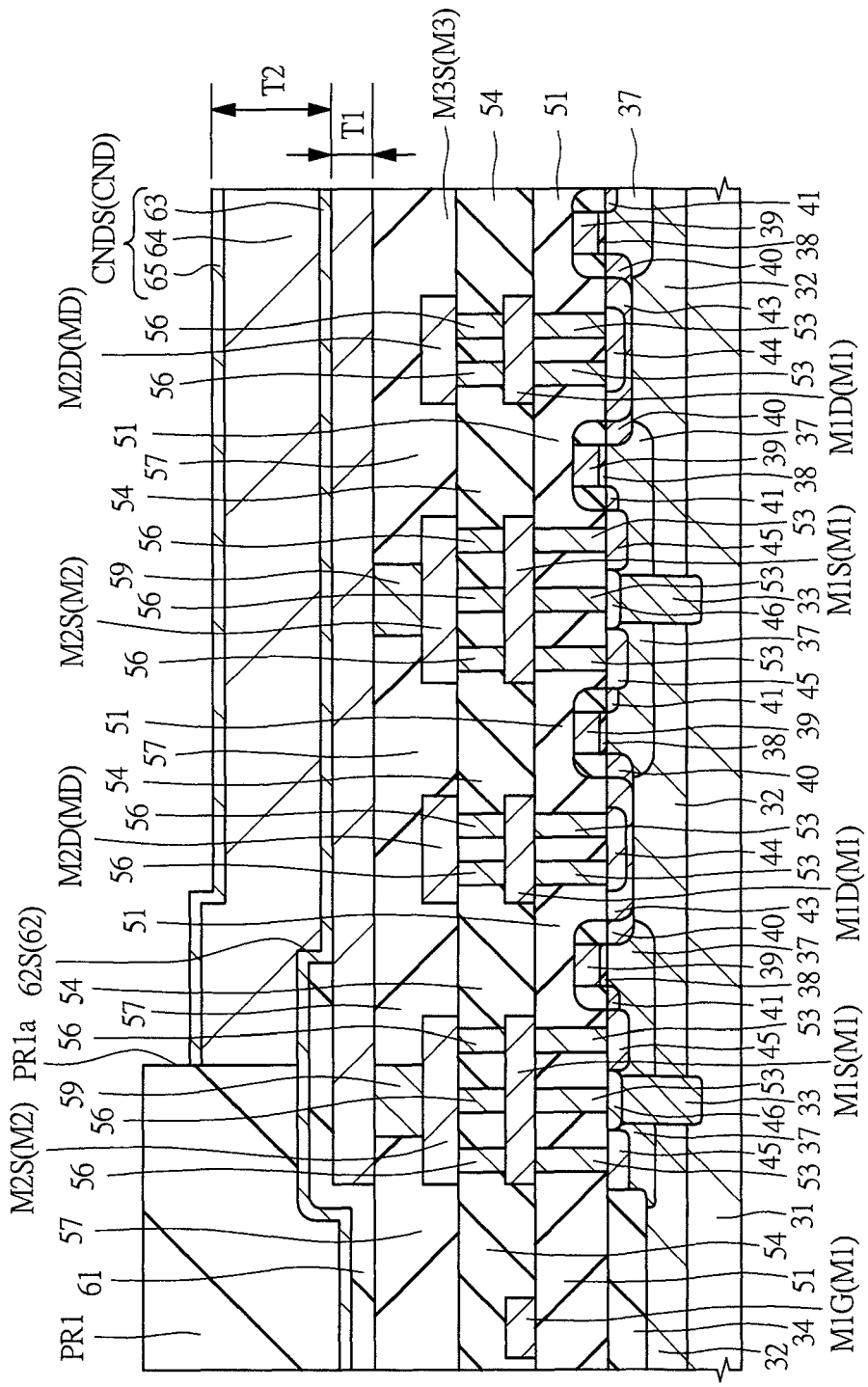
Figure 24:
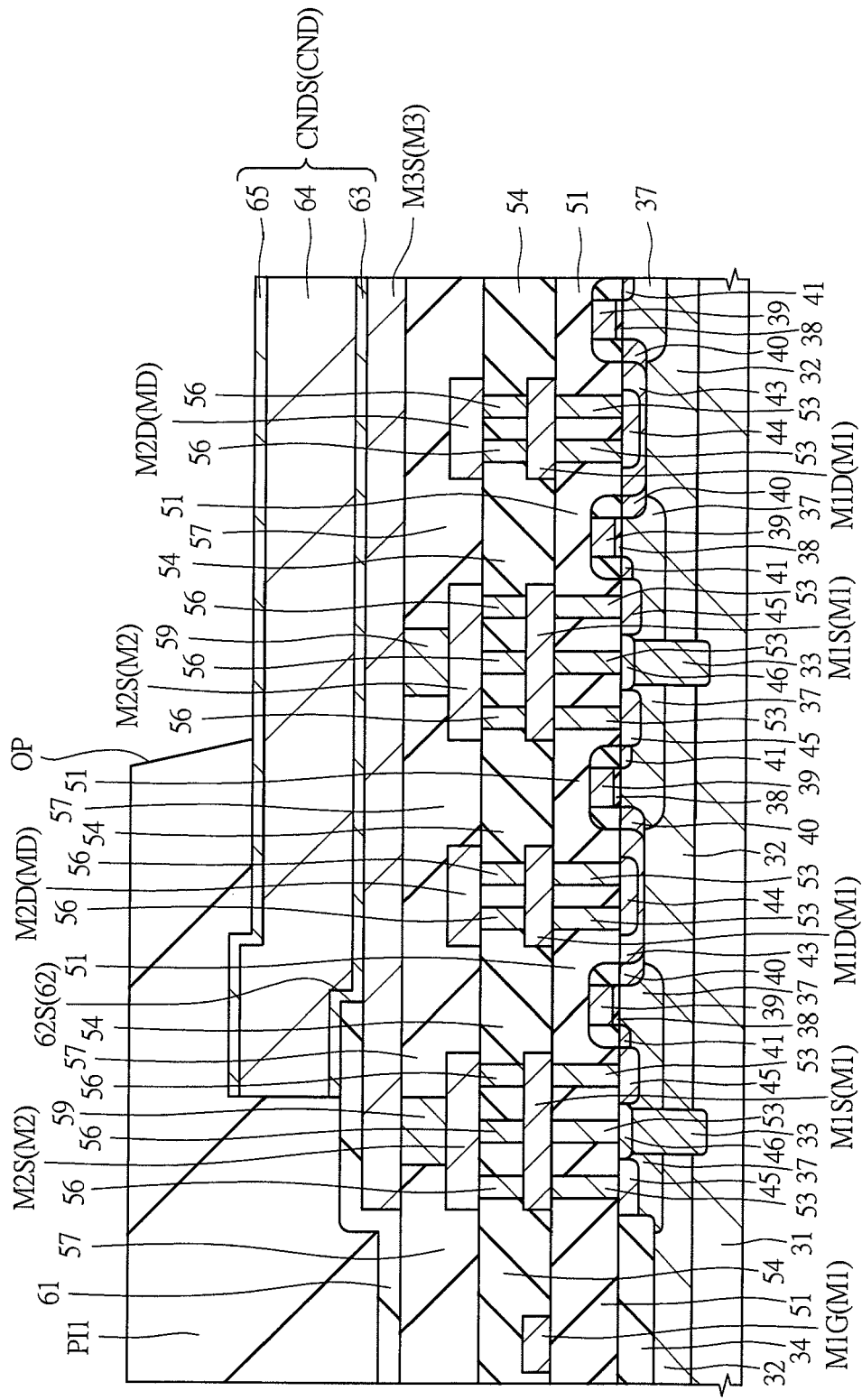
Figure 25:
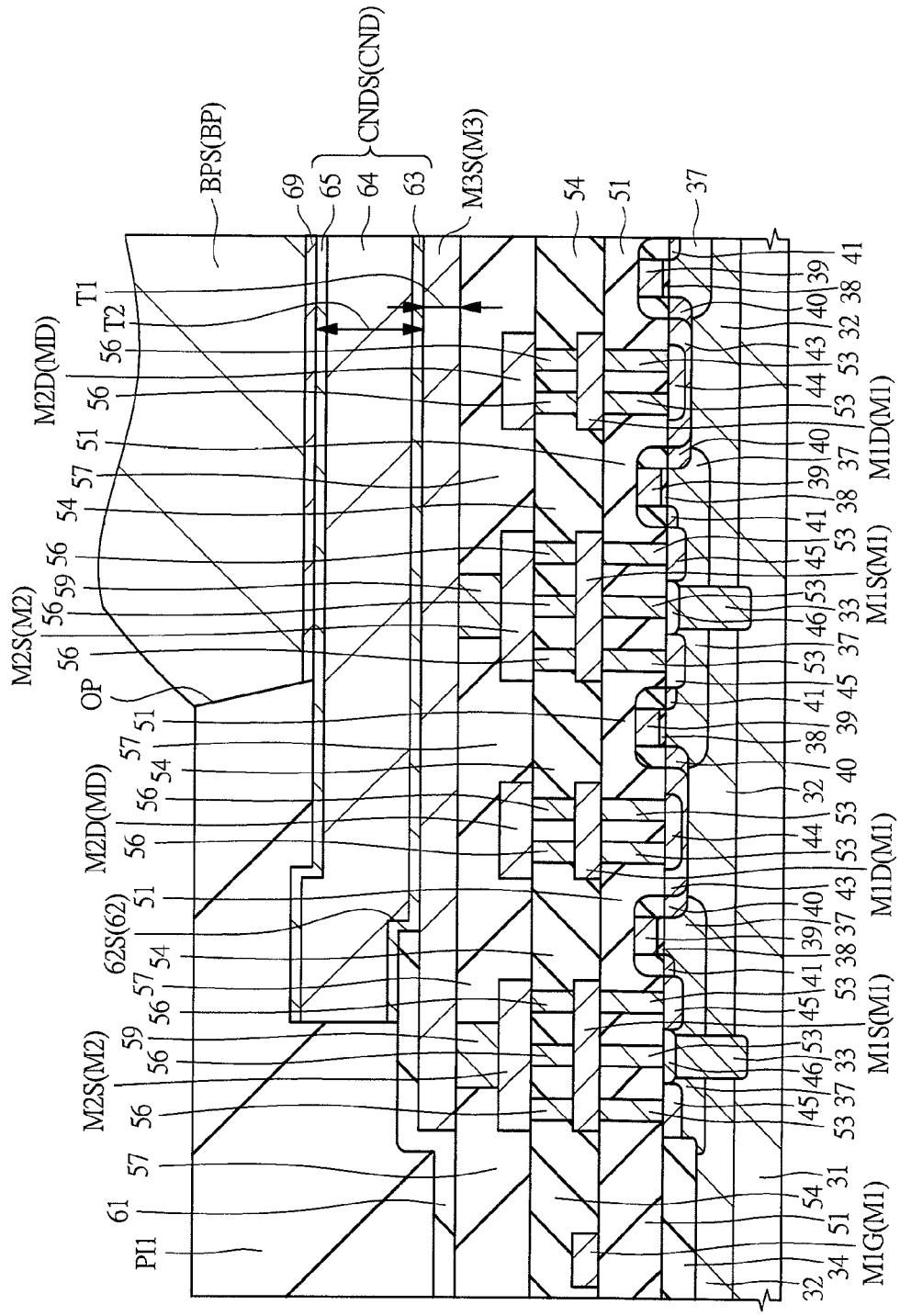
Figure 26:
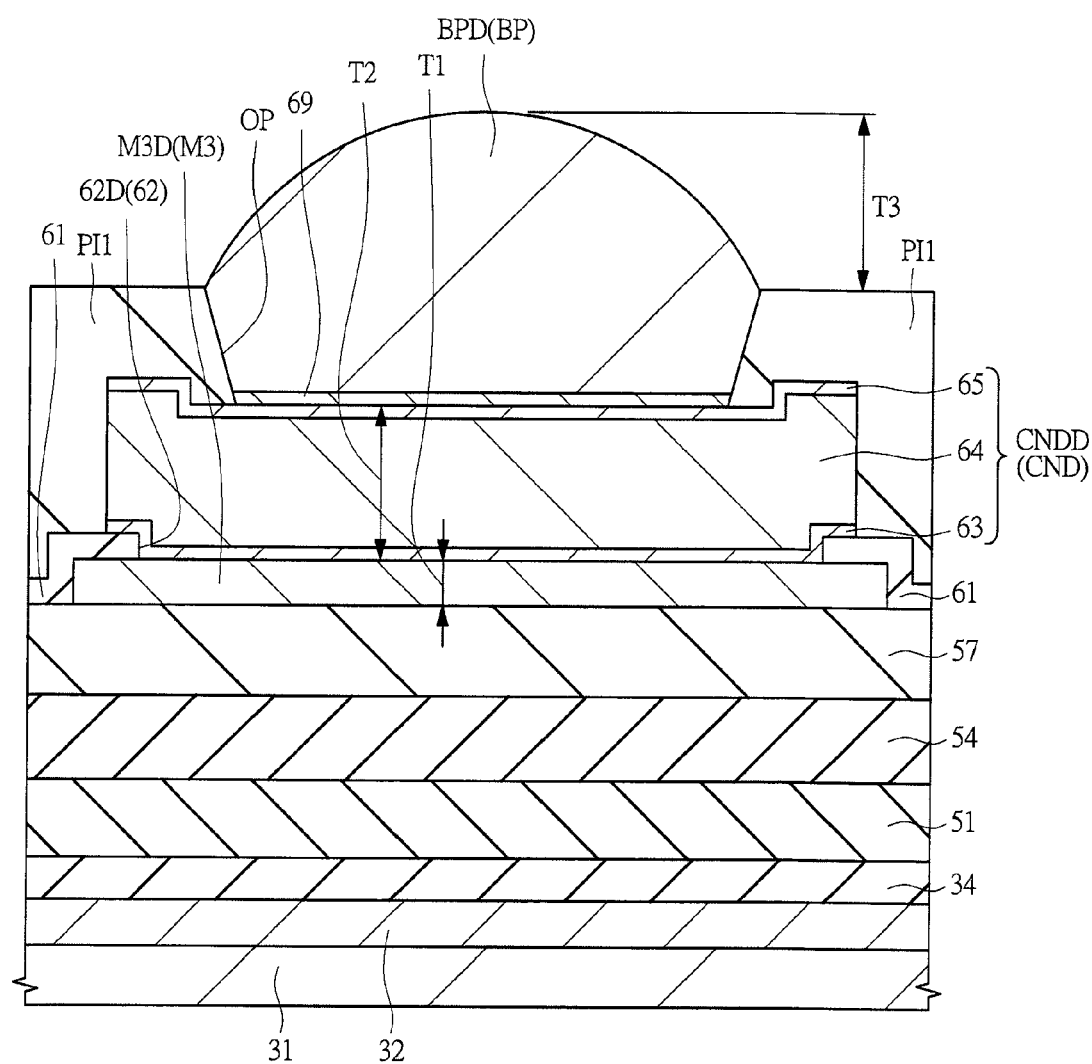
Figure 27:
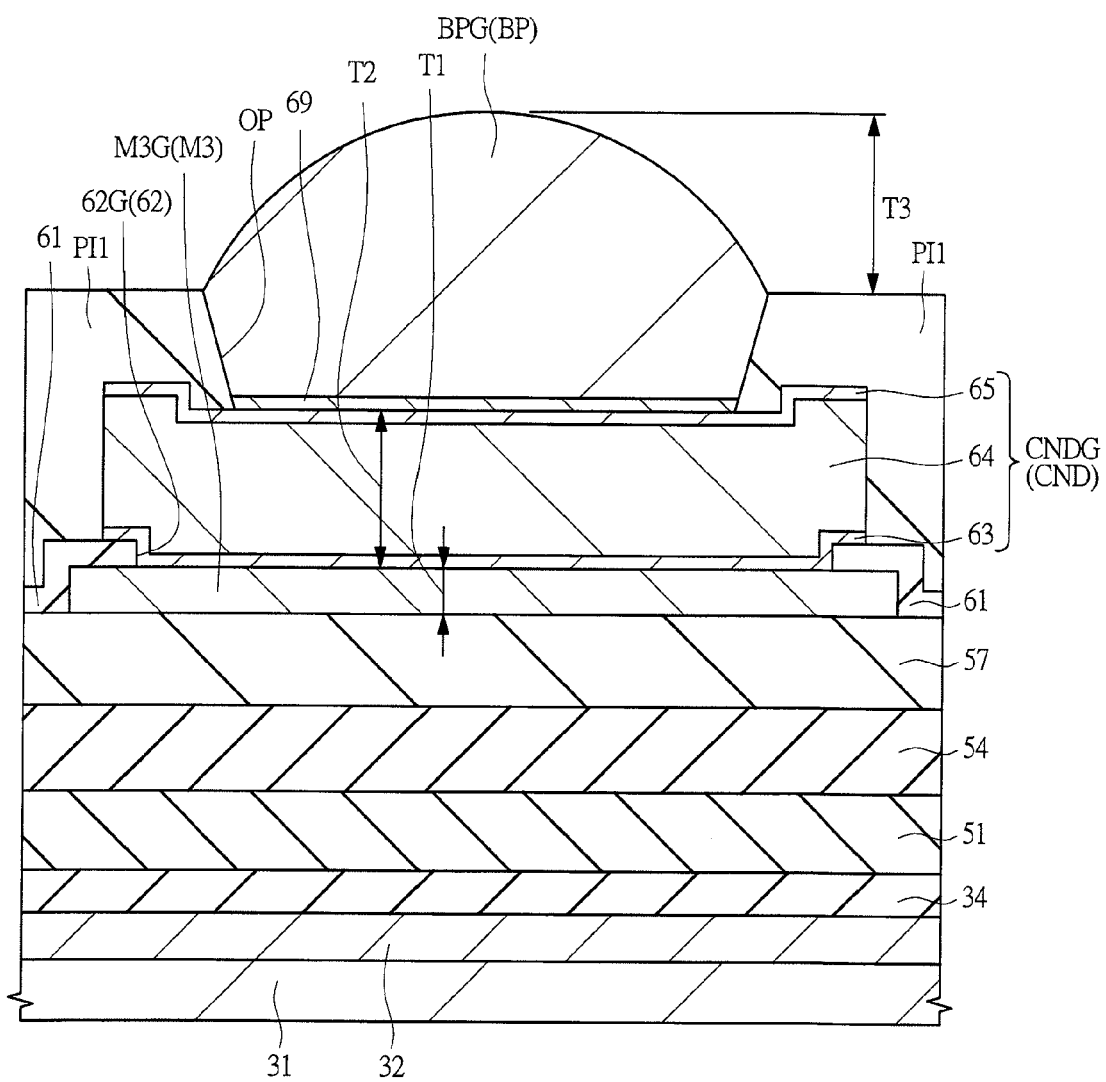
Figure 28:
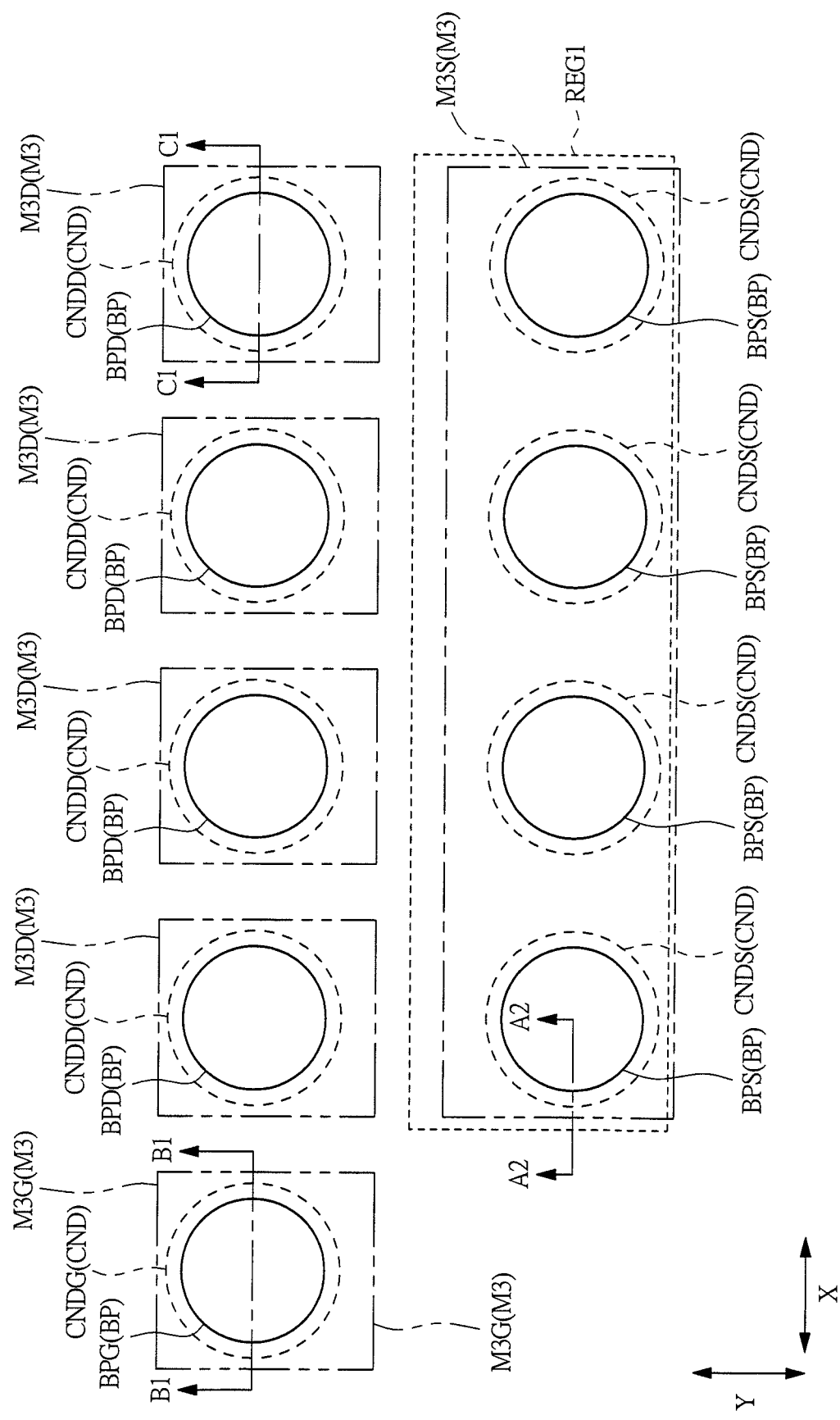
Figure 29:
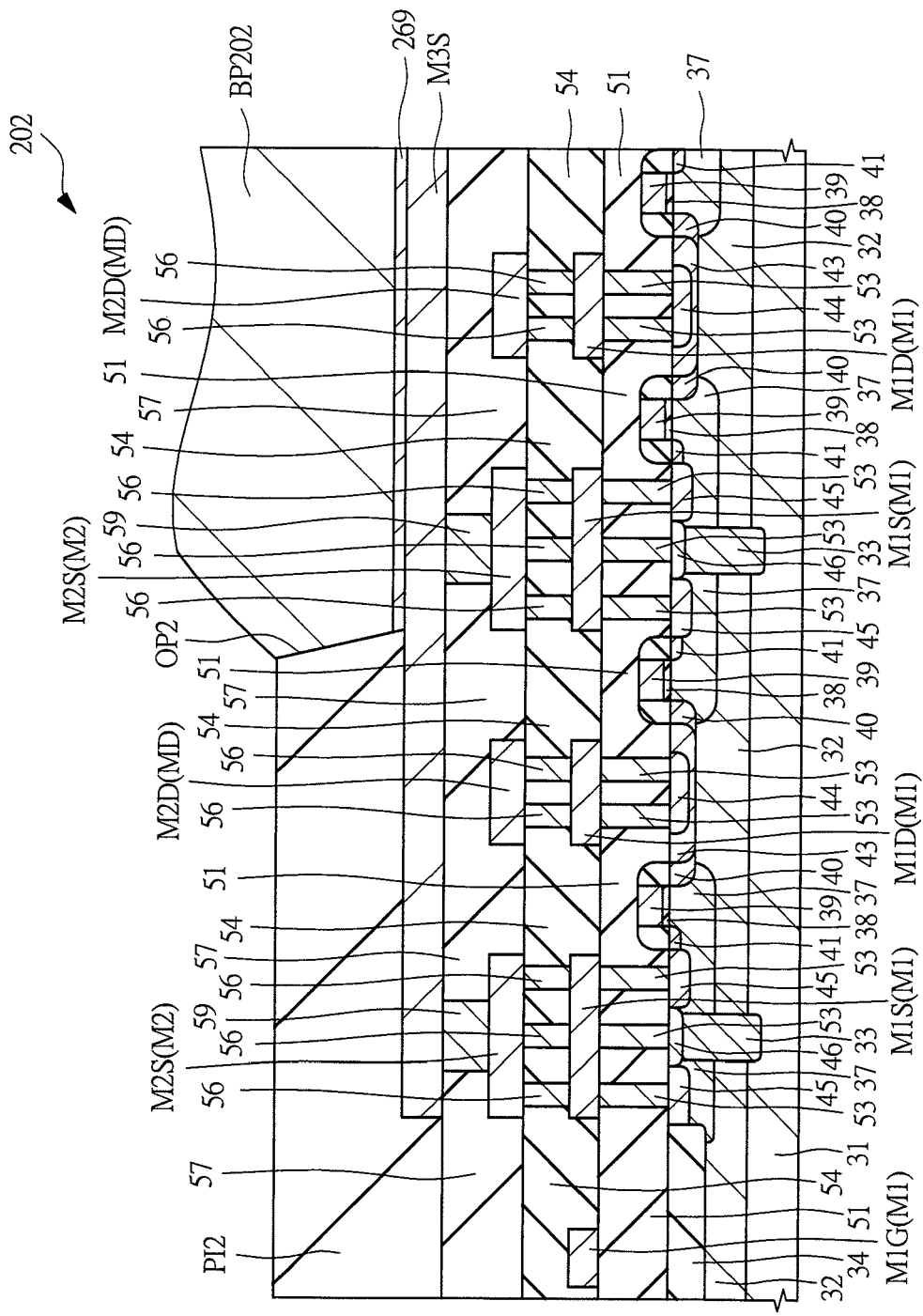
Figure 30:
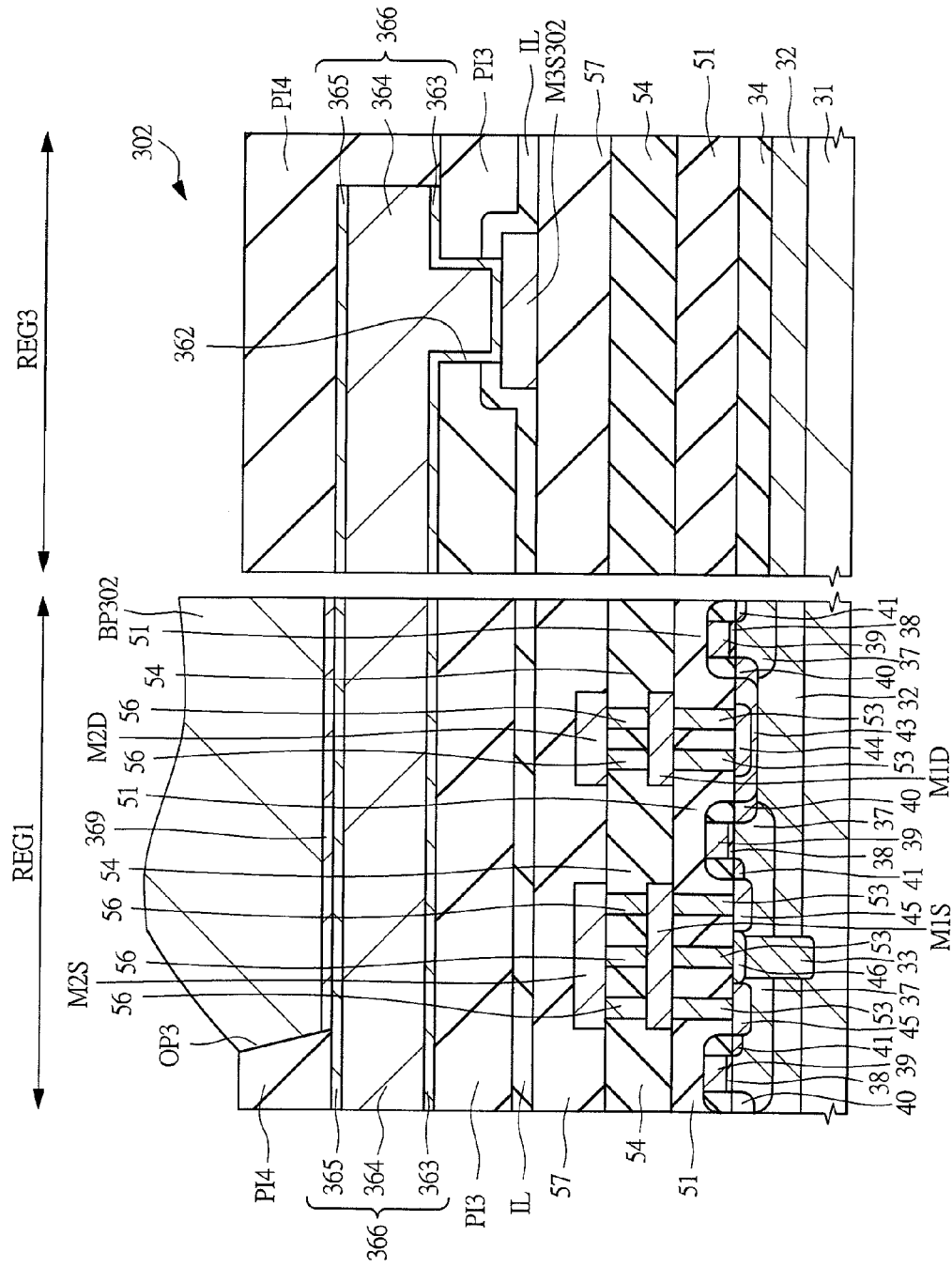
Figure 31:
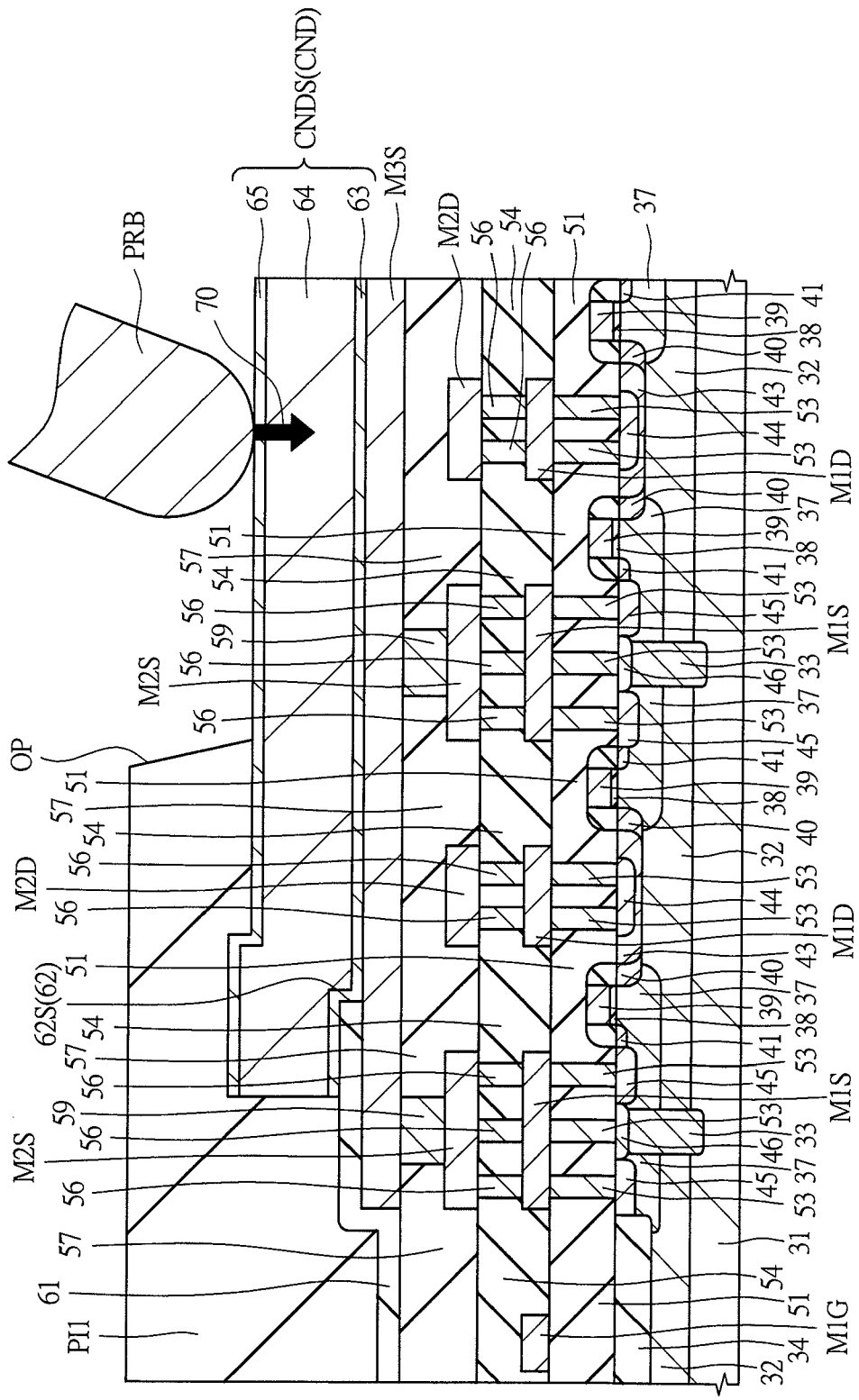
Figure 32:
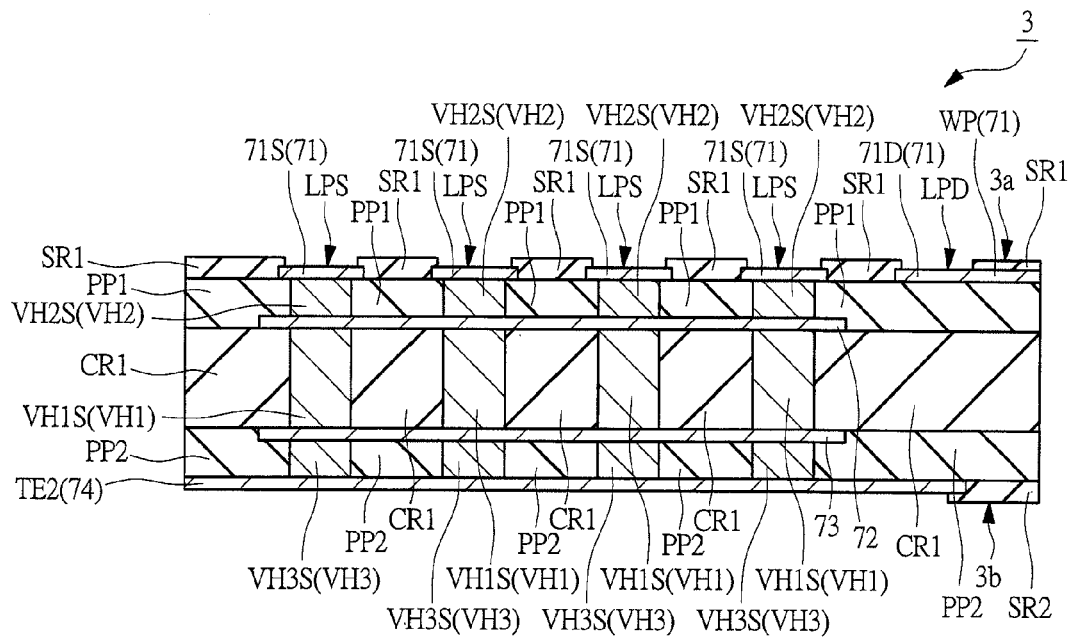
Figure 33:
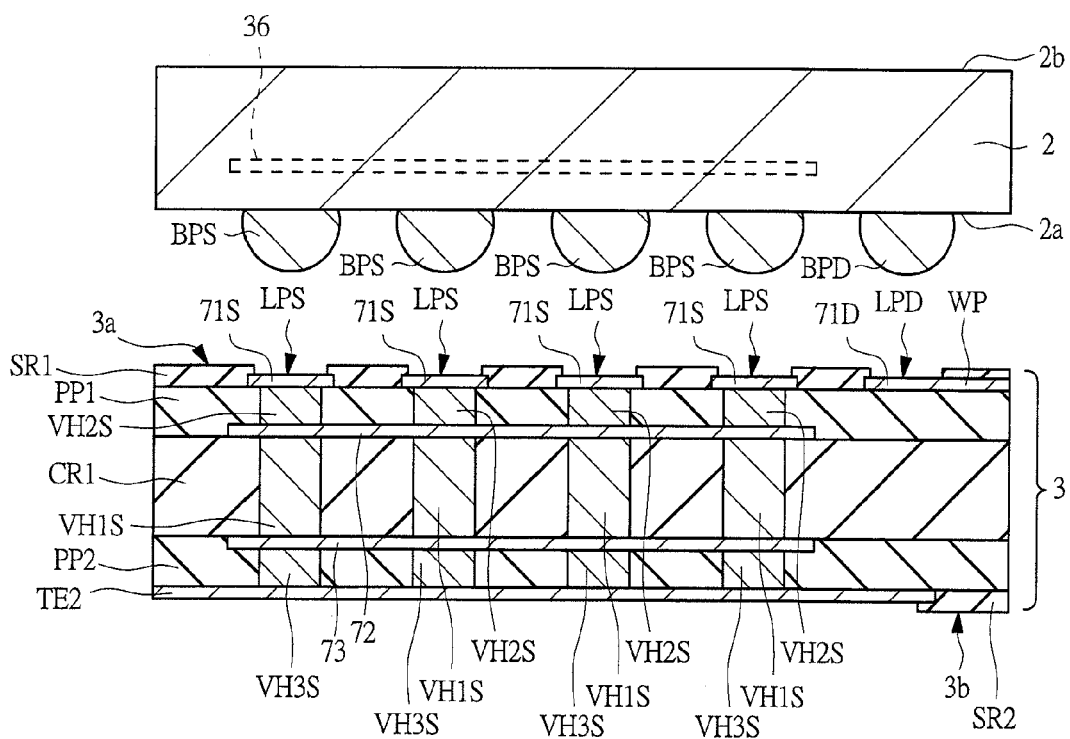
Figure 34:
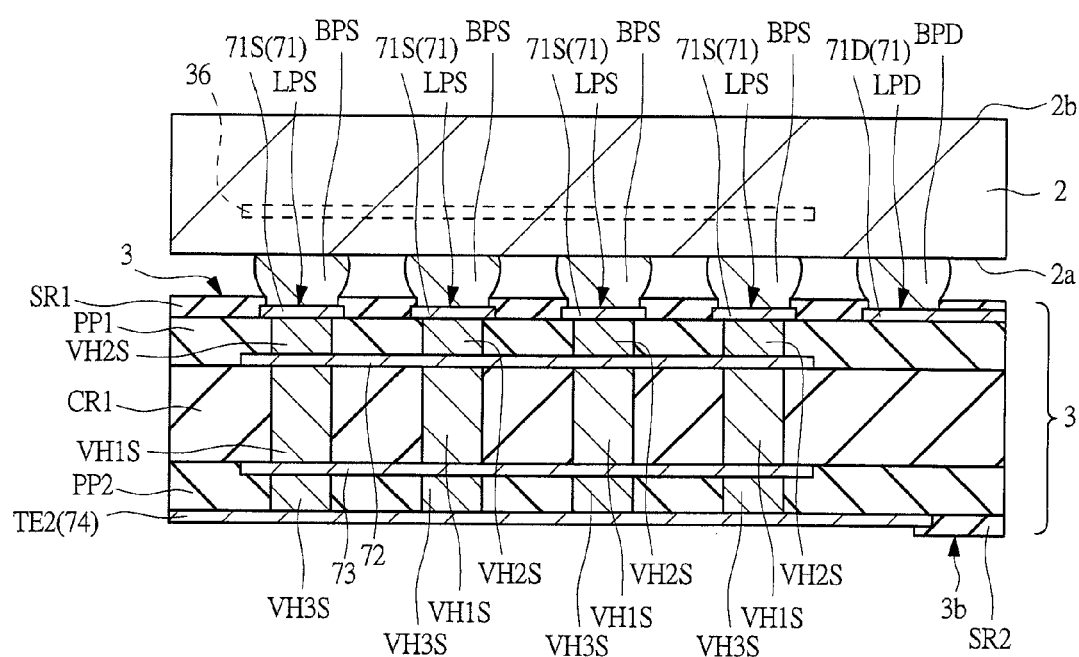
Figure 35:
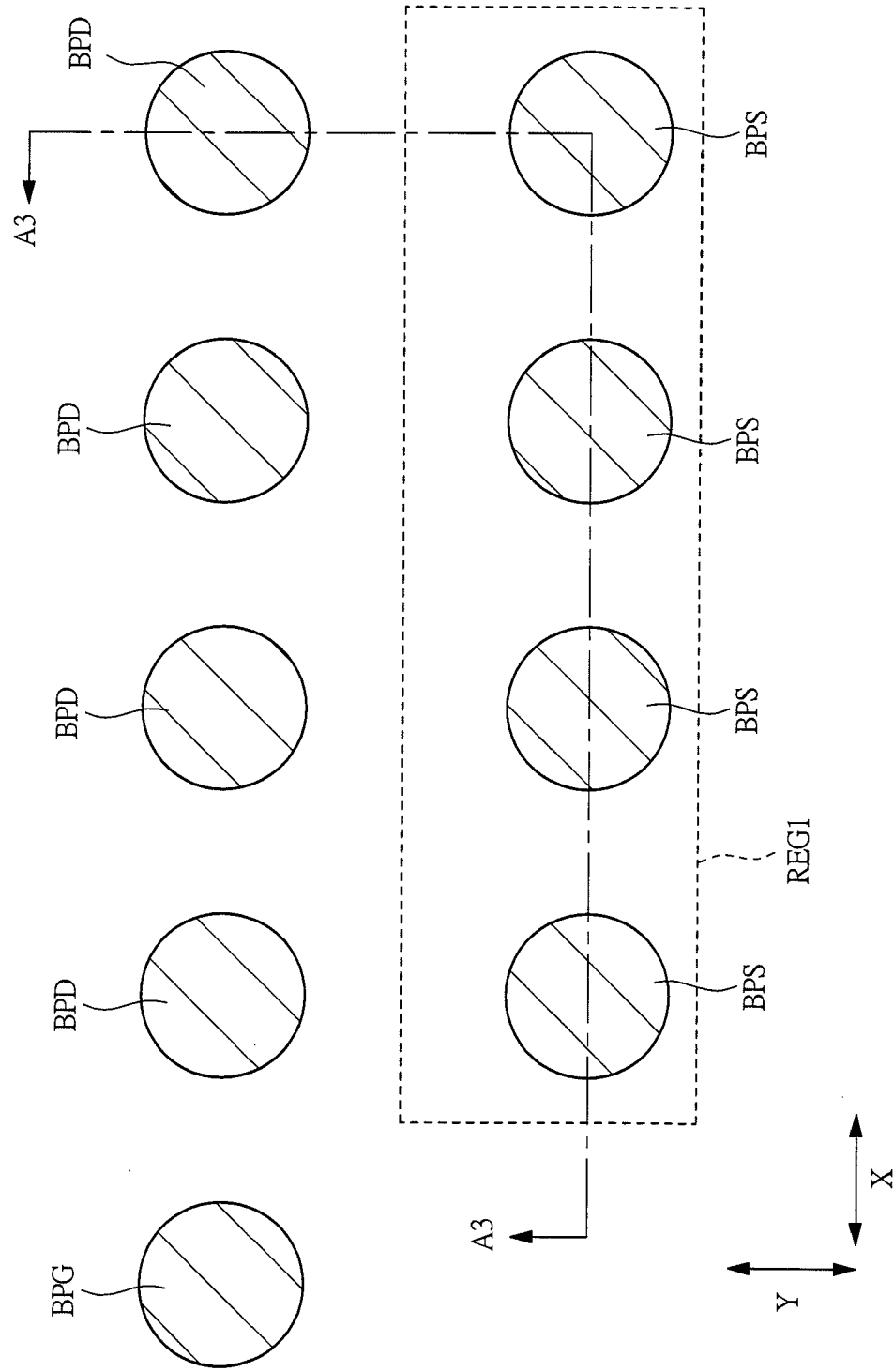
Figure 36:
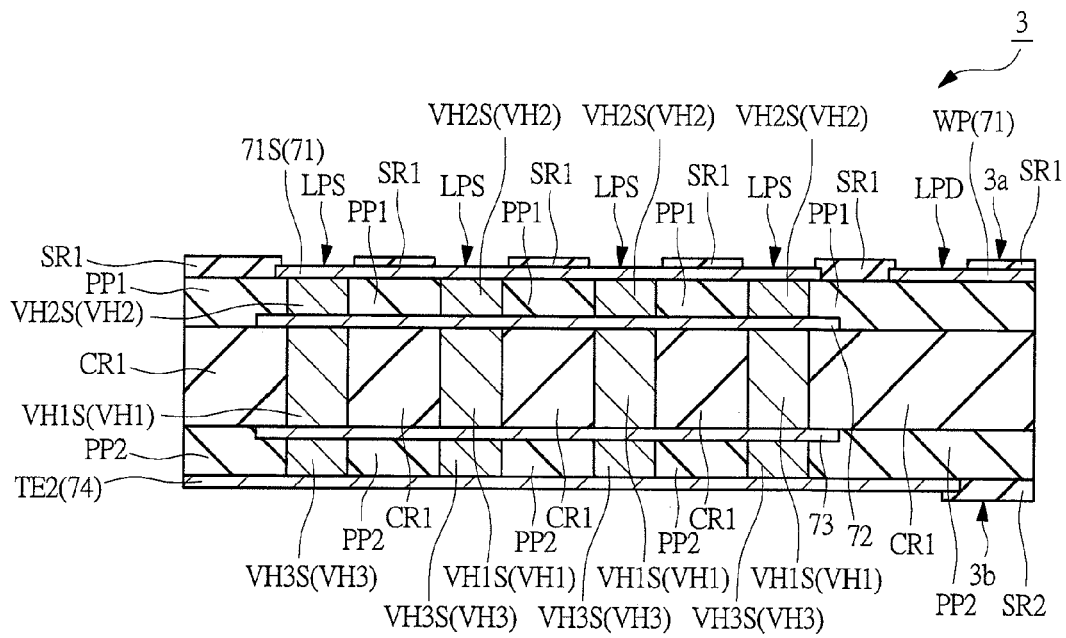
Figure 37:
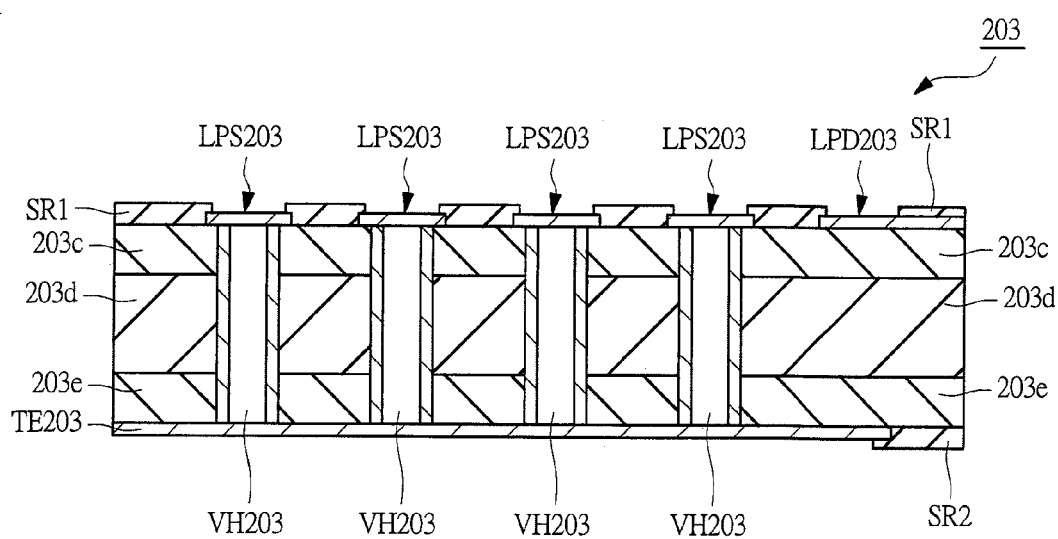
Figure 38:
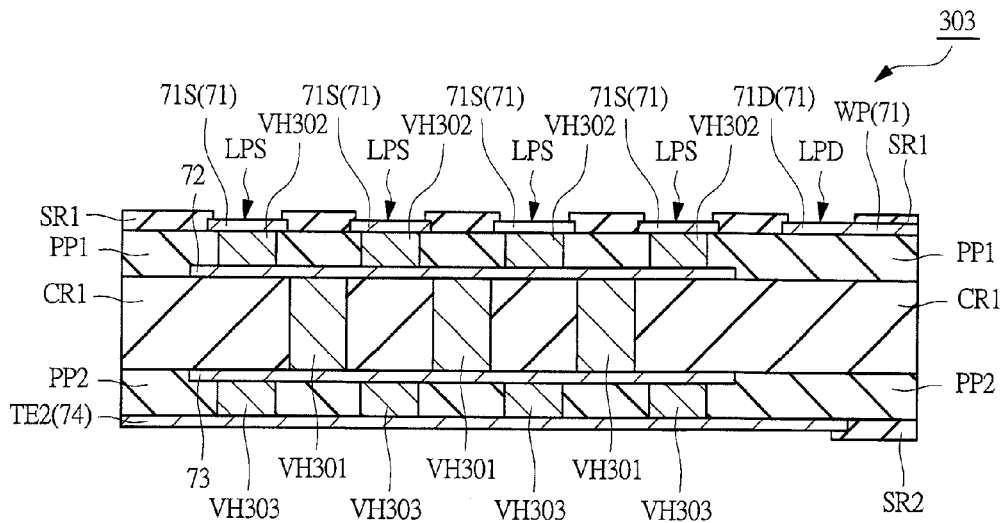
Figure 39:
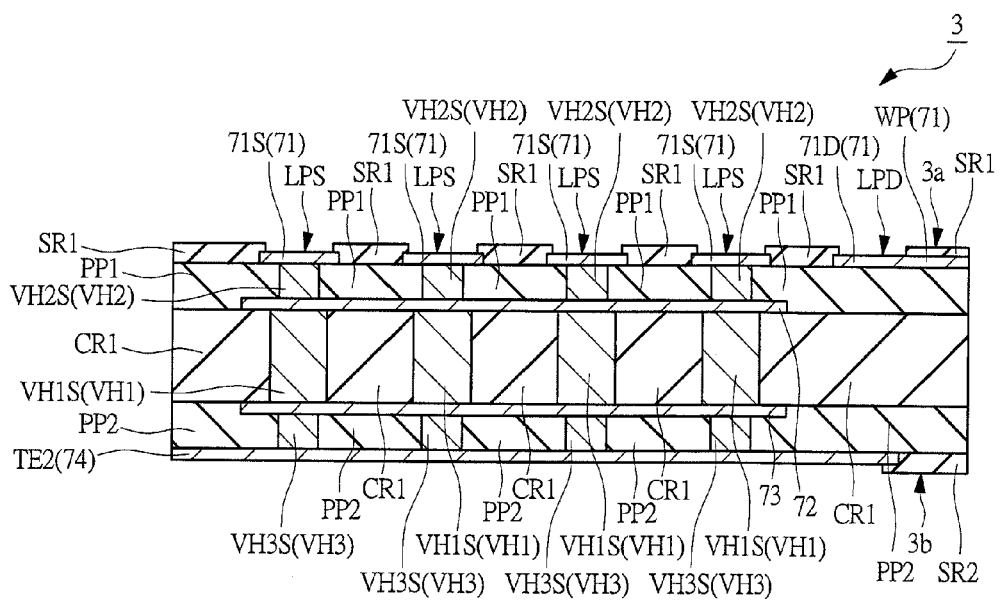
Figure 40:
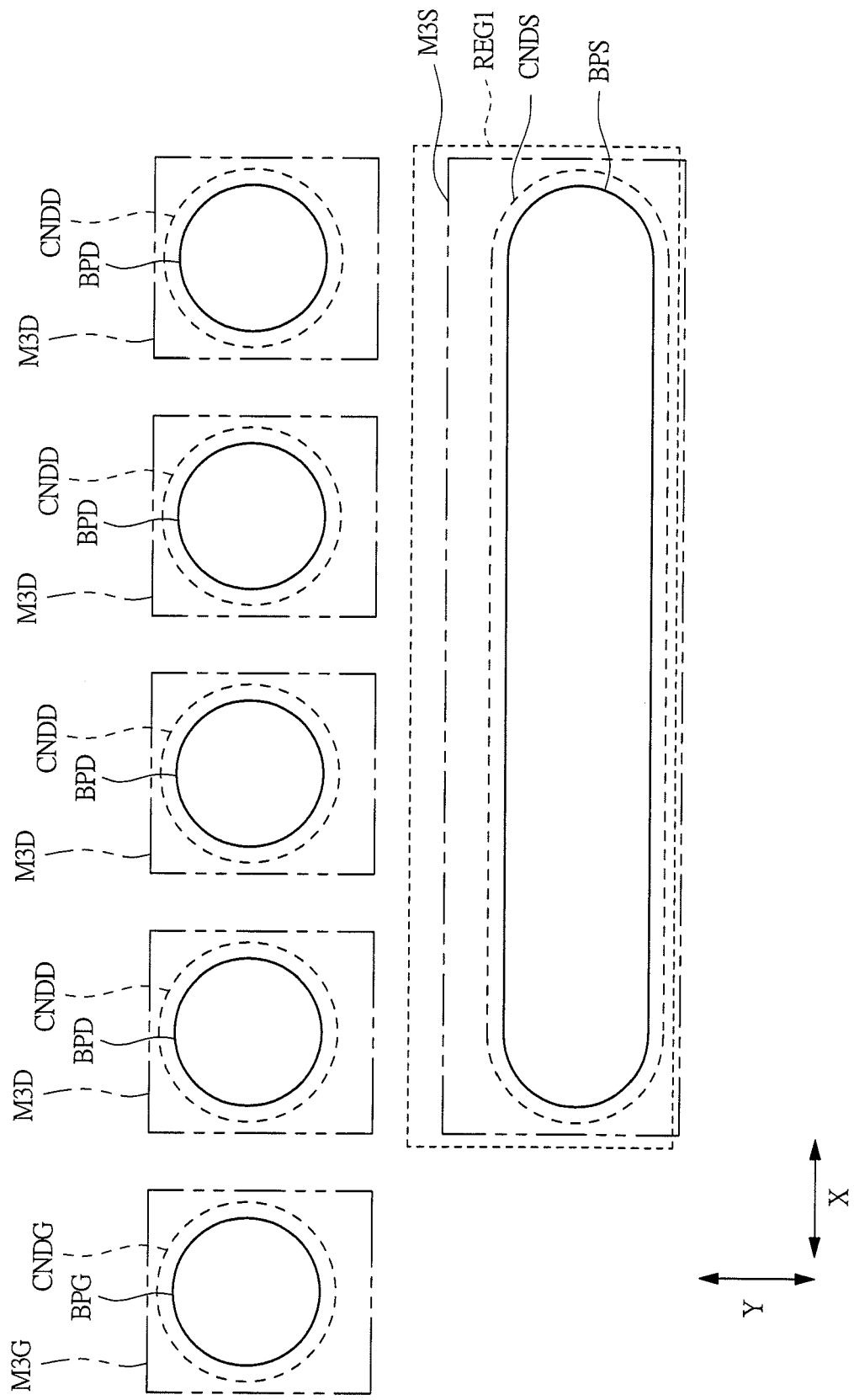
Figure 41:
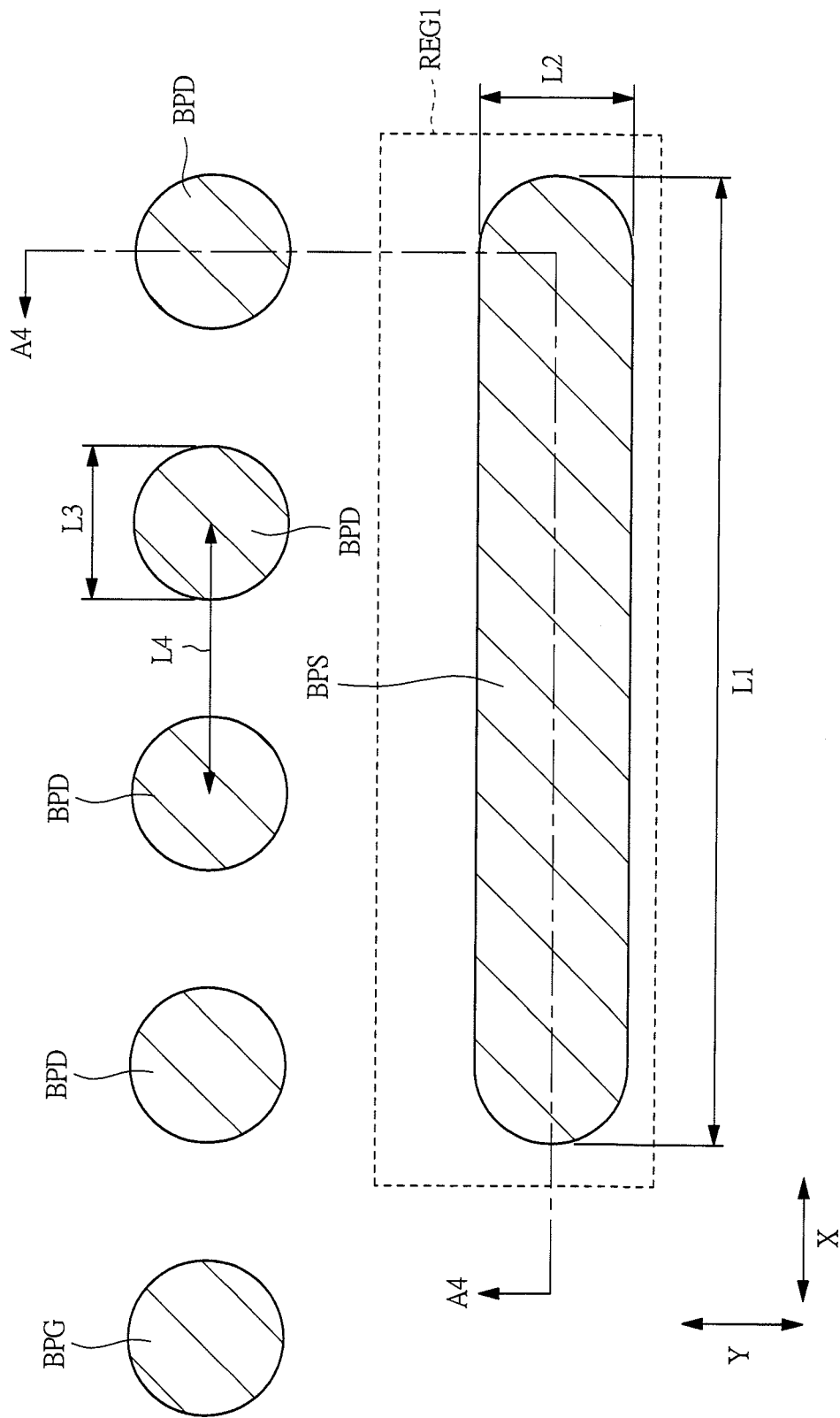
Figure 42:
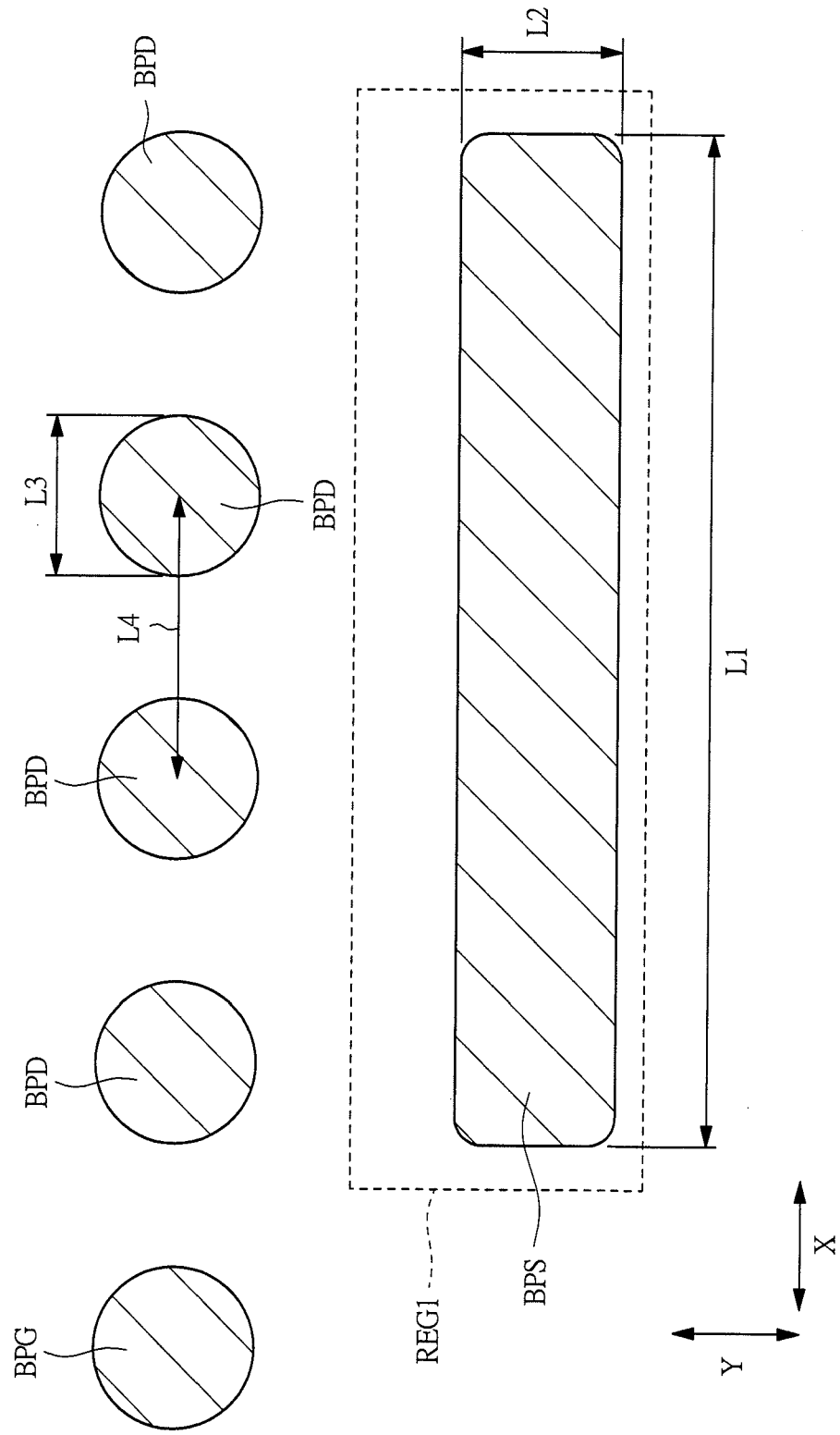
Figure 43:
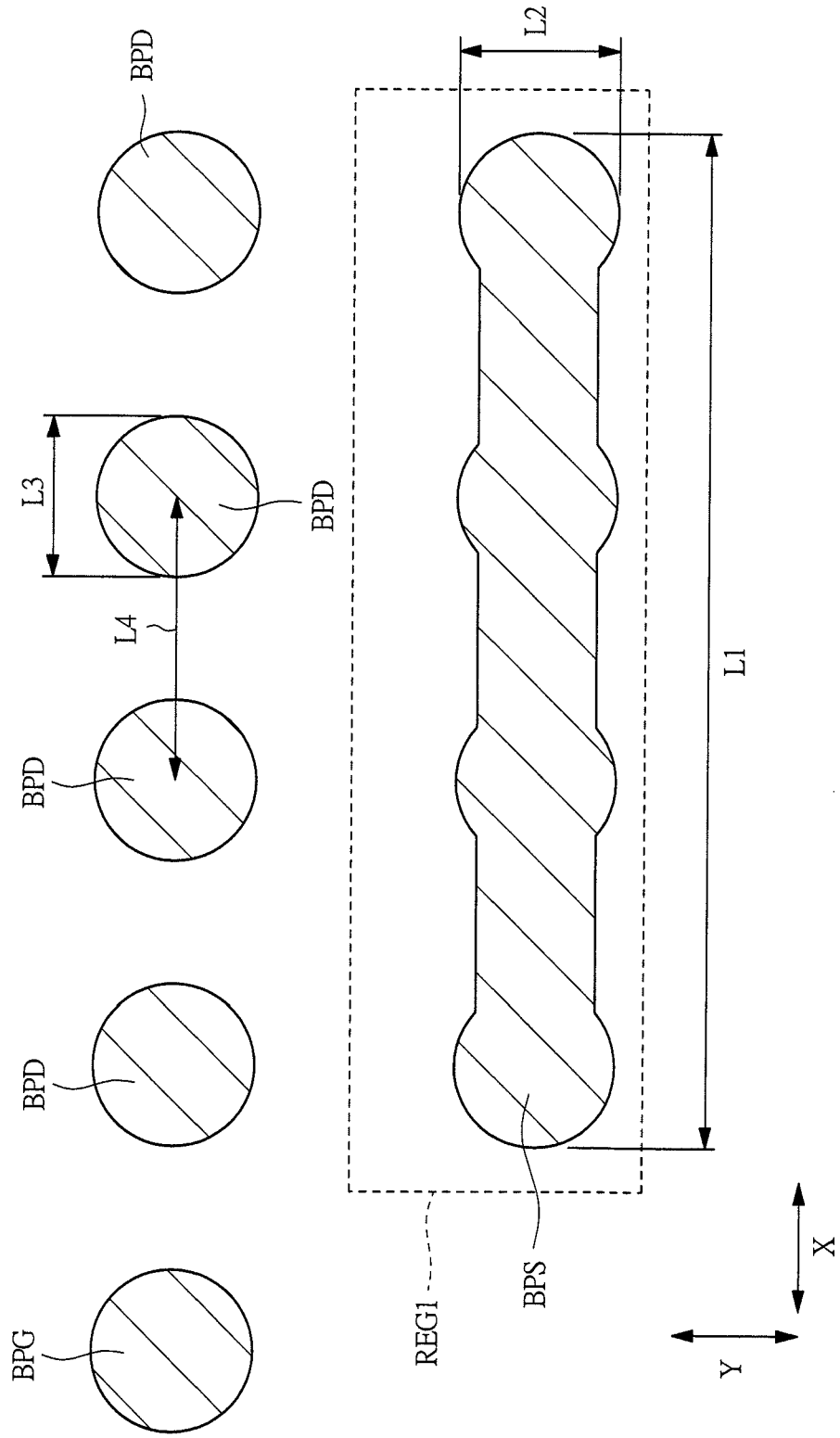
Figure 44:
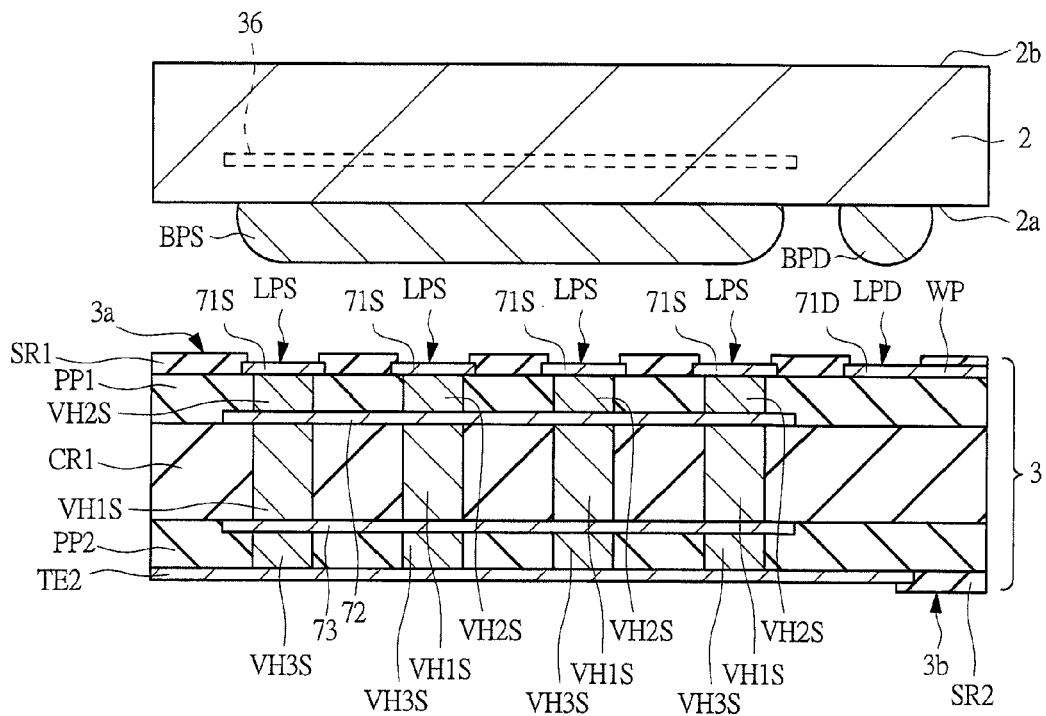
Figure 45:
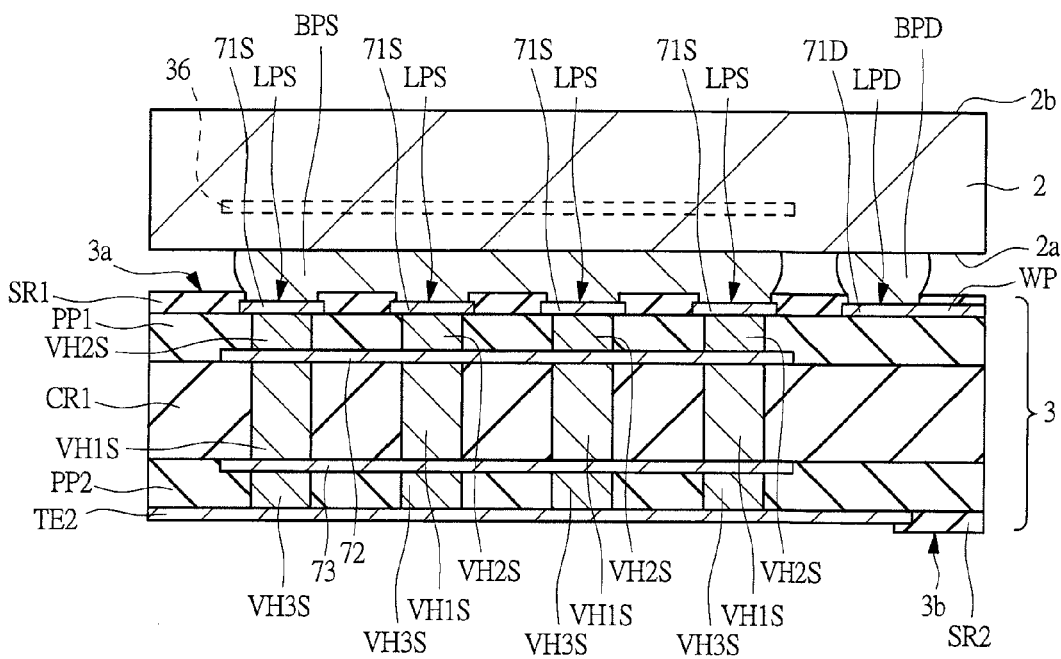
Figure 46:
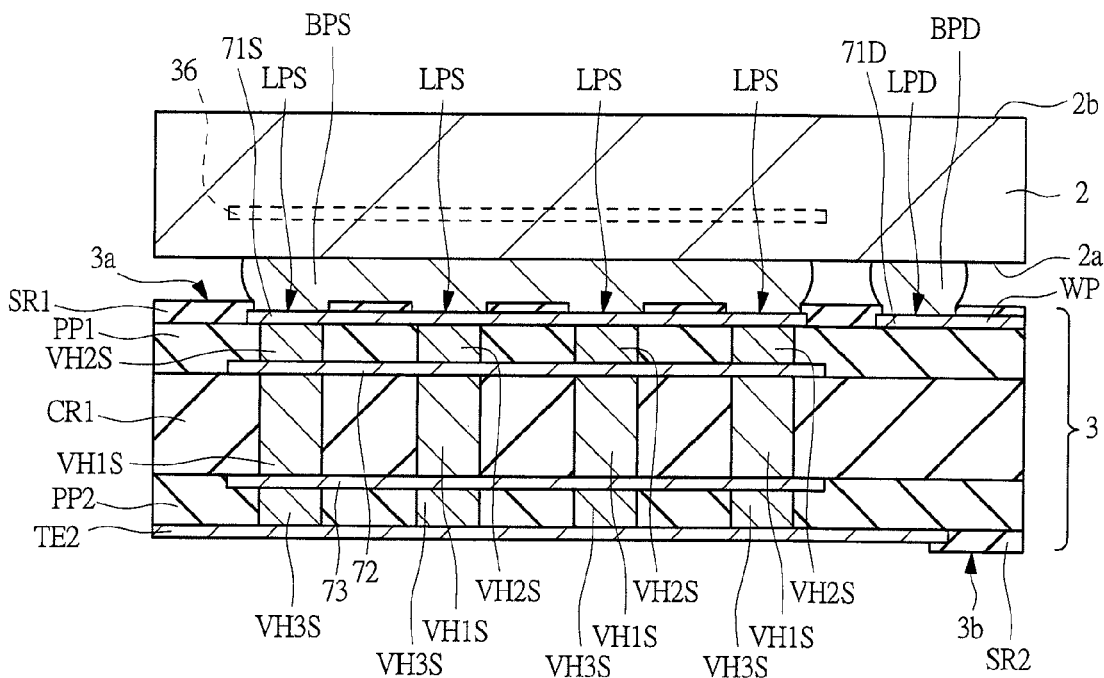
Figure 47:
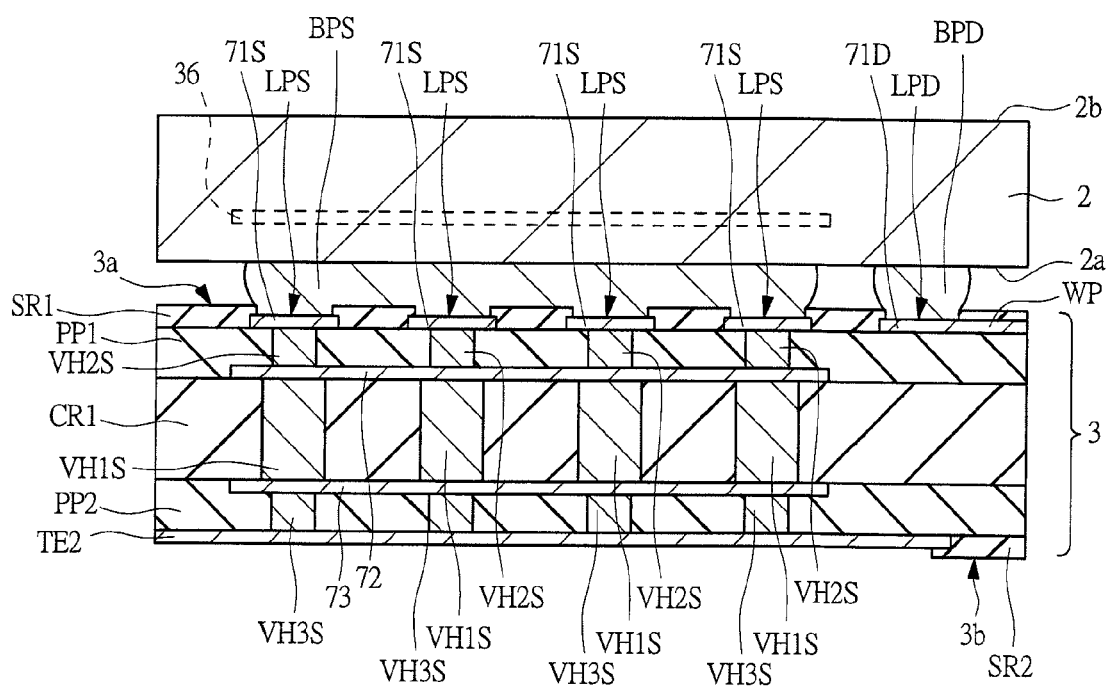
Figure 48:
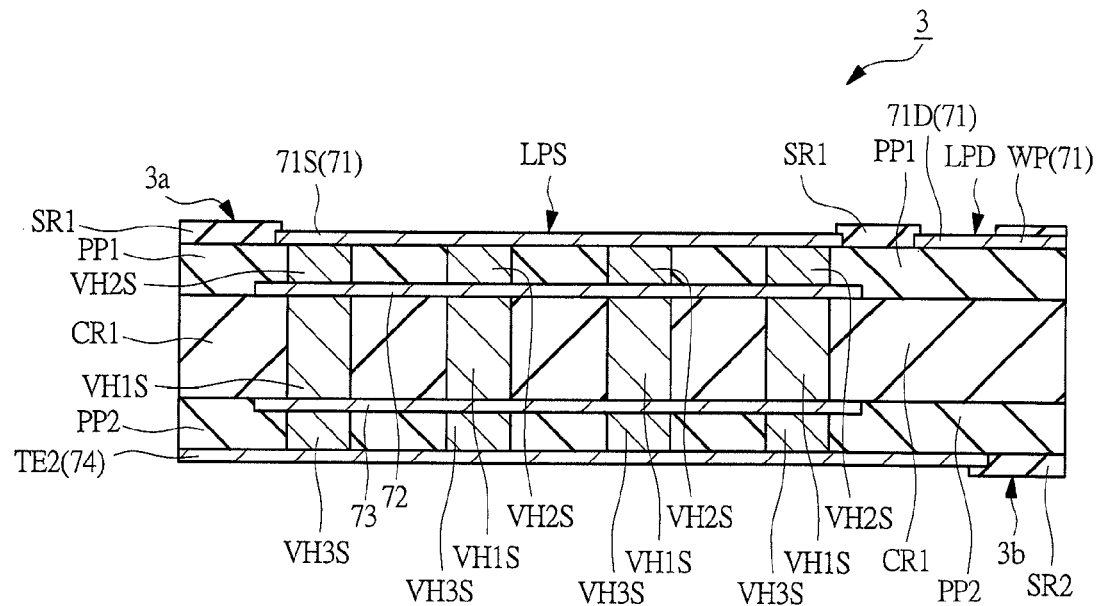
Figure 49:
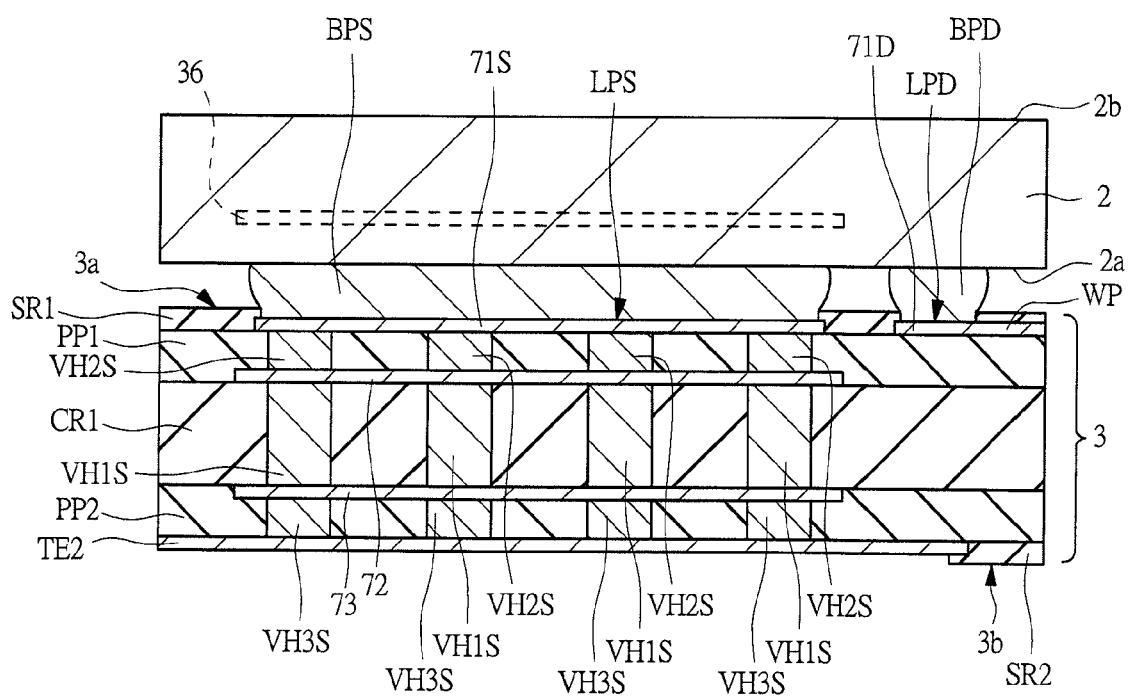
Figure 50:
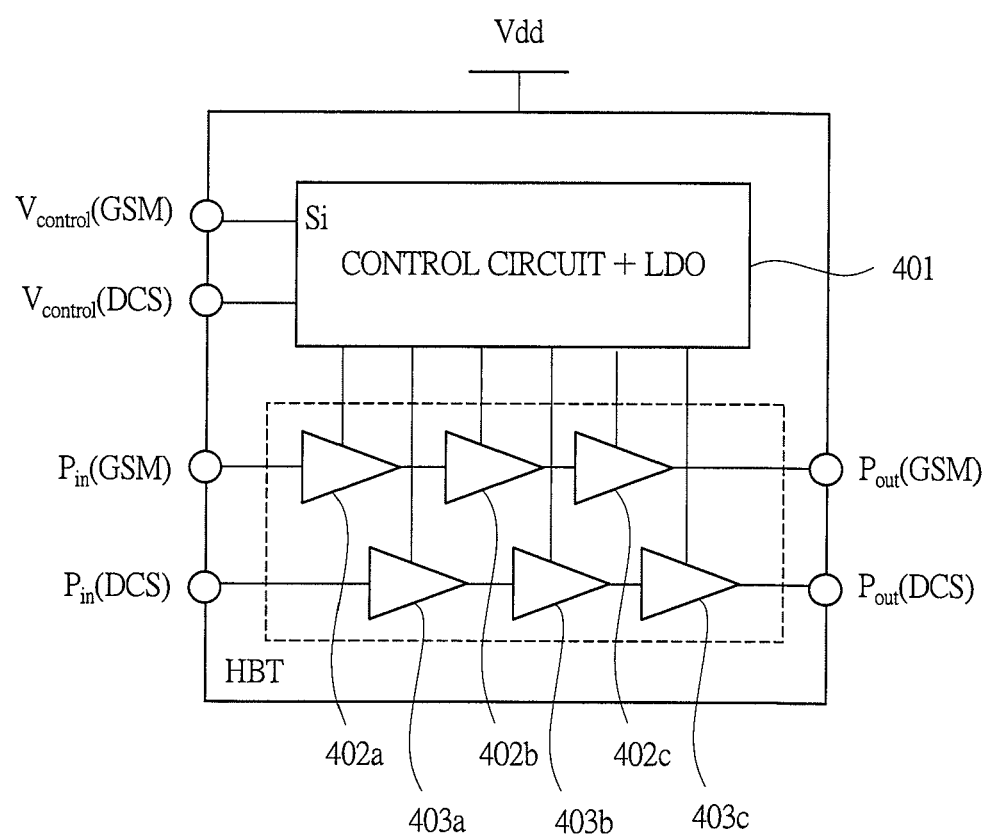
Figure 51:
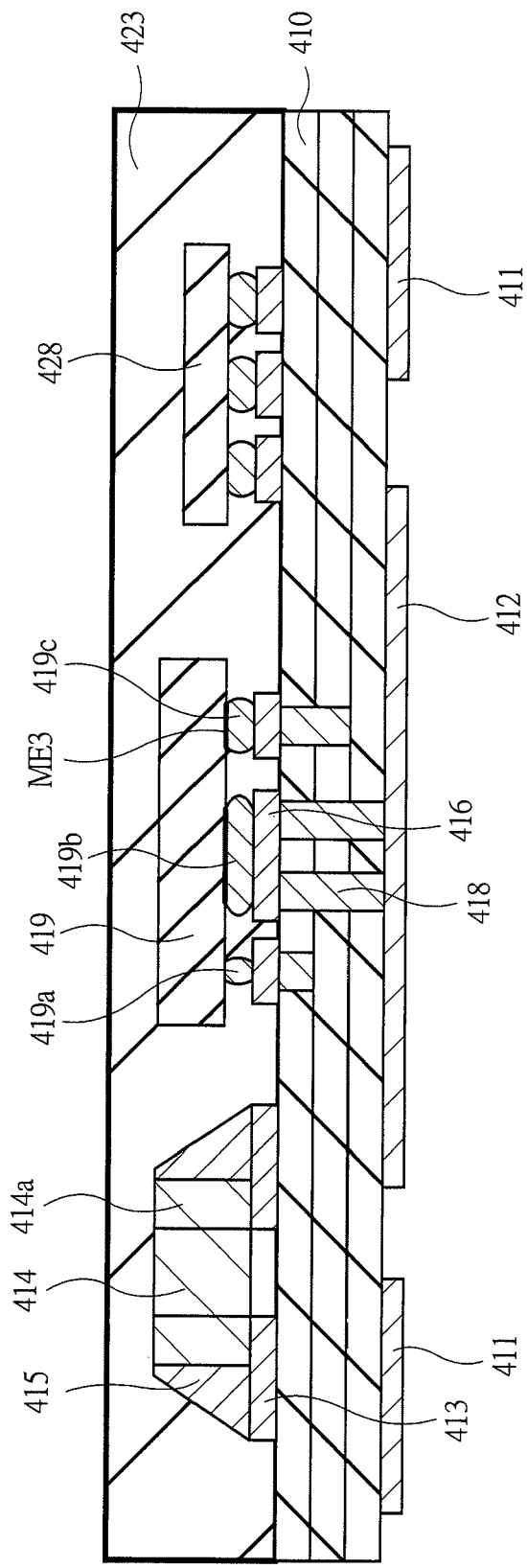
Figure 52:
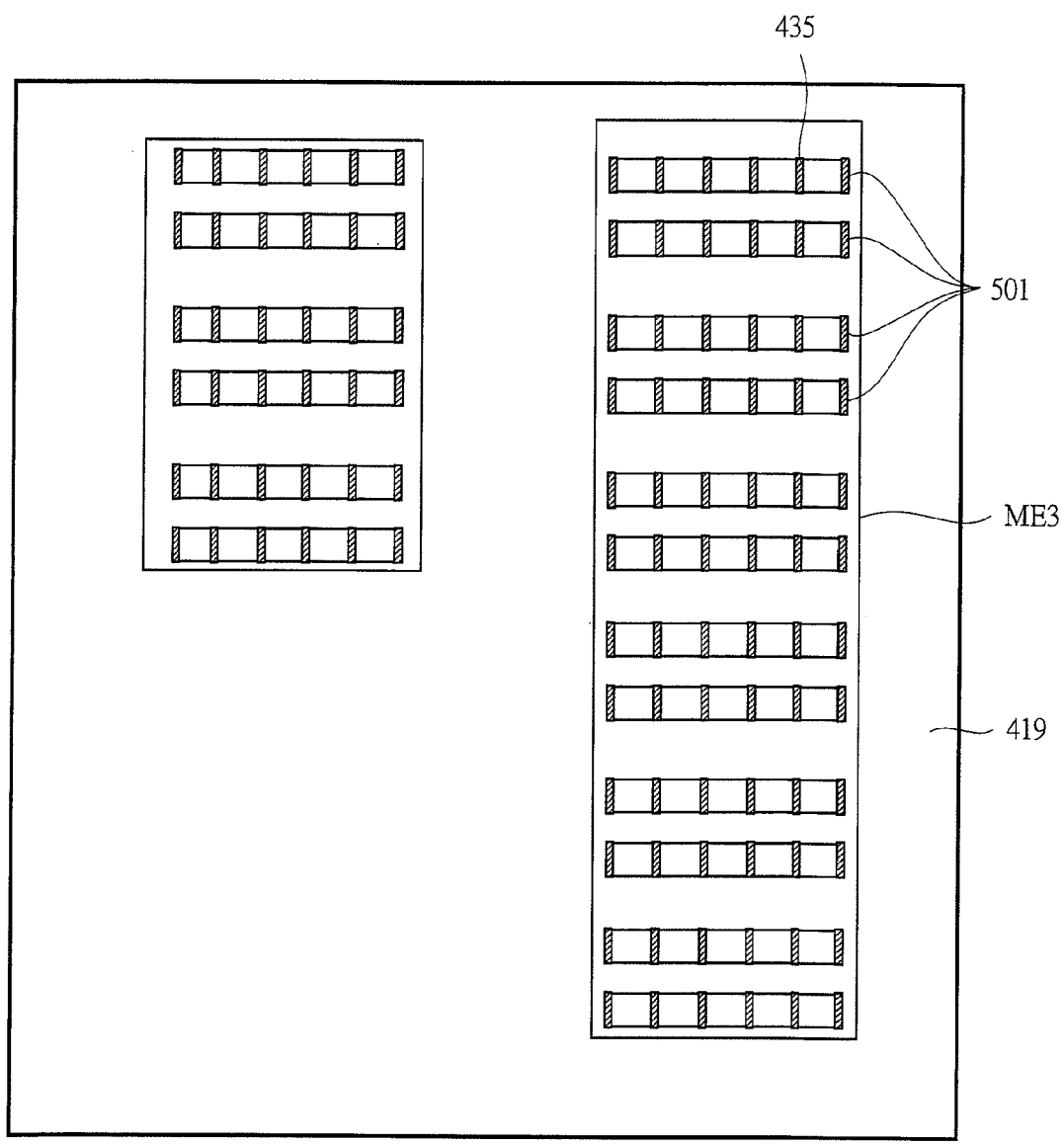
Figure 53:
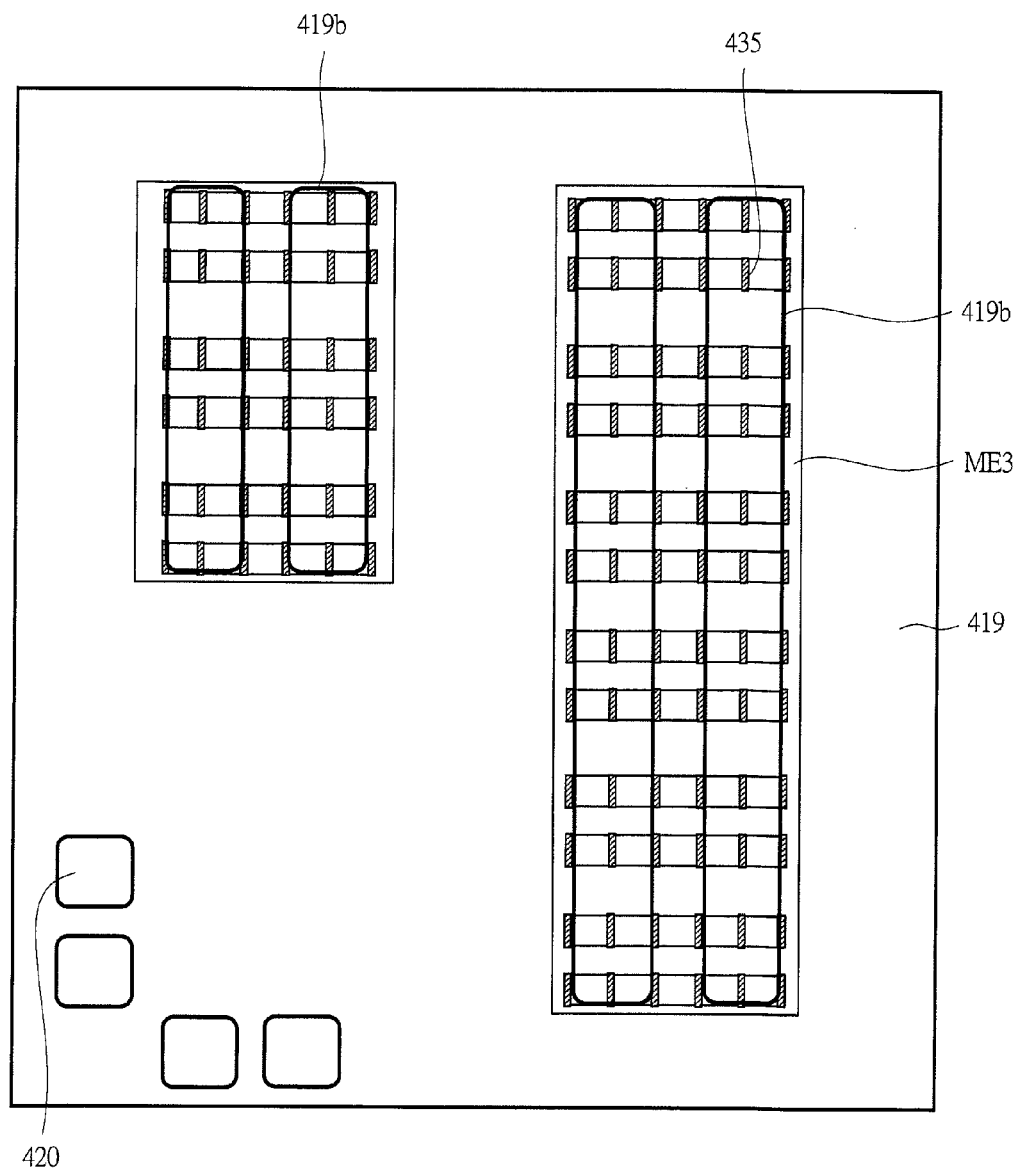
Figure 54:
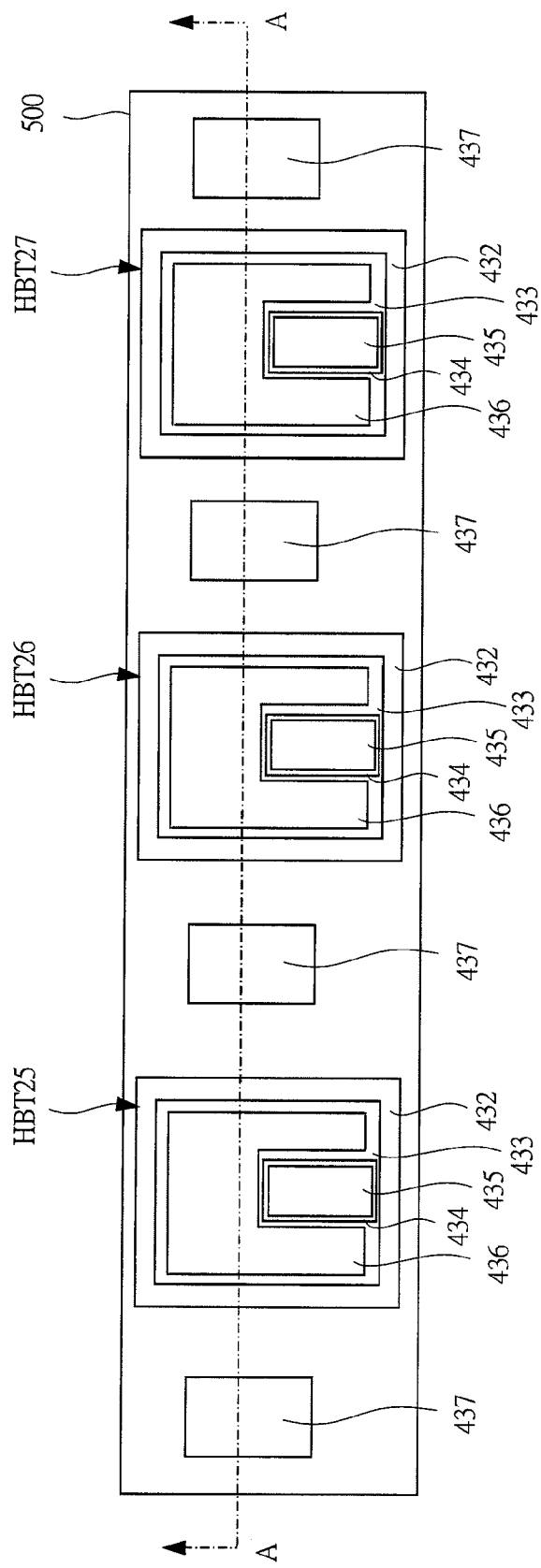
Figure 55:
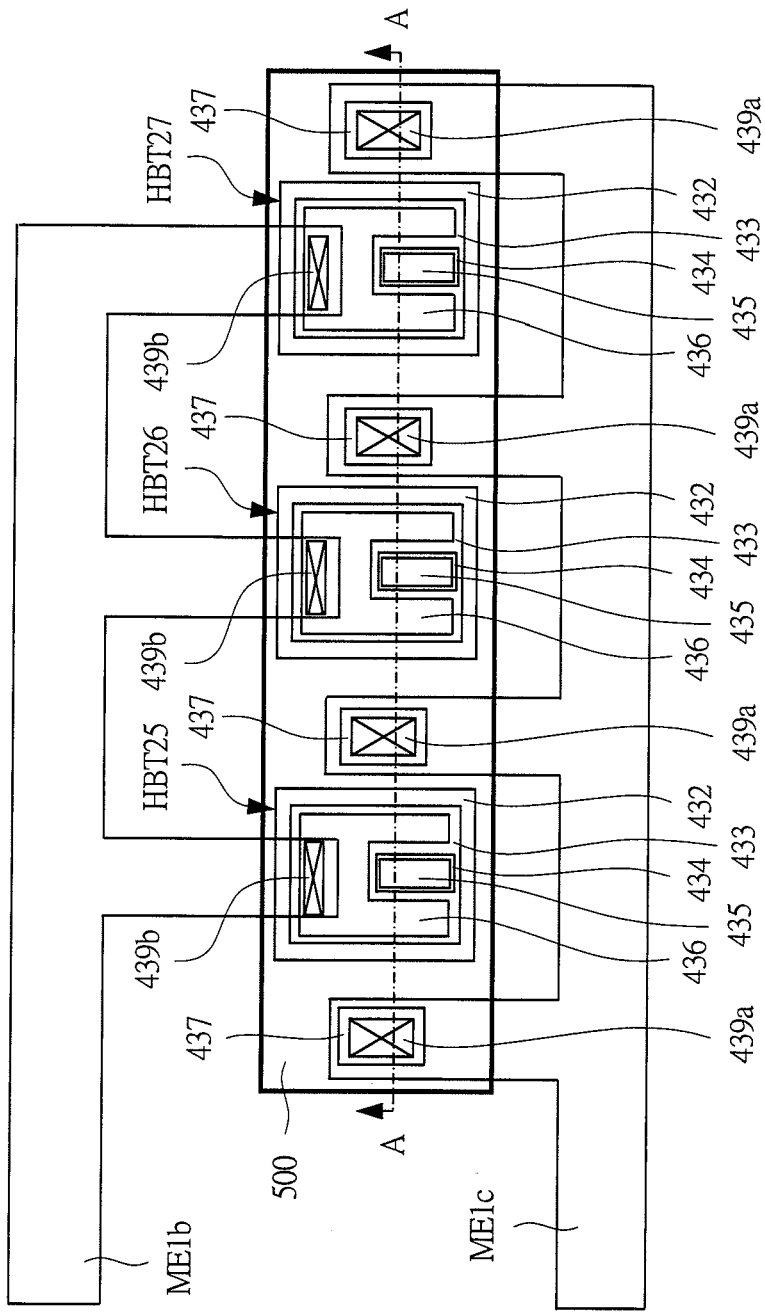
Figure 56:
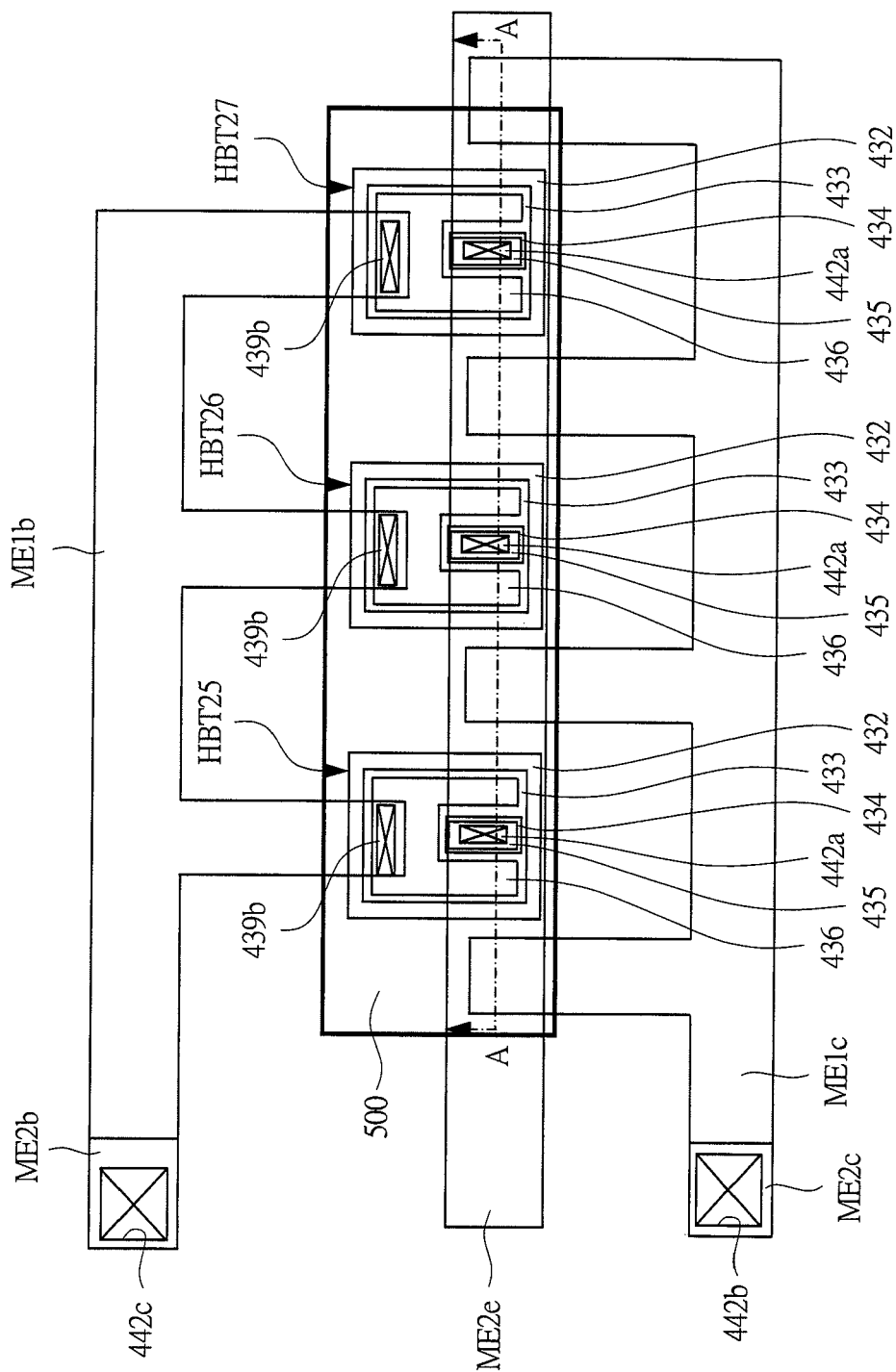
Figure 57:
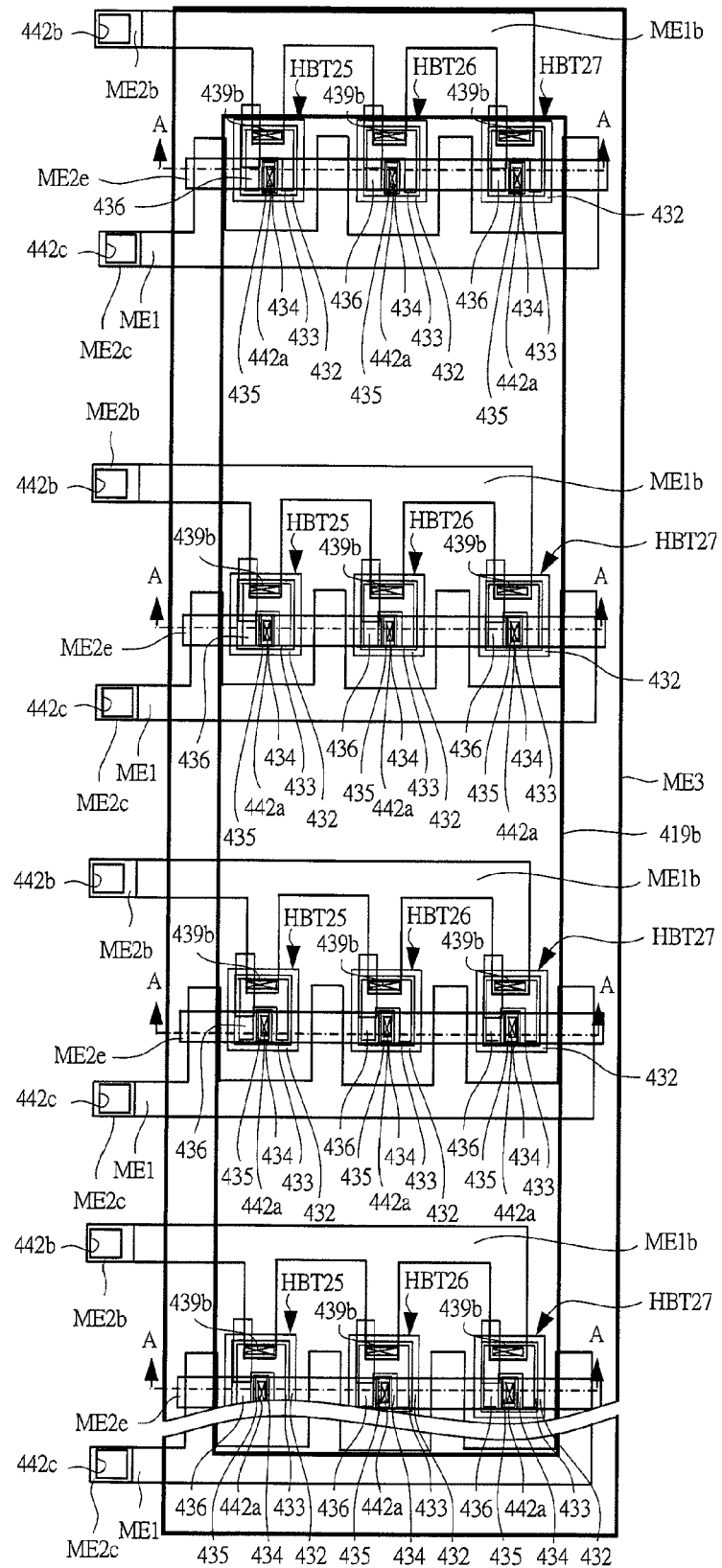
Figure 58:
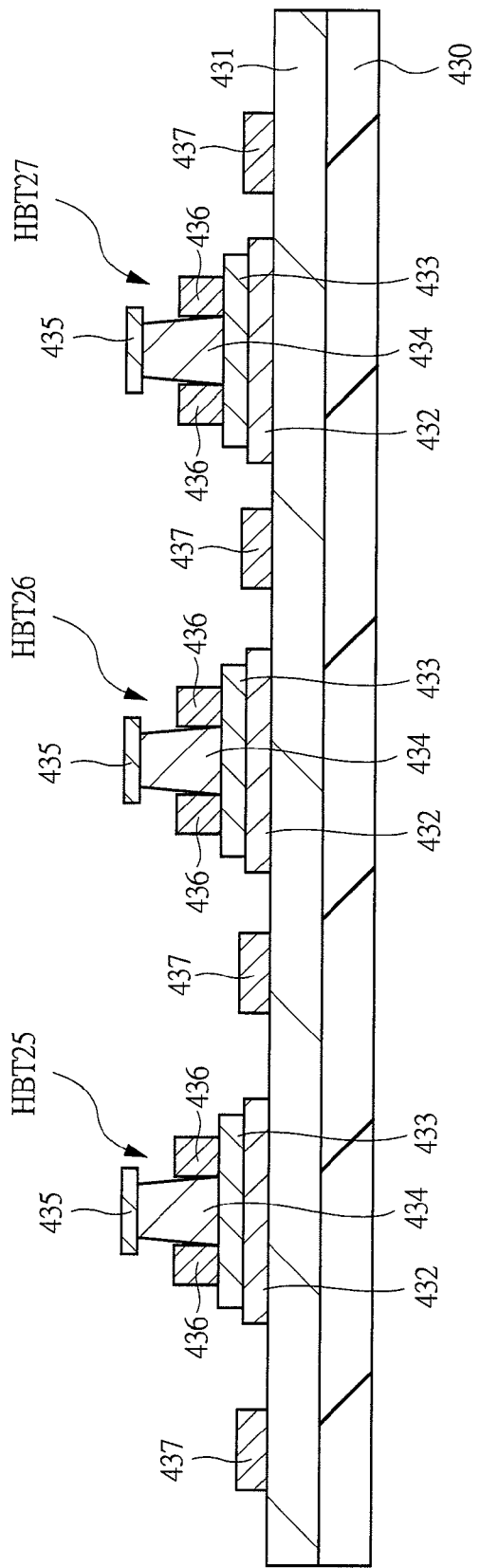
Figure 59:
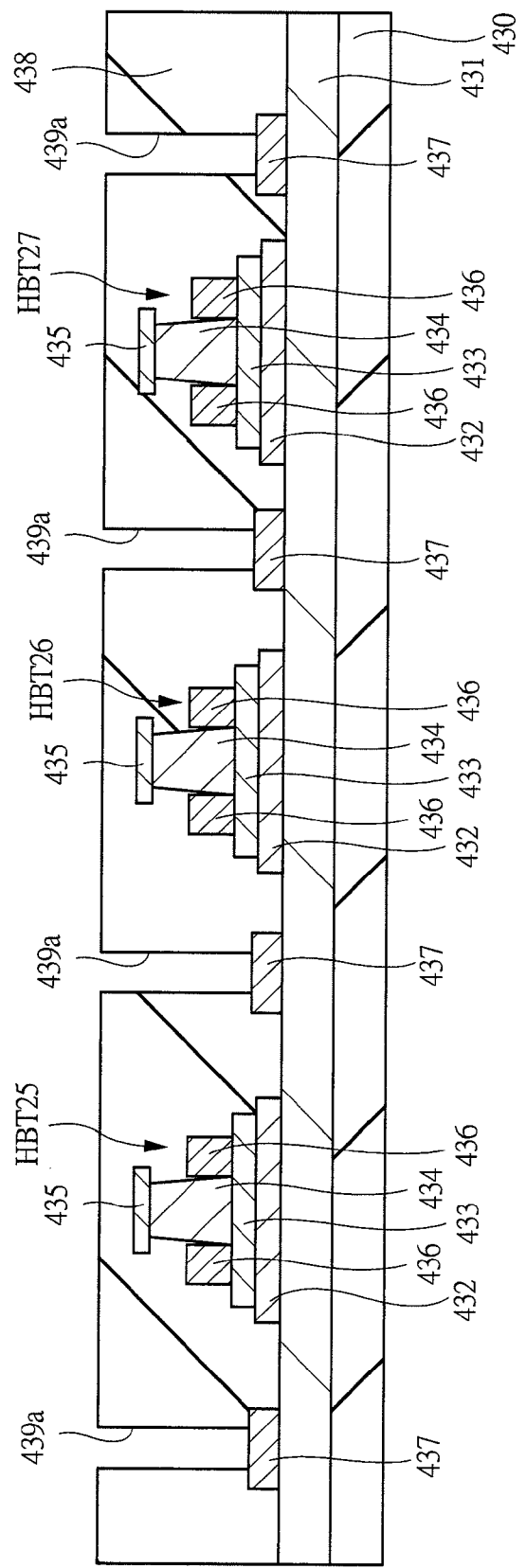
Figure 60:
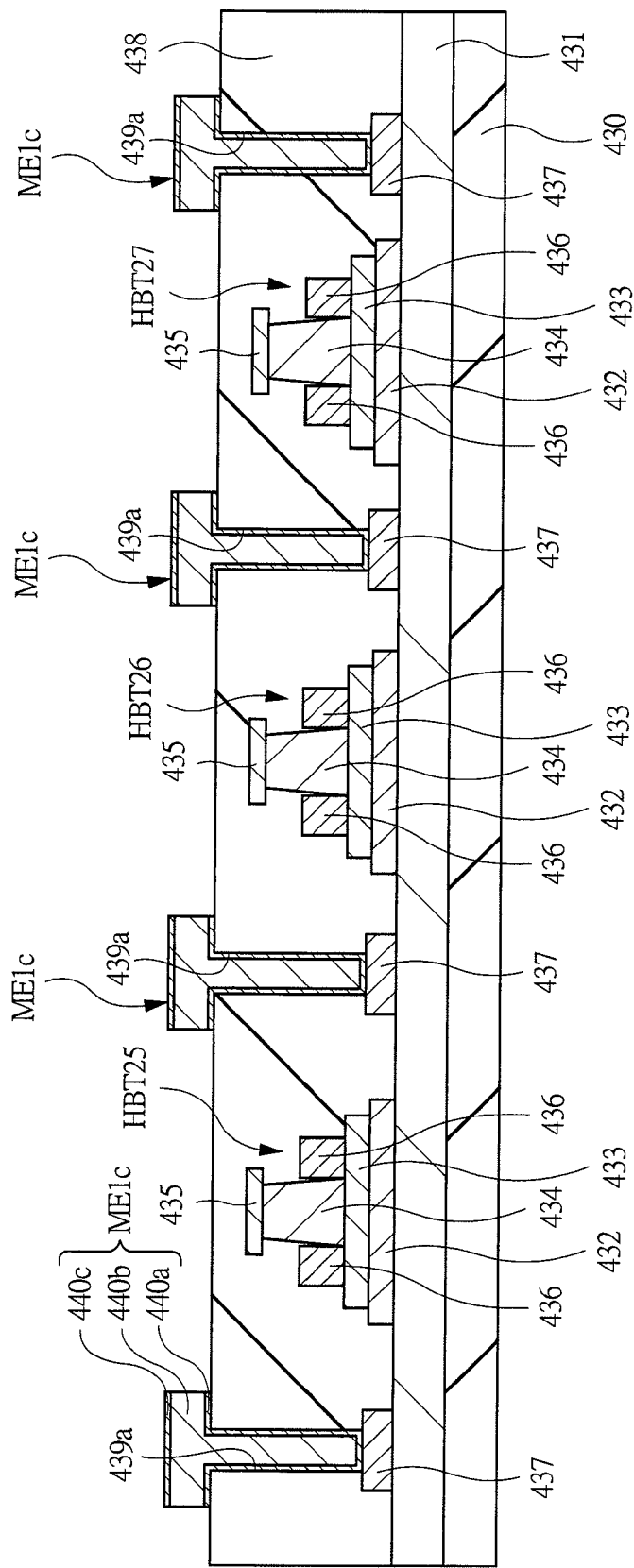
Figure 61:
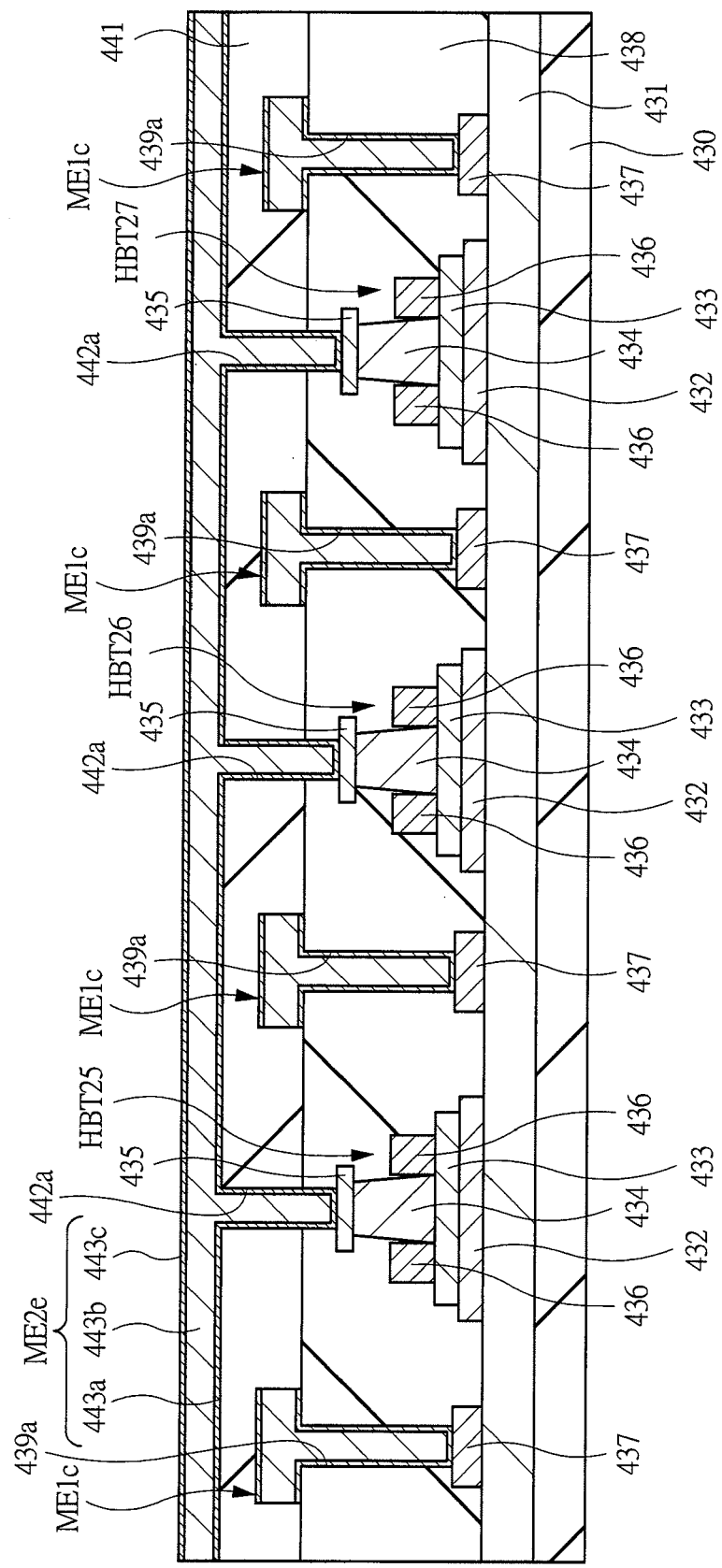
Figure 62:
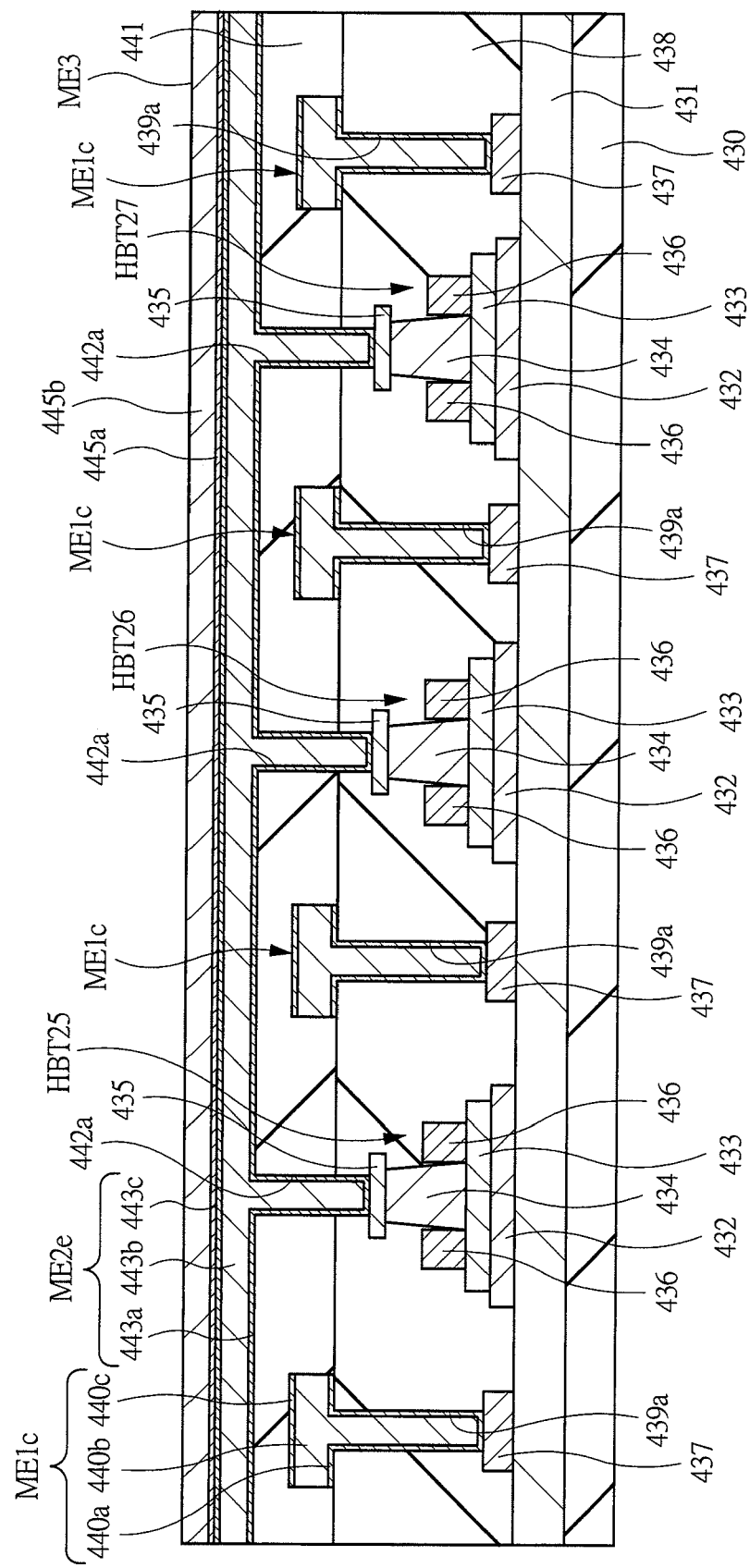
Figure 63:
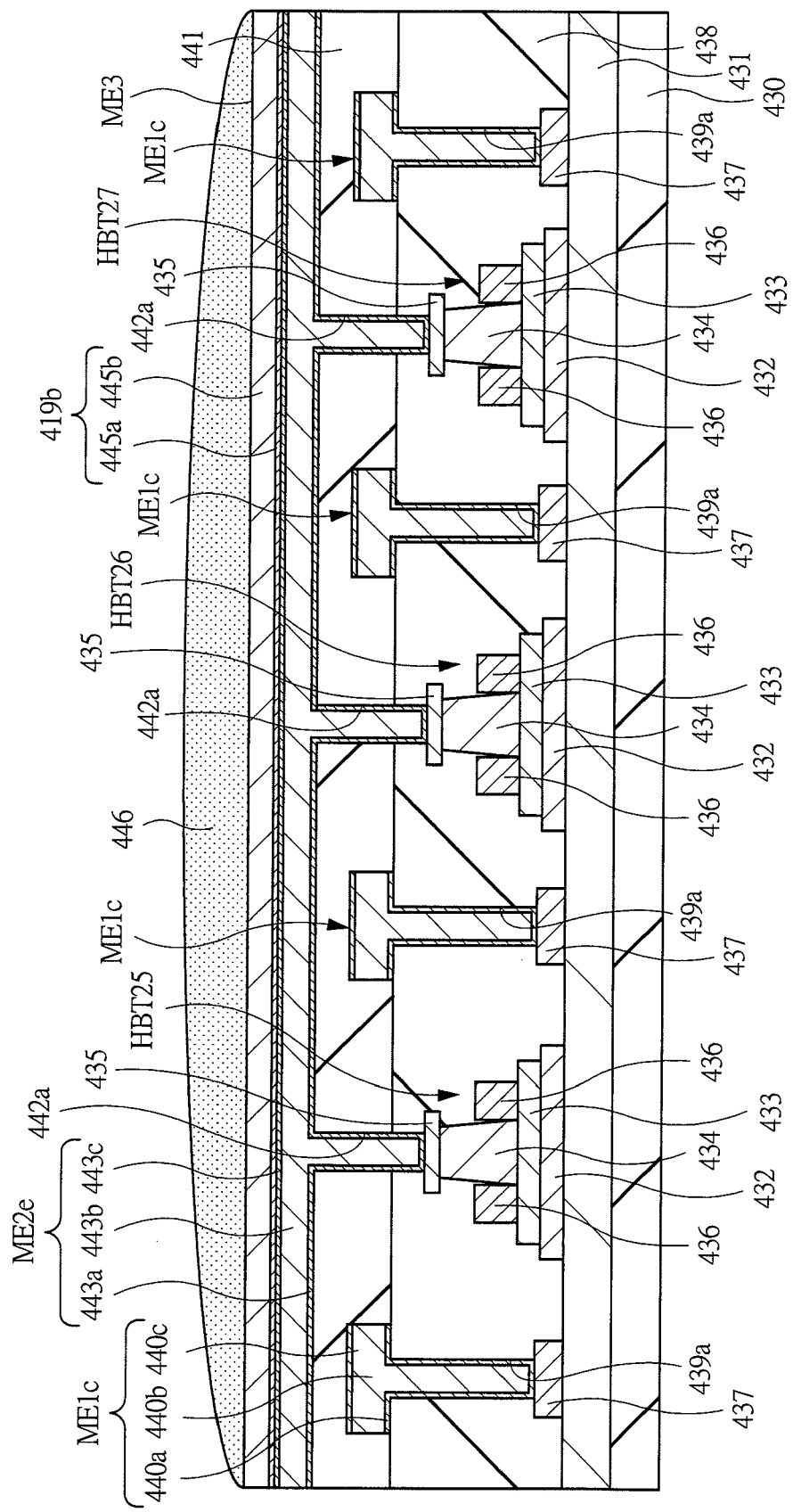
Figure 64:
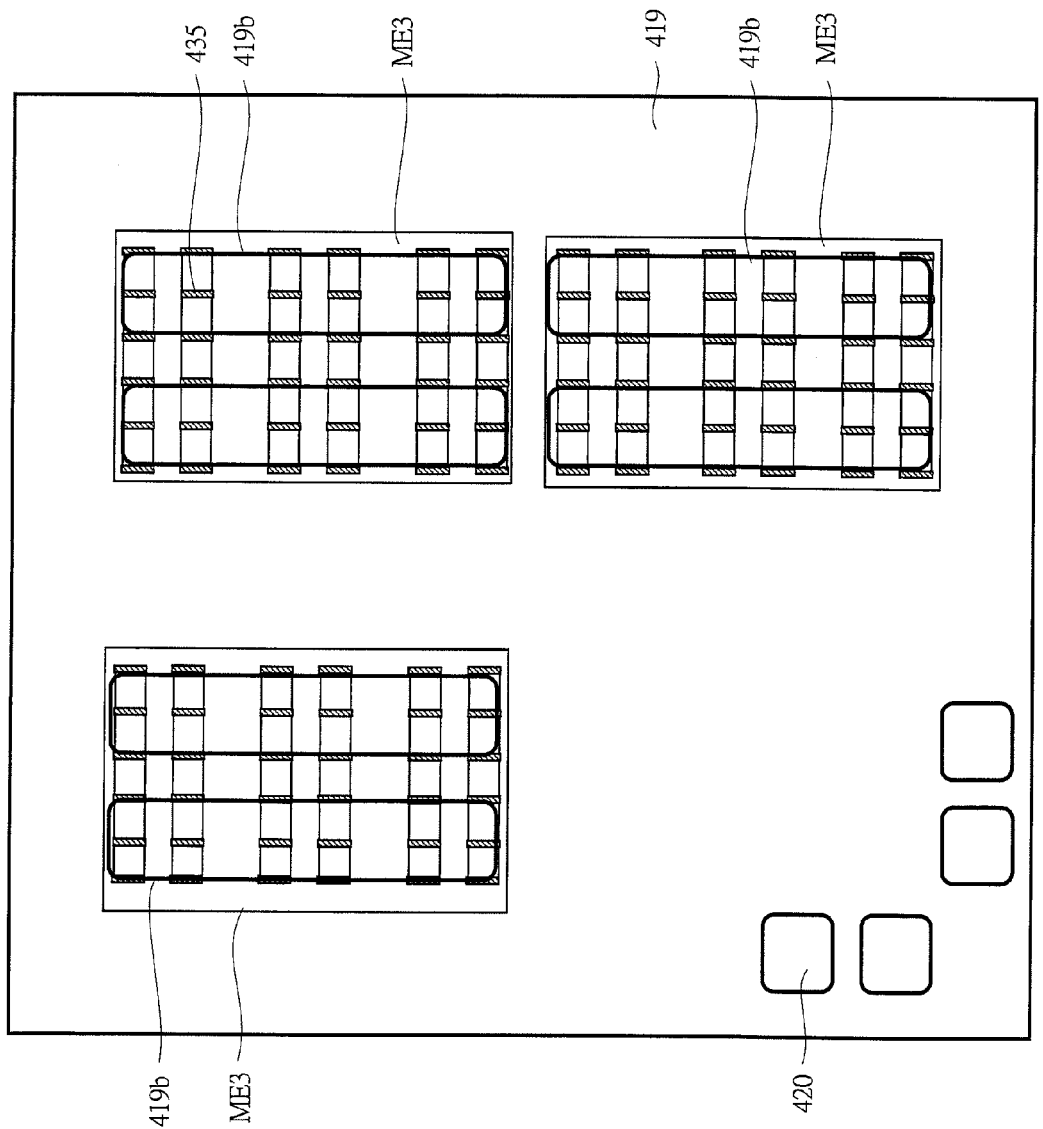
Figure 65:
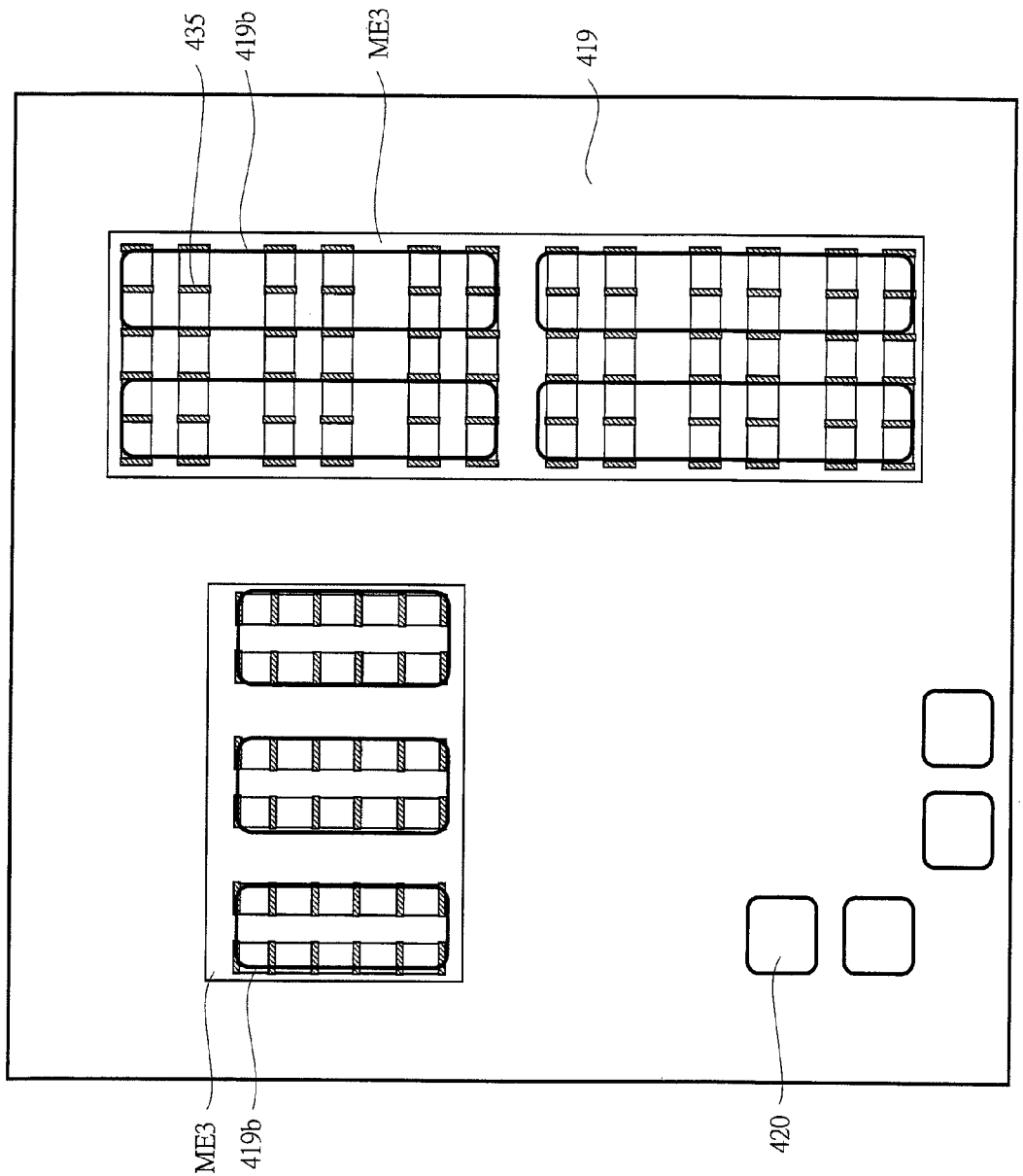
Figure 66:
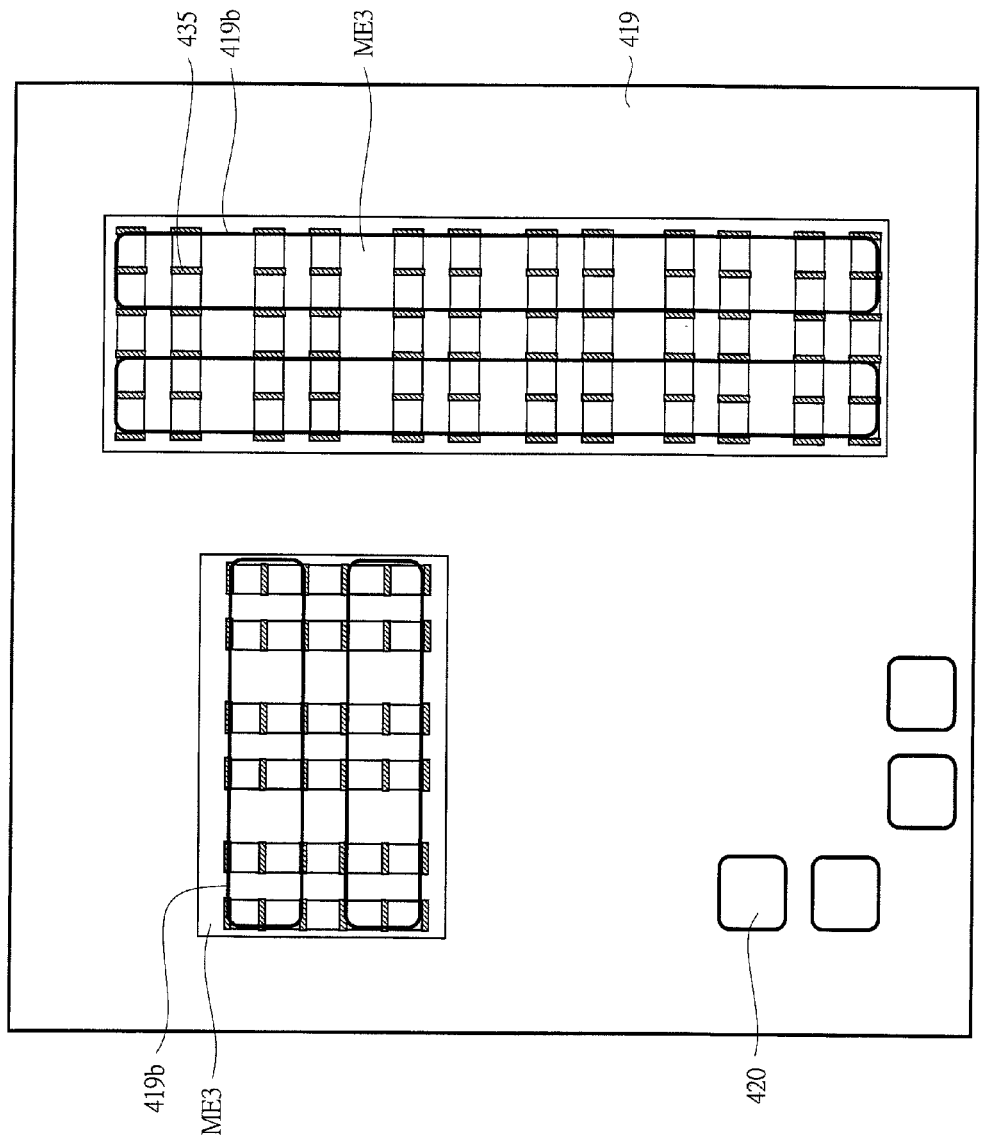
Figure 67:
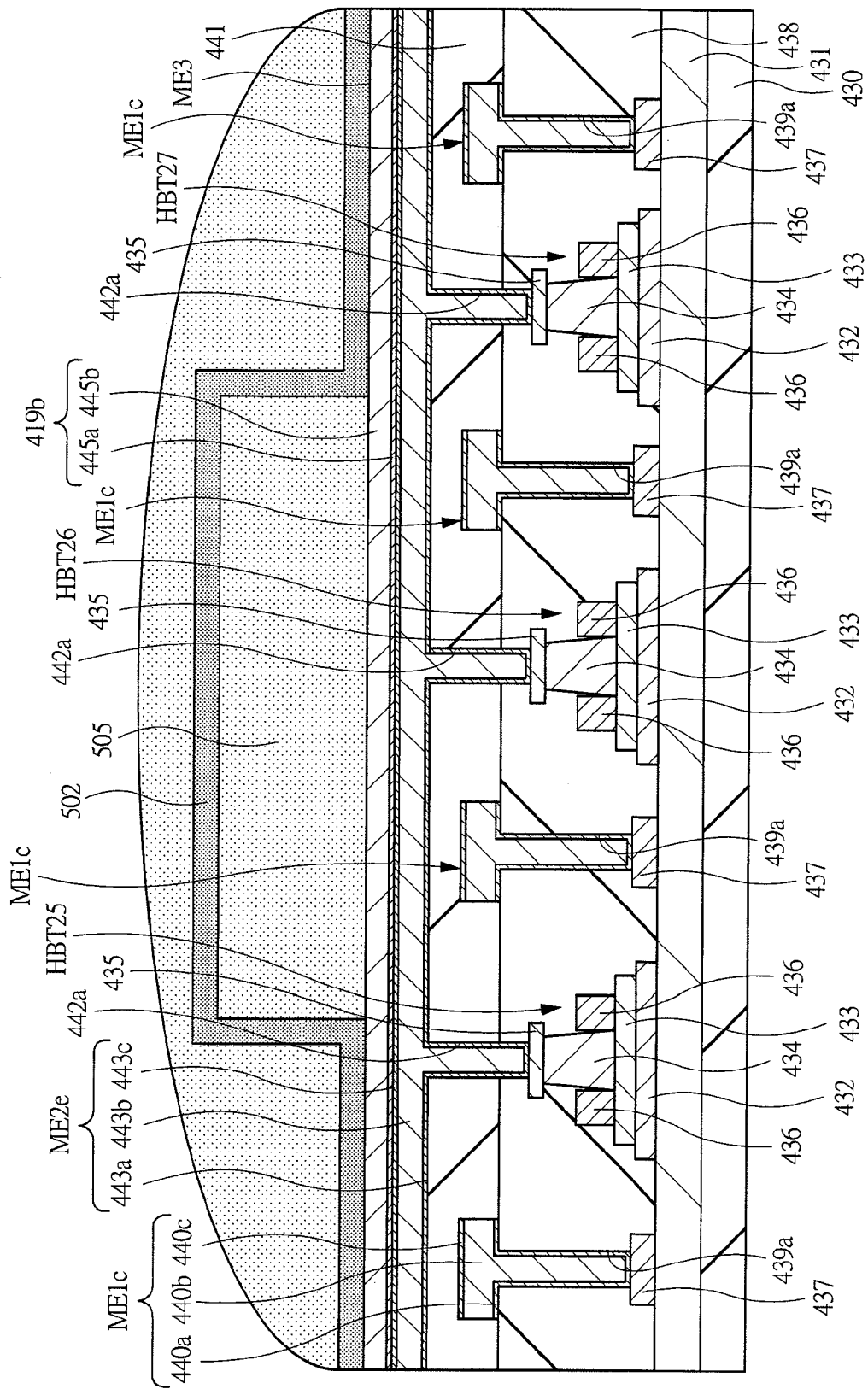
Figure 68:
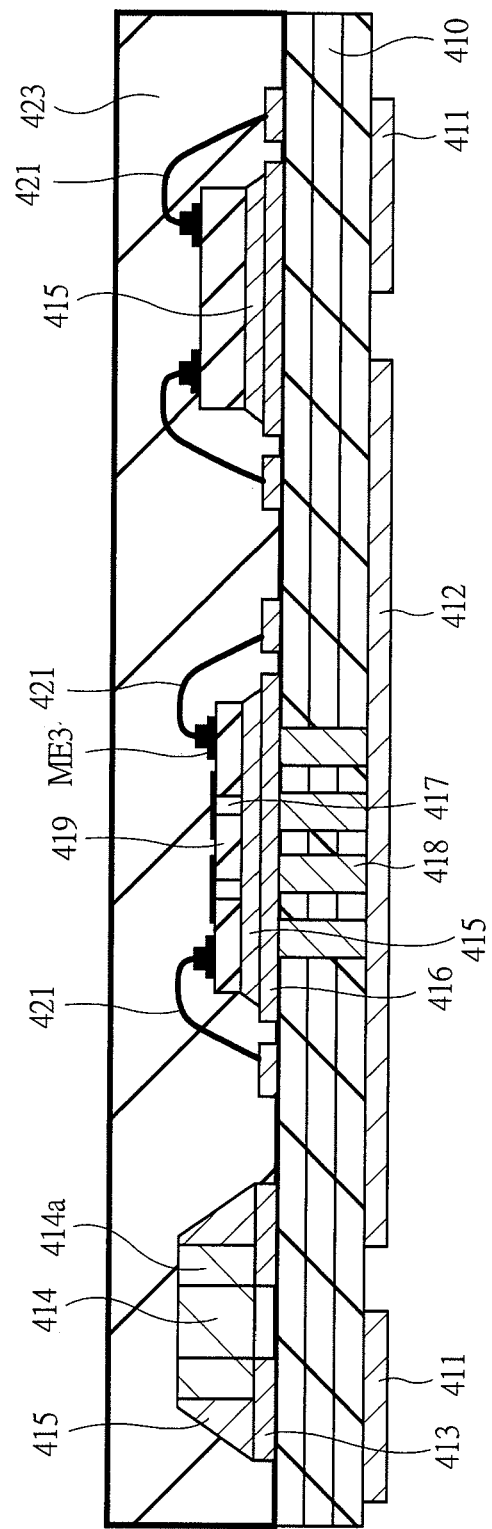
Figure 69:
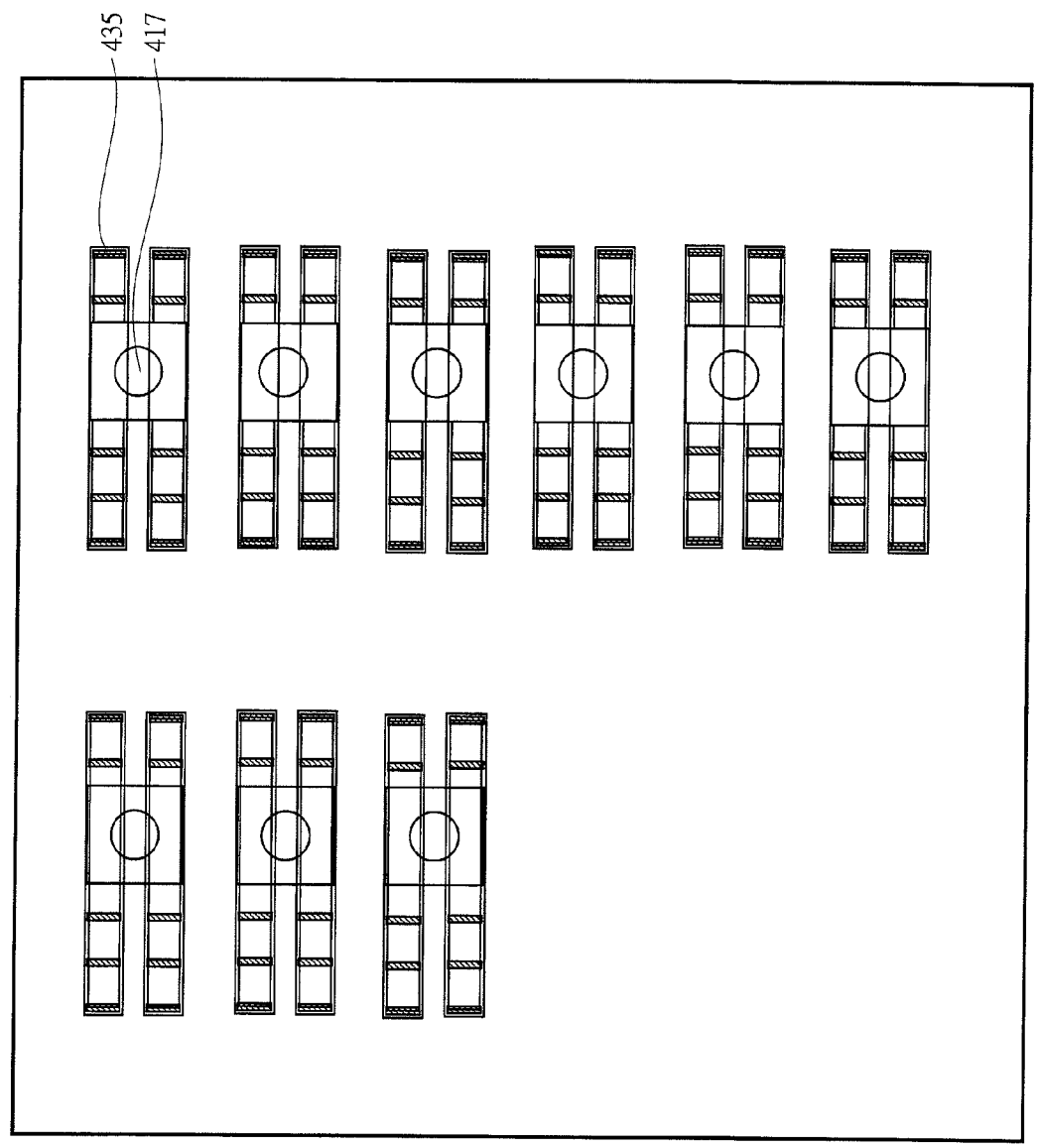

FIG. 13 a plan view of the principal part in the same manufacturing process of the semiconductor device as FIG. 12;

FIG. 14 is a cross-sectional view of the principal part in the manufacturing process of the semiconductor device continued from FIG. 12;

FIG. 15 is a plan view of the principal part in the same manufacturing process of the semiconductor device as FIG. 14;

FIG. 16 is a plan view of the principal part in the same manufacturing process of the semiconductor device as FIG. 14;

FIG. 17 is a cross-sectional view of the principal part in the manufacturing process of the semiconductor device continued from FIG. 14;

FIG. 18 is a plan view of the principal part in the same manufacturing process of the semiconductor device as FIG. 17;

FIG. 19 is a plan view of the principal part in the same manufacturing process of the semiconductor device as FIG. 17;

FIG. 20 is a cross-sectional view of the principal part in the manufacturing process of the semiconductor device continued from FIG. 17;

FIG. 21 is a plan view of the principal part in the same manufacturing process of the semiconductor device as FIG. 20;

FIG. 22 is a cross-sectional view of the principal part in the manufacturing process of the semiconductor device continued from FIG. 20;

FIG. 23 is a cross-sectional view of the principal part in the manufacturing process of the semiconductor device continued from FIG. 22;

FIG. 24 is a cross-sectional view of the principal part in the manufacturing process of the semiconductor device continued from FIG. 23;

FIG. 25 is a cross-sectional view of the principal part in the manufacturing process of the semiconductor device continued from FIG. 24;

FIG. 26 is another cross-sectional view of the principal part in the same manufacturing process of the semiconductor device as FIG. 25;

FIG. 27 is another cross-sectional view of the principal part in the same manufacturing process of the semiconductor device as FIG. 25;

FIG. 28 is a plan view of the principal part in the same manufacturing process of the semiconductor device as FIG. 25;

FIG. 29 is a cross-sectional view of the principal part of a semiconductor chip of a first comparative example;

FIG. 30 is a cross-sectional view of the principal part of a semiconductor chip of a second comparative example;

FIG. 31 is a cross-sectional view of the principal part in the manufacturing process of the semiconductor device according to an embodiment of the present invention;

FIG. 32 is a cross-sectional view of the principal part of a wiring board used in a power amplifier module according to an embodiment of the present invention;

FIG. 33 is a cross-sectional view of the principal part schematically showing the state just before mounting the semiconductor chip on the wiring board;

FIG. 34 is a cross-sectional view of the principal part showing the state where the semiconductor chip is flip-chip mounted on the wiring board;

FIG. 35 is a plan view of the principal part of the semiconductor chip which is mounted on the wiring board;

FIG. 36 is a cross-sectional view of the principal part showing a first modification example of the wiring board used for the power amplifier module according to an embodiment of the present invention;

FIG. 37 is a cross-sectional view of the principal part of the wiring board of the first comparative example;

FIG. 38 is a cross-sectional view of the principal part of the wiring board of the second comparative example;

FIG. 39 is a cross-sectional view of the principal part showing a second modification example of the wiring board used for the power amplifier module according to an embodiment of the present invention;

FIG. 40 is a plan view of the principal part of the semiconductor chip according to another embodiment of the present invention;

FIG. 41 is a plan view of the principal part of the semiconductor chip according to another embodiment of the present invention;

FIG. 42 is a plan view of the principal part showing the first modification example of the semiconductor chip according to another embodiment of the present invention;

FIG. 43 is a plan view of the principal part showing the second modification example of the semiconductor chip according to another embodiment of the present invention;

FIG. 44 is a cross-sectional view of the principal part schematically showing the state just before mounting the semiconductor chip on the wiring board;

FIG. 45 is a cross-sectional view of the principal part showing the state where the semiconductor chip is mounted on the wiring board;

FIG. 46 is a cross-sectional view of the principal part showing the state where the semiconductor chip of FIG. 40 is mounted on the wiring board of FIG. 36;

FIG. 47 is a cross-sectional view of the principal part showing the state where the semiconductor chip of FIG. 40 is mounted on the wiring board of FIG. 39;

FIG. 48 is a cross-sectional view of the principal part showing a third modification example of the wiring board used for the power amplifier module according to another embodiment of the present invention;

FIG. 49 is a cross-sectional view of the principal part showing the state where the semiconductor chip of FIG. 40 is mounted on the wiring board of FIG. 48;

FIG. 50 is a configuration diagram showing the configuration of the semiconductor device according to an embodiment (third embodiment) of the present invention;

FIG. 51 is a cross-sectional view showing the structure of the semiconductor device according to an embodiment (third embodiment) of the present invention;

FIG. 52 is a plan view showing the structure of an emitter wiring layer by simplifying the element formation surface of HBT of the semiconductor device according to an embodiment (third embodiment) of the present invention;

FIG. 53 is a diagram showing the structure of the emitter wiring layer, arbitrarily-formed emitter electrode bump and signal electrode bump of HBT of the semiconductor device according to an embodiment (third embodiment) of the present invention;

FIG. 54 is a diagram showing the internal structure of the semiconductor device according to an embodiment (third embodiment) of the present invention;

FIG. 55 is a plan view showing the state in which the plurality of HBTs and the first wiring layer of the semiconductor device according to an embodiment (third embodiment) of the present invention have been formed;

FIG. 56 is a plan view showing the state in which the plurality of HBTs, the first wiring layer and the second wiring layer of the semiconductor device according to an embodiment (third embodiment) of the present invention have been formed;

FIG. 57 is a plan view showing the state in which a plurality of HBT groups, the first wiring layer and a second wiring layer electrode across the plurality of HBT groups of the semiconductor device according to an embodiment (third embodiment) of the present invention have been formed;

FIG. 58 is a cross-sectional view for describing the manufacturing method of the semiconductor device according to an embodiment (third embodiment) of the present invention;

FIG. 59 is a cross-sectional view for describing the manufacturing method of the semiconductor device according to an embodiment (third embodiment) of the present invention;

FIG. 60 is a cross-sectional view for describing the manufacturing method of the semiconductor device according to an embodiment (third embodiment) of the present invention;

FIG. 61 is a cross-sectional view for describing the manufacturing method of the semiconductor device according to an embodiment (third embodiment) of the present invention;

FIG. 62 is a cross-sectional view for describing the manufacturing method of the semiconductor device according to an embodiment (third embodiment) of the present invention;

FIG. 63 is a cross-sectional view for describing the manufacturing method of the semiconductor device according to an embodiment (third embodiment) of the present invention;

FIG. 64 is an explanatory diagram for describing the modification example of the semiconductor device according to an embodiment (third embodiment) of the present invention;

FIG. 65 is an explanatory diagram for describing the modification example of the semiconductor device according to an embodiment (third embodiment) of the present invention;

FIG. 66 is an explanatory diagram for describing the modification example of the semiconductor device according to an embodiment (third embodiment) of the present invention;

FIG. 67 is an explanatory diagram for describing the modification example of the semiconductor device according to an embodiment (third embodiment) of the present invention;

FIG. 68 is a cross-sectional view for describing the module formed by the conventional wire bonding; and FIG. 69 is an explanatory diagram for describing the conventional VIA hole, in which the arrangement of transistor group called finger in the case of seeing the HBT device from the front surface is seen from the above.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Hereinafter, embodiments of the present invention will be described in detail with reference to the accompanying drawings. Note that components having the same function are denoted by the same reference numbers throughout the drawings for describing the embodiments, and the repetitive description thereof will be omitted. Also, in the following embodiments, the description of the same or similar part is omitted in principle unless it is particularly required.

Also, in the drawings used in the embodiments, hatching is used in some cases even in a cross-sectional view so as to make the drawings easy to see. Alternatively, hatching is used in some cases even in a plan view so as to make the drawings easy to see.

First Embodiment

The present embodiment is a power amplifier module (semiconductor device) such as an RF (Radio Frequency) power module used (mounted) in a digital mobile phone (mobile communication system) transmitting information through a network of, for example, the GSM system and is a semiconductor chip (semiconductor device) used (mounted) in the power amplifier module.

Here, the GSM (Global System for Mobile Communication) is one of wireless communication systems or standards used for the digital mobile phone. There are three frequency bands defined for GSM. Of these, a 900 MHz band (824-915 MHz) is called GSM900 or simply GSM, a 1800 MHz band (1710-1910 MHz) is called GSM1800, DCS1800 (Digital Cellular System 1800) or PCN, and a 1900 MHz band is called GSM1900, DCS1900 or PCS (Personal Communication Services). GSM1900 is mainly used in North America. In addition, GSM850 which operates in a 850 MHz band is sometimes used in North America. A power amplifier module of the present embodiment is, for example, a power amplifier module used in these frequency bands (radio frequency band).

<Configuration of Digital Mobile Phone System>

Figure 1:
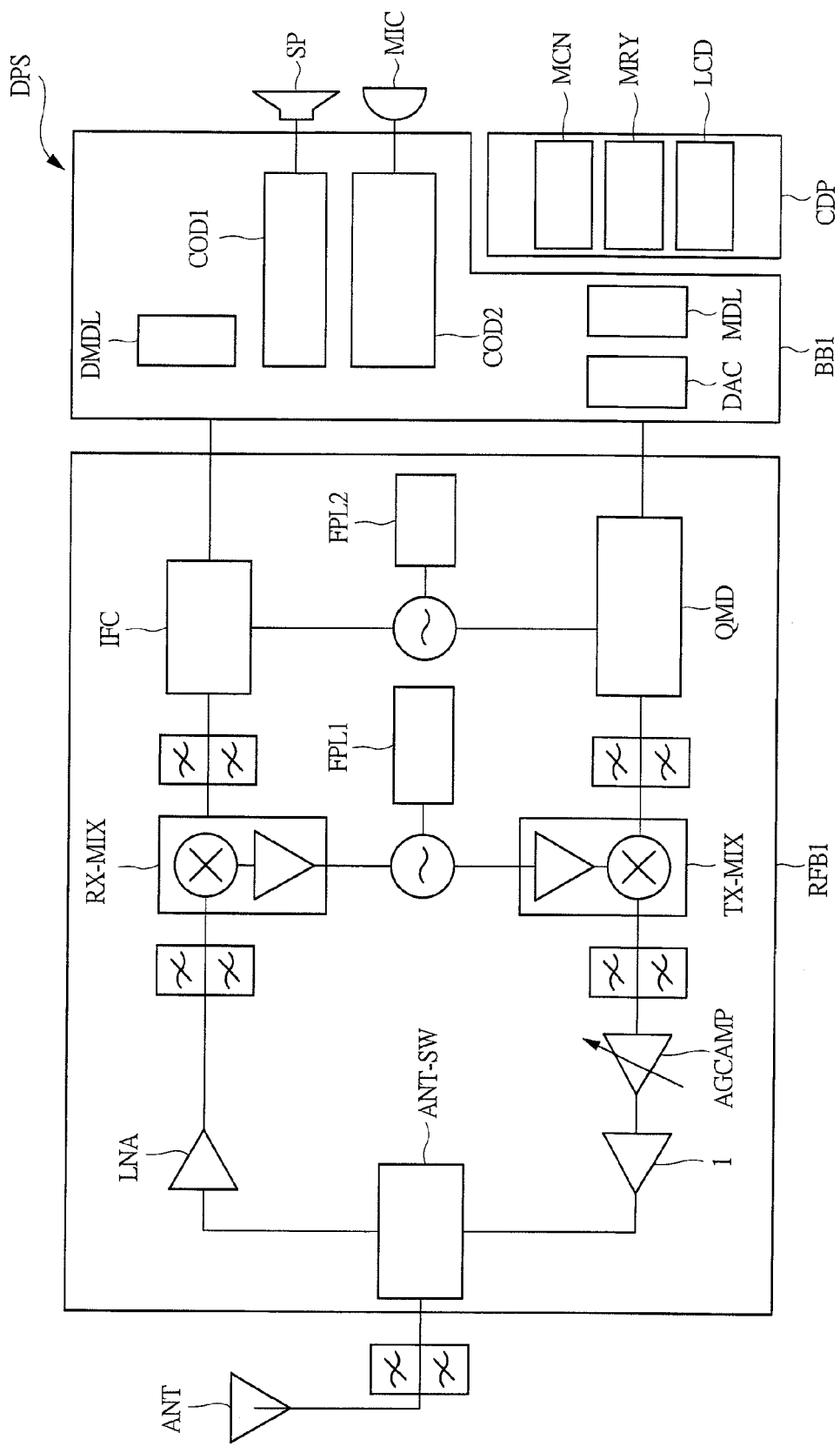
FIG. 1 is a block diagram showing an example of a digital mobile phone system.

FIG. 1 is a block diagram (explanatory diagram) showing an example of a standard digital mobile phone system (mobile communication device) DPS.

In the digital mobile phone system DPS shown in FIG. 1, a signal received by an antenna ANT passes through an antenna switch ANT-SW and is amplified by a low-noise amplifier LNA and then converted to an IF frequency (intermediate frequency) of about 150 to 250 MHz by a receive mixer RX-MIX. Thereafter, it is further frequency-converted by an IF circuit IFC and then is led to a base band unit BB1 as a second IF frequency of about 455 kHz and demodulated by a demodulator circuit DMDL. In FIG. 1, a reference symbol COD1 denotes an audio CODEC (codec), a reference symbol SP denotes a speaker, a reference symbol MIC denotes a microphone, a reference symbol COD2 denotes a channel CODEC (codec), and a reference symbol MDL denotes a modulator circuit.

Further, a signal obtained by digitalizing sound is D-A converted (digital-analog converted) by a D/A converter circuit DAC of the base band unit BB1 and led as an I/Q signal to an RF block unit RFB1. Then, after it is modulated to an IF frequency by a quadrature modulator QMD and is converted to a transmission signal by a transmit mixer TX-MIX, it is amplified by the power amplifier module 1 and then transmitted from the antenna ANT through the antenna switch ANT-SW. A local signal is supplied to the receive mixer RX-MIX and the transmit mixer TX-MIX from a synthesizer made up of an oscillator and a PLL (phase synchronous circuit). In FIG. 1, a reference symbol AGCAMP denotes an AGC (Automatic Gain Control) amplifier, a reference symbol FPL1 denotes an RF-PLL (RF frequency phase synchronous circuit), and a reference symbol FPL2 denotes an IF-PLL (IF frequency phase synchronous circuit). Further, the digital mobile phone system DPS is provided with a display/control unit CDP including a liquid crystal display LCD, a microcomputer MCN and a memory MRY.

<Circuit Configuration of Power Amplifier Module>

Figure 2:
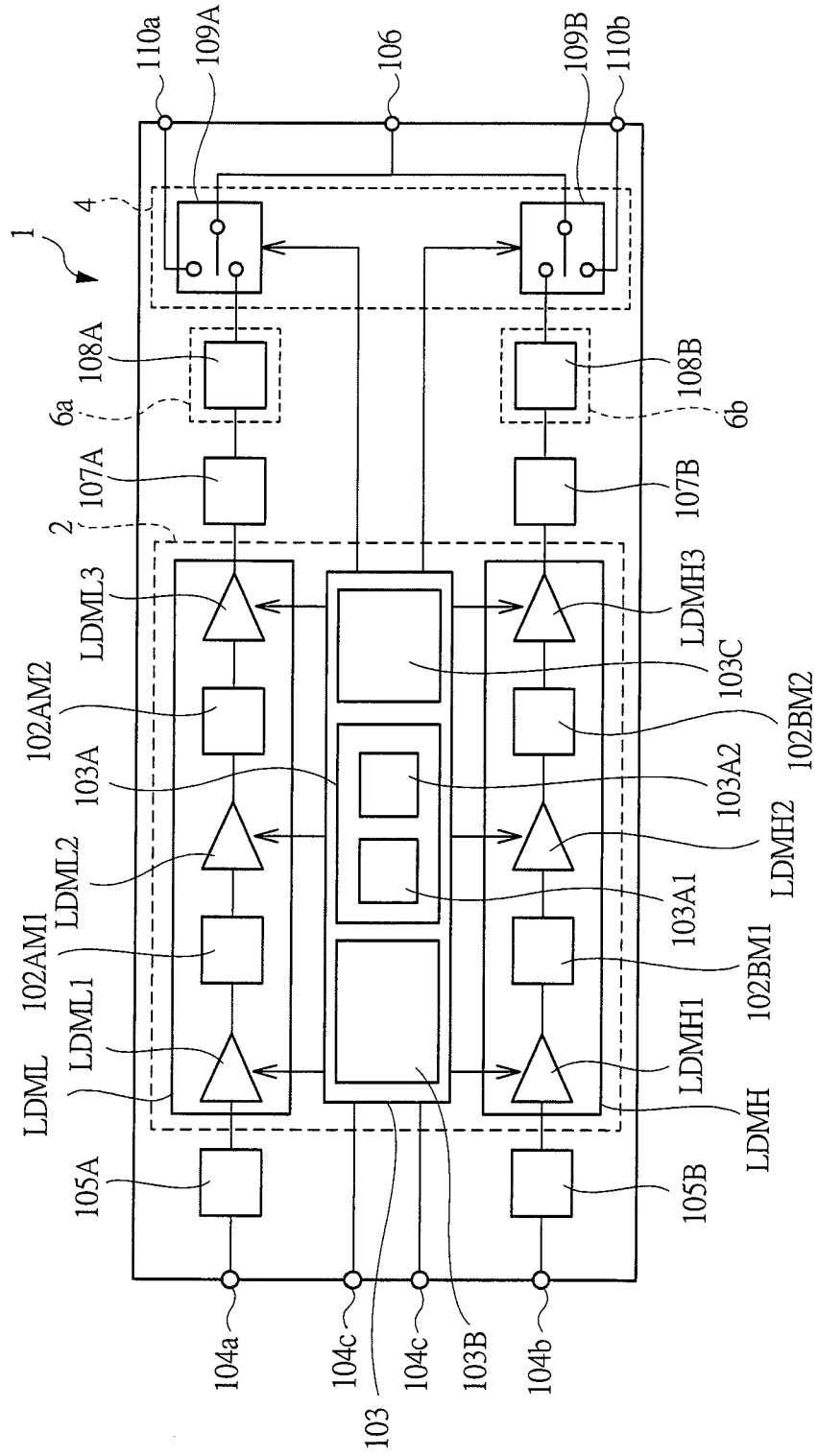
FIG. 2 is a circuit block diagram schematically showing a configuration example of a power amplifier module used for the digital mobile phone system shown in FIG. 1.

FIG. 2 is a circuit block diagram (explanatory diagram) schematically showing a configuration example of the power amplifier module (semiconductor device, electronic device, power amplifier, high output amplifier, radio-frequency power amplifier, radio-frequency power amplifier device, power amplifier module, RF power module) 1 used for a mobile communication system such as the digital mobile phone system DPS shown in FIG. 1. FIG. 2 shows a circuit block diagram (amplifier circuit) of a power amplifier module capable of using two frequency bands of, for example, GSM900 and DCS1800 (dual band system) and capable of using two communication systems of GMSK (Gaussian filtered Minimum Shift Keying) modulation method and EDGE (Enhanced Data GSM Environment) modulation method in the respective frequency bands. Note that the GMSK modulation method is used for the communication of an audio signal, and the phase of a carrier wave is shifted in accordance with transmission data. Also, the EDGE modulation method is used for the data communication, and the amplitude shift is further added to the phase shift of the GMSK modulation.

As shown in FIG. 2, the circuit configuration of the power amplifier module 1 includes two lines of power amplifier circuits (radio-frequency power amplifier circuit) LDML and LDMH, a peripheral circuit 103, matching circuits 105A, 105B, 107A and 107B, low-pass filters (low-pass filter circuit) 108A and 108B and switch circuits 109A and 109B.

The power amplifier circuit LDML is a power amplifier circuit for GSM900 and has a multi-stage configuration in which a plurality of amplifier stages (amplifier circuit), in this case, three amplifier stages (amplifier circuit) LDML1, LDML2 and LDML3 are multi-stage connected. The power amplifier circuit LDMH is a power amplifier circuit for DCS1800 and has a multi-stage configuration in which a plurality of amplifier stages (amplifier circuit), in this case, three amplifier stages (amplifier circuit) LDMH1, LDMH2 and LDMH3 are multi-stage connected.

The matching circuit (input matching circuit) 105A is provided between an input terminal 104a for GSM900 and the power amplifier circuit LDML (first amplifier stage LDML1), and the matching circuit (input matching circuit) 105B is provided between an input terminal 104b for DCS1800 and the power amplifier circuit LDMH (first amplifier stage LDMH1). The matching circuit (output matching circuit) 107A is provided between the switch circuit 109A for GSM900 and the power amplifier circuit LDML (third amplifier stage LDML3), and the matching circuit (output matching circuit) 107B is provided between the switch circuit 109B for DCS1800 and the power amplifier circuit LDMH (third amplifier stage LDMH3).

The low-pass filter 108A for GSM900 is provided between the matching circuit 107A and the switch circuit 109A for GSM900, and an output of the power amplifier circuit LDML is inputted thereto through the matching circuit 107A. The low-pass filter 108B for DCS1800 is provided between the matching circuit 107B and the switch circuit 109B for DCS1800, and an output of the power amplifier circuit LDMH is inputted thereto through the matching circuit 107B.

Also, an interstage matching circuit 102AM1 is provided between the amplifier stage LDML1 and the amplifier stage LDML2 of the power amplifier circuit LDML for GSM900, and an interstage matching circuit 102AM2 is provided between the amplifier stage LDML2 and the amplifier stage LDML3. Further, an interstage matching circuit 102BM1 is provided between the amplifier stage LDMH1 and the amplifier stage LDMH2 of the power amplifier circuit LDMH for DCS1800, and an interstage matching circuit 102BM2 is provided between the amplifier stage LDMH2 and the amplifier stage LDMH3. Each of the matching circuits is provided for the impedance matching, and the low-pass filters 108A and 108B attenuate the harmonics (harmonic components generated in the power amplifier circuits LDML and LDMH).

Of these, the power amplifier circuit LDML for GSM900 (amplifier stages LDML1 to LDML3), the power amplifier circuit LDMH for DCS1800 (amplifier stages LDMH1 to LDMH3) and the peripheral circuit 103 are formed in one semiconductor chip (semiconductor amplifier element chip, radio-frequency power amplifier element chip, semiconductor device) 2. Note that, although the amplifier stages LDML1 to LDML3 making up the power amplifier circuit LDML and the amplifier stages LDMH1 to LDMH3 making up the power amplifier circuit LDMH are formed in the semiconductor chip 2, it does not matter if the interstage matching circuits 102AM1, 102AM2, 102BM1 and 102BM2 are formed in the semiconductor chip 2 or outside the semiconductor chip 2.

The peripheral circuit 103 is a circuit for controlling and supporting the amplification of the power amplifier circuits LDML and LDMH or controlling the switch circuits 109A and 109B, and it includes control circuits 103A and 103C, a bias circuit 103B for applying bias voltage to the amplifier stages LDML1 to LDML3 and LDMH1 to LDMH3 and others.

The control circuit 103A is a circuit which generates a desired voltage to be applied to the power amplifier circuits LDML and LDMH, and it includes a power supply control circuit 103A1 and a bias voltage generation circuit 103A2. The power supply control circuit 103A1 is a circuit which generates a first power supply voltage to be applied to drain terminals of the respective output amplifier elements (in this case, LDMOSFET) of the amplifier stages TDML1 to LDML3 and LDMH1 to LDMH3. Also, the bias voltage generation circuit 103A2 is a circuit which generates a first control voltage for controlling the bias circuit 103B. In this case, when the power supply control circuit 103A1 generates the first power supply voltage based on an output level specification signal supplied from an external base band circuit, the bias voltage generation circuit 103A2 generates the first control voltage based on the first power supply voltage generated in the power supply control circuit 103A1. The base band circuit is a circuit which generates the output level specification signal. This output level specification signal is a signal which specifies the output level of the power amplifier circuits LDML and LDMH, and it is generated based on a distance between a mobile phone system and a base station, that is, an output level in accordance with the amplitude of radio waves.

The control circuit 103C is a circuit which controls the switch circuits 109A and 109B. The switch circuit 109A for switching the transmission and reception of GSM900 connects a terminal 106 to an output side of the low-pass filter 108A in accordance with a switch signal from the control circuit 103C at the time of transmission of GSM900 and connects the terminal 106 to a terminal 110a at the time of reception of GSM900. Also, the switch circuit 109B for switching the transmission and reception of DCS1800 connects the terminal 106 to an output side of the low-pass filter 108B in accordance with the switch signal from the control circuit 103C at the time of transmission of DCS1800 and connects the terminal 106 to a terminal 110b at the time of reception of DCS1800.

An RF input signal inputted to the input terminal 104a for GSM900 of the power amplifier module 1 is inputted to the semiconductor chip 2 through the matching circuit 105A, amplified by the power amplifier circuit LDML, that is, the three amplifier stages LDML1 to LDML3 in the semiconductor chip 2, and then outputted as an amplified RF signal (RF signal of GSM900) from the semiconductor chip 2. The RF signal of GSM900 amplified and outputted from the semiconductor chip 2 is inputted to the switch circuit 109A through the matching circuit 107A and the low-pass filter 108A. When the switch circuit 109A is switched so as to connect the terminal 106 to the output side of the low-pass filter 108A, the RF signal inputted to the switch circuit 109A through the low-pass filter 108A is outputted as the RF output signal of GSM900 from the terminal 106 and then transmitted from the antenna ANT.

Also, the RF input signal inputted to the input terminal 104b for DCS1800 of the power amplifier module 1 is inputted to the semiconductor chip 2 through the matching circuit 105B, amplified by the power amplifier circuit LDMH, that is, the three amplifier stages LDMH1 to LDMH3 in the semiconductor chip 2, and then outputted as an amplified RF signal (RF signal of DCS1800) from the semiconductor chip 2. The RF signal of DCS1800 amplified and outputted from the semiconductor chip 2 is inputted to the switch circuit 109B through the matching circuit 107B and the low-pass filter 108B. When the switch circuit 109B is switched so as to connect the terminal 106 to the output side of the low-pass filter 108B, the RF signal inputted to the switch circuit 109B through the low-pass filter 1083 is outputted as the RF output signal of DCS1800 from the terminal 106 and then transmitted from the antenna ANT.

Further, an input signal (for example, control signal) inputted to the input terminal 104c of the power amplifier module 1 is inputted to the peripheral circuit 103, and the peripheral circuit 103 can perform the control of the power amplifier circuits LDML and LDMH and the control of the switch circuits 109A and 109B based on the input signal.

The switch circuits 109A and 109B correspond to the antenna switch ANT-SW shown in FIG. 1, and the power amplifier module 1 of the present embodiment shown in FIG. 2 corresponds to the case where the antenna switch ANT-SW shown in FIG. 1 is also incorporated in the power amplifier module 1. As another embodiment, the antenna switch ANT-SW may be provided outside the power amplifier module 1.

Each of the power amplifier circuits LDML and LDMH has the circuit configuration in which three n channel LDMOS- FETs (Laterally Diffused Metal-Oxide-Semiconductor Field Effect Transistor) are sequentially cascade-connected (multi-stage connected) as the three amplifier stages TDML1 to LDML3 and LDMH1 to LDMH3. More specifically, each of the amplifier stages LDML1, LDML2, LDML3, LDMH1, LDMH2 and LDMH3 is formed of an n channel LDMOSFET element.

Further, the three n channel LDMOSFETs (that is, the n channel LDMOSFET making up the amplifier stage LDML1, the n channel LDMOSFET making up the amplifier stage LDML2 and the n channel LDMOSFET making up the amplifier stage LDML3) are sequentially connected (multi-stage connected) to form the power amplifier circuit LDML.

More specifically, the input terminal 104a for GSM900 is electrically connected to a gate of the n channel LDMOSFET making up the amplifier stage LDML1 through the matching circuit 105A, and a drain of the n channel LDMOSFET making up the amplifier stage LDML1 is electrically connected to a gate of the n channel LDMOSFET making up the amplifier stage LDML2 through the matching circuit 102AM1. Further, a drain of the n channel LDMOSFET making up the amplifier stage LDML2 is electrically connected to a gate of the n channel LDMOSFET making up the amplifier stage LDML3 through the matching circuit 102AM2, and a drain of the n channel TDMOSFET making up the amplifier stage LDML3 is electrically connected to the low-pass filter 108A through the matching circuit 107A.

Also, the three n channel LDMOSFETs (that is, the n channel LDMOSFET making up the amplifier stage LDMH1, the n channel LDMOSFET making up the amplifier stage LDMH2 and the n channel LDMOSFET making up the amplifier stage LDMH3) are sequentially connected (multi-stage connected) to form the power amplifier circuit LDMH.

More specifically, the input terminal 104b for DCS1800 is electrically connected to a gate of the n channel LDMOSFET making up the amplifier stage LDMH1 through the matching circuit 105B, and a drain of the n channel LDMOSFET making up the amplifier stage LDMH1 is electrically connected to a gate of the n channel LDMOSFET making up the amplifier stage LDMH2 through the matching circuit 102BM1. Further, a drain of the n channel LDMOSFET making up the amplifier stage LDMH2 is electrically connected to a gate of the n channel LDMOSFET making up the amplifier stage LDMH3 through the matching circuit 102BM2, and a drain of the n channel LDMOSFET making up the amplifier stage LDMH3 is electrically connected to the low-pass filter 108B through the matching circuit 107B.

In the present embodiment, three amplifier stages are connected (multi-stage connected) to form each of the power amplifier circuits LDML and LDMH. As another embodiment, two amplifier stages or four or more amplifier stages may be connected (multi-stage connected) to form each of the power amplifier circuits LDML and LDMH. In this case, each of the power amplifier circuits LDML and LDMH has the circuit configuration in which two n channel LDMOSFETs or four or more n channel LDMOSFETs are cascade-connected.

<Structure of Power Amplifier Module>

Figure 3:
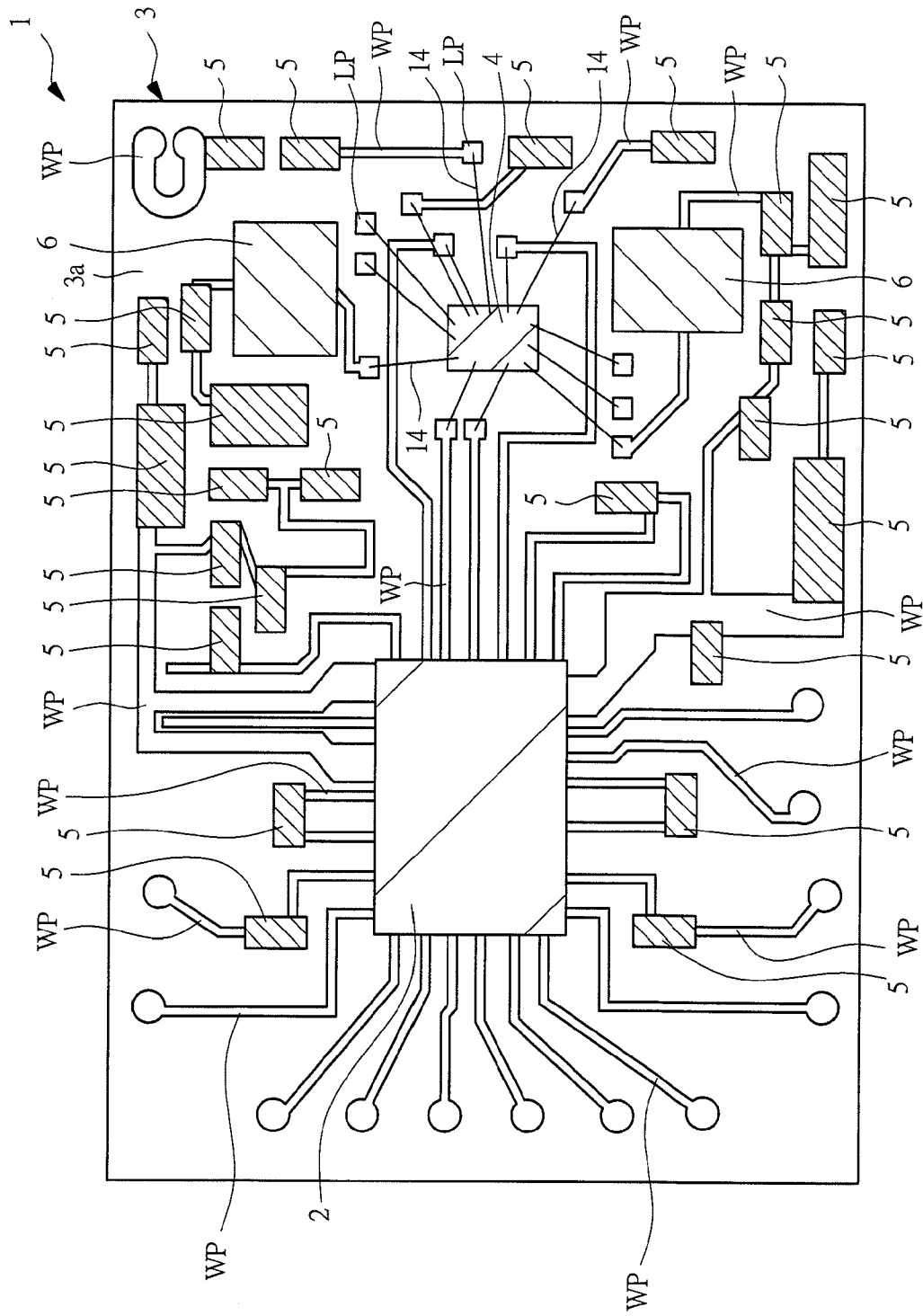
FIG. 3 is a conceptual top view showing the structure of the power amplifier module according to an embodiment of the present invention.
Figure 4:
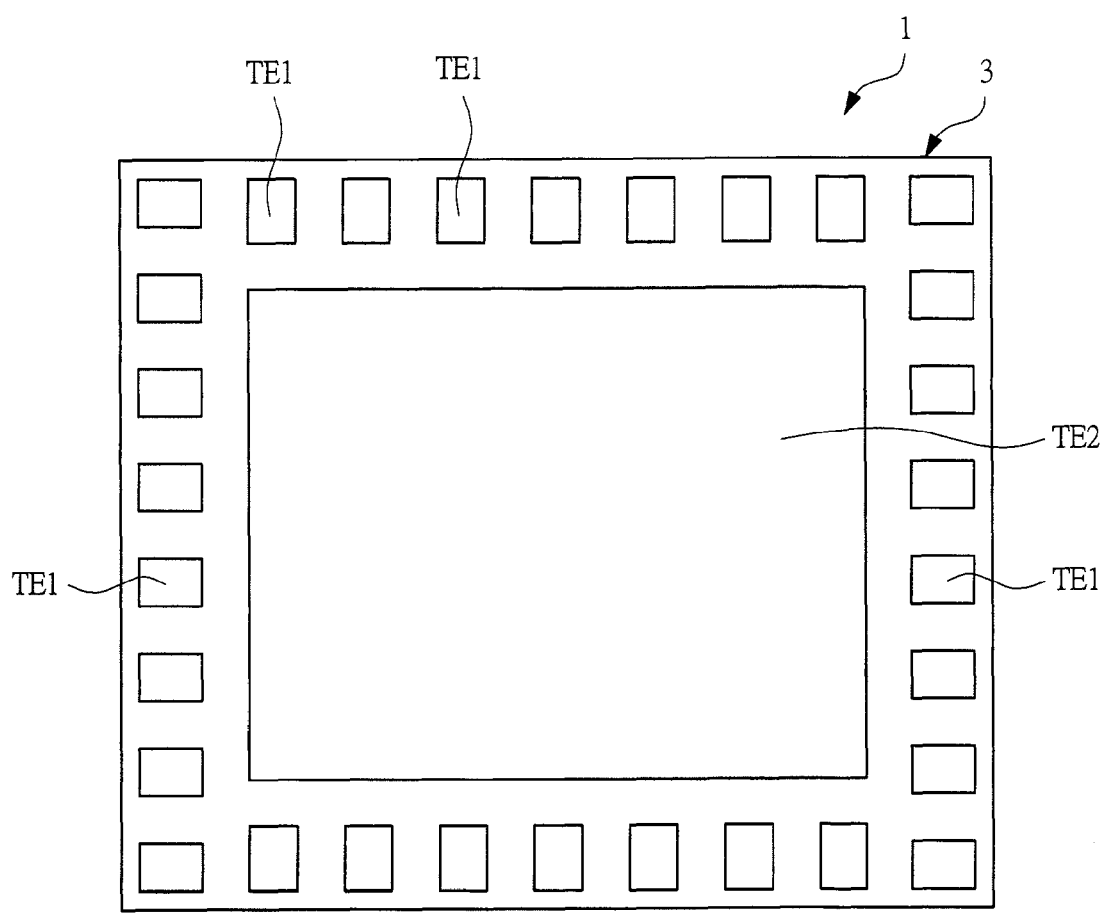
FIG. 4 is a conceptual bottom view showing the structure of the power amplifier module according to an embodiment of the present invention.
Figure 5:
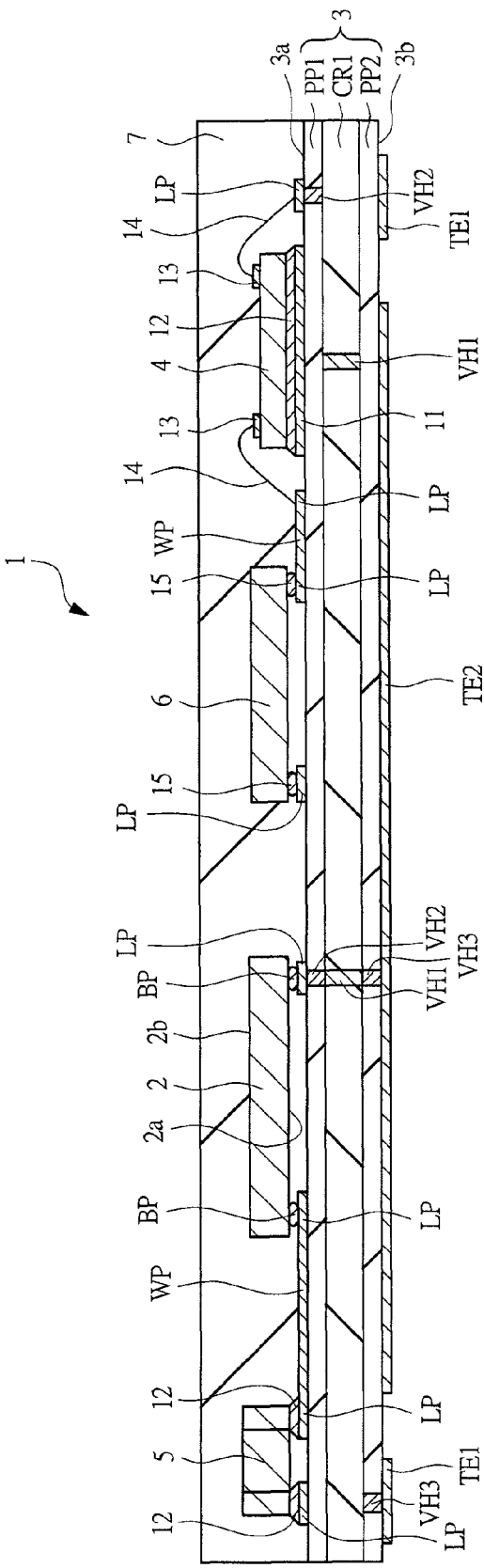
FIG. 5 is a conceptual cross-sectional view showing the structure of the power amplifier module according to an embodiment of the present invention.

FIG. 3 is a conceptual top view (top perspective view, plan view) showing the structure of the power amplifier module 1 of the present embodiment, FIG. 4 is a conceptual bottom view (plan view) of the power amplifier module 1 of the present embodiment, and FIG. 5 is a conceptual cross-sectional view (side cross-sectional view) of the power amplifier module 1 of the present embodiment. FIG. 3 shows the state seen through a sealing resin 7. Also, FIG. 3 corresponds to a plan view and FIG. 5 corresponds to a cross-sectional view and each of them shows a conceptual structure of the power amplifier module 1, and the cross section taken at a predetermined position of the structure of FIG. 3 does not completely conform to the cross-sectional view of FIG. 5. Also, though FIG. 3 is a plan view, hatching is used for the semiconductor chips 2 and 4, a passive component 5 and an integrated passive component 6 so as to make the drawing easy to see.

The power amplifier module 1 of the present embodiment shown in FIG. 3 to FIG. 5 includes a wiring board 3, the semiconductor chips 2 and 4 mounted on the wiring board 3, the passive component 5 mounted on the wiring board 3, the integrated passive component 6 mounted on the wiring board 3, and the sealing resin (sealing portion, sealing resin portion) 7 covering the upper surface of the wiring board 3 including the semiconductor chips 2 and 4, the passive component 5 and the integrated passive component 6.

The semiconductor chip 2 is a semiconductor chip in which the semiconductor integrated circuit corresponding to the circuit configuration enclosed by dotted lines showing the semiconductor chip 2 in the circuit block diagram of FIG. 2 is formed. Therefore, LDMOSFET elements (corresponding to LDMOSFET formation regions REGL1 to REGL3 and REGH1 to REGH3 described later) as the semiconductor amplifier elements making up the amplifier stages LDML1 to LDML3 and LDMH1 to LDMH3 of the power amplifier circuits LDML and LDMH and the semiconductor elements making up the peripheral circuit 103 are formed in the semiconductor chip 2 (or on the surface portion thereof). The interstage matching circuits 102AM1, 102AM2, 102BM1 and 102BM2 may be formed of passive elements in the semiconductor chip 2 or may be formed of the passive component 5 outside the semiconductor chip 2.

As shown in FIG. 5, a plurality of bump electrodes (protruding electrode) BP are formed on a front surface (main surface on a side of forming semiconductor elements) 2a of the semiconductor chip 2. The bump electrode BP is, for example, a solder bump. A gold bump may be used as the bump electrode BP. The bump electrode BP is electrically connected to an element (semiconductor element or passive element) or a semiconductor integrated circuit formed in the semiconductor chip 2. The front surface 2a and a rear surface 2b of the semiconductor chip 2 are mutually opposite main surfaces of the semiconductor chip 2, and the front surface 2a is the main surface on a side of forming the bump electrodes BP (main surface on a side of forming semiconductor elements).

The semiconductor chip 2 mentioned here is formed in the following manner. That is, after forming semiconductor integrated circuits on a semiconductor substrate (semiconductor wafer) made of single crystal silicon or others, a rear surface of the semiconductor substrate is ground according to need, and then, the semiconductor substrate is separated into respective semiconductor chips 2 by dicing or others. The manufacturing process and the structure of the semiconductor chip 2 will be described later in detail.

The semiconductor chip 2 is flip-chip mounted (flip-chip connected) on an upper surface (main surface) 3a of the wiring board 3. More specifically, the semiconductor chip 2 is mounted on the upper surface 3a of the wiring board 3 so that the rear surface 2b thereof is directed upward and the front surface 2a thereof faces the upper surface 3a of the wiring board 3. Therefore, the semiconductor chip 2 is face-down bonded on the upper surface 3a of the wiring board 3. The bump electrode BP on the front surface 2a of the semiconductor chip 2 is mechanically and electrically connected (bonded) to a conductive land (land pattern, terminal, electrode) LP on the upper surface 3a of the wiring board 3.

The semiconductor chip 4 is a semiconductor chip in which the semiconductor integrated circuit corresponding to the circuit configuration enclosed by dotted lines showing the semiconductor chip 4 in the circuit block diagram of FIG. 2 is formed. Therefore, the switch circuits 109A and 109B are formed in the semiconductor chip 4. In the semiconductor chip 4, the switch circuits 109A and 109B are formed of HEMT (High Electron Mobility Transistor) elements and others. The semiconductor chip 4 mentioned here is formed in the following manner. That is, after forming semiconductor integrated circuits on a semiconductor substrate (semiconductor wafer) made of GaAs or others, a rear surface of the semiconductor substrate is ground according to need, and then, the semiconductor substrate is separated into respective semiconductor chips 4 by dicing or others.

As shown in FIG. 3 and FIG. 4, the semiconductor chip 4 is die-bonded in a face-up manner to a chip-mounting conductor pattern 11 on the upper surface 3a of the wiring board 3 by a bonding material such as solder 12. A plurality of pad electrodes 13 formed on the front surface of the semiconductor chip 4 are electrically connected to the lands LP on the upper surface 3a of the wiring board 3 via bonding wires (conductive wire) 14, respectively. Also, as another embodiment, by forming bump electrodes instead of the pad electrodes 13 of the semiconductor chip 4, the semiconductor chip 4 can be face-down mounted on the upper surface 3a of the wiring board 3, and the bump electrodes of the semiconductor chip 4 can be connected (flip-chip connected) to the lands LP on the upper surface 3a of the wiring board 3.

The passive component 5 is made up of a passive element such as a resistor element (for example, chip resistor), a capacitor element (for example, chip capacitor) or an inductor element (for example, chip inductor) and is made up of, for example, a chip component. The passive component 5 is, for example, the passive component making up the matching circuits 105A, 105B, 107A, 107B and others shown in FIG. 2. Also, the passive element making up the interstage matching circuits 102AM1, 102AM2, 102BM1 and 102BM2 may be formed inside the semiconductor chip 2 or may be formed of the passive component 5 instead of forming it inside the semiconductor chip 2. The passive component 5 is mounted on the land LP on the upper surface 3a of the wiring board 3 by a conductive bonding material such as the solder 12.

The integrated passive component 6 is an integrated passive device (IPD) making up the low-pass filters 108A and 108B. An inductor element and a capacitor element making up the low-pass filters 108A and 108B are formed in the integrated passive component 6. Two integrated passive components 6 are mounted on the wiring board 3, and one is for the low-pass filter 108A and the other is for the low-pass filter 108B.

A plurality of bump electrodes 15 are formed on the front surface of the integrated passive component 6, and the integrated passive component 6 is flip-chip mounted on the upper surface 3a of the wiring board 3. More specifically, the integrated passive component 6 is face-down mounted on the upper surface 3a of the wiring board 3, and the bump electrodes of the integrated passive component 6 are bonded and electrically connected to the lands LP on the upper surface 3a of the wiring board 3. Also, by forming pad electrodes instead of the bump electrodes 15 of the integrated passive component 6, the integrated passive component 6 can be face-up mounted on the upper surface 3a of the wiring board 3, and the pad electrodes of the integrated passive component 6 can be connected to the lands LP on the upper surface 3a of the wiring board 3 by bonding wires.

The sealing resin 7 is formed on the upper surface 3a of the wiring board 3 so as to cover the semiconductor chips 2 and 4, the passive component 5, the integrated passive component 6 and the bonding wires 14. The sealing resin 7 is made of, for example, a resin material such as epoxy resin or silicone resin and may contain filler.

The wiring board 3 is a multilayer wiring board (multilayer board) obtained by stacking and integrating a plurality of insulating layers (dielectric layer) and a plurality of conductor layers (wiring layer). Here, the wiring board 3 has a core layer (base layer, base, support insulating layer, insulating layer) CR1 and prepreg layers (insulating layer) PP1 and PP2 provided on both upper and lower surfaces of the core layer CR1. Therefore, the core layer CR1, the prepreg layer PP1 and the prepreg layer PP2 are all insulating films making up the wiring board 3. Conductor layers (conductor layers 71, 72, 73 and 74 described later) are formed on the upper surface (front surface, main surface) 3a and the lower surface (rear surface) 3b of the wiring board 3 and between the insulating layers, and the conductor layers (conductor layers 71 and 74 described later) on the upper surface 3a and the lower surface 3b of the wiring board 3 are illustrated in FIG. 5, but the illustration of the conductor layers (conductor layers 72 and 73 described later) between the insulating layers is omitted. The upper surface 3a and the lower surface 3b of the wiring board 3 are mutually opposite main surfaces of the wiring board 3, and the upper surface 3a is the main surface on the side of mounting the semiconductor chip 2.

The lands LP, wiring patterns WP and the chip-mounting conductor patterns 11 are formed from the pattern of the uppermost conductor layer (corresponding to conductor layer 71 described later) of the wiring board 3 on the upper surface 3a of the wiring board 3. In the uppermost conductor layer of the wiring board 3, the land LP is a portion connected to the bump BP of the semiconductor chip 2, a portion electrically connected to the pad electrode 13 of the semiconductor chip 4 via the bonding wire 14, a portion connected to an electrode of the passive component 5, and a portion connected to the bump electrode 15 of the integrated passive component 6. Also, the wiring pattern WP is a portion interconnecting the lands LP according to need. Further, the chip-mounting conductor pattern 11 is a portion on which the semiconductor chip 4 is mounted. Of the lands LP, the land LP connected to the bump electrode BP of the semiconductor chip 2, the land LP connected to the electrode of the passive component 5 and the land LP connected to the bump electrode 15 of the integrated passive component 6 are shown in the cross-sectional view of FIG. 5, but are not illustrated in the plan view of FIG. 3 because they are hidden under the semiconductor chip 2, the passive component 5 and the integrated passive component 6.

Also, a solder resist layer (corresponding to solder resist layer SR1 described later though not illustrated in FIG. 3 and FIG. 5) is formed on the upper surface 3a of the wiring board 3 and the land LP is exposed from an opening provided in the solder resist layer, but the wiring pattern WP is covered with the solder resist layer.

Further, a rear-surface terminal (terminal, electrode, external connection terminal) TE1 and a rear-surface terminal (terminal, electrode, external connection terminal) TE2 are formed of the pattern of the lowermost conductor layer (corresponding to conductor layer 74 described later) of the wiring board 3 on the lower surface 3b of the wiring board 3. The rear-surface terminals TE1 and TE2 correspond to the external connection terminals of the power amplifier module 1.

As shown in FIG. 4 and FIG. 5, on the lower surface 3b of the rectangular wiring board 3, the rectangular rear-surface terminal TE2 is formed in the center and a plurality of rectangular rear-surface terminals TE1 are formed along the periphery of the lower surface 3b of the wiring board 3 so as to surround the rear-surface terminal TE2. The rear-surface terminal TE2 formed in the center of the lower surface 3b of the wiring board 3 is larger in size than the rear-surface terminals TE1 formed in the periphery of the lower surface 3b of the wiring board 3, and the rear-surface terminal TE2 functions as a reference potential terminal to which the reference potential (more specifically, ground potential) is applied. The plurality of rear-surface terminals TE1 formed in the periphery of the lower surface 3b of the wiring board 3 include a signal terminal, a power supply potential terminal and others. Also, a solder resist layer (corresponding to solder resist layer SR2 described later though not illustrated in FIG. 4 and FIG. 5) is formed on the lower surface 3b of the wiring board 3, and the rear-surface terminals TE1 and TE2 are exposed from an opening provided in the solder resist layer.

Each of the conductor patterns (wiring layer) making up the wiring board 3 is electrically connected through vias (via hole) VH1, VH2 and VH3 formed in the insulating layers making up the wiring board 3 according to need. Of these, the via VH1 is a via formed in the core layer CR1, the via VH2 is a via formed in the prepreg layer PP1 and the via VH3 is a via formed in the prepreg layer PP2. Note that, when referring to a via or a via hole in the wiring board in the present application, it means not only a hole (penetration hole, opening portion, through hole) formed in the insulating layer making up the wiring board but a hole including a conductive film or a conductor formed on an inner wall of the hole or formed to fill the hole. Therefore, the lands LP formed on the upper surface 3a of the wiring board 3 are interconnected through the wiring pattern WP formed on the upper surface 3a of the wiring board 3, the pattern of the conductor layer and the vias VH1, VH2 and VH3 formed inside the wiring board 3 according to need and are electrically connected to the rear-surface terminals TE1 and TE2 formed on the lower surface 3b of the wiring board 3.

The rear-surface terminal TE2 which supplies the ground potential is electrically connected to some of the bump electrodes BP (corresponding to bump electrodes BP to which ground potential is to be supplied and including a source bump BPS described later) of the semiconductor chip 2 mounted on the upper surface 3a of the wiring board 3 through the vias VH1, VH2 and VH3 of the wiring board 3.

In the present embodiment, the source bump BPS described later of the semiconductor chip 2 and the rear-surface terminal TE2 of the wiring board 3 are electrically connected through the vias VH1, VH2 and VH3 and the heat of the semiconductor chip 2 is conducted to the rear-surface terminal TE2 of the wiring board 3 from the source bump BPS described later of the semiconductor chip 2 through the vias VH1, VH2 and VH3, and this will be described later in detail. The heat conducted from the semiconductor chip 2 to the rear-surface terminal TE2 through the bump electrode BP and the vias VH1, VH2 and VH3 is dissipated to the outside of the power amplifier module 1 from the rear-surface terminal TE2, and when the rear-surface terminal TE2 is connected to the terminal 23b of a mounting board 21 as described later, the heat is dissipated to the side of the mounting board 21. Therefore, the rear-surface terminal TE2 formed in the center of the lower surface 3b of the wiring board 3 has a large area so as to improve the heat-dissipation properties. The configuration of the vias VH1, VH2 and VH3 will be described later in more detail.

Figure 6:
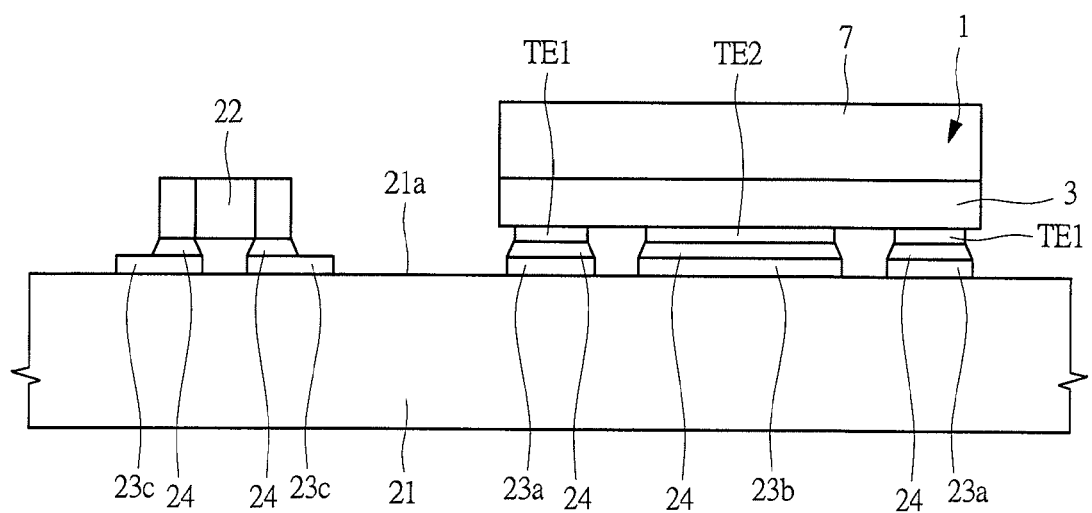
FIG. 6 is a side view schematically showing the state where the power amplifier module according to an embodiment of the present invention is mounted on a mounting board.

FIG. 6 is a side view schematically showing the state where the power amplifier module 1 of the present embodiment is mounted on the mounting board (wiring board, mother board, external circuit board) 21.

As shown in FIG. 6, the power amplifier module 1 and another component 22 (for example, passive component and others) are mounted on an upper surface 21a of the mounting board 21. At this time, the rear-surface terminal TE1 of the power amplifier module 1 is bonded via a conductive bonding material such as solder 24 and electrically connected to a terminal 23a of the mounting board 21, and the rear-surface terminal TE2 of the power amplifier module 1 is bonded via a conductive bonding material such as solder 24 and electrically connected to a terminal (reference potential supply terminal) 23b of the mounting board 21. Further, the electrode of the component 22 is bonded via a conductive bonding material such as the solder 24 and electrically connected to a terminal 23c of the mounting board 21. Therefore, the reference potential (ground potential) can be supplied to the power amplifier module 1 from the terminal (reference potential supply terminal) 23b of the mounting board 21 through the solder 24 and the rear-surface terminal TE2.

Next, one example of the manufacturing process of the power amplifier module 1 will be simply described.

First, a wiring-board base body (to be wiring boards 3 after the cutting process described later) is prepared, and the semiconductor chip 2, the semiconductor chip 4, the passive component 5 and the integrated passive component 6 are mounted on this wiring-board base body. At this time, the semiconductor chip 2 is flip-chip mounted, and the plurality of bump electrodes BP of the semiconductor chip 2 are electrically and mechanically connected to the plurality of corresponding lands LP of the wiring-board base body, respectively. Then, the plurality of pad electrodes 13 of the semiconductor chip 4 and the plurality of corresponding lands LP of the wiring-board base body are electrically connected via the plurality of bonding wires 14, respectively. Thereafter, the sealing resin 7 is formed on the upper surface of the wiring-board base body so as to cover the semiconductor chips 2 and 4, the passive component 5 and the integrated passive component 6, and then, the wiring-board base body and the sealing resin 7 are cut by dicing or others. In this manner, the power amplifier module 1 can be manufactured. The wiring-board base body after the cutting corresponds to the above-described wiring board 3.

<Connecting Method of Semiconductor Chip and Wiring Board>

Figure 7:
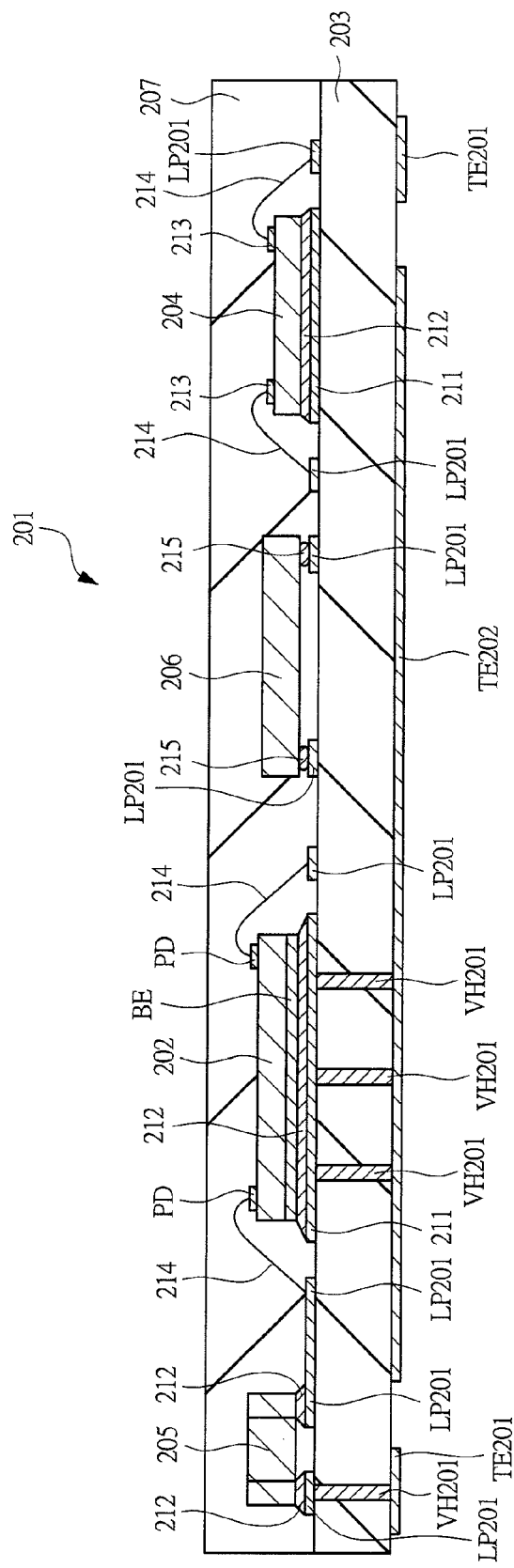
FIG. 7 is a conceptual cross-sectional view showing the structure of a power amplifier module of a comparative example.

FIG. 7 is a cross-sectional view (side cross-sectional view) showing a power amplifier module 201 of a comparative example, and it corresponds to FIG. 5 of the present embodiment.

In the power amplifier module 201 of the comparative example shown in FIG. 7, semiconductor chips 202 and 204 (corresponding to the semiconductor chips 2 and 4, respectively), a passive component 205 and an integrated passive component 206 (corresponding to the passive component 5 and the integrated passive component 6, respectively) are mounted on an upper surface of a wiring board 203, and sealing resin 207 (corresponding to the sealing resin 7) is formed so as to cover them.

However, different from the present embodiment, in the power amplifier module 1 of the comparative example shown in FIG. 7, the semiconductor chip 202 corresponding to the semiconductor chip 2 is die-bonded in a face-up manner on the upper surface of the wiring board 203, and pad electrodes PD on a front surface of the semiconductor chip 202 are electrically connected to lands LP201 on the upper surface of the wiring board 203 via bonding wires 214. Further, the rear-surface electrode BE formed on a rear surface of the semiconductor chip 202 is connected via a conductive bonding material such as solder 212 to a chip-mounting conductor pattern 211 on the upper surface of the wiring board 203. Note that the reference symbol 213 in FIG. 7 denotes a pad electrode of the semiconductor chip 204, the reference symbol 215 denotes a bump electrode of the integrated passive component 206, a reference symbol VH201 denotes a via (via hole) of the wiring board 203, and reference symbols TE201 and TE202 denote rear-surface terminals corresponding to the rear-surface terminals TE1 and TE2 of the present embodiment, respectively.

In the power amplifier module 201 of the comparative example shown in FIG. 7, a bonding wire 209 is used for the connection between the pad electrode PD of the semiconductor chip 202 and the land LP201 of the wiring board 203. For the wire bonding by the use of the bonding tool, a certain interval (for example, about several hundreds μm) is required from a side surface of the semiconductor chip 202 to the connecting portion between the land LP201 of the wiring board 203 and the bonding wire 209, and an unnecessary region (not necessary for electric circuits, but required for disposing the bonding wire 209) is formed around the region for mounting the semiconductor chip 202 on the wiring board 203. Therefore, planar dimensions of the wiring board are increased and the planar dimensions of the power amplifier module are enlarged.

Therefore, in the power amplifier module 1 of the present embodiment shown in FIG. 3 to FIG. 5, the semiconductor chip 2 is face-down bonded and flip-chip mounted on the wiring board 3 as described above, and the bump electrode BP of the semiconductor chip 2 is connected to the land LP of the wiring board 3. Therefore, it is not required to provide the unnecessary region as described above around the mounting region of the semiconductor chip 2 on the wiring board 3. More specifically, since the land LP for connecting the bump electrode BP is disposed below the semiconductor chip 2 and the bump electrode BP of the semiconductor chip 2 is connected thereto, the connecting portion of the bump electrode BP of the semiconductor chip 2 and the land LP of the wiring board 3 is located below the semiconductor chip 2, and the region corresponding to the above-described unnecessary region is not present around the mounting region of the semiconductor chip 2.

Therefore, in the power amplifier module 1 of the present embodiment, compared with the power amplifier module 201 of the comparative example shown in FIG. 7 in which the wire bonding is used for the connecting method between the semiconductor chip 202 and the land LP201 of the wiring board 203, the mounting area of the semiconductor chip 2 on the wiring board 3 can be reduced, and therefore, the planar dimensions of the wiring board 3 can be reduced and the planar dimensions of the power amplifier module 1 can be miniaturized.

However, in the power amplifier module 201 of the comparative example shown in FIG. 7, since the semiconductor chip 202 is face-up bonded, the rear surface of the semiconductor chip 202 (rear-surface electrode BE) can be directly bonded to the chip-mounting conductor pattern 211 on the upper surface of the wiring board 203 via the solder 212 and others. Therefore, the heat generated in the semiconductor chip 202 can be conducted to the wiring board 203 from the entire rear surface of the semiconductor chip 202, and the power amplifier module 201 of the comparative example is excellent in heat dissipation properties.

On the other hand, in the structure of the power amplifier module 1 of the present embodiment, since the semiconductor chip 2 is face-up bonded on the wiring board 3, the rear surface of the semiconductor chip 2 cannot be directly connected to the wiring board 3 and the heat generated in the semiconductor chip 2 is conducted to the wiring board 3 via the bump electrode BP. The planar dimensions of the bump electrode BP (dimensions or area on a surface parallel to the front surface of the semiconductor chip 2) are considerably smaller than the planar dimensions of the semiconductor chip 2.

Therefore, the bump connecting method (flip-chip mounting method) adopted for the connecting method of the semiconductor chip 2 in the present embodiment is disadvantageous in the heat dissipation properties of a semiconductor chip when compared with the face-up die-bonding method adopted for the connecting method of the semiconductor chip 202 in the power amplifier module 201 of the comparative example shown in FIG. 7. Furthermore, since the LDMOSFETs making up the amplifier stages LDML1 to LDML3 and LDMH1 to LDMH3 are formed in the semiconductor chip 2 as described above, the heating value of the semiconductor chip 2 is extremely large. Therefore, in the power amplifier module 1 of the present embodiment, the improvement of the heat dissipation properties from the semiconductor chip 2 to the wiring board 3 is extremely important.

Therefore, in the present embodiment, the improvement of the heat dissipation properties is achieved by devising the structure of the semiconductor chip 2 and the structure of the wiring board 3 (in particular, structure of vias). First, the structure of the semiconductor chip 2 will be described.

<Structure of Semiconductor Chip>

Figure 8:
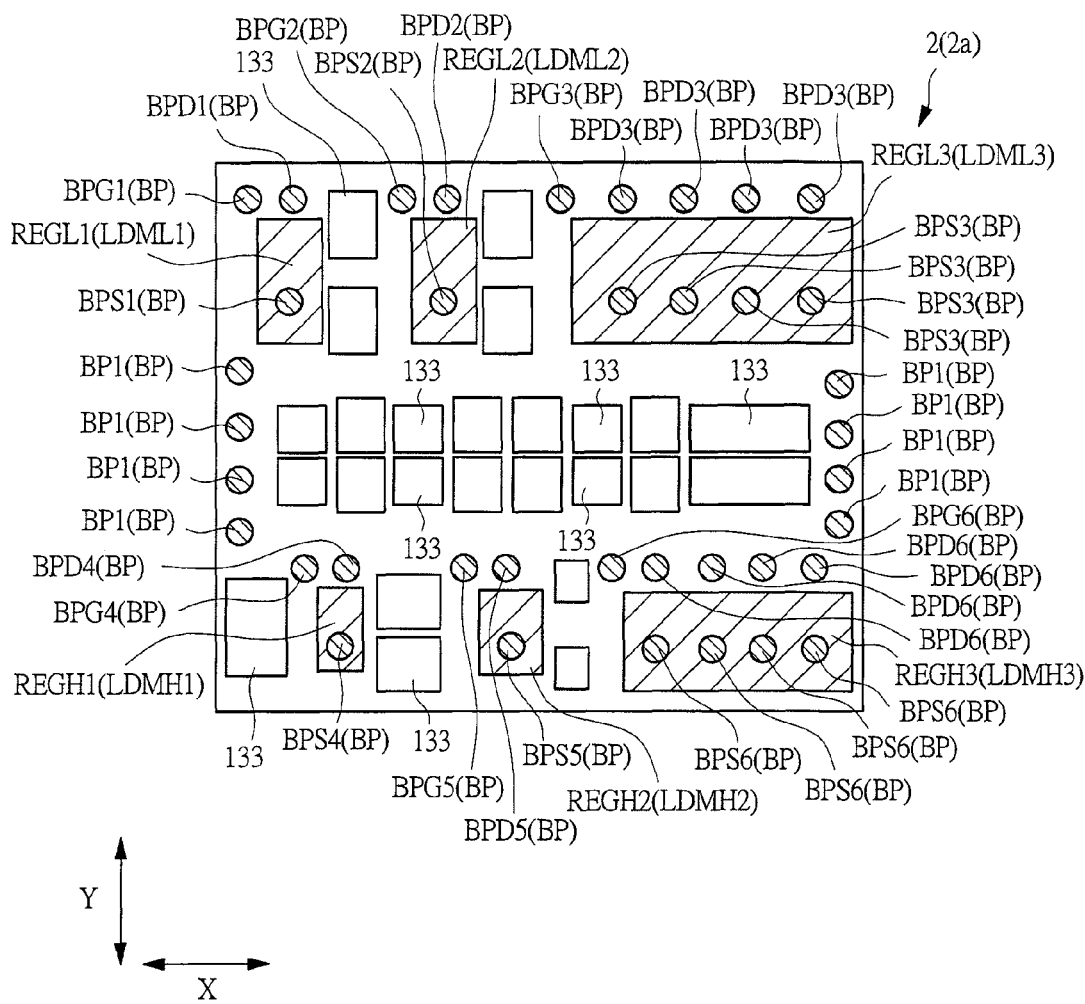
FIG. 8 is a plan view of a semiconductor chip according to an embodiment of the present invention.

FIG. 8 is a plan view (plan layout view) of the semiconductor chip 2 of the present embodiment, and it shows a circuit layout example of the semiconductor chip 2. Although FIG. 8 is a plan view, the hatching is used for the LDMOSFET formation regions REGL1 to REGL3 and REGH1 to REGH3 and the bump electrodes BP so as to make the drawing easy to see.

In FIG. 8, in the semiconductor chip 2, the region in which the LDMOSFET element making up the first amplifier stage LDML1 for GSM900 is formed is denoted by a reference symbol REGL1 and shown as the LDMOSFET formation region REGL1, and the region in which the TDMOSFET element making up the second amplifier stage LDML2 for GSM900 is formed is denoted by a reference symbol REGL2 and shown as the LDMOSFET formation region REGL2. Further, the region in which the LDMOSFET element making up the third amplifier stage LDML3 (final amplifier stage) for GSM900 is formed is denoted by a reference symbol REGL3 and shown as the LDMOSFET formation region REGL3.

Also, the region in which the LDMOSFET element making up the first amplifier stage LDMH1 for DCS1800 is formed is denoted by a reference symbol REGH1 and shown as the LDMOSFET formation region REGH1, and the region in which the LDMOSFET element making up the second amplifier stage LDMH2 for DCS1800 is formed is denoted by a reference symbol REGH2 and shown as the LDMOSFET formation region REGH2. Further, the region in which the LDMOSFET element making up the third amplifier stage LDMH3 (final amplifier stage) for DCS1800 is formed is denoted by a reference symbol REGH3 and shown as the LDMOSFET formation region REGH3.

Furthermore, the semiconductor chip 2 has an element formation region 133 in which a capacitor element, a resistor element or a control MOSFET is formed, and each of the elements formed in the element formation region 133 corresponds to the element making up the above-described peripheral circuit 103 and others. Also, a plurality of bump electrodes BP are formed on the front surface of the semiconductor chip 2.

The bump electrodes BP include drain bumps BPD1, BPD2, BPD3, BPD4, BPD5 and BPD6 which are the bump electrodes BP for drain, source bumps BPS1, BPS2, BPS3, BPS4, BPS5 and BPS6 which are the bump electrodes BP for source, and gate bumps BPG1, BPG2, BPG3, BPG4, BPG5 and BPG6 which are the bump electrode BP for gate. Other than these, the bump electrodes BP include bump electrodes BP1 used for the input of a control signal and the output of a detection signal.

Of these, the gate bump BPG1 is a bump electrode for input (bump electrode for inputting an RF signal through the above-described matching circuit 105A) electrically connected to the gate electrode of the LDMOSFET formation region REGL1. The drain bump BPD1 is a bump electrode for output (bump electrode for outputting an RF signal amplified in the LDMOSFET formation region REGL1) electrically connected to the drain of the LDMOSFET formation region REGL1. The source bump BPS1 is a bump electrode electrically connected to the source of the LDMOSFET formation region REGL1.

Also, the gate bump BPG2 is a bump electrode for input (bump electrode for inputting an RF signal through the above-described matching circuit 102AM1) electrically connected to the gate electrode of the LDMOSFET formation region REGL2. The drain bump BPD2 is a bump electrode for output (bump electrode for outputting an RF signal amplified in the LDMOSFET formation region REGL2) electrically connected to the drain of the LDMOSFET formation region REGL2. The source bump BPS2 is a bump electrode electrically connected to the source of the LDMOSFET formation region REGL2.

Also, the gate bump BPG3 is a bump electrode for input (bump electrode for inputting an RF signal through the above-described matching circuit 102AM2) electrically connected to the gate electrode of the LDMOSFET formation region REGL3. The drain bump BPD3 is a bump electrode for output (bump electrode for outputting an RF signal amplified in the LDMOSFET formation region REGL3) electrically connected to the drain of the LDMOSFET formation region REGL3. The source bump BPS3 is a bump electrode electrically connected to the source of the LDMOSFET formation region REGL3.

Also, the gate bump BPG4 is a bump electrode for input (bump electrode for inputting an RF signal through the above-described matching circuit 105B) electrically connected to the gate electrode of the LDMOSFET formation region REGH1. The drain bump BPD4 is a bump electrode for output (bump electrode for outputting an RF signal amplified in the LDMOSFET formation region REGH1) electrically connected to the drain of the LDMOSFET formation region REGH1. The source bump BPS4 is a bump electrode electrically connected to the source of the LDMOSFET formation region REGH1.

Also, the gate bump BPG5 is a bump electrode for input (bump electrode for inputting an RF signal through the above-described matching circuit 102BM1) electrically connected to the gate electrode of the LDMOSFET formation region REGH2. The drain bump BPD5 is a bump electrode for output (bump electrode for outputting an RF signal amplified in the LDMOSFET formation region REGH2) electrically connected to the drain of the LDMOSFET formation region REGH2. The source bump BPS5 is a bump electrode electrically connected to the source of the LDMOSFET formation region REGH2.

Also, the gate bump BPG6 is a bump electrode for input (bump electrode for inputting an RF signal through the above-described matching circuit 102BM2) electrically connected to the gate electrode of the LDMOSFET formation region REGH3. The drain bump BPD6 is a bump electrode for output (bump electrode for outputting an RF signal amplified in the LDMOSFET formation region REGH3) electrically connected to the drain of the LDMOSFET formation region REGH3. The source bump BPS6 is a bump electrode electrically connected to the source of the LDMOSFET formation region REGH3.

Further, in the semiconductor chip 2, the regions in each of which each of the LDMOSFET formation regions REGL1, REGL2, REGL3, REGH1, REGH2 and REGH3 is formed and each of the element formation regions 133 are electrically isolated from each other by element isolation regions (corresponding to element isolation region 32 described later) made of a buried oxide film formed between each of the regions. Also, an internal wiring of the semiconductor chip 2 electrically connects between the LDMOSFET formation regions REGL1, REGL2, REGL3, REGH1, REGH2 and REGH3 and the element formation region 133 and between these regions and the bump electrodes BP according to need.

In the semiconductor chip 2, the heat is apt to be generated from the LDMOSFET formation regions REGL1, REGL2, REGL3, REGH1, REGH2 and REGH3 making up the amplifier circuit, and among these, the heating value is particularly large in the LDMOSFET formation regions REGL3 and REGH3 corresponding to the final amplifier stages LDML3 and LDMH3. In the present embodiment, since the semiconductor chip 2 is mounted on the wiring board 3 via the bump electrodes BP, the heat of the semiconductor chip 2 is dissipated to the side of the wiring board 3 through the bump electrodes BP. Therefore, if the bump electrodes BP are disposed just above the heat generating portion of the semiconductor chip 2, the heat generated in the semiconductor chip 2 can be dissipated to the wiring board 3 through the shortest path via the bump electrodes BP, and it is extremely preferable in view of the improvement in the heat dissipation properties.

Therefore, in the present embodiment, in the LDMOSFET formation regions REGL1, REGL2, REGL3, REGH1, REGH2 and REGH3 of the semiconductor chip 2, in particular, in the LDMOSFET formation regions REGL3 and REGH3 corresponding to the final amplifier stages LDML3 and LDMH3, the source bumps are disposed on each of the LDMOSFET formation regions. More specifically, in the present embodiment, the source bump BPS3 is disposed on the LDMOSFET formation region REGL3, and the source bump BPS6 is disposed on the LDMOSFET formation region REGH3. Further, although its effect is small compared with the source bumps BPS3 and BPS6 disposed on the LDMOSFET formation regions REGL3 and REGH3, it is also preferable to dispose the source bumps BPS1, BPS2, BPS4 and BPS5 on the LDMOSFET formation regions REGL1, REGL2, REGH1 and REGH2, respectively.

By doing so, the heat generated in the LDMOSFET formation regions REGL1, REGL2, REGL3, REGH1, REGH2 and REGH3 (in particular, LDMOSFET formation regions REGL3 and REGH3) of the semiconductor chip 2 can be dissipated to the side of the wiring board 3 through the source bumps BPS1 to BPS6 (in particular, source bumps BPS3 and BPS6) disposed directly above them. In this manner, the heat dissipation properties of the semiconductor chip 2 can be improved, and the performance (heat dissipation properties) of the power amplifier module 1 can be improved.

Note that, although source bumps, gate bumps and drain bumps are provided for each of the LDMOSFET formation regions REGL1, REGL2, REGL3, REGH1, REGH2 and REGH3, the bump electrodes disposed on the LDMOSFET formation regions in the present embodiment are not gate bumps and drain bumps but source bumps. The reason therefor is as follows.

That is, since it is only necessary to supply the reference voltage (ground potential) to the source bumps BPS1 to BPS6 of the semiconductor chip 2, the source bumps BPS1 to BPS6 can be electrically and thermally connected to the rear-surface terminal TE2 with a large area on the lower surface 3b of the wiring board 3 through the vias VH1, VH2 and VH3 of the wiring board 3. Therefore, if the source bumps are provided on the LDMOSFET formation regions, the heat generated in the LDMOSFET formation regions can be efficiently dissipated through the source bumps of the semiconductor chip 2 and the vias VH1, VH2 and VH3 of the wiring board 3 to the rear-surface terminal TE2 on the lower surface 3b of the wiring board 3 existing below the semiconductor chip 2. The heat conducted to the rear-surface terminal TE2 can be dissipated from the rear-surface terminal TE2 to the outside of the power amplifier module 1.

On the other hand, since the gate bumps BPG1 to BPG6 and the drain bumps BPD1 to BPD6 of the semiconductor chip 2 have to be connected to the matching circuits, the lands LP connected to the gate bumps BPG1 to BPG6 and the drain bumps BPD1 to BPD6 are led out to the outside of the mounting region of the semiconductor chip 2 on the upper surface 3a of the wiring board 3 by the wiring patterns WP or the like of the wiring board 3. Therefore, the lands LP connected to the source bumps BPS1 to BPS6 can ensure the thermal heat-dissipation path to the rear-surface terminal TE2 on the lower surface 3b of the wiring board 3 through the vias VH1, VH2 and VH3, whereas the lands LP connected to the gate bumps BPG1 to BPG6 and the drain bumps BPD1 to BPD6 are difficult to ensure the heat-dissipation path to the rear-surface terminal on the lower surface 3b of the wiring board 3 through the vias VH1, VH2 and VH3.

Therefore, by disposing the source bumps on the LDMOSFET formation regions instead of the gate bumps and the drain bumps like in the present embodiment, the heat generated in the LDMOSFET formation regions can be efficiently conducted to the side of the lower surface 3b of the wiring board 3, and by this means, the heat-dissipation properties of the semiconductor chip 2 can be improved and the performance (heat-dissipation properties) of the power amplifier module 1 can be improved.

Also, in the case where the source bumps are disposed on the LDMOSFET formation regions like in the present embodiment, the area reduction of the semiconductor chip 2 (reduction in chip size) can be achieved compared with the case where the source bumps are disposed in the upper portions outside the LDMOSFET formation regions because it is not necessary to specially ensure the source-bump disposing region in the semiconductor chip.

However, the studies by the inventors of the present invention have revealed that there is the possibility that the failure occurs if the source bumps are simply disposed on the LDMOSFET formation regions. For example, when a probe test is carried out to the source pad before the formation of the source bump, if the source pad is present on the LDMOSFET formation region, the external force (impact, pressure) of the probe is applied to the LDMOSFET formation region, and therefore, there is the possibility that the LDMOSFET element and the wiring structure formed in the LDMOSFET formation region are adversely affected.

For its prevention, in the present embodiment, the configuration of the LDMOSFET formation regions in the semiconductor chip 2 and the source bumps, the drain bumps and the gate bumps connected thereto is devised in the following manner.

<Configuration of LDMOSFET Formation Region in Semiconductor Chip>

The configuration of the LDMOSFET formation regions REGL1, REGL2, REGL3, REGH1, REGH2 and REGH3 in the semiconductor chip 2 will be described together with the manufacturing process thereof. FIG. 9 to FIG. 28 are cross-sectional views and plan views of the principal part in the manufacturing process of the semiconductor device (corresponding to the semiconductor chip 2 described above) of the present embodiment.

Figure 9:
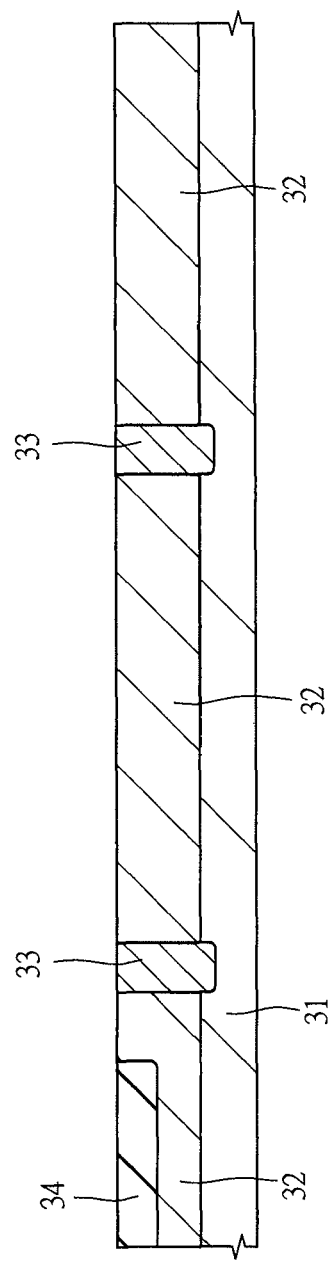
FIG. 9 is a cross-sectional view of the principal part in the manufacturing process of the semiconductor device according to an embodiment of the present invention.

For the manufacture of the semiconductor chip 2, first, a semiconductor substrate (hereinafter, simply referred to as substrate) 31 formed as a low-resistance substrate made of, for example, $p^+$ type silicon (Si) single crystal and having a resistivity (specific resistance) of, for example, about 1 to 10 mΩcm is prepared as shown in FIG. 9. Then, an epitaxial layer (semiconductor layer) 32 made of, for example, p type single crystal silicon having a resistivity of about 20 Ωcm and a thickness of about 2 μm is formed on a main surface of the substrate (semiconductor substrate, semiconductor wafer) 31 by using the well-known epitaxial growth method. Although the epitaxial layer 32 is a semiconductor layer, an impurity concentration of the epitaxial layer 32 is lower than that of the substrate 31 and the resistivity of the epitaxial layer 32 is higher than that of the substrate 31. It is also possible to regard the substrate obtained by combining the substrate 31 and the epitaxial layer 32 as a semiconductor substrate.

Next, after a part of the epitaxial layer 32 is etched by using the photolithography technique and the dry-etching technique to form a trench reaching the substrate 31, a p type polycrystalline silicon film is deposited on the epitaxial layer 32 including the inside of the trench by using the CVD method or the like. Thereafter, the p type polycrystalline silicon film outside the trench is removed by the etch-back method or the like. By this means, a p type buried layer (sinker, p type semiconductor layer) 33 made of the p type polycrystalline silicon film buried in the trench is formed. The p type buried layer 33 penetrates through the epitaxial layer 32 and a bottom of the p type buried layer 33 reaches the substrate 31.

As described above, by filling the inside of the trench with the p type polycrystalline silicon film doped with an impurity at a high concentration, the p type buried layer 33 having a low parasitic resistance can be formed. Therefore, the impurity concentration of the p type buried layer 33 is higher than that of the epitaxial layer 32 and the resistivity of the p type buried layer 33 is lower than that of the epitaxial layer 32.

Note that, since the rear-surface source electrode is not formed on the rear surface of the semiconductor chip 2 in the present embodiment, the formation of the p type buried layer 33 is not essential, but for reducing the source resistance as much as possible, the formation of the p type buried layer 33 is more preferable. Further, it is also possible to form a buried layer having still lower parasitic resistance by filling the inside of the trench with a metal film instead of the polycrystalline silicon film.

Figure 10:
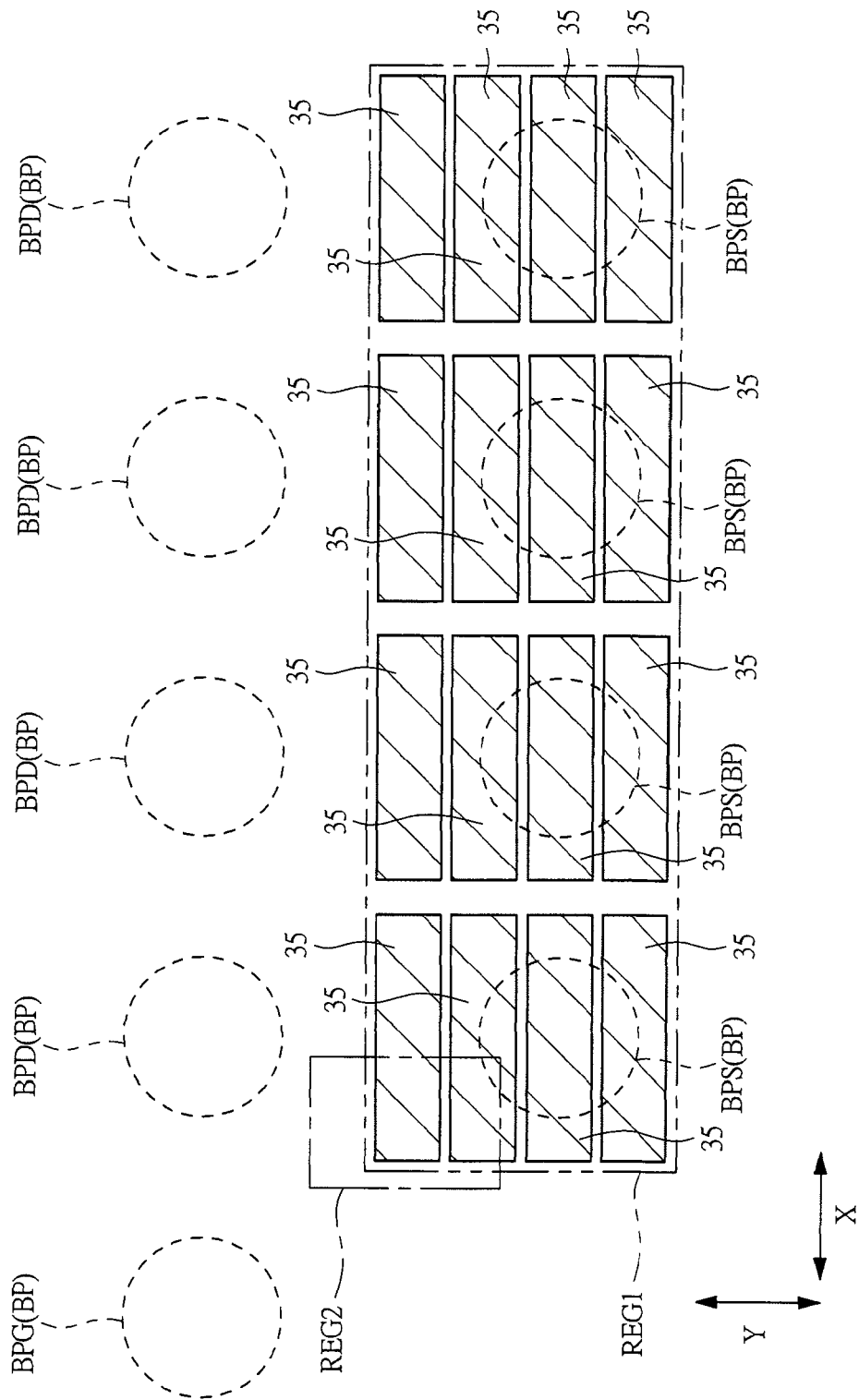
FIG. 10 is a plan view of the principal part in the same manufacturing process of the semiconductor device as FIG. 9.

Next, an element isolation region 34 made of an insulator is formed on a main surface of the epitaxial layer 32 by, for example, the STI (Shallow Trench Isolation) method or the LOCOS (Local Oxidization of Silicon) method. For example, the element isolation region 34 can be formed in the epitaxial layer 32 by forming a trench in the epitaxial layer 32 by etching and then filling the trench with an insulating film such as a silicon oxide film. By forming the element isolation region 34, an active region 35 in which a cell of the LDMOS-FET is to be formed is defined in the main surface of the substrate 31 (main surface of the epitaxial layer 32) as shown in FIG. 10. The active region 35 is surrounded by the element isolation region 34.

Figure 11:
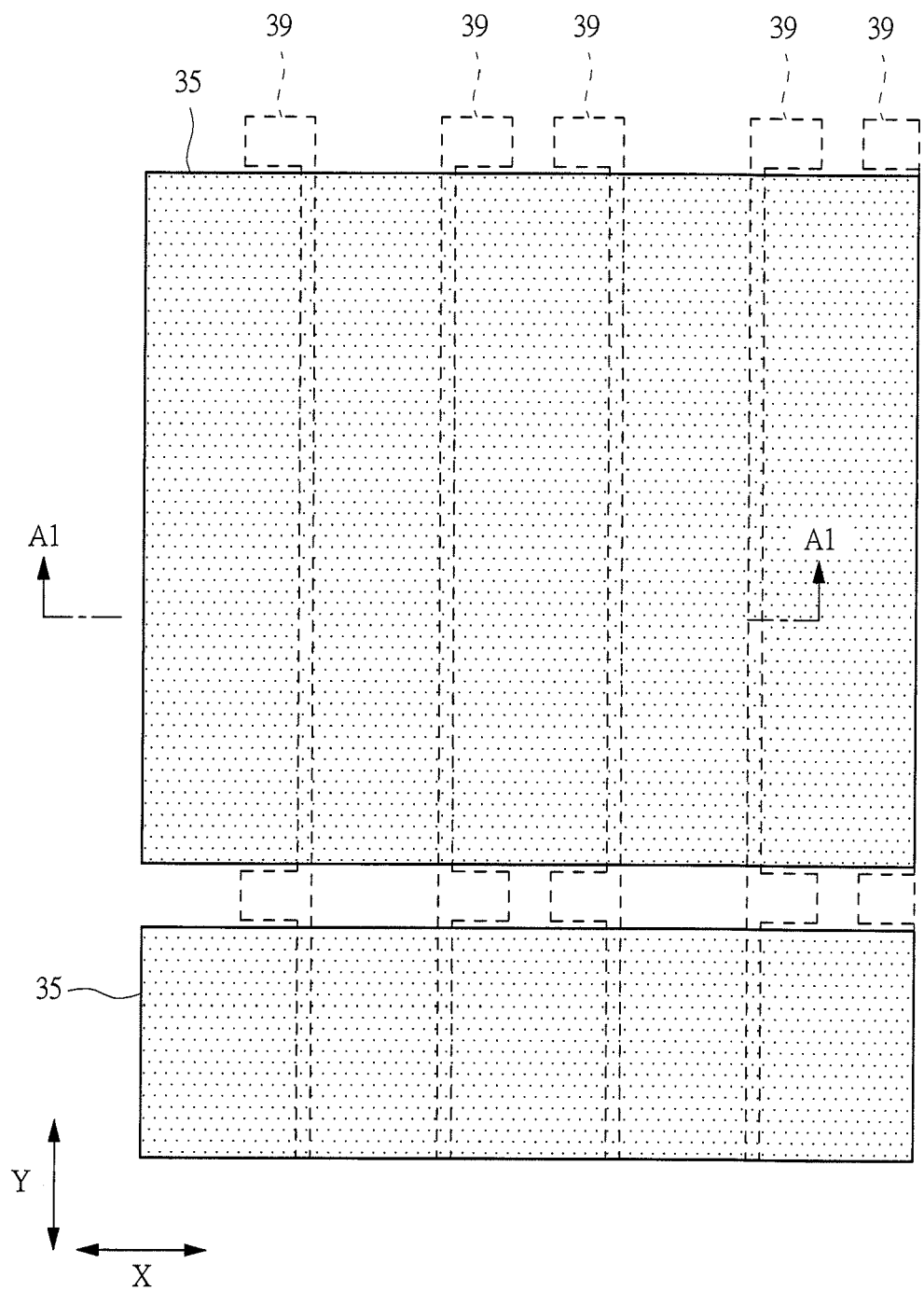
FIG. 11 is a plan view of the principal part in the same manufacturing process of the semiconductor device as FIG. 9.

Note that, although FIG. 10 and FIG. 11 are plan views (plan views of principal part), hatching of diagonal lines is used for the active region 35 in FIG. 10 and hatching of dots is used for the active region 35 in FIG. 11 so as to make the drawings easy to see. Also, the region REG1 made up of a group of the active regions 35 (region enclosed by two-dot chain lines in FIG. 10) will be the region corresponding to any one of the LDMOSFET formation regions REGL1, REGL2, REG3, REGH1, REGH2 and REGH3. Therefore, the region REG1 is referred to as an LDMOSFET formation region REG1. Thus, FIG. 10 shows any one of the LDMOSFET formation regions REGL1, REGL2, REGL3, REGH1, REGH2 and REGH3 (in particular, the LDMOSFET formation regions REGL3 and REGH3) and the region in which drain bump electrodes, gate bump electrodes and source bump electrodes connected to the LDMOSFET element of the LDMOSFET formation region are formed. Also, FIG. 11 corresponds to an enlarged view of the region REG2 enclosed by one-dot chain lines in FIG. 10, and a gate electrode 39 to be formed later is shown by broken lines in FIG. 11. FIG. 9 shows a cross section at the position almost corresponding to the line A1-A1 of FIG. 11. Further, the Y direction shown in FIG. 10 and FIG. 11 corresponds to an extending direction of the gate electrode 39, a drain region (first n$^-$ type drain region 40, second n$^-$ type drain region 43 and n$^+$ type drain region 44) and a source region (n$^-$ type source region 41 and n$^+$ type source region 45) described later of the LDMOSFET formed in the LDMOSFET formation region REG1, and the X direction is a direction orthogonal to the Y direction. The same goes for the X direction and the Y direction in the following plan views. Also, though the source bump electrodes BPS, the drain bump electrodes BPD and the gate bump electrodes BPG described later are not yet formed in FIG. 10 and FIGS. 15, 18 and 21 described later, the positions of the source bump electrodes BPS, the drain bump electrodes BPD and the gate bump electrodes BPG to be formed later are shown by broken lines so as to make the positional relation of respective constituent components easily understood.

Next, as shown in FIG. 12, a p type impurity such as boron (B) is ion-implanted into a part of the epitaxial layer 32 with using a photoresist pattern (not shown) as an ion-implantation blocking mask, thereby forming a p type well (p type base region, p type semiconductor region) 37 for punch-through stopper. The p type well 37 has a function as a punch-through stopper which suppresses the extension of a depletion layer from the drain to the source of the LDMOSFET. The p type well 37 is formed mainly in the source formation region and the channel formation region of the LDMOSFET. Further, the p type well 37 is used also for the threshold adjustment of the LDMOSFET.

Next, after cleaning the surface of the epitaxial layer 32 with hydrofluoric acid or the like, the substrate 31 is subjected to the heat treatment (thermal oxidation treatment) at about 800° C., thereby forming a gate insulating film 38 made of a silicon oxide film with a thickness of about 11 nm on the surface of the epitaxial layer 32. It is also possible to apply a silicon oxide film containing nitrogen, that is, the so-called oxynitride film to the gate insulating film 38 instead of the thermally-oxidized film. Alternatively, it is also possible to deposit a silicon oxide film by the CVD method on the thermally-oxidized film, thereby forming the gate insulating film 38 from these two layers of oxide films.

Next, the gate electrode 39 is formed on the gate insulating film 38. For the formation of the gate electrode 39, for example, an n type polycrystalline silicon film (doped polysilicon film) is deposited on the main surface of the epitaxial layer 32 (that is, on the gate insulating film 38) by the CVD method or the like, and the n type polycrystalline silicon film is patterned by using the photolithography technique and the dry-etching technique. In this manner, the gate electrode 39 made of the patterned n type polycrystalline silicon film is formed on the surface of the p type well 37 of the LDMOSFET formation region REG1 (active region 35) via the gate insulating film 38.

Next, an n type impurity such as phosphorus (P) is ion-implanted into a part of the epitaxial layer 32 with using a photoresist pattern (not shown) as an ion-implantation blocking mask, thereby forming a first n$^-$ type drain region (first low-concentration n type drain region, first n type LDD (Lightly Doped Drain) region) 40. Since the first n$^-$ type drain region 40 is formed in a self-alignment manner with respect to the gate electrode 39, the first n$^-$ type drain region 40 terminates at a lower portion of a sidewall of the gate electrode 39 so that an end portion thereof contacts with the channel formation region. By lowering the impurity concentration of the first n-type drain region 40, the depletion layer spreads between the gate electrode 39 and the drain, and therefore, the feedback capacitance formed therebetween (parasitic capacitance between drain and gate electrodes, Cgd) is reduced.

Next, an n type impurity such as arsenic (As) is ion-implanted into a part of the p type well 37 with using a photoresist pattern (not shown) as an ion-implantation blocking mask, thereby forming the n$^-$ type source region 41. Since the n$^-$ type source region 41 is formed in a self-alignment manner with respect to the gate electrode 39, the n$^-$ type source region 41 terminates at a lower portion of a sidewall of the gate electrode 39 so that an end portion thereof contacts with the channel formation region. By forming the n$^-$ source region 41 to have a shallow depth by performing the ion implantation with low acceleration energy, the expansion of the impurity from the source to the channel formation region can be suppressed, and therefore, the reduction of the threshold voltage can be suppressed. It is also possible to form a p type halo region (not shown) below the n$^-$ type source region 41 by ion-implanting a p type impurity (for example, tilted ion implantation) after forming the n$^-$ type source region 41.

Next, a sidewall spacer (sidewall insulating film) 42 made of an insulating film such as a silicon oxide film is formed on a sidewall of the gate electrode 39. The sidewall spacer 42 can be formed by, for example, depositing an insulating film such as a silicon oxide film by the CVD method on the substrate 31 and then performing the anisotropic etching to the insulating film.

Next, an n type impurity such as phosphorus (P) is ion-implanted into a part of the first n$^-$ type drain region 40 with using a photoresist pattern (not shown) having an opening on the drain formation region as an ion-implantation blocking mask. By this means, a second n$^-$ type drain region (second low-concentration n type drain region, second n type LDD (Lightly Doped Drain) region) 43 is formed in a part of the first n$^-$ type drain region 40 in a self alignment manner with respect to the sidewall spacer 42 formed on the sidewall of the gate electrode 39 on the drain side.

Since the impurity (P) implanted in the formation of the second n$^-$ type drain region 43 has the same conductivity type as the impurity implanted in the formation of the first n⁻ type drain region 40, the impurity concentration of the second n⁻ type drain region 43 is higher than that of the first n⁻ type drain region 40. More specifically, since the second n⁻ type drain region 43 has a resistance lower than that of the first n⁻ type drain region 40, the on-resistance (Ron) can be reduced.

Also, the first n⁻ type drain region 40 is formed in a self-alignment manner with respect to the gate electrode 39, whereas the second n⁻ type drain region 43 is formed in a self-alignment manner with respect to the sidewall spacer 42 on the sidewall of the gate electrode 39. Therefore, the second n type drain region 43 is formed so as to be separate from the gate electrode 39 by a distance corresponding to the thickness of the sidewall spacer 42 along the gate length direction. Accordingly, even when the impurity concentration of the second n⁻ type drain region 43 is increased, the influence on the feedback capacitance (Cgd) is negligible. Also, since the acceleration energy in the ion implantation in the formation of the second n⁻ type drain region 43 is the same as the acceleration energy in the ion implantation in the formation of the first n⁻ type drain region 40, the junction depth of the second n⁻ type drain region 43 is almost the same as the junction depth of the first n⁻ type drain region 40.

Next, an n type impurity such as arsenic (As) is ion-implanted into a part of the second n⁻ type drain region 43 and the p type well 37 of the source formation region with using a photoresist pattern (not shown) having an opening on each of the part of the second n– type drain region 43 and the p type well 37 of the source formation region as an ion-implantation blocking mask.

By this ion implantation, an n⁺ type drain region (drain high-concentration region, high-concentration n type drain region) 44 having an impurity concentration higher than that of the second n⁻ type drain region 43 and more separate from the channel formation region than the second n⁻ type drain region 43 is formed in a part of the second n⁻ type drain region 43. At this time, the parasitic capacitance (drain capacitance) between the source and the drain can be reduced by forming the n⁺ type drain region 44 with the high impurity concentration to be shallower than the second n⁻ type drain region 43 and the first n⁻ type drain region 40 with the low impurity concentration.

Also, by this ion implantation, an n⁺ type source region 45 having higher impurity concentration than that of the n⁻ type source region 41 and having a bottom portion deeper in position than that of the n⁻ type source region 41 is formed in the p type well 7. The n⁺ type source region 45 is formed in a self-alignment manner with respect to the sidewall spacer 42 on the sidewall of the gate electrode 39 and is formed in contact with the n⁻ type source region 41. Therefore, the n⁺ type source region 45 is formed so as to be separate from the channel formation region by a distance corresponding to the thickness of the sidewall spacer 42 along the gate length direction.

As described above, the low-concentration n type drain region (n type LDD region) interposed between the gate electrode 39 and the n⁺ type drain region 44 is formed so as to have a double structure, the impurity concentration of the first n⁻ type drain region 40 closest to the gate electrode 39 is set relatively low, and the impurity concentration of the second n⁻ type drain region 43 separate from the gate electrode 39 is set relatively high. By this means, a depletion layer spreads between the gate electrode 39 and the drain, and as a result, the feedback capacitance (Cgd) formed between the gate electrode 39 and its adjacent first n⁻ type drain region 40 is reduced. Further, since the impurity concentration of the second n⁻ type drain region 43 is high, the on-resistance (Ron) is also reduced. Since the second n⁻ type drain region 43 is formed at a position separate from the gate electrode 39, the influence on the feedback capacitance (Cgd) is negligible. Therefore, since it is possible to reduce both the on-resistance (Ron) and the feedback capacitance (Cgd), the power added efficiency of the amplifier circuit can be improved.

Through the process described above, the LDMOSFET having the drain (drain region) including the first n⁻ type drain region 40, the second n⁻ type drain region 43 and the n⁺ type drain region 44, the source (source region) including the n⁻ type source region 41 and the n⁺ type source region 45 and the gate electrode 39 is formed on the main surface (active region 35, LDMOSFET formation region REG1) of the epitaxial layer 32.

Note that, when referring to the MOSFET or the LDMOSFET in the present application, it includes not only the MISFET using an oxide film (silicon oxide film) for a gate insulating film but the MISFET using an insulating film other than an oxide film (silicon oxide film).

Here, the LDMOSFET is a MISFET (Metal insulator Semiconductor Field Effect Transistor: MIS type field effect transistor) element, and it is a MISFET element having the following features (first to third features).

As the first feature, the LDMOSFET has an LDD (Lightly Doped Drain) region formed on a drain side of the gate electrode 39 so as to enable the high-voltage operation with a short channel length. More specifically, the drain of the LDMOSFET is made up of the n⁺ type region with a high impurity concentration (here, n⁺ type drain region 44) and the LDD region with a impurity concentration lower than that (here, first n⁻ type drain region 40 and second n⁻ type drain region 43), and the n⁺ type region (n⁺ type drain region 44) is formed so as to be separate from the gate electrode 39 (or channel formation region below the gate electrode 39) via the LDD region. By this means, the high breakdown voltage can be achieved. The charge amount (impurity concentration) in the LDD region on the drain side and the distance along the plane (main surface of the epitaxial layer 32) between the end portion of the gate electrode 39 and the n⁺ type drain region (drain high-concentration region) 44 have to be optimized so that the breakdown voltage of the LDMOSFET becomes the maximum value.

As the second feature, the LDMOSFET has the p type well (p type base region) 37 for punch-through stopper formed in the source formation region (n⁻ type source region 41 and n⁺ type source region 45) on the source side and the channel formation region. On the drain side (drain formation region) of the LDMOSFET, the p type well 37 is not formed or formed so as to contact with only a part of the drain formation region on the side close to the channel region.

As the third feature, the LDMOSFET has a structure in which the source (here, source region made up of n⁻ type source region 41 and n⁺ type source region 45) and the drain (here, drain region made up of first n⁻ type drain region 40, second n⁻ type drain region 43 and n⁺ type drain region 44) are asymmetrical with respect to the gate electrode 39.

Next, a p type impurity such as boron fluoride ($BF_2$) is ion-implanted into the surface of the p type buried layer 33 with using a photoresist pattern (not shown) having an opening on the p type buried layer 33 as an ion-implantation blocking mask, thereby forming a p⁺ type semiconductor region 46 in an upper region of the p type buried layer 33. By forming the p⁺ type semiconductor region 46 in the upper region of the p type buried layer 33, the resistance of the surface of the p type buried layer 33 can be reduced.

Through the process described above, the structure shown in FIG. 12 can be obtained.

FIG. 13 is a plan view of the principal part corresponding to the process step of FIG. 12, and it shows the region corresponding to FIG. 11 (that is, region corresponding to REG2 in FIG. 10). In FIG. 13, the planar layout of the p type buried layer 33, the active region 35, the gate electrode 39, the $n^+$ type drain region 44 and the $n^+$ type source region 45 is shown, and the illustration of other constituent components is omitted. Further, although FIG. 13 is a plan view, hatching of dots is used for the gate electrode 39 in FIG. 13 so as to make the drawing easy to see.

As shown in FIG. 13, the gate electrode 39 of the LDMOSFET extends in the Y direction. The drain region (first $n^-$ type drain region 40, second $n^-$ type drain region 43 and $n^+$ type drain region 44) of the LDMOSFET is formed in the region between a gate electrode 39 and another gate electrode 39 adjacent thereto on one side and extends in the Y direction in the active region 35. Also, the source region ($n^-$ type source region 41 and $n^+$ type source region 45) of the LDMOSFET is formed in the region between the gate electrode 39 and another gate electrode 39 adjacent thereto on the other side and extends in the Y direction in the active region 35. Further, the p type buried layer 34 is formed in the region between the $n^+$ type source regions 45 of the adjacent LDMOSFETs. Further, through not shown in FIG. 13, the $p^+$ type semiconductor region 46 is formed in the region between the $n^+$ type source regions 45 of the adjacent LDMOSFETs and extends in the Y direction.

Further, in the LDMOSFET formation region REG1 (active region 35), the structure (layout) of a unit cell (repetition unit, basic cell, unit region, unit cell of LDMOSFET) 50 as shown in FIG. 12 and FIG. 13 is repeated in the X direction. Two unit LDMOSFETs (unit LDMOSFET element, LDMOSFET cell, unit MISFET element) 50a are formed from one unit cell 50. More specifically, although the repetition unit is the unit cell 50, each of the unit cells 50 is made up of two unit LDMOSFETs 50a sharing the $n^+$ type drain region 44 and having a symmetrical structure in the X direction. Note that, since the LDMOSFET is an MISFET element, it is possible to regard the unit LDMOSFET 50a as a unit MISFET element.

In the LDMOSFET formation region REG1 (each of the LDMOSFET formation regions REGL1 to REGL3 and REGH1 to REGH3), the structure (layout) of the unit cell 50 is repeated in the X direction, whereby a large number of (plurality of) unit LDMOSFETs 50a are formed (arranged), and the large number of (plurality of) unit LDMOSFETs 50a are connected in parallel. More specifically, in the LDMOSFET formation region REG1 (each of the LDMOSFET formation regions REGL1 to REGL3 and REGH1 to REGH3), the unit LDMOSFET 50a is repeatedly arranged in the X direction, and the plurality of unit LDMOSFETs 50a arranged in the LDMOSFET formation region REG1 (each of the LDMOSFET formation regions REGL1 to REGL3 and REGH1 to REGH3) are connected in parallel. Therefore, the LDMOSFET elements making up each of the amplifier stages LDML1 to LDML3 and LDMH1 to LDMH3 of the power amplifier circuits LDML and LDMH are formed by connecting the plurality of unit LDMOSFETs 50a in parallel. This parallel connection is made by gate wirings M1G and M2G, source wirings M1S and M2S, a source pad M3S, drain wirings M1D and M2D and plugs 53, 56 and 59.

Next, a metal silicide layer (not shown) made of, for example, cobalt silicide is formed on the surface (upper surface, upper portion) of the $n^+$ type source region 45 and the $p^+$ type semiconductor region 46 according to need.

Next, as shown in FIG. 14, an insulating film (interlayer insulating film) 51 made of a stacked film of a relatively thin silicon nitride film and a relatively thick silicon oxide film formed thereon is formed on the substrate 31 by the CVD method, and the surface thereof is planarized by the CMP (Chemical Mechanical Polishing) method or the like according to need.

Next, the insulating film 51 is dry-etched with using a photoresist (not shown) as an etching mask, thereby forming contact holes (penetration hole) in the insulating film 51, and then, plugs (connecting conductor portion) 53 mainly made of a tungsten (W) film are buried inside the contact holes. For example, after forming a barrier film such as a titanium nitride film on the insulating film 51 including the inside of the contact holes, a tungsten film is formed on the barrier film so as to fill the contact holes, and the unnecessary tungsten film and barrier film on the insulating film 51 are removed by the CMP method or the etch-back method, thereby forming the plugs 53. The contact hole and the plug 53 buried therein are formed on each of the p type buried layer 33 ($p^+$ type semiconductor region 46), the source ($n^+$ type source region 45), the drain ($n^+$ type drain region 44) and the gate electrode 39.

Next, a wiring (first layer wiring) M1 is formed on the insulating film 51 in which the plugs 53 are buried. The wiring M1 can be formed by forming a conductor film on the insulating film 51 in which the plugs 53 are buried and then patterning the conductor film by the photolithography method and the dry-etching method. As the wiring M1, a tungsten wiring mainly made of a tungsten (W) film or an aluminum wiring mainly made of an aluminum (Al) film can be used.

Through the process described above, the structure of FIG. 14 can be obtained. FIG. 15 and FIG. 16 are plan views of the principal part corresponding to the process step of FIG. 14, and FIG. 15 shows the region corresponding to FIG. 10 and FIG. 16 shows the region corresponding to FIG. 11. In FIG. 15, the planar layout of the wiring M1, that is, the source wiring M1S, the drain wiring M1D and the gate wiring M1G is shown. Also in FIG. 16, the planar layout of the source wiring M1S, the drain wiring M1D and the gate wiring M1G is shown, and the position of the contact holes (contact holes in which the plugs 53 are buried) located below the source wiring M1S, the drain wiring M1D and the gate wiring M1G is also illustrated in FIG. 16. Further, although FIG. 16 is a plan view, the hatching of dots is used for the source wiring M1S, the drain wiring M1D and the gate wiring M1G so as to make the drawing easy to see. Further, in FIG. 16 and FIG. 19 described later, the position of the gate electrode 39 is shown by broken lines so as to make the positional relation easily understood.

As shown in FIG. 14 to FIG. 16, the wiring M1 includes the source wiring (wiring for source) M1S electrically connected to both the $n^+$ type source region 45 and the $p^+$ type semiconductor region 46 through the plug 53, the drain wiring (wiring for drain) M1D electrically connected to the $n^+$ type drain region 44 through the plug 53, and the gate wiring (wiring for gate) M1G electrically connected to the gate electrode 39 through the plug 53.

Note that, although the structure in which the gate wiring M1G is connected to the gate electrode 39 through the plug 53 is not shown in the cross-sectional view of FIG. 14, the plug 53 is disposed in the region in which the gate wiring M1G and the gate electrode 39 are planarly overlapped (more specifically, region in which the gate electrode 39 extending in the Y direction and the gate wiring M1G extending in the X direction intersect) as shown in FIG. 16, and the gate wiring M1G and the gate electrode 39 are electrically connected through this plug.

Next, as shown in FIG. 17, an insulating film (interlayer insulating film) 54 made of a silicon oxide film or the like is formed on the insulating film 51 by the CVD method so as to cover the wiring M1.

Next, the insulating film 54 is dry-etched with using a photoresist pattern (not shown) as an etching mask, thereby forming through holes (penetration hole) through which a part of the wiring M1 is exposed in the insulating film 54, and then, plugs (connecting conductor portion) 56 mainly made of a tungsten (W) film are buried inside the though holes. The plug can be formed in almost the same manner as the above-described plug 53. The plug 56 is in contact with and electrically connected to the wiring M1 by its bottom portion.

Next, a wiring (second layer wiring) M2 is formed on the insulating film 54 in which the plugs 56 are buried. A conductor film mainly made of an aluminum (Al) alloy film is formed on the insulating film 54 in which the plugs 56 are buried, and this conductor film is patterned by using the photolithography method and the dry-etching method, thereby forming the wiring M2 made of the patterned conductor film. As the conductor film for forming the wiring M2, a stacked film obtained by forming a barrier conductor film (for example, stacked film of titanium film and titanium nitride film), an aluminum film (or aluminum alloy film) and a barrier conductor film (for example, stacked film of titanium film and titanium nitride film) in this order from below can be used. In this stacked film, compared with the thickness of the aluminum film serving as a main conductor film, the thickness of the barrier conductor films formed on and below it is small.

As another embodiment, the wiring M2 can be formed by forming the through hole through which a part of the wiring M1 is exposed in the insulating film 54, forming the conductor film for forming the wiring M2 so as to fill the through hole, and then patterning the conductor film. In this case, the portion corresponding to the plug 56 (via portion) is formed of the same conductor film as the wiring M2 integrally with the wiring M2.

Through the process described above, the structure of FIG. 17 can be obtained. FIG. 18 and FIG. 19 are plan views of the principal part corresponding to the process step of FIG. 17, and FIG. 18 shows the region corresponding to FIG. 10 and FIG. 19 shows the region corresponding to FIG. 11. FIG. 18 and FIG. 19 show the planar layout of the wiring M2, that is, the source wiring M2S, the drain wiring M2D and the gate wiring M2G. Further, although FIG. 19 is a plan view, the hatching of dots is used for the source wiring M2S and the drain wiring M2D in FIG. 19 so as to make the drawing easy to see.

As shown in FIG. 17 to FIG. 19, the wiring M2 includes the drain wiring (wiring for drain) M2D electrically connected to the drain wiring M1D through the plug 56, the gate wiring (wiring for gate) M2G electrically connected to the gate wiring M1G through the plug 56, and the source wiring (wiring for source) M2S electrically connected to the source wiring M1S through the plug 56.

Further, although the structure in which the gate wiring M2G is connected to the gate wiring M1G through the plug 56 is not shown in the cross-sectional view of FIG. 17, the gate wiring M2G and the gate wiring M1G are partly overlapped planarly (in the portions extending in the X direction) as is apparent from the comparison between FIG. 15 and FIG. 18, and the plug 56 is disposed in this overlapping region and the gate wiring M2G and the gate wiring M1G are electrically connected through this plug 56.

In the case where the through hole for the plug 56 is filled with a part of the wiring M2 without forming the plug 56, the source wiring M2S is electrically connected to the source wiring M1S through the via portion thereof (portion filling the through hole), the drain wiring M2D is electrically connected to the drain wiring M1D through the via portion thereof, and the gate wiring M2G is electrically connected to the gate wiring M1G through the via portion thereof.

Next, as shown in FIG. 20, an insulating film (interlayer insulating film) 57 made of a silicon oxide film is formed on the insulating film 54 by the CVD method or the like so as to cover the wiring M2.

Next, the insulating film 57 is dry-etched with using a photoresist pattern (not shown) as an etching mask, thereby forming through holes (penetration hole) through which a part of the wiring M2 is exposed in the insulating film 57, and then, plugs (connecting conductor portion) 59 mainly made of a tungsten (W) film or an aluminum film are buried inside the though holes. The plug 59 can be formed in almost the same manner as the above-described plug 53. The plug 59 is in contact with and electrically connected to the wiring M2 by its bottom portion.

Next, a wiring (third layer wiring) M3 is formed on the insulating film 57 in which the plugs 59 are buried. The wiring M3 also serves as the conductor film for the pad (pad electrode). A conductor film mainly made of an aluminum (Al) alloy film is formed on the insulating film 57 in which the plugs 59 are buried, and this conductor film is patterned by using the photolithography method and the dry-etching method, thereby forming the wiring M3 made of the patterned conductor film. As the conductor film for forming the wiring M3, a stacked film obtained by forming a barrier conductor film (for example, stacked film of titanium film and titanium nitride film), an aluminum film (or aluminum alloy film) and a barrier conductor film (for example, stacked film of titanium film and titanium nitride film) in this order from below can be used. In this stacked film, compared with the thickness of the aluminum film serving as a main conductor film, the thickness of the barrier conductor films formed on and below it is small. Therefore, the wiring M3 is mainly made of aluminum (Al).

As another embodiment, the wiring M3 can be formed by forming the through hole through which a part of the wiring M2 is exposed in the insulating film 57, forming the conductor film for forming the wiring M3 so as to fill the through hole, and then patterning the conductor film. In this case, the portion corresponding to the plug 59 (via portion) is formed of the same conductor film as the wiring M3 integrally with the wiring M3.

Through the process described above, the structure shown in FIG. 20 can be obtained. FIG. 21 is a plan view of the principal part corresponding to the process step of FIG. 20, and FIG. 21 shows the region corresponding to FIG. 10. In FIG. 21, the planar layout of a source pad M3S, drain pads M3D and a gate pad M3G is shown by solid lines. Also, in FIG. 21, the LDMOSFET formation region REG1 shown in FIG. 10 is shown by broken lines, the gate wiring M2G and a connecting wiring portion M2D2 of the drain wiring M2D are shown by two-dot chain lines, and the source bump electrode BPS, the drain bump electrode BPD and the gate bump electrode BPG to be formed later are shown by broken lines so as to make the positional relation easily understood.

As shown in FIG. 20 and FIG. 21, the wiring M3 includes the drain pad M3D electrically connected to the drain wiring M2D through the plug 59, the gate pad M3G electrically connected to the gate wiring M2G through the plug 59, and the source pad M3S electrically connected to the source wiring M2S through the plug 59. The drain pad (drain pad electrode, drain wiring) M3D, the gate pad (gate pad electrode, gate wiring) M3G and the source pad (source pad electrode, source wiring) M3S are made of the same material in the same process and formed in the same layer, but are mutually isolated patterns. Further, the wiring M3 is formed also as the wiring for connecting elements, circuits or an bump electrode BP and an element (circuit) in the region not shown in FIG. 20 and FIG. 21 (region other than the LDMOSFET formation region REG1), and an inductor element or the like can be formed by using the wiring M3.

Further, although the structure in which the gate pad M3G is connected to the gate wiring M2G through the plug 59 is not shown in the cross-sectional view of FIG. 20, the gate pad M3G and the gate wiring M2G are partly overlapped planarly as is apparent from FIG. 21, and the plug 59 is disposed in this overlapping region and the gate pad M3G and the gate wiring M2G are electrically connected through this plug 59. Furthermore, although the structure in which the drain pad M3D is connected to the drain wiring M2D through the plug 59 is not shown in the cross-sectional view of FIG. 20, the drain pad M3D and (the connecting wiring portion M2D2 of) the drain wiring M2D are partly overlapped planarly as is apparent from FIG. 21, and the plug 59 is disposed in this overlapping region and the drain pad M3D and the drain wiring M2D are electrically connected through this plug 59.

Therefore, the source wirings M1S and M2S are formed in the layer above the gate electrode 39 and below the source pad M3S on the main surface of the substrate 31, and they can be regarded as the wirings (source wiring) which electrically connect a plurality of source regions ($n^+$ type source region 45) formed in the LDMOSFET formation region REG1 and the source pad M3S. Further, the drain wirings M1D and M2D are formed in the layer above the gate electrode 39 and below the drain pad M3D on the main surface of the substrate 31, and they can be regarded as the wirings (drain wiring) which electrically connect a plurality of drain regions ($n^+$ type drain region 44) formed in the LDMOSFET formation region REG1 and the drain pad M3D. Furthermore, the gate wirings M1G and M2G are formed in the layer above the gate electrode 39 and below the gate pad M3G on the main surface of the substrate 31, and they can be regarded as the wirings (gate wiring) which electrically connect a plurality of gate electrodes 39 formed in the LDMOSFET formation region REG1 and the gate pad M3G.

Note that, when the through hole for the plug 59 is filled with a part of the wiring M3 without forming the plug 59, the source pad M3S is electrically connected to the source wiring M2S through the via portion thereof (portion filling the through hole), the drain pad M3D is electrically connected to the drain wiring M2D through the via portion thereof, and the gate pad M3G is electrically connected to the gate wiring M2G through the via portion thereof. However, it is more preferable to separately form the wiring M3 and the plug 59, and by this means, the flatness of the source pad M3S can be improved.

Here, before describing the process after the formation of the wiring M3, the layout and the connecting relation of the wirings M1, M2 and M3 will be described. First, the layout and the connecting relation of the drain wirings M1D and M2D and the drain pad M3D will be described.

As shown in FIG. 13 and FIG. 15 to FIG. 19, the drain wiring M1D is formed on the drain region ($n^+$ type drain region 44) of the LDMOSFET formed in the active region 35, and the drain wiring M1D and the drain region ($n^+$ type drain region 44) of the LDMOSFET below it are electrically connected through the plug 53 disposed on the $n^+$ type drain region 44. Since the drain region extends in the Y direction in the active region 35, the drain wiring M1D also extends in the Y direction on the active region 35, but the drain wiring M1D is not formed on the element isolation region 34 between the active regions 35. Therefore, the drain region M1D is an isolated pattern formed only on each active region 35, but it is electrically connected through the plug 56 to the drain wiring M2D extending on the drain wiring M1D in the Y direction.

As shown in FIG. 17 to FIG. 19, the drain wiring M2D includes a wiring portion (first drain wiring portion) M2D1 extending in the Y direction over a plurality of active regions 35 (drain region) arranged in the Y direction and a connecting wiring portion (second drain wiring portion) M2D2 which extends in the X direction and connects one terminals of the plurality of wiring portions M2D1. The width (dimension in the Y direction) of the connecting wiring portion M2D2 is larger than the width (dimension in the X direction) of each wiring portion M2D1. The plurality of wiring portions M2D1 and the wiring portion M2D2 are integrally formed to make up the drain wiring M2D. Therefore, the drain wiring M2D has the so-called comb-shaped pattern. Each of the wiring portions M2D1 extends in the Y direction so as to be located on each drain region of the plurality of unit LDMOSFETs 50a formed in the LDMOSFET formation region REG1, and is electrically connected to each drain region of the plurality of unit LDMOSFETs 50a through the plug 56, the drain wiring M1D and the plug 53. More specifically, each of the drain regions ($n^+$ type drain region 44) of the plurality of unit LDMOSFETs 50a formed in the LDMOSFET formation region REG1 is drawn up to the wiring portion M2D1 of the drain wiring M2D through the plug 53, the drain wiring M1D and the plug 56 and then electrically connected to each other by the connecting wiring portion M2D2 of the drain wiring M2D.

As shown in FIG. 21, the drain pad M3D is formed so that a part thereof is planarly overlapped with the connecting wiring portion M2D2 of the drain wiring M2D, and the drain pad M3D and the drain wiring M2D are electrically connected through the plug 59 formed in this overlapping region. The drain pad M3D has, for example, a rectangular shape, and is located at a position not overlapped planarly with the LDMOSFET formation region REG1. Since the drain pad M3D is formed for each drain bump electrode BPD provided for the LDMOSFET formation region REG1, a plurality of drain pads M3D can be provided when a plurality of drain bump electrodes BPD are provided for the LDMOSFET formation region REG1. In particular, when the LDMOSFET formation region REG1 is the LDMOSFET formation region REGL3 or the LDMOSFET formation region REH3 making up the final amplifier stage, it is preferable to provide the drain bump electrode BPD for the LDMOSFET formation region REG1, and therefore, a plurality of drain pads M3D are formed. FIG. 21 shows the case where four drain bump electrodes BPD are provided for the LDMOSFET formation region REG1, and thus, four drain pads M3D are also formed.

As described above, a plurality of drain regions ($n^+$ type drain region 44) of a plurality of unit LDMOSFETs 50a formed in the LDMOSFET formation region REG1 are electrically connected to each other through the plugs 53 and 56 and the drain wirings M1D and M2D, and are electrically connected also to the drain pad M3D through the plug 59.

Next, the layout and the connecting relation of the source wirings M1S and M2S and the source pad M3S will be described.

As shown in FIG. 13 and FIG. 15 to FIG. 19, the source wiring M1S is formed on the source region ($n^+$ type source region 45) and the $p^+$ type semiconductor region 46 of the LDMOSFET formed in the active region 35, and the source wiring MIS is electrically connected to the $n^+$ type source region 45 and the p+ type semiconductor region 46 through the plug 53. Since the source region extends in the Y direction in the active region 35, the source wiring M1S also extends in the Y direction on the active region 35, but the source wiring M1S is not formed on the element isolation region 34 between the active regions 35. Therefore, the source wiring M1S is an isolated pattern formed only on each active region 35, but it is electrically connected through the plug 56 to the source wiring M2S extending on the source wiring M1S in the Y direction. As shown in FIG. 17 to FIG. 19, the source wiring M2S extends in the Y direction over a plurality of active regions 35 (source region) arranged in the Y direction, but each of the source wirings M2S is not electrically connected to each other.

As shown in FIG. 21, the source pad M3S is formed so as to almost entirely cover the LDMOSFET formation region REG1 and has, for example, a rectangular shape. Since the source wiring M2S extends in the Y direction in the LDMOSFET formation region REG1, at least a part of each source wiring M2S is planarly overlapped with the source pad M3S. The source wiring M2S and the source pad M3S are electrically connected through the plug 59 formed in this overlapping region. In the LDMOSFET formation region REG1, a plurality of source wirings M2S extending in the Y direction are arranged in the X direction, but these source wirings M2S are electrically connected to the same source pad M3S through a plurality of plugs 59. More specifically, a plurality of source regions (n+ type source region 45) of a plurality of unit LDMOSFETs 50a formed in the LDMOSFET formation region REG1 are electrically connected to the source pad M3S through the plug 53, the source wiring M1S, the plug 56, the source wiring M2S and the plug 59, and are electrically connected to each other by the source pad M3S. Since a plurality of source bumps are formed on the source pad M3S as described later, the source pad M3S has a larger plane area than the drain pad M3D and the gate pad M3G.

Note that, when the p type buried layer 33 is formed, the plurality of source regions (n+ type source region 45) of the plurality of unit LDMOSFETs 50a formed in the LDMOSFET formation region REG1 are electrically connected to each other through the p type buried layer 33, the substrate 31 and others.

Next, the layout and the connecting relation of the gate wirings M1G and M2G and the gate pad M3G will be described.

As shown in FIG. 13 and FIG. 15 to FIG. 18, the gate electrode 39 extends in the Y direction and is electrically connected to the gate wiring M1G through the plug 53 at a position located on the element isolation region 34 around or between the active regions 35. The gate wiring M1G extends in the X direction and the Y direction on the element isolation region 34 around or between the active regions 35. In the LDMOSFET formation region REG1, each gate electrode 39 extending in the Y direction is electrically connected to the part of the gate wiring M1G extending in the X direction through the plug 53, and the part of the gate wiring M1G extending in the X direction and that extending in the Y direction are integrally connected. Therefore, each of the gate electrodes 39 is electrically connected to each other through the gate wiring M1G.

The gate wiring M1G is the wiring in the same layer as the drain wiring M1D and the source wiring M1S, but as is apparent from FIG. 15 and FIG. 16, the drain wiring M1D and the source wiring M1S are not formed on the element isolation region 34 between the active regions 35, and the gate wiring M1G extends there in the X direction. Accordingly, the drain wiring M1D and the source wiring M1S extending in the Y direction are arranged between the portions of the gate wiring M1G extending in the X direction.

As can be seen from FIG. 15 and FIG. 18, the gate wiring M1G is located on an opposite side (far side from the connecting wiring portion M2D2) of the connecting wiring portion M2D2 of the drain wiring M2D, and in the part extending in the X direction, it is electrically connected to the gate wiring M2G extending in the X direction on the element isolation region 34 through the plug 56. More specifically, at least a part of the gate wiring M2G extending in the X direction is planarly overlapped with a part of the gate wiring M1G extending in the X direction, and the gate wiring M2G in the upper layer and the gate wiring M1G in the lower layer are electrically connected through the plug 59 formed in the overlapping region.

As shown in FIG. 21, similarly to the drain pad M3D, the gate pad M3G is formed at a position not planarly overlapped with the LDMOSFET formation region REG1, and it has almost the same planar shape (for example, rectangular shape) and planar dimensions as the drain pad M3D. FIG. 21 shows the case where the plurality of drain pads M3D and the gate pad M3G are arranged in a line. The gate wiring M2G extends around the LDMOSFET formation region REG1 so as not to be planarly overlapped with the LDMOSFET formation region REG1, and a part thereof is planarly overlapped with the gate pad M3G. The gate pad M3G and the gate wiring M2G are electrically connected through the plug 59 disposed in this overlapping region.

As described above, a plurality of gate electrodes 39 of a plurality of unit LDMOSFETs 50a formed in the LDMOSFET formation region REG1 are electrically connected to each other through the plug 53 and the gate wiring M1G, and further electrically connected to the gate pad M3G through the plug 56, the gate wiring M2G and the plug 59.

Subsequently, the process after the formation of the source pad M3S, the drain pad M3D and the gate pad M3G will be described.

After the wiring 3 (the source pad M3S, the drain pad M3D and the gate pad M3G) is formed as described above, as shown in FIG. 22, an insulating film 61 is formed on the insulating film 57 so as to cover the wiring M3. This insulating film 61 is made of, for example, a single film of a silicon oxide film or a stacked film of a silicon oxide film and a silicon nitride film formed thereon, and it can be formed by the CVD method or the like.

Next, a part of the insulating film 61 is selectively removed by using the photolithography method and the dry-etching method to form an opening portion (penetration hole) 62 in the insulating film 61, thereby exposing the wiring M3 at the bottom of the opening portion 62.

The opening portion 62 of the insulating film 61 includes an opening portion 62S formed on the source pad M3S, though not shown in the cross-sectional view of FIG. 22, an opening portion 62D formed on the drain pad M3D as shown in FIG. 26 described later, and an opening portion 62G formed on the gate pad M3G as shown in FIG. 27 described later. Each of the opening portions 62S, 62D and 62G has, for example, a circular planar shape (opening shape).

Since the opening portion 62 is provided for each of the bump electrodes BP to be formed, when a plurality of drain bumps are provided, the opening 62D is formed on each of the plurality of drain pads M3D. The opening portion 62D formed on each drain pad M3D is planarly enclosed in the drain pad M3D, and a part of the drain pad M3D is exposed at the bottom of the opening portion 62D.

Also, when a plurality of source bumps are provided on the same source pad M3S, a plurality of opening portions 62S are formed on the same source pad M3S. Each of the plurality of opening portions 62S provided on the same source pad M3S is planarly enclosed in the source pad M3S, and a part of the source pad M3S is exposed at the bottom of each opening portion 62S.

Also, the opening portion 62 provided on the gate pad M3G is planarly enclosed in the gate pad M3G, and a part of the gate pad M3G is exposed at the bottom of the opening portion 62.

Next, as shown in FIG. 23, a seed film 63 made of a conductor film such as a chromium (Cr) film is formed on the substrate 31. By this means, the seed film 63 is formed on the insulating film 61 including the source pad M3S, the drain pad M3D and the gate pad M3G exposed in each of the opening portions 62. Then, a photoresist pattern (photoresist layer) PR1 is formed on the seed film 63 by using the photolithography method. This photoresist pattern PR1 is formed in the region other than the region in which a copper film 64 described later is to be formed, and it has an opening portion PR1a in the region in which the copper film 64 is to be formed and the seed film 63 is exposed through the opening portion PR1a.

Next, the copper (Cu) film 64 is formed as a conductor film by using the plating method or the like. For example, the copper film 64 can be formed by the electroplating method on the exposed seed film 63 not covered with the photoresist pattern PR1 with using the seed film 63 as an electrode. Then, a nickel (Ni) film 65 is formed on the copper film 64 by using the plating method or the like.

Next, as shown in FIG. 24, the photoresist pattern PR1 is removed and the etching is performed lightly. By this means, a portion of the seed film 63 not covered with the copper film 64 (that is, a part of the seed film 63 covered with the photoresist pattern PR1 before removal) is removed.

In this manner, a conductor layer (conductor film) CND made of a stacked film of the seed film 63, the copper film 64 and the nickel film 65 formed in this order from below is formed. In the conductor layer CND, the thickness of the copper film 64 is larger than those of the seed film 63 and the nickel film 65.

A conductor layer CND formation region is provided for each bump electrode BP to be formed. The conductor layer CND includes a drain conductor layer (drain conductor film) CNDD, a gate conductor layer (gate conductor film) CNDG and a source conductor layer (source conductor film) CNDS. Note that, though the drain conductor layer CNDD and the gate conductor layer CNDG are not shown in the cross-sectional view of FIG. 22, they are shown in FIG. 26 and FIG. 27 described later.

The drain conductor layer CNDD, the gate conductor layer CNDG and the source conductor layer CNDS are made of the same material and formed in the same layer by the same process as the conductor layer CND, but they are the mutually isolated patterns. The drain conductor layer CNDD is the conductor layer CND formed on the drain pad M3D and in contact with and electrically connected to the drain pad M3D at the bottom of the opening portion 62D, and it planarly encloses the opening portion 62D. The gate conductor layer CNDG is the conductor layer CND formed on the gate pad M3G and in contact with and electrically connected to the gate pad M3G at the bottom of the opening portion 62G, and it planarly encloses the opening portion 62G. The source conductor layer CNDS is the conductor layer CND formed on the source pad M3S and in contact with and electrically connected to the source pad M3S at the bottom of the opening portion 62S, and it planarly encloses the opening portion 62S. The drain conductor layer CNDD, the gate conductor layer CNDG and the source conductor layer CNDS have, for example, a circular planar shape, respectively.

When a plurality of drain bumps are formed, the opening portion 62D and the drain conductor layer CNDD planarly enclosing the opening portion 62D are formed on each of the plurality of drain pads M3D, and each drain conductor layer CNDD is in contact with and electrically connected to each drain pad M3D at the bottom of each opening portion 62D. Also, when a plurality of source bumps are provided on the same source pad M3S, a plurality of pairs of the opening portion 62S and the source conductor layer CNDS planarly enclosing the opening portion 62S are formed on the same source pad M3S, and each source conductor layer CNDS is in contact with and electrically connected to the same source pad M3S at the bottom of each opening portion 62S.

Next, an insulating film (resin film, resin insulating film, passivation film) PI1 made of, for example, a resin material film (resin film) such as polyimide resin is formed on the substrate 31 (insulating film 61) as a surface protection film (uppermost-layer protection film) so as to cover the conductor layer CND. By this means, the conductor layer CND is covered with the insulating film PI1 as a surface protection film. This insulating film PI1 is the uppermost layer of the semiconductor chip 2 and functions as the uppermost-layer protection film for protecting the semiconductor chip 2. By using a resin film (organic insulating film) such as polyimide resin for the insulating film PI1 of the uppermost layer, a relatively soft resin film is used as the uppermost layer, and therefore, the handling of the semiconductor chip 2 can be facilitated.

Next, an opening portion (bump opening portion) OP which exposes a part of the conductor layer CND is formed in the insulating film PI1 by using the photolithography method and the dry-etching method. The (nickel film 65 of the) conductor layer CND is exposed at the bottom of the opening portion OP.

Next, as shown in FIG. 25, a UBM (Under Bump Metal) film (bump foundation metal layer, conductor film) 69 made of conductor is formed on the (nickel film 65 of the) conductor layer CND exposed through the opening portion OP. The UBM film 69 is formed of, for example, a stacked film of a palladium (Pd) film and a titanium (Ti) film, a stacked film of a chromium (Cr) film, a nickel (Ni)-based alloy film and a gold (Au) film or the like. The UBM film 69 can be formed by the plating method or the sputtering method. When the UBM film 69 is formed by the sputtering method, the UBM film 69 in an unnecessary region can be removed by etching or the like.

Alternatively, without forming the nickel film 65 at the stage of FIG. 23, after forming the opening portion OP in the insulating film PI1, the nickel film 65 is formed on the copper film 64 exposed through the opening portion OP, and then the UBM film 69 is formed on this nickel film 65. In this case, the nickel film 65 is formed only on a part of the upper surface of the copper film 64 exposed through the opening portion OP. Also, a part of the conductor layer CND exposed through the opening portion OP is formed of a stacked film of the seed film 63, the copper film 64 and the nickel film 65, and a part thereof covered with the insulating film PI1 is formed of a stacked film of the seed film 63 and the copper film 64.

Next, the bump electrode BP is formed on the UBM film 69 on the copper film 64 exposed through the opening portion OP. The bump electrode BP is made of, for example, solder bump. For example, the spherical solder bump (bump electrode BP) can be formed on the UBM film 69 by performing the heat treatment (solder reflow process) after printing the solder paste on the UBM film 69. The UBM film 69 can be regarded as a part of the bump electrode BP.

FIG. 26 and FIG. 27 are other cross-sectional views showing the same process step as FIG. 25. Also, FIG. 28 is a plan view of the principal part corresponding to the process step of FIG. 25 to FIG. 27, and FIG. 28 shows the region corresponding to FIG. 10. In FIG. 28, the planar layout of the bump electrode BP, that is, the source bump electrode BPS, the drain bump electrode BPD and the gate bump electrode BPG is shown by solid lines. Also, in FIG. 28, the source conductor layer CNDS, the drain conductor layer CNDD and the gate conductor layer CNDG are shown by broken lines, the source pad M3S, the drain pad M3D and the gate pad M3G are shown by two-dot chain lines, and the LDMOSFET formation region REG1 shown in FIG. 10 is shown by broken lines so as to make the positional relation easily understood. Note that FIG. 26 almost corresponds to the cross-sectional view taken along the line B1-B1 of FIG. 28, and FIG. 27 almost corresponds to the cross-sectional view taken along the line C1-C1 of FIG. 28. Further, FIG. 25 and FIG. 22 to FIG. 24 almost correspond to the cross-sectional view taken at the position along the line A2-A2 of FIG. 28 so as to illustrate a part of the source bump electrode BPS.

As shown in FIG. 25 to FIG. 28, the bump electrode BP includes the drain bump electrode (drain bump) BPD, the gate bump electrode (gate bump) BPG and the source bump electrode (source bump) BPS. The drain bump electrode BPD is the bump electrode BP formed on the drain conductor layer CNDD, that is, the bump electrode BP formed on the drain pad M3D via the drain conductor layer CNDD. The gate bump electrode BPG is the bump electrode BP formed on the gate conductor layer CNDG, that is, the bump electrode BP formed on the gate pad M3G via the gate conductor layer CNDG. The source bump electrode BPS is the bump electrode BP formed on the source conductor layer CNDS, that is, the bump electrode BP formed on the source pad M3S via the source conductor layer CNDS.

Since the source bump electrode BPS is formed on the LDMOSFET formation region REG1, the source bump electrode BPS is planarly overlapped with at least a part of a plurality of source regions ($n^+$ type source region 45), a plurality of drain regions ($n^+$ type drain region 44) and a plurality of gate electrodes 39 of a plurality of unit LDMOSFETs 50a formed in the LDMOSFET formation region REG1. On the other hand, the drain bump electrode BPD and the gate bump electrode BPG are disposed at the positions not planarly overlapped with the LDMOSFET formation region REG1.

When a plurality of drain bump electrodes BPD are provided, the plurality of drain bump electrodes BPD are formed on each of the plurality of drain pads M3D via the drain conductor layer CNDD. Also, when a plurality of source bump electrodes BPS are provided, the plurality of source bump electrodes BPS are formed on the common (same) source pad M3S disposed so as to be planarly overlapped with the LDMOSFET formation region REG1 via each source conductor layer CNDS, and each of the source bump electrodes BPS is planarly enclosed in the LDMOSFET formation region REG1.

When the LDMOSFET formation region REG1 corresponds to the above-described LDMOSFET formation region REGL1, the source bump electrode BPS, the drain bump electrode BPD and the gate bump electrode BPG correspond to the source bump BPS1, the drain bump BPD1 and the gate bump BPG1, respectively. When the LDMOSFET formation region REG1 corresponds to the above-described LDMOSFET formation region REGL2, the source bump electrode BPS, the drain bump electrode BPD and the gate bump electrode BPG correspond to the source bump BPS2, the drain bump BPD2 and the gate bump BPG2, respectively. When the LDMOSFET formation region REG1 corresponds to the above-described LDMOSFET formation region REGL3, the source bump electrode BPS, the drain bump electrode BPD and the gate bump electrode BPG correspond to the source bump BPS3, the drain bump BPD3 and the gate bump BPG3, respectively. When the LDMOSFET formation region REG1 corresponds to the above-described LDMOSFET formation region REGH1, the source bump electrode BPS, the drain bump electrode BPD and the gate bump electrode BPG correspond to the source bump BPS4, the drain bump BPD4 and the gate bump BPG4, respectively. When the LDMOSFET formation region REG1 corresponds to the above-described LDMOSFET formation region REGH2, the source bump electrode BPS, the drain bump electrode BPD and the gate bump electrode BPG correspond to the source bump BPS5, the drain bump BPD5 and the gate bump BPG5, respectively. When the LDMOSFET formation region REG1 corresponds to the above-described LDMOSFET formation region REGH3, the source bump electrode BPS, the drain bump electrode BPD and the gate bump electrode BPG correspond to the source bump BPS6, the drain bump BPD6 and the gate bump BPG6, respectively. The height T3 of the bump electrode BP (height in the direction vertical to the main surface of the substrate 31 from the upper surface of the insulating film 27 to the top of the bump electrode BP illustrated in FIG. 26) is, for example, about 30 to 50 µm, and this is common to the source bump electrode BPS, the drain bump electrode BPD and the gate bump electrode BPG.

Thereafter, the substrate 31 is cut and separated (divided) into respective semiconductor chips 2 by dicing or the like, but the detail description thereof is omitted here. Also, it is also possible to perform the rear-surface grinding of the substrate 31 before the dicing. Note that the rear-surface electrode (metal electrode layer) is not formed on the main surface of the substrate 31 opposite to the side on which the epitaxial layer 32 is formed (corresponding to the rear surface 2b of the semiconductor chip 2). The divided semiconductor chip 2 is flip-chip mounted on the wiring board 3, thereby manufacturing the power amplifier module 1.

<Semiconductor Chip of First Comparative Example>

FIG. 29 is a cross-sectional view of the principal part of a semiconductor chip 202 of a first comparative example.

FIG. 29 corresponds to FIG. 25 of the present embodiment, and the source pad M3S and the structure below it of the semiconductor chip 202 of the first comparative example shown in FIG. 29 are the same as those of the semiconductor chip 2 of the present embodiment shown in FIG. 25, and therefore, the description thereof is omitted here.

In the semiconductor chip 202 of the first comparative example shown in FIG. 29, different from the present embodiment, the equivalent of the above-described conductor layer CND is not formed after forming the source pad M3S. Also, in the semiconductor chip 202 of the first comparative example, a surface protection resin insulating film PI2 (corresponding to the insulating film PI1 of the present embodiment) is formed so as to cover the source pad M3S as shown in FIG. 29, and a bump opening portion OP2 through which a part of the source pad M3S is exposed is formed in this resin insulating film PI2. Then, as shown in FIG. 29, a UBM film 269 (corresponding to the UBM film 69 of the present embodiment) and a source bump electrode BP202 (corresponding to the source bump electrode PBS of the present embodiment) are formed on the source pad M3S exposed through the bump opening portion OP2.

In general, the bump electrode is directly formed on the pad portion. Therefore, assuming that the source bump electrode is formed in the LDMOSFET formation region REG1, it is conceivable that the source pad M3S is disposed in the LDMOSFET formation region REG1 and the source bump electrode BP202 is directly formed on the source pad M3S like in the semiconductor chip 202 of the first comparative example shown in FIG. 29 without forming the above-described conductor layer CND. However, the studies by the inventors of the present invention have revealed that there is the possibility that the following failures occur in this case.

That is, the probe test is carried out by putting a test probe to a pad portion in general after forming the pad portion and before forming the bump electrode. However, in the case where the source pad M3S is disposed in the LDMOSFET formation region REG1 like in the semiconductor chip 202 of the first comparative example shown in FIG. 29, if a probe is put and pressed to the source pad M3S, the external force by the probe generates the stress on the wiring structure and the above-described plurality of unit LDMOSFETs 50a located below the source pad MS3, and there is the possibility that the wiring structure and the elements are deformed. This probably reduces the reliability of the semiconductor chip 202 to be manufactured.

<Semiconductor Chip of Second Comparative Example>

FIG. 30 is a cross-sectional view of the principal part of a semiconductor chip 302 of a second comparative example.

In FIG. 30, a cross-sectional view corresponding to a part of FIG. 25 in the LDMOSFET formation region REG1 (cross-sectional view of a range denoted by a reference symbol REG1 in FIG. 30) and a cross-sectional view in an external region of the LDMOSFET formation region REG1 (cross-sectional view in a range denoted by a reference symbol REG3 in FIG. 30) in the semiconductor chip 302 of the second comparative example are illustrated alongside.

The source wiring M1S and the structure below it of the semiconductor chip 302 of the second comparative example shown in FIG. 30 are the same as those of the semiconductor chip 2 of the present embodiment shown in FIG. 25, and therefore, the description thereof is omitted here.

In the semiconductor chip 302 of the second comparative example, a source pad M3S302 is disposed in a region REG3 outside the LDMOSFET formation region REG1 as shown in FIG. 30. Therefore, even if the probe test is carried out by putting a test probe to this source pad M3S302 before forming the bump electrode, the deformation and the like of the elements and the wiring structure of the LDMOSFET formation region REG1 are less likely to occur.

However, in the semiconductor chip 302 of the second comparative example, in order to dispose the source bump electrode BP302 on the LDMOSFET formation region REG1, the source pad M3S302 of the region REG3 outside the LDMOSFET formation region REG1 is led out to the position on the LDMOSFET formation region REG1 by a rewiring 366 by using the so-called rewiring technique. Then, the source bump electrode BP302 is disposed on a part of the rewiring 366 on the LDMOSFET formation region REG1.

More specifically, in the region REG3 outside the LDMOSFET formation region REG1, the rewiring 366 is formed on a resin film PI3 so as to be in contact with and electrically connected to the source pad M3S302 at the bottom of an opening portion 362 formed in a stacked film of an insulating film IL such as silicon nitride and the resin film (resin insulating film) PI3, and the rewiring 366 is extended to the position on the LDMOSFET formation region REG1. This rewiring 366 is made of a stacked film of a seed film 363 such as a chromium (Cr) film functioning as a plating electrode, a copper (Cu) film 364 formed on the seed film 363 by the plating method and a nickel (Ni) film 365 formed on the copper film 64 by the plating method. Then, on the LDMOSFET formation region REG1, a source bump opening portion OP3 (opening for source bump) is provided in an uppermost-layer resin insulating film PI4 for surface protection of the semiconductor chip 302, and the UBM film 369 and the source bump electrode BP302 are formed on a part of the rewiring 366 exposed through the opening portion OP3.

In the case where the source pad M3S302 is disposed in the region REG3 outside the LDMOSFET formation region REG1 and the source bump electrode BP302 is disposed on the LDMOSFET formation region REG1 like in the semiconductor chip 302 of the second comparative example shown in FIG. 30, the extension distance of the rewiring 366 connecting them is elongated, and most part of the rewiring 366 (other than the part in contact with the source pad M3S302) is located on the resin film PI3. The reason for providing the resin film PI3 is that the adhesiveness between the rewiring 366 and the insulating film IL is insufficient and the protection from the stress in the formation of the rewiring 366 by the plating method is necessary. Therefore, the heat generated in the plurality of unit LDMOSFETs 50a in the LDMOSFET formation region REG1 is transmitted to the source bump electrode BP302 on the LDMOSFET formation region REG1 through the resin film PI3, but the heat conductivity of the resin film PI3 made of polyimide resin or the like is extremely low. Accordingly, when attempting to dissipate the heat generated in the plurality of unit LDMOSFETs 50a in the LDMOSFET formation region REG1 to the wiring board 3 from the source bump electrode BP302, the resin film PI3 with low heat conductivity interferes and the heat dissipation properties are lowered. The same goes for the case where the source pad M3S302 is provided in the same layer as the source wiring M2S in FIG. 30 (in this case, the insulating film 57 can be omitted).

<Feature of Semiconductor Chip of Present Embodiment>

As described above, in the semiconductor chip 2 of the present embodiment, out of the source bump electrode BPS, the drain bump electrode BPD and the gate bump electrode BPG of the LDMOSFET element (LDMOSFET element made up by connecting a plurality of unit LDMOSFETs 50a in parallel) formed in the LDMOSFET formation region REG1, the source bump electrode BPS is disposed on the LDMOSFET formation region REG1. By this means, the properties of the semiconductor chip 2, in particular, the heat dissipation properties can be improved, and as a result, the performance (properties) of the power amplifier module 1, in particular, the heat dissipation properties can be improved.

Further, in the semiconductor chip 2 of the present embodiment, the source pad M3S is disposed so as to be planarly overlapped with the LDMOSFET formation region REG1, and in the region on the LDMOSFET formation region REG1, the source bump electrode BPS is formed (disposed) on the source pad M3S via the source conductor layer CNDS thicker than the source pad M3S. Also, the drain pad M3D is disposed on the region outside the LDMOSFET formation region REG1 though it is in the vicinity of the LDMOSFET formation region REG1, and the drain bump electrode BPD is formed (disposed) on the drain pad M3D via the drain conductor layer CNDD thicker than the drain pad M3D. Further, the gate pad M3G is disposed on the region outside the LDMOSFET formation region REG1 though it is in the vicinity of the LDMOSFET formation region REG1, and the gate bump electrode BPG is formed (disposed) on the gate pad M3G via the gate conductor layer CNDG thicker than the gate pad M3G.

More specifically, on the LDMOSFET formation region REG1, the source pad M3S, the source conductor layer CNDS and the source bump electrode BPS (including the UBM film 69) are stacked in this order from below as shown in FIG. 25. Also, on the region outside the LDMOSFET formation region REG1 though it is in the vicinity of the LDMOSFET formation region REG1, the drain pad M3D, the drain conductor layer CNDD and the drain bump electrode BPD (including the UBM film 69) are stacked in this order from below as shown in FIG. 26. Further, on the region outside the LDMOSFET formation region REG1 though it is in the vicinity of the LDMOSFET formation region REG1, the gate pad M3G, the gate conductor layer CNDG and the gate bump electrode BPG (including the UBM film 69) are stacked in this order from below as shown in FIG. 27.

Therefore, in the present embodiment, the probe test carried out before forming the bump electrode BP can be carried out at the process stage of FIG. 24, that is, at the stage where a plurality of opening portions OP are formed in the insulating film PI1 to expose each part of the source conductor layer CNDS, the drain conductor layer CNDD and the gate conductor layer CNDG through the opening portions OP (stage before forming the UBM film 69 and the bump electrode BP).

FIG. 31 is a cross-sectional view of the principal part in the manufacturing process of a semiconductor device (corresponding to the semiconductor chip 2) of the present embodiment, and it schematically shows the state of carrying out the probe test process after the steps up to FIG. 24 have been performed and before the step of FIG. 25 (step of forming the UBM film 69 and the bump electrode BP) is performed.

In the present embodiment, the probe test process is carried out by bringing a probe PRB into contact with the source conductor layer CNDS, the drain conductor layer CNDD and the gate conductor layer CNDG on the source pad M3S, the drain pad M3D and the gate pad M3G. FIG. 31 schematically shows the state in which the probe PRE is brought into contact with the source conductor layer CNDS.

Note that the probe test means the process for testing the electrical properties of the semiconductor device by putting a probe before dicing (cutting) the semiconductor wafer (here, corresponding to the substrate 31), and the probe PRE is put to the source pads M3S and M3S302 in the case of the semiconductor chips 202 and 302 of the first and second comparative examples, but the probe PRB is put on the source conductor layer CNDS on the source pad M3S in the present embodiment.

The probe PRB put on the source conductor layer CNDS is pressed in the direction shown by the arrow 70 in FIG. 31. When the probe PRB is put to the region on the LDMOSFET formation region REG1, as described in relation to the semiconductor chip 202 of the first comparative example of FIG. 29, there is the possibility that the external force by the probe PRB gives the stress to the wiring structure and the elements on the LDMOSFET formation region REG1 and deforms them.

Meanwhile, in the present embodiment, the source pad M3S is disposed on the LDMOSFET formation region REG1, but the source bump electrode BPS is formed (disposed) on this source pad M3S via the source conductor layer CNDS thicker than the source pad M3S. Therefore, even if the source pad M3S is disposed on the LDMOSFET formation region REG1, the probe test can be carried out by putting the probe PRB to the source conductor layer CNDS thicker than the source pad M3S, and this thick source conductor layer CNDS suppresses (mitigates) the external force (pressure, impact) of the probe PRB and the stress caused thereby from acting on the wiring structure and the elements below the source pad M3S.

More specifically, because of the presence of the thick source conductor layer CNDS in the present embodiment, the thick source conductor layer CNDS can absorb or mitigate the external force of the probe PRB, and therefore, it is possible to suppress the stress from acting on the wiring structure and the elements below the source pad M3S compared with the case of bringing the probe into direct contact with the source pad M3S without providing the source conductor layer CNDS like in the semiconductor chip 202 of the first comparative example shown in FIG. 29. Therefore, the deformation of the wiring structure on the LDMOSFET formation region REG1 and the LDMOSFET element formed in the LDMOSFET formation region REG1 can be suppressed or prevented, and the reliability of the semiconductor chip 2 to be manufactured can be improved.

Therefore, in the present embodiment, in order to enable the source conductor layer CNDS to absorb (mitigate) the external force of the probe PRE, the thickness T2 of the source conductor layer CNDS is preferably larger than the thickness T1 of the source pad M3S (T2>T1). Here, the thicknesses T2 of the source conductor layer CNDS, the drain conductor layer CNDD and the gate conductor layer CNDG are almost equal to each other, and the thicknesses T1 of the source pad M3S, the drain pad M3D and the gate pad M3G are almost equal to each other. Accordingly, the thickness T2 of the source conductor layer CNDS is set larger than the thickness T1 of the source pad M3S, the thickness. T2 of the drain conductor layer CNDD is set larger than the thickness T1 of the drain pad M3D, and the thickness T2 of the gate conductor layer CNDG is set larger than the thickness T1 of the gate pad M3G. The thickness T1 of the source pad M3S is preferably about 2 μm, and the thickness T2 of the source conductor layer CNDS is preferably about 6 μm. Further, since the thickness T2 of the source conductor layer CNDS is mainly occupied by the thickness of the copper film 64, the thickness of the copper film 64 is preferably about 4 μm.

Note that the thicknesses T1 and T2 are shown in FIG. 23 and FIG. 25 to FIG. 27. The thickness T2 of the source conductor layer CNDS and the thickness T1 of the source pad M3S mentioned here indicate the thicknesses in the region directly below the source bump electrode BPS, the thickness T2 of the drain conductor layer CNDD and the thickness T1 of the drain pad M3D mentioned here indicate the thicknesses in the region directly below the drain bump electrode BPD, and the thickness T2 of the gate conductor layer CNDG and the thickness T1 of the gate pad M3G mentioned here indicate the thicknesses in the region directly below the gate bump electrode BPG.

Also, as described in relation to the semiconductor chip 302 of the second comparative example of FIG. 30, if a resin film is present below the source conductor layer ENDS in the region directly below the source bump electrode BPS, the heat resistance from the plurality of unit LDMOSFETs 50*a* formed in the LDMOSFET formation region REG1 to the source bump electrode BPS is increased.

Contrary to this, as is apparent from FIG. 25 to FIG. 27, not only the insulating film PI1 as a resin film but other resin films are not formed between the source pad M3S and the source conductor layer CNDS, between the drain pad M3D and the drain conductor layer CNDD, and between the gate pad M3G and the gate conductor layer CNDG in the present embodiment.

More specifically, since both the source conductor layer CNDS and the source pad M3S planarly enclose the source bump electrode BPS, the stacked structure of the source conductor layer CNDS and the source pad M3S below it is present in the region directly below the source bump electrode BPS (including the UBM film 69). Further therebelow, the multilayer wiring structure including the source wirings M2S and M1S, the drain wirings M2D and M1D and the interlayer insulating films (57, 54, 51) and the plurality of gate electrodes 39, the plurality of source regions and the plurality of drain regions of the plurality of unit LDMOSFETs 50*a* are present. Also, it is more preferable if the opening portion 62S planarly encloses the source bump electrode BPS, and by this means, the portion in which the insulating film 61 is interposed between the source conductor layer CNDS and the source pad M3S is present in the region outside the region directly below the source bump electrode BPS as shown in FIG. 25 and not only the resin film but the insulating film is not interposed between the source conductor layer CNDS and the source pad M3S in the region directly below the source bump electrode BPS. As a result, the heat resistance between the source bump electrode BPS and the source pad M3S can be further reduced.

Therefore, the heat generated in the plurality of unit LDMOSFETs 50*a* formed in the LDMOSFET formation region REG1 is transmitted to the source pad M3S on the LDMOSFET formation region REG1 through the wiring structure on the LDMOSFET formation region REG1 and further to the source bump electrode BPS through the source conductor layer CNDS. Since no resin film is interposed in the heat conduction path in the vertical direction from the source bump electrode BPS to the source pad M3S through the source conductor layer CNDS in the region planarly overlapped with the source bump electrode BPS, the heat resistance from the source pad M3S to the source bump electrode BPS can be reduced. Further, since not only the source bump electrode BPS but the source pad M3S is disposed on the LDMOSFET formation region REG1, the source wirings M2S and M1S, the drain wirings M2D and M1D, the plugs 59, 56 and 53 and others are interposed between the source pad M3S and the plurality of unit LDMOSFETs 50*a* formed in the LDMOSFET formation region REG1 directly below it. Therefore, it is possible to reduce the heat resistance from the plurality of unit LDMOSFETs 50*a* formed in the LDMOS-FET formation region REG1 to the source pad M3S.

Therefore, the heat generated in the plurality of unit LDMOSFETs 50*a* formed in the LDMOSFET formation region REG1 can be efficiently conducted to the source bump electrode BPS formed on the LDMOSFET formation region REG1 and can be efficiently dissipated to the wiring board 3 from the source bump electrode BPS.

Also, though the drain bump electrode BPD and the gate bump electrode BPG do not affect the heat dissipation properties of the semiconductor chip 2 so much as the source bump electrode BPS, since the drain bump electrode BPD and the gate bump electrode BPG are also formed in the same process as the source bump electrode BPS, they preferably have the same structure. More specifically, since both the drain conductor layer CNDD and the drain pad M3D planarly enclose the drain bump electrode BPD, the stacked structure of the drain conductor layer CNDD and the drain pad M3D below it is present in the region directly below the drain bump electrode BPD (including the UBM film 69) as shown in FIG. 26. Also, preferably, the opening portion 62D planarly encloses the drain bump electrode BPD, whereby not only the resin film but also the insulating film is not interposed between the drain conductor layer CNDD and the drain pad M3D in the region directly below the drain bump electrode BPD. Further, since both the gate conductor layer CNDG and the gate pad M3G planarly enclose the gate bump electrode BPG, the stacked structure of the gate conductor layer CNDG and the gate pad M3G below it is present in the region directly below the gate bump electrode BPG (including the UBM film 69) as shown in FIG. 27. Also, preferably, the opening portion 62G planarly encloses the gate bump electrode BPG, whereby not only the resin film but also the insulating film is not interposed between the gate conductor layer CNDG and the gate pad M3G in the region directly below the gate bump electrode BPG.

In the semiconductor chip 2 of the present embodiment, the resin film (resin material film) is the insulating film PI1 serving as the uppermost-layer protection film. This resin film (insulating film PI1) is formed so as to cover the source conductor layer CNDS, the drain conductor layer CNDD, the gate conductor layer CNDG, the source pad M3S, the drain pad M3D and the gate pad M3G in the portion where the source bump electrode BPS, the drain bump electrode BPD and the gate bump electrode BPG are not disposed. However, this resin film (that is, insulating film PI1) is not interposed (not formed) between the source pad M3S and the source conductor layer CNDS, between the drain pad M3D and the drain conductor layer CNDD and between the gate pad M3G and the gate conductor layer CNDG.

The insulating film PI1 serving as the uppermost-layer protection film is preferably a resin film in view of the protection and handling easiness of the semiconductor chip 2, but it is preferable that the insulating films 51, 54, 57 and 61 other than the insulating film PI1 are not made of a resin material in view of the heat dissipation properties. In this manner, not only the insulating film PI1 as a resin film but also other resin film is not present in any of the region directly below the source bump electrode BPS, the drain bump electrode BPD and the gate bump electrode BPG, the region directly below the source conductor layer CNDS, the drain conductor layer CNDD and the gate conductor layer CNDG, and the region directly below the source pad M3S, the drain pad M3D and the gate pad M3G on the substrate 31.

Further, at the bottoms of the opening portions 62S, 62D and 62G, the source conductor layer CNDS, the drain conductor layer CNDD and the gate conductor layer CNDG adhere tightly to the source pad M3S, the drain pad M3D and the gate pad M3G, and the adhesion areas thereof correspond to the areas of the opening portions 62S, 62D and 62G. When the adhesion areas are increased, the exfoliation prevention effect of the source conductor layer CNDS, the drain conductor layer CNDD and the gate conductor layer CNDG is improved. Therefore, when the opening portions 62S, 62D and 62G are formed to have the planar shape planarly enclosing the source bump electrode BPS, the drain bump electrode BPD and the gate bump electrode BPG, respectively, the adhesion areas can be increased and the exfoliation of the source conductor layer CNDS, the drain conductor layer CNDD and the gate conductor layer CNDG can be accurately prevented.

Also, in the semiconductor chip 202 of the first comparative example shown in FIG. 29, it is conceivable that the external force of the probe PRB when the probe PRB is brought into contact with the source pad M3S in the probe test is absorbed (mitigated) by the source pad M3S itself by increasing the thickness of the source pad M3S, for example, by increasing the thickness of the source pad M3S to the thickness corresponding to the sum of the thicknesses T1 and T2. However, in the case where the thickness of the source pad M3S itself is increased without providing the source conductor layer CNDS, the property variation of a single element (for example, inductor element formed of the wiring M3) using the wiring M3 (wiring in the same layer as the source pad M3S) or the wiring rule (wiring pitch rule) of the wiring M3 has to be reexamined, and there is the possibility that the failure of the increase in chip size occurs.

Meanwhile, in the present embodiment, the source conductor layer CNDS is formed on the source pad M3S and the external force of the probe PRB can be suppressed (mitigated) by this source conductor layer CNDS, and therefore, the above-described failure does not occur.

Also, the source conductor layer CNDS, the drain conductor layer CNDD and the gate conductor layer CNDG (that is, conductor layer CND) are mainly made of copper (Cu). More specifically, the main conductor film of the conductor layer CND is made of the copper film 64 and the thickness of the copper film 64 is made larger than the thicknesses of the seed film 63 and the nickel film 65. In other words, over the half of the conductor layer CND is made of the copper film 64. Accordingly, since copper with good heat conductivity is used, the advantage of the reduction of the heat resistance can be obtained.

<Configuration of Wiring Board>

The configuration of the wiring board 3 of the present embodiment, in particular, the vias VH1, VH2 and VH3 in the wiring board 3 will be described in more detail.

FIG. 32 is a cross-sectional view of the principal part of the wiring board 3 used in the power amplifier module 1 of the present embodiment. FIG. 32 mainly shows a cross section across the source vias VH2S, VH1S and VH3S connected to the source bump electrode BPS of the semiconductor chip 2. FIG. 33 is a cross-sectional view of the principal part schematically showing the state just before mounting the semiconductor chip 2 on the wiring board 3, and FIG. 34 is a cross-sectional view of the principal part showing the state where the semiconductor chip 2 is flip-chip mounted on the wiring board 3. Therefore, although FIG. 34 corresponds to the cross-sectional view of the principal part of the power amplifier module 1, the sealing resin 7 is not illustrated in FIG. 34. FIG. 35 is a plan view of the principal part of the semiconductor chip 2 which is mounted on the wiring board 3, in which the region corresponding to FIG. 28 is shown, the layout of the source bump electrode BPS, the drain bump electrode BPD and the gate bump electrode BPG is shown by solid lines, and the LDMOSFET formation region REG1 is shown by broken lines. Note that, although FIG. 35 is a plan view, hatching of diagonal lines is used for the source bump electrode BPS, the drain bump electrode BPD and the gate bump electrode BPG so as to make the drawings easily understood. The cross-sectional views of FIG. 32 to FIG. 34 correspond to the cross section taken along the line A3-A3 of FIG. 35 when the semiconductor chip 2 is flip-chip mounted on the wiring board 3. Also, in FIG. 33 and FIG. 34 and FIG. 44 to FIG. 47 and FIG. 49 described later, the position (region, range) corresponding to the LDMOSFET formation region REG1 is schematically shown by broken lines so as to make the positional relation of the LDMOSFET formation region REG1 and the source bump electrode BPS in the semiconductor chip 2 easily understood.

The wiring board 3 used in the present embodiment is a multilayer wiring board, and as described above, it includes the core layer CR1, the prepreg layer PP1 disposed on the upper surface side of the core layer CR1 and the prepreg layer PP2 disposed on the lower surface side of the core layer CR1 as the insulating layers making up the multilayer wiring board. The wiring board 3 further includes the conductor layer 73 on the upper surface of the prepreg layer PP1, the conductor layer 72 between the core layer CR1 and the prepreg layer PP1, the conductor layer 73 between the core layer CR1 and the prepreg layer PP2, and the conductor layer 74 on the lower surface side of the prepreg layer PP2. FIG. 32 shows the case where the wiring board 3 is the so-called four-layer board in which a total of four conductor layers (that is, conductor layers 71, 72, 73 and 74) are formed each between the three insulating layers (that is, the core layer CR1 and the prepreg layers PP1 and PP1) and on the upper and lower surfaces of the three insulating layers. The core layer CR1 is made of, for example, a resin layer (resin material layer) containing glass woven fabric, and epoxy resin or the like can be used as the resin material. The prepreg layers PP1 and PP2 are resin layers, but they may be the resin layers containing glass woven fabric as a reinforcement material, and epoxy resin or the like can be used as the resin material. The conductor layers 71, 72, 73 and 74 are, for example, copper (Cu) layers. As an example of the thickness of each layer, the core layer CR1 can be about 100 μm, each of the prepreg layers PP1 and PP2 can be about 60 μm, and each of the conductor layers 71, 72, 73 and 74 can be about 20 to 30 μm.

The conductor layers 71, 72, 73 and 74 are patterned into predetermined patterns. The conductor layer 71 on the prepreg layer PP1 is the uppermost conductor layer 71 of the wiring board 3, and this conductor layer 71 forms the land LP, the wiring pattern WP and the chip-mounting conductor pattern 11. Further, the conductor layer 74 on the lower surface of the prepreg layer PP2 is the lowermost conductor layer 74 of the wiring board 3, and this conductor layer 74 forms the rear-surface terminals TE1 and TE2.

Furthermore, the wiring board 3 includes the solder resist layer SR1 formed on the upper surface of the prepreg layer PP1 and the solder resist layer SR2 formed on the lower surface of the prepreg layer PP2. Note that the solder resist layer SR1 is formed on the upper surface of the prepreg layer PP1 so that the land LP and the chip-mounting conductor pattern 11 are exposed (through the opening portion of the solder resist layer SR1) and the wiring pattern WP is covered with the solder resist layer SR1. Also, the solder resist layer SR2 is formed on the lower surface of the prepreg layer PP2 so that the rear-surface terminals TE1 and TE2 are exposed without being covered with the solder resist layer SR2.

Also, the plurality of vias (via hole) VH1 for electrically connecting the conductor layer 72 and the conductor layer 73 are formed in the core layer CR1. The via VH1 is made up of a hole (penetration hole, opening portion, through hole) formed in the core layer CR1 and a conductor film or a conductor portion formed so as to fill the inside of the hole. The conductor film or the conductor portion making up the via VH1 electrically connects the upper and lower conductor layers 72 and 73 inside the wiring board 3. The conductor film or the conductor portion making up the via VH1 is made of a plating film such as a copper plating film.

The via VH1 formed in the core layer CR1 is a via which connects the conductor layers (wiring layers) inside the wiring board 3, in this case, the conductor layer 72 and the conductor layer 73, and it is the so-called inner via hole. The via VH1 as the inner via hole does not reach (the conductor layers 71 and 74 of) the upper surface 3a and the lower surface 3b of the wiring board 3.

Also, the plurality of vias (via hole) VH2 for electrically connecting the conductor layer 71 and the conductor layer 72 are formed in the prepreg layer PP1. Each of the vias VH2 is made up of a hole (penetration hole, opening portion, through hole) formed in the prepreg layer PP1 and a conductor film or a conductor portion formed so as to fill the inside of the hole. The conductor film or the conductor portion making up the via VH2 electrically connects the upper and lower conductor layers 71 and 72. The conductor film or the conductor portion making up the via VH2 is made of a plating film such as a copper plating film.

The via VH2 formed in the prepreg layer PP1 is a via which connects the conductor layer (uppermost conductor layer out of the plurality of conductor layers making up the wiring board 3, conductor layer 71 in this case) formed on the upper surface of the wiring board 3 and the conductor layer just below it (conductor layer 72 in this case), and it is the so-called blind via hole. An upper end of the via VH2 as the blind via hole reaches (the conductor layer 71 of) the upper surface 3a of the wiring board 3, and a lower end thereof does not reach (the conductor layer 74 of) the lower surface 3b of the wiring board 3 and terminates (at the conductor layer 72) inside the wiring board 3.

Also, the plurality of vias (via hole) VH3 for electrically connecting the conductor layer 73 and the conductor layer 74 are formed in the prepreg layer PP2. Each of the vias VH3 is made up of a hole (penetration hole, opening portion, through hole) formed in the prepreg layer PP2 and a conductor film or a conductor portion formed so as to fill the inside of the hole. The conductor film or the conductor portion making up the via VH3 electrically connects the upper and lower conductor layers 73 and 74. The conductor film or the conductor portion making up the via VH3 is made of a plating film such as a copper plating film.

The via VH3 formed in the prepreg layer PP2 is a via which connects the conductor layer (lowermost conductor layer out of the plurality of conductor layers making up the wiring board 3, conductor layer 74 in this case) formed on the lower surface of the wiring board 3 and the conductor layer just above it (conductor layer 73 in this case), and it is the so-called blind via hole. A lower end of the via VH3 as the blind via hole reaches (the conductor layer 74 of) the lower surface 3b of the wiring board 3, and an upper end thereof does not reach (the conductor layer 71 of) the upper surface 3a of the wiring board 3 and terminates (at the conductor layer 73) inside the wiring board 3.

Note that the inner via hole means the via which connects the conductor layers inside the multilayer wiring board, and the blind via hole means the via which connects the conductor layer on an upper or lower surface of the multilayer wiring board and the conductor layer inside the multilayer wiring board.

The land LP of the wiring board 3 includes the land LP to which the bump electrode BP of the semiconductor chip 2 is connected, the land LP to which the bonding wire 14 is connected, the land LP to which the electrode of the passive component 5 is connected, and the land LP to which the bump electrode 15 of the integrated passive component 6 is connected. The land LP to which the bump electrode BP of the semiconductor chip 2 is connected includes the land LP to which the source bump electrode BPS is connected, the land LD to which the drain bump electrode BPD is connected, and the land LP to which the gate bump electrode BPG is connected. Of these, the land LP to which the source bump electrode BPS of the semiconductor chip 2 is connected is denoted by the reference symbol LPS and referred to as the source land LPS, and the land LP to which the drain bump electrode BPD of the semiconductor chip 2 is connected is denoted by the reference symbol LPD and referred to as the drain land LPD. FIG. 32 shows these source land LPS and drain land LPD.

As shown in FIG. 32, a drain land conductor pattern (land pattern, conductor layer portion, conductor pattern) 71D, which is a part of the patterned conductor layer 71, is exposed through the opening portion of the solder resist SR1, thereby forming each of the drain lands LPD. In the region covered with the solder resist layer SR1, an end of the wiring WP made of a part of the patterned conductor layer 71 is integrally coupled (connected) to the drain land conductor pattern 71D. The drain land LPD is led out to the outside of the mounting region of the semiconductor chip 2 (region located below the semiconductor chip 2 when the semiconductor chip 2 is flip-chip mounted on the wiring board 3) through this wiring WP.

As shown in FIG. 32, a source land conductor pattern (land pattern, conductor layer portion, conductor pattern) 71S, which is a part of the patterned conductor layer 71, is exposed through the opening portion of the solder resist SR1, thereby forming each of the source lands LPS. FIG. 32 illustrates the case where the source land conductor patterns 71S making up each of the source lands LPS are isolated patterns separated from each other.

FIG. 36 is a cross-sectional view of the principal part showing a first modification example (another embodiment) of the wiring board 3 of the present embodiment, and it corresponds to FIG. 32. Since the source bump electrodes BPS are set to be equipotential (ground potential), the source land conductor patterns 71S making up each of the source lands LPS are set to be equipotential. Therefore, as shown in FIG. 36, the source land conductor patterns 71S making up each of the source lands LPS can be integrally coupled (connected) in the region covered with the solder resist layer SR1, and in this case, a plurality of opening portions of the solder resist layer SR1 are provided on the integrated source land conductor pattern and the plurality of source lands LPS are formed from the same source land conductor pattern exposed through each of the opening portions.

<Feature of Wiring Board>

Next, the feature of the wiring board 3 of the present embodiment will be described in relation to the heat dissipation path in the wiring board 3 for the heat conducted from the source bump electrode BPS to the wiring board 3.

In the present embodiment, the heat generated in the LDMOSFET element in the LDMOSFET formation region REG1 of the semiconductor chip 2 is dissipated to the wiring board 3 through the source bump electrode BPS, and the heat is further conducted to the lower surface 3b of the wiring board 3 and dissipated to the outside of the power amplifier module 1 from the lower surface 3b of the wiring board 3. Therefore, as shown in FIG. 32 and others, in the wiring board 3, each of the source lands LPS (source land conductor pattern 71S) is electrically connected to the rear-surface terminal TE2 formed on the lower surface 3b of the wiring board 3 and also thermally connected thereto through the source via VH2S, the conductor layer 72, the source via VH1S, the conductor layer 73 and the source via VH3S.

Note that the source via VH2S is the via VH2 formed in the prepreg layer PP1 and is the via VH2 electrically connected to the source land LPS (source land conductor pattern 71S). Also, the source via VH1S is the via VH1 formed in the core layer CR1 and is the via VH1 electrically connected to the source via VH2S. Further, the source via VH3S is the via VH3 formed in the prepreg layer PP2 and is the via VH3 electrically connected to the source via VH1S.

In the present embodiment, as shown in FIG. 33 to FIG. 35, the plurality of source bump electrodes BPS are formed for (the LDMOSFET element formed in) the same LDMOSFET formation region REG1 of the semiconductor chip 2, and the plurality of source bump electrodes BPS are electrically and mechanically connected to the plurality of source lands LPS of the wiring board 3, respectively. Further, the drain bump electrodes BPD and the gate bump electrodes BPG are also formed for (the LDMOSFET element formed in) the same LDMOSFET formation region REG1 of the semiconductor chip 2, and the drain bump electrodes BPD and the gate bump electrodes BPG are electrically and mechanically connected to the drain lands LPD and the gate lands (gate lands are not illustrated in FIG. 32 to FIG. 34) of the wiring board 3, respectively.

When the bump electrode BP is the solder bump, the solders making up the source bump electrode BPS, the drain bump electrode BPD and the gate bump electrode BPG are wet-spread, are joined to the source land LPS, the drain land LPD and the gate land LPG by the solder reflow process, respectively, and are electrically and mechanically connected thereto.

Then, in the wiring board 3 of the present embodiment, the plurality of source vias VH2S are disposed (directly) below the plurality of source lands LPS (that is, the plurality of source lands LPS to which the plurality of source bumps BPS are joined) and are electrically connected to the plurality of source lands LPS, respectively. Also, the plurality of source vias VH1S are disposed (directly) below the plurality of source vias VH2 and are electrically connected to the plurality of source vias VH2, respectively. Further, the plurality of source vias VH3S are disposed (directly) below the plurality of source vias VH1 and are electrically connected to the plurality of source vias VH1, respectively.

More specifically, the plurality of source vias VH2S, the plurality of source vias VH1S and the plurality of source vias VH3S are respectively disposed on the same straight lines orthogonal to the upper surface 3a of the wiring board 3 (vertically arranged). Therefore, in the power amplifier module 1 in which the semiconductor chip 2 is flip-chip mounted on the wiring board 3, the plurality of source lands LPS, the plurality of source vias VH2S, the plurality of source vias VH1S and the plurality of source vias VH3S are vertically arranged below (directly below) the plurality of source bump electrodes BPS of the semiconductor chip 2 so as to be located on the straight lines orthogonal to the upper surface 3a of the wiring board 3, respectively.

The electrical connection between the source via VH2S and the source via VH1S directly below it is made by the conductor layer or the conductor portion in each hole making up the source via VH2S and the source via VH1S and the conductor layer 72 interposed between the source vias VH2S and the VH1S. The electrical connection between the source via VH1S and the source via VH3S directly below it is made by the conductor layer or the conductor portion in each hole making up the source via VH1S and the source via VH3S and the conductor layer 73 interposed between the source vias VH1S and the VH3S. Also, in order that the source vias VH2S, VH1S and VH3S are vertically arranged surely on the straight line orthogonal to the upper surface 3a of the wiring board 3 below each source land LPS, the source land LPS is preferably formed to have a diameter lager than that of the via VH2 so that each source land LPS planarly encloses each via VH2 disposed below it.

As can be seen from FIG. 4 and FIG. 5, in the wiring board 3, the rear-surface terminal TE2 is present below the mounting region of the semiconductor chip 2, and this rear-surface terminal TE2 is formed so as to include all of the region located directly below the semiconductor chip 2 in the lower surface 3b of the wiring board 3. More specifically, when viewed in the plane parallel to the upper surface 3a of the wiring board 3, the rear-surface terminal TE2 is formed with a pattern larger in area than the semiconductor chip 2 on the rear surface 3b of the wiring board 3 so as to planarly enclose the semiconductor chip 2.

Therefore, the rear-surface terminal TE2 made of the conductor layer 74 is present below the source via VH3S, and the source via VH3S is electrically connected to this rear-surface terminal TE2. Accordingly, each of the source bump electrodes BPS is electrically and thermally connected through the straight shortest path to the rear-surface terminal TE2 on the lower surface 3b of the wiring board 3 through the source land LPS, the source via VH2S, the source via VH1S and the source via VH3S vertically arranged on the same straight line orthogonal to the upper surface 3a of the wiring board 3. By this means, not only the source bump electrode BPS of the semiconductor chip 2 is electrically connected to the rear-surface terminal TE2 on the lower surface 3b of the wiring board 3, but the heat generated in the LDMOSFET element in the LDMOSFET formation region REG1 of the semiconductor chip 2 can be efficiently conducted to the rear-surface terminal TE2 on the lower surface 3b of the wiring board 3 from the source bump electrode BPS through the source land LPS and the source vias VH2S, VH2S and VH3S and can be dissipated therefrom. Note that, since the rear-surface terminal TE2 of the wiring board 3 is electrically connected to the source bump electrode BPS of the semiconductor chip 2 through the source vias VH3S, VH1S and VH2S, the rear-surface terminal TE2 can be regarded as a source terminal.

<Wiring Board of Comparative Example>

FIG. 37 is a cross-sectional view of the principal part of the wiring board 203 of the first comparative example and FIG. 38 is a cross-sectional view of the principal part of the wiring board 303 of the second comparative example, and each corresponds to FIG. 32 of the present embodiment described above.

The wiring board 203 of the first comparative example shown in FIG. 37 is a multilayer wiring board including three insulating layers 203c, 203d and 203e and conductor layers formed between the insulating layers 203c, 203d and 203e, on the insulating layer 203c and below the insulating layer 203e. The conductor layers between the insulating layers 203c, 203d and 203e are not shown in FIG. 37, but the source land LPS 203 and the drain land LPD are formed of the conductor layer on the insulating layer 203c and the rear-surface terminal TE2 is formed of the conductor layer below the insulating layer 203e. The source land LPS203, the drain land LPD203 and the rear-surface terminal TE203 correspond to the source land LPS, the drain land LPD and the rear-surface terminal TE2 of the present embodiment, respectively.

In the wiring board 203 of the first comparative example shown in FIG. 37, different from the present embodiment, a penetration via VH203 penetrating through the entire wiring board 203 is formed as a thermal via below the source land LPS. In the penetration via VH203, a conductor film is formed on a sidewall of a hole penetrating through the entire wiring board 203. More specifically, the penetration via VH203 is provided so as to entirely penetrate through the insulating layers 203c, 203d and 203e making up the wiring board 203, and the source land LPS203 on the upper surface of the wiring board 203 and the rear-surface terminal TE2 on the lower surface of the wiring board 203 are electrically and thermally connected through the penetration via VH203.

When the penetration via VH203 penetrating through the entire wiring board 203 is formed, the hole of the penetration via VH203 has to be formed in the entire insulating layers 203c, 203d and 203e. Therefore, the hole is formed by drill in general. However, the formation of hole by drill is inferior in the positional accuracy of the hole. Therefore, the dimensions of the lands and the interval therebetween in the wiring board 203 have to be increased to some extent in the light of the low positional accuracy of the penetration via VH203.

However, when the chip area of the semiconductor chip 2 is reduced for the purpose of reducing the area and cost of the power amplifier module 1, the arrangement intervals of the bump electrodes BP in the semiconductor chip 2 are narrowed. The above-described increase of the dimensions and intervals of the lands in the wiring board 203 in consideration of the low positional accuracy of the penetration via VH203 is disadvantageous for the reduction in the area of the semiconductor chip 2, and it imposes a severe restriction on the chip design including the arrangement position of the bump electrode BP in the semiconductor chip 2.

In particular, in the case where the source bump electrode BPS is disposed on the TDMOSFET formation region REG1 like in the present embodiment, the interval between the source bump electrode BPS and the drain bump electrode BPD is shortened compared with the case where the source bump electrode BPS is disposed on the region outside the LDMOSFET formation region. No electrical problem arises even when the source bump electrodes BPS or the drain bump electrodes BPD are short-circuited, but since the short-circuit between the source bump electrode BPS and the drain bump electrode BPD causes an electrical problem, the short-circuit therebetween has to be prevented without fail. However, in the wiring board 203 of the first comparative example, since the positional accuracy of the penetration via VH203 is low, the dimensions of the conductor pattern for the source land LPS203 have to be enlarged. Therefore, it is necessary to increase the pitch (distance between centers) between the source land LPS203 and the drain land LPD203. Accordingly, when the semiconductor chip 2 of the present embodiment is to be flip-chip mounted on the wiring board 203 of the first comparative example, the drain bump electrode BPD has to be kept away from the LDMOSFET formation region REG1 because the source bump electrode BPS is disposed on the LDMOSFET formation region REG1. This probably leads to the increase in area of the semiconductor chip 2.

The hole positional accuracy of the hole formation by the laser and the hole formation using the photolithography is high compared with the hole formation by drill. However, it is difficult to apply the laser technique and the etching technique using the photolithography to the hole formation for the penetration via VH203 in the wiring board 203. This is because the total thickness of the wiring board is usually 0.3 to 0.4 mm in general and it is difficult to penetrate through this thickness by the laser and others.

The wiring board 303 of the second comparative example shown in FIG. 38 is the same as the wiring board 3 of the present embodiment in that it is made up of the core layer CR1, the prepreg layers PP1 and PP2, the conductor layers 71, 72, 73 and 74, and the solder resist layers SR1 and SR2. However, in the wiring board 303 of the second comparative example shown in FIG. 38, the source via VH302 formed in the prepreg layer PP1, the source via VH301 formed in the core layer CR1 and the source via VH303 formed in the prepreg layer PP2 are not arranged on the same straight line orthogonal to the upper surface 3a of the wiring board 3 and are planarly displaced from each other unlike the present embodiment. Note that the source vias VH301, VH302 and VH303 correspond to the source vias VH2S, VH1S and VH3S of the present embodiment, respectively.

When the semiconductor chip 2 is flip-chip mounted on the wiring board 303 of the second comparative example shown in FIG. 38, the heat from the source bump electrode BPS is conducted to the conductor layer 72 from the source land LPS through the source via VH302 and is once conducted in a horizontal direction in the wiring board 303 through the conductor layer 72, and then conducted to the source via VH301. Thereafter, the heat conducted to the conductor layer 73 from this source via VH301 is conducted in a horizontal direction again in the wiring board 303 through the conductor layer 73 and then conducted to the rear-surface terminal TE2 through the source via VH303. In the wiring board 303, the heat conduction in the horizontal direction through the conductor layer has high heat resistance due to the thinness of the conductor layer compared with the heat conduction in the vertical direction through the via, and it becomes a factor for deteriorating the heat dissipation efficiency. Therefore, the heat resistance from the source bump electrode BPS of the semiconductor chip 2 to the rear-surface terminal TE2 of the wiring board 303 is increased and the heat dissipation efficiency (heat dissipation properties) is lowered.

<Wiring Board>

Meanwhile, in the present embodiment, the plurality of vias VH1, the plurality of vias VH2 and the plurality of vias VH3 are provided in the core layer CR1, the prepreg layer PP1 and the prepreg layer PP2 in the wiring board 3, respectively, and the vias VH1, the vias VH2 and the vias VH3 are separately formed. More specifically, in the wiring board 3, the source via VH2S, the source via VH1S and the source via VH3S are located on the same straight line orthogonal to the upper surface 3a of the wiring board 3, but they are not the penetration via formed at the same time in the same process.

The source via VH1S is an inner via hole which connects the conductors (between the conductor 72 and the conductor 73 in this case) in the wiring board 3. Also, the source via VH2S is a blind via hole which connects the conductor layer (conductor layer 71 in this case) formed on the upper surface of the wiring board 3 and the conductor layer just below it (conductor layer 72 in this case), and the source via VH3S is a blind via hole which connects the conductor layer (conductor layer 74 in this case) formed on the lower surface of the wiring board 3 and the conductor layer just above it (conductor layer 73 in this case). These vias in the three layers (source via VH2S, source via VH1S and source via VH3S) are separately formed, but are arranged so as to be located on the same straight line orthogonal to the upper surface 3a of the wiring board 3.

For example, for the fabrication of the wiring board 3, first, the core layer CR1 (cured) having the conductor layers 72 and 73 and the via VH1 formed therein is prepared (hole of the via VH1 is filled with a plating film), and this core layer CR1 is sandwiched between the prepreg layer PP1 (uncured) and copper foil for the conductor layer 71 from the upper side and the prepreg layer PP2 (uncured) and copper foil for the conductor layer 74 from the lower side. Then, this stacked body is heated and pressurized to cure the prepreg layers PP1 and PP2, thereby integrating the stacked body. Thereafter, one of the hole for the via VH2 and the hole for the via VH3 is formed, and then the other thereof is formed. After forming the holes for the vias VH2 and VH3 in the prepreg layers PP1 and PP2, the holes are filled with a plating film, and then, the copper foil for the conductor layer 71 and the copper foil for the conductor layer 74 are patterned by the etching using the photolithography, thereby forming the conductor layers 71 and 74 having the predetermined patterns. Furthermore, the solder resist layers SR1 and SR2 are formed, and thus, the wiring board 3 is fabricated. As described above, the via VH1 (including the source via VH1S), the via VH2 (including the source via VH2S) and the via VH3 (including the source via VH3S) are separately formed in the different processes. The hole for the via VH1 in the core layer CR1 can be formed by using laser with high positional accuracy, and the holes for the vias VH2 and VH3 in the prepreg layers PP1 and PP2 can be formed by using etching utilizing the photolithography with high positional accuracy. Therefore, even when the source via VH2S, the source via VH1S and the source via VH3S are separately formed, they can be vertically arranged so as to be located on the same straight line orthogonal to the upper surface 3a of the wiring board 3.

In the present embodiment, the via of the wiring board 3 which connects the source land LPS connected to the source bump electrode BPS of the semiconductor chip 2 and the rear-surface terminal TE2 of the wiring board 3 is electrically connected by the source via VH1S which is a blind via hole, the source via VH1S which is an inner via hole and the source via VH3S which is a blind via hole instead of a penetration via which penetrates through the entire wiring board 3. Therefore, in the present embodiment, since the via VH1 of the core layer CR1, the via VH2 of the prepreg layer PP1 and the via VH3 of the prepreg layer PP2 can be separately formed (in the different processes), the holes for each of the via VH1, via VH2 and via VH3 can be formed by the laser technique or the etching technique using the photolithography with high positional accuracy without using the drill with low positional accuracy. Accordingly, the dimensions and intervals of the lands LP (source land LPS, drain land LPD and gate land LPG) in the wiring board 3 can be reduced.

In this manner, the arrangement intervals of the bump electrodes BP in the semiconductor chip 2 can be narrowed, and therefore, the area reduction of the semiconductor chip 2 can be achieved, and the degree of freedom for the chip design including the arrangement position of the bump electrodes BP in the semiconductor chip 2 can be improved.

In particular, since the pitch (distance between centers) between the source land LPS and the drain land LPD can be shortened, even when the semiconductor chip 2 in which the source bump electrode PBS is disposed on the LDMOSFET formation region REG1 is flip-chip mounted on the wiring board 3, it becomes unnecessary to increase the distance between the source bump electrode BPS and the drain bump electrode BPD due to the restriction on the side of the wiring board 3. Therefore, even when the source bump electrode BPS is disposed on the LDMOSFET formation region REG1 in the semiconductor chip 2, it is unnecessary to keep the drain bump electrode BPD away from the LDMOSFET formation region REG1, and the area of the semiconductor chip 2 can be reduced.

Further, in the present embodiment, the heat generated in the LDMOSFET element in the LDMOSFET formation region REG1 of the semiconductor chip 2 is efficiently conducted from the source bump electrode BPS to the rear-surface terminal TE2 on the lower surface 3b of the wiring board 3 through the source land LPS and the source vias VH2S, VH1S and VH3S, and then dissipated therefrom as described above. The source via VH2S, the source via VH1S and the source via VH3S are vertically arranged. In other words, they are located on the same straight line orthogonal to the upper surface 3a of the wiring board 3. Therefore, the heat from the source bump electrode BPS of the semiconductor chip 2 can be linearly conducted to the rear-surface terminal TE2 on the lower surface 3b of the wiring board 3 in the vertical direction through the source vias VH2S, VH1S and VH3S arranged vertically on the straight line inside the wiring board 3. Therefore, since each of the source bump electrodes BPS of the semiconductor chip 2 is electrically and thermally connected to the rear-surface terminal TE2 on the lower surface 3b of the wiring board 3 through the straight shortest path, the heat dissipation efficiency (heat dissipation properties) of the power amplifier module 1 can be improved.

Also, in the vias of the wiring board, the conductor film is formed on the inner walls of the holes formed in the insulating layers making up the wiring board, and the vias include a via whose hole is not completely filled with the conductor film and a via whose hole formed in the insulating layer making up the wiring board is completely filled with the conductor film or the conductor portion. The source vias VH2S and VH3S (therefore, also VH2 and VH3) which are blind via holes are preferably formed as the latter vias (via whose hole is completely filled with the conductor film or the conductor portion) so as to make it easy to form the land and the rear-surface terminal. By this means, the effect of improving the heat dissipation efficiency through the source vias VH2S and VH3S can be also obtained. On the other hand, since the source via VH1S which is an inner via hole is not directly connected to the land and the rear-surface terminal, the source via VH1S may be formed as the former via (via in which the conductor film is formed on the inner wall of the hole, but the hole is not completely filled with the conductor film), but it is more preferable to use the latter via (via whose hole is completely filled with the conductor film or the conductor portion) also for the source via VH1S from the perspective of improving the heat dissipation efficiency through the source via VH1.

Also, in the semiconductor chip 2, the heat is apt to be generated particularly from the LDMOSFET formation regions REGL3 and REGH3 corresponding to the final amplifier stages LDML3 and LDMH3 out of the LDMOSFET formation regions REGL1, REGL2, REGL3, REGH1, REGH2 and REGH3. Therefore, it is important for the improvement of the heat dissipation properties of the power amplifier module 1 that the heat generated from the LDMOSFET formation regions REGL3 and REGH3 is dissipated to the wiring board 3 from the source bump electrode BPS and further dissipated to the side of the lower surface 3b of the wiring board 3 through the vias VH2S, VH1S and VH3S. Therefore, it is extremely effective to apply the present embodiment (configuration of the LDMOSFET formation region REG1 including the bump electrode, configuration of the source vias VH1S, VH2S and VH3S connected to the source bump electrode BPS and others) when the LDMOSFET formation region REG1 is the LDMOSFET formation regions REGL3 and REGH3 corresponding to the final amplifier stages LDML3 and LDMH3. In this case, the group of the LDMOSFET formation region REG1, the source bump electrode BPS, the drain bump electrode BPD and the gate bump electrode BPG corresponds to one or both (preferably both) of the group of the LDMOSFET formation region REGL3, the source bump BPS3, the drain bump BPD3 and the gate bump BPG3 and the group of the LDMOSFET formation region REGH3, the source bump BPS6, the drain bump BPD6 and the gate bump BPG6.

Also, though its effect is not so large as the LDMOSFET formation regions REGL3 and REGH3, the heat dissipation effect can be further improved when the present first embodiment is applied also to the LDMOSFET formation regions REGL1, REGL2, REGH1 and REGH2 in addition to the LDMOSFET formation regions REGL3 and REGH3. However, since the LDMOSFET formation regions REGL1, REGL2, REGH1 and REGH2 are smaller in area than the LDMOSFET formation regions REGL3 and REGH3, the number of source bump electrodes BPS and drain bump electrodes BPD provided for the LDMOSFET formation region REG1 may be one, respectively.

FIG. 39 is a cross-sectional view of the principal part showing a second modification example (another embodiment) of the wiring board 3 of the present embodiment, and it corresponds to FIG. 32 described above.

In the case of FIG. 32, in the wiring board 3, the via VH2, the via VH1 and the via VH3 are formed to have the same diameter. Therefore, in the source vias VH2S, VH1S and VH3S located on the same straight line orthogonal to the upper surface 3a of the wiring board 3 (that is, vertically arranged), the diameter of the source via VH2S, the diameter of the source via VH1S and the diameter of the source via VH3S are equal to each other. By this means, the heat dissipation efficiency (heat dissipation properties) by the heat dissipation path formed of the source vias VH2S, VH1S and VH3S can be further improved, and the heat can be more efficiently dissipated from the source bump electrode BPS of the semiconductor chip 2 to the rear-surface terminal TE2 of the wiring board 3.

Meanwhile, in the wiring board 3 of the second modification example of FIG. 39, the diameter of the via VH2 and the diameter of the via VH3 are made smaller than the diameter of the via VH1. Therefore, in the source vias VH2S, VH1S and VH3S located on the same straight line orthogonal to the upper surface 3a of the wiring board 3 (that is, vertically arranged), the diameter of the source via VH2S and the diameter of the source via VH3S are smaller than the diameter of the source via VH1S. As an example, the diameter of the source via VH2S and the diameter of the source via VH3S are about 100 μm, respectively, and the diameter of the source via VH1S is about 150 μm.

Since the source land LPS (source land conductor pattern 71S) is disposed directly on the source via VH2S and the rear-surface terminal TE2 is disposed directly below the source via VH3S, it is preferable to prevent the surfaces of the conductor portions filling the source vias VH2S and VH3S (upper surface of the conductor portion in the case of the source via VH2S and lower surface of the conductor portion in the case of the source via VH3S) from being dented as much as possible. By doing so, the flatness of the source land LPS and the rear-surface terminal TE2 can be improved. On the other hand, since the source via VH1 is connected only to the conductor layer inside the wiring board 3, even when the upper surface and the lower surface of the conductor portion filling the source via VH1 are dented to some extent, its influence is small. For the improvement of the flatness of the surface of the conductor portion filling the via, it is advantageous to reduce the diameter of the via, and on the other hand, for the improvement of the heat dissipation properties through the via, it is advantageous to increase the diameter of the via.

Therefore, in the wiring board 3 of the second modification example of FIG. 39, the diameters of the source vias VH2S and VH3 for which the flatness is required are reduced to improve the flatness, and the diameter of the source via VH1 for which the flatness is not required is increased to improve the heat dissipation properties. In other words, in the wiring board 3 of the second modification example of FIG. 39, the diameter of the source via VH2S and the diameter of the source via VH3S are made smaller than the diameter of the source via VH1S. By this means, it is possible to prevent the surfaces of the conductor portions filling the source vias VH2S and VH3 from being dented and the flatness of the source land LPS and the rear-surface terminal TE2 can be improved, and further, the heat dissipation efficiency (heat dissipation properties) by the heat dissipation path formed of the source vias VH2S, VH1S and VH3S can be improved.

Second Embodiment

FIG. 40 is a plan view of the principal part of the semiconductor chip 2 of the present embodiment, and it corresponds to FIG. 28 of the first embodiment described above. Similarly to FIG. 28, the planar layout of the source bump electrode BPS, the drain bump electrode BPD and the gate bump electrode BPG is shown by solid lines in FIG. 40. Also, in FIG. 40, the source conductor layer CNDS, the drain conductor layer CNDD and the gate conductor layer CNDG are shown by broken lines, the source pad M3S, the drain pad M3D and the gate pad M3G are shown by two-dot chain lines, and the LDMOSFET formation region REG1 is shown by broken lines so as to make the positional relation easily understood. FIG. 41 is a plan view of the principal part of the semiconductor chip 2 of the present embodiment showing the same region as FIG. 40, and it corresponds to FIG. 35 described above. In FIG. 41, the layout of the source bump electrode BPS, the drain bump electrode BPD and the gate bump electrode BPG is shown by solid lines, the LDMOSFET formation region REG1 is shown by broken lines, and the illustration of other components is omitted. Note that, though FIG. 41 is a plan view, hatching of diagonal lines is used for the source bump electrode BPS, the drain bump electrode BPD and the gate bump electrode BPG so as to make the drawing easily understood.

In the above-described first embodiment, a plurality of source bump electrodes BPS electrically connected to a plurality of source regions (n$^+$ type source region 45) formed in the LDMOSFET formation region REG1 through the source wirings M1S and M2S and others are disposed on the LDMOSFET formation region REG1. Also, the planar shape of each source bump electrode BPS is the same as those of the other bump electrodes BP (drain bump electrode BPD, gate bump electrode BPG and others) and is the nearly circular shape.

Meanwhile, in the present embodiment, one source bump electrode BPS electrically connected to a plurality of source regions (n$^+$ type source region 45) formed in the LDMOSFET formation region REG1 through the source wirings M1S and M2S and others is disposed on the LDMOSFET formation region REG1, and the planar shape of this source bump electrode BPS is devised.

Since the other configuration of the semiconductor chip 2 of the present embodiment is the same as that of the above-described first embodiment, the difference therebetween will be described here.

As is apparent from the comparison between FIG. 40 and FIG. 28 or between FIG. 41 and FIG. 35, the source bump electrode BPS in the present embodiment has the planar shape obtained by combining and integrating, in the X direction, the plurality of source bump electrodes BPS disposed on the LDMOSFET formation region REG1 in the semiconductor chip 2 of the above-described first embodiment. Accordingly, the source conductor layer CNDS in the present embodiment has the planar shape obtained by combining and integrating, in the X direction, the plurality of source conductor layers CNDS provided for each of the plurality of source bump electrodes BPS disposed on the LDMOSFET formation region REG1 in the semiconductor chip 2 of the above-described first embodiment.

If the heat dissipation from the source bump electrode BPS to the side of the wiring board 3 is taken into consideration, the heat dissipation properties are improved when the planar dimensions (area) of the source bump electrode BPS are large. Further, the total area of the source bump electrode BPS disposed on the LDMOSFET formation region REG1 can be more increased by forming the source bump electrode BPS having a planar shape obtained by combining and joining the plurality of source bump electrodes BPS compared with the case of providing the plurality of source bump electrodes BPS. Therefore, the source bump electrode BPS having a larger area than each of the drain bump electrodes BPD is disposed on the LDMOSFET formation region REG1.

More specifically, in the present embodiment, based on the fact that, compared with the case where two or more source bump electrodes having the same area (same planar dimensions) as the drain bump electrode BPD are disposed on the LDMOSFET formation region REG1, the case where a large-area source bump electrode BPS is formed by combining the source bump electrodes is more advantageous in the heat dissipation properties, the large-area source bump electrode BPS is designed. Therefore, in the present embodiment, the area (plane area) of the source bump electrode BPS disposed on the LDMOSFET formation region REG1 is larger than the total area (plane area) of the two drain bump electrodes BPD (drain bump electrode BPD connected to the drain of the LDMOSFET element in the LDMOSFET formation region REG1). More specifically, even when the plurality of drain bump electrodes BPD are formed for the LDMOSFET formation region REG1, the area of each drain bump electrode BPD is almost equal, but the area of the source bump electrode BPS is larger than the sum of the areas of the two drain bump electrodes BPD thereof (that is, twice of the area of one drain bump electrode BPD).

In this manner, by increasing the area of the source bump electrode BPS disposed on the LDMOSFET formation region REG1 as described above, in the power amplifier module 1, the heat generated by the LDMOSFET element in the LDMOSFET formation region REG1 of the semiconductor chip 2 can be efficiently dissipated from the large-area source bump electrode BPS to the wiring board 3, and the heat dissipation properties can be further improved.

FIG. 42 is a plan view of the principal part showing the first modification example of the semiconductor chip 2 of the present embodiment and FIG. 43 is a plan view of the principal part showing the second modification example of the semiconductor chip 2 of the present embodiment, and each of them corresponds to FIG. 41 described above. In FIG. 42 and FIG. 43, the layout of the source bump electrode BPS, the drain bump electrode BPD and the gate bump electrode BPG is shown by solid lines, the LDMOSFET formation region REG1 is shown by broken lines, and the illustration of the other components is omitted. Also, similarly to FIG. 41, though FIG. 42 and FIG. 43 are plan views, hatching of diagonal lines is used for the source bump electrode BPS, the drain bump electrode BPD and the gate bump electrode BPG so as to make the drawings easily understood.

In any of the cases of FIG. 40, FIG. 41, FIG. 42 and FIG. 43, the planar shape of the source bump electrode BPS is a nearly rectangular shape. More specifically, it is a nearly rectangular shape having a long side in the X direction and a short side in the Y direction. Therefore, the length of the long side (dimension of long side, that is, dimension in the X direction) L1 of the source bump electrode BPS is larger than the length of short side (dimension of short side, that is, dimension in the Y direction) L2 of the source bump electrode BPS (L1>L2).

The nearly rectangular shape mentioned here means not only the true rectangle formed by two long sides with the same length and two short sides with the same length meeting at right angles, but the rectangle whose corners are truncated like the source bump electrode BPS in FIG. 42, the rectangle whose short sides are semicircular like the source bump electrode BPS in FIG. 40 and FIG. 41 and the rectangle whose long sides are not straight lines like the source bump electrode BPS in FIG. 43. However, the case where the long sides (sides extending in the X direction with the length L1) are straight lines like the source bump electrode BPS in FIG. 41 and the source bump electrode BPS in FIG. 42 is more preferable than the case where the long sides are not straight lines like the source bump electrode BPS in FIG. 43 because the area of the source bump electrode BPS can be more efficiently increased and the heat dissipation efficiency from the source bump electrode BPS to the wiring board 3 can be improved. Further, the case where the planar shape of the source bump electrode BPS is formed to have truncated corners like those of FIG. 41 and FIG. 42 is more preferable than the case where the planar shape of the source bump electrode BPS is formed to be the true rectangle whose four corners have an angle of 90 degrees because the source bump electrode BPS can be stably formed.

Therefore, when the source bump electrode with the nearly rectangular shape is mentioned, it means the planar shape in which the length L1 of the long side is larger than the length L2 of the short side, and the length L1 of the long side of the source bump electrode BPS has the following features (that is, L1>L3×2, L1>L4).

As described above, in the present embodiment, based on the fact that, compared with the case where two or more source bump electrodes having the same area (same planar dimensions) as the drain bump electrode BPD are disposed on the LDMOSFET formation region REG1, the case where a source bump electrode BPS with a nearly rectangular shape is formed by combining the source bump electrodes is more advantageous in the heat dissipation properties, the source bump electrode BPS with a nearly rectangular shape is designed. Therefore, in the present embodiment, the length L1 of the long side of the source bump electrode BPS disposed on the LDMOSFET formation region REG1 is larger than twice the diameter L3 of the drain bump electrode BPD (L1>L3×2). Further, in the present embodiment, the length L1 of the long side of the source bump electrode BPS disposed on the LDMOSFET formation region REG1 is larger than the length L4 between the centers of the two adjacent drain bump electrodes BPD out of the plurality of drain bump electrodes BPD (L1>L4). The length L2 of the short side of the source bump electrode BPS can be made almost equal to the diameter L3 of the drain bump electrode BPD.

In this manner, by forming the source bump electrode BPS disposed on the LDMOSFET formation region REG1 to have a nearly rectangular shape and increasing the length L1 of the long side as described above, in the power amplifier module 1, the heat generated by the LDMOSFET element in the LDMOSFET formation region REG1 of the semiconductor chip 2 can be efficiently dissipated to the wiring board 3 from the source bump electrode BPS, and the heat dissipation properties can be further improved.

FIG. 44 is a cross-sectional view of the principal part schematically showing the state just before mounting the semiconductor chip 2 of the present embodiment on the wiring board 3, and FIG. 45 is a cross-sectional view of the principal part showing the state where the semiconductor chip 2 of the present embodiment is flip-chip mounted on the wiring board 3. Therefore, although FIG. 45 corresponds to the cross-sectional view of the principal part of the power amplifier module 1, it does not illustrate the sealing resin 7. FIG. 44 and FIG. 45 correspond to FIG. 33 and FIG. 34 of the above-described first embodiment, respectively. Therefore, the cross section taken along the line A4-A4 of FIG. 41 when the semiconductor chip 2 is flip-chip mounted on the wiring board 3 corresponds to the cross-sectional views of FIG. 44 and FIG. 45.

As described in the first embodiment, the semiconductor chip 2 of the present embodiment is flip-chip mounted on the wiring board 3, thereby making up the power amplifier module 1 as shown in FIG. 44 and FIG. 45. Since the wiring board 3 shown in FIG. 44 and FIG. 45 is the same as the wiring board 3 of FIG. 32 used in the above-described first embodiment, the description of the structure of the wiring board 3 is omitted here. Hereinafter, the difference in the mounting method of the semiconductor chip 2 on the wiring board 3 between the first embodiment and the present embodiment will be described.

In the above-described first embodiment, the source bump electrode BPS and the source land LPS are joined in a one-to-one manner. More specifically, after the plurality of source bump electrodes BPS are formed on the LDMOSFET formation region REG1, each of the plurality of source bump electrodes BPS is electrically and mechanically connected to each of the plurality of source lands LPS, and one source bump electrode BPS is joined to one source land LPS.

Meanwhile, in the present embodiment, the source bump electrode BPS and the source land LPS are joined in a one-to-multiple manner. More specifically, the source bump electrode BPS having the planar shape as described with reference to FIG. 40 to FIG. 43 is formed on the LDMOSFET formation region REG1, and this source bump electrode BPS is electrically and mechanically connected to the plurality of source lands LPS. In other words, one source bump electrode BPS is joined to the plurality of source lands LPS. In the present embodiment, this can be easily realized because the source bump electrode BPS has a large area or the length L1 of the long side is large as described with reference to FIG. 40 to FIG. 43. Since the mounting method of the semiconductor chip 2 on the wiring board 3 is the same as that of the first embodiment other than this, the description thereof is omitted here.

The heat dissipation path from the semiconductor chip 2 to the lower surface 3b of the wiring board 3 of the present embodiment is the same as that of the first embodiment. More specifically, similarly to the first embodiment, also in the present embodiment, the heat generated in the LDMOSFET element in the LDMOSFET formation region REG1 of the semiconductor chip 2 is conducted from the source bump electrode BP to the rear-surface terminal TE2 through the source land LPS (source land conductor pattern 71S), the source via VH2S, the conductor layer 72, the source via VH1S, the conductor layer 73 and the source via VH3S, and then dissipated therefrom to the outside of the power amplifier module 1. Since the positional relation of the source land LPS, the source via VH2S, the source via VH1S, the source via VH3S and the rear-surface terminal TE2 is the same as that of the first embodiment, the description thereof is omitted here.

However, since the source bump electrode BPS is joined to the plurality of source lands LPS as described above in the present embodiment, in the power amplifier module 1, the plurality of source lands LPS, the plurality of source vias VH2S, the plurality of source vias VH1S and the plurality of source vias VH3S are vertically arranged below (directly below) one source bump electrode BPS so as to be located on the straight lines orthogonal to the upper surface 3a of the wiring board 3, respectively. Therefore, the heat is dissipated from the source bump electrode BPS to the rear-surface terminal TE2 on the lower surface 3b of the wiring board 3 through a plurality of linear heat dissipation paths (heat dissipation paths made up of source vias VH2S, VH1S and VH3S arranged vertically), and then dissipated therefrom to the outside of the power amplifier module 1.

In the present embodiment, in addition to the effect of the first embodiment described above, the heat dissipation properties of the power amplifier module 1 can be further improved by devising the planar shape of the source bump electrode BPS.

Also, as described above, in the semiconductor chip 2, the heat is apt to be generated particularly from the LDMOSFET formation regions REGL3 and REGH3 out of the LDMOSFET formation regions REGL1, REGL2, REGL3, REGH1, REGH2 and REGH3, and the LDMOSFET formation regions REGL3 and REGH3 have large areas. Therefore, it is extremely effective to apply the present embodiment when the LDMOSFET formation region REG1 is the LDMOSFET formation regions REGL3 and REGH3 corresponding to the final amplifier stages LDML3 and LDMH3. In this case, one or both of the source bumps BPS3 and BPS6 correspond to the source bump electrode BPS having the above-described planar shape. Although it is also possible to apply the present embodiment to the source bumps BPS1, BPS2, BPS4 and BPS5 of the LDMOSFET formation regions REGL1, REGL2, REGH1 and REGH2, the LDMOSFET formation regions REGL1, REGL2, REGH1 and REGH2 are smaller in area than the LDMOSFET formation regions REGL3 and REGH3. Therefore, the source bumps BPS1, BPS2, BPS4 and BPS5 may have the same shape and the same area as the drain bump.

FIG. 46 is a cross-sectional view of the principal part showing the state where the semiconductor chip 2 of the present embodiment is flip-chip mounted on the wiring board 3 of the first modification example of the first embodiment shown in FIG. 36, and it corresponds to FIG. 45 described above. Also in the present embodiment, as shown in FIG. 46, the source land conductor patterns 71S making up each of the source lands LPS can be integrally coupled (connected) in the region covered with the solder resist layer SR1.

FIG. 47 is a cross-sectional view of the principal part showing the state where the semiconductor chip 2 of the present embodiment is flip-chip mounted on the wiring board 3 of the second modification example of the first embodiment shown in FIG. 39, and it corresponds to FIG. 45 described above. Also in the present embodiment, the effect described in relation to FIG. 39 can be obtained by making the diameter of the via VH2 and the diameter of the via VH3 smaller than the diameter of the via VH1 and making the diameter of the source via VH2S and the diameter of the source via VH3S smaller than the diameter of the source via VH1S as shown in FIG. 47.

FIG. 48 is a cross-sectional view of the principal part showing the wiring board 3 of the third modification example, and it corresponds to FIG. 32 described above. However, the wiring board 3 of the third modification example shown in FIG. 48 is not used for the flip-chip mounting of the semiconductor chip 2 of the first embodiment but can be used in the case where the semiconductor chip 2 of the second embodiment is flip-chip mounted. FIG. 49 is a cross-sectional view of the principal part showing the state where the semiconductor chip 2 of the second embodiment is flip-chip mounted on the wiring board 3 of the third modification example of FIG. 48, and it corresponds to FIG. 45 described above.

In the present embodiment, the source bump electrode BPS of the semiconductor chip 2 is formed to have the planar shape shown in FIG. 41 to FIG. 43, but in the wiring board 3 of the third modification example shown in FIG. 48 and FIG. 49, the source land LPS to which the source bump electrode BPS is connected is formed to have the planar shape corresponding to the planar shape of the source bump electrode BPS (almost the same planar shape as the source bump electrode BPS). Therefore, as shown in FIG. 49, the source bump electrode BPS and the source land LPS are joined by one-to-one manner. More specifically, in FIG. 49, the source bump electrode BPS having the planar shape as described with reference to FIG. 40 to FIG. 43 is formed on the LDMOSFET formation region REG1, and this source bump electrode BPS is electrically and mechanically connected to the source land LPS having the planar shape corresponding to the source bump electrode BPS, so that one source bump electrode BPS is joined to one source land LPS. Further, in FIG. 49, the plurality of source vias VH2S are disposed below (directly below) the source land LPS. Other configuration of the wiring board 3 of the third modification example shown in FIG. 48 and FIG. 49 is the same as any of the wiring board 3 shown in FIG. 32, the wiring board 3 of the first modification example shown in FIG. 36 and the wiring board 3 of the second modification example shown in FIG. 39. Therefore, also in the wiring board 3 of the third modification example shown in FIG. 48 and FIG. 49, the positional relation of the source via VH2S, the source via VH1S, the source via VH3S and the rear-surface terminal TE2 is the same as that described in the first embodiment.

Therefore, in the case of the wiring board 3 of the third modification example shown in FIG. 48 and FIG. 49, the plurality of source vias VH2S are disposed below (directly below) one source land LPS, the plurality of source vias VH1S are disposed below (directly below) the plurality of source vias VH2S, respectively, and the plurality of source vias VH3S are disposed below (directly below) the plurality of source vias VH1S, respectively. More specifically, in the wiring board 3 of the third modification example, below (directly below) one source land LPS, the plurality of source via VH2S, the plurality of source via VH1S and the plurality of source via VH3S are (vertically) arranged on the same straight lines orthogonal to the upper surface 3a of the wiring board 3, respectively. Therefore, in the power amplifier module 1 in which the semiconductor chip 2 of the second embodiment is flip-chip mounted on the wiring board 3 of the third modification example shown in FIG. 48, one source land LPS, the plurality of source vias VH2S, the plurality of source vias VH1S and the plurality of source vias VH3S are vertically arranged below (directly below) the source bump electrode BPS of the semiconductor chip 2 so as to be located on the straight lines orthogonal to the upper surface 3a of the wiring board 3, respectively.

Also when the wiring board 3 of the third modification example shown in FIG. 48 and FIG. 49 is used for the flip-chip mounting of the semiconductor chip 2 of the present embodiment, the effect of improving the heat dissipation properties almost equal to the case of FIG. 45 can be obtained.

However, when the plane area of the source bump electrode BPS is enlarged like in the present embodiment, the use of the wiring board 3 shown in FIG. 32, the wiring board 3 of the first modification example shown in FIG. 36 and the wiring board 3 of the second modification example shown in FIG. 39 is more advantageous than the wiring board 3 of the third modification example shown in FIG. 48 and FIG. 49 in terms of stabilizing the connection of the semiconductor chip 2 flip-chip mounted on the wiring board 3 and preventing the tilt of the semiconductor chip 2. The reason therefor is as follows.

That is, when the plane area of the source bump electrode BPS is enlarged like in the present embodiment, the amount of solder of the source bump electrode BPS becomes considerably large. In this case, when the large-area source bump electrode BPS using a large amount of solder is solder-connected to the large-area source land LPS as shown in FIG. 49, the solder connection state becomes uneven in the large-area source land LPS, and the flip-chip mounted semiconductor chip 2 is apt to be tilted. On the other hand, when the large-area source bump electrode BPS using a large amount of solder is solder-connected to the plurality of source lands LPS as shown in FIG. 45 to FIG. 47, the solder connection state of each of the plurality of source lands LPS can be easily made even, and the flip-chip mounted semiconductor chip 2 is less likely to be tilted. Therefore, the use of the wiring board 3 shown in FIG. 32, the wiring board 3 of the first modification example shown in FIG. 36 and the wiring board 3 of the second modification example shown in FIG. 39 is more advantageous than the wiring board 3 of the third modification example shown in FIG. 48 and FIG. 49 in terms of stabilizing the connection of the semiconductor chip 2 and preventing the tilt of the semiconductor chip 2. Accordingly, when the wiring board 3 of the third modification example shown in FIG. 48 and FIG. 49 is used, the tilt of the semiconductor chip 2 has to be prevented by appropriately adjusting the amount of solder of the source bump electrode BPS.

Further, it is also possible to make up the power amplifier module 1 by mounting (flip-chip mounting) a semiconductor chip 19 of the third embodiment described later on the wiring board 3 instead of the semiconductor chip 2 of the present embodiment. In this case, an emitter bump electrode 419b described later corresponds to the source bump electrode BPS of the present embodiment, and in FIG. 45, FIG. 46, FIG. 47 or FIG. 49, the emitter bump electrode 419b corresponding to the source bump electrode BPS is connected to an emitter land corresponding to the source land LPS, and the source vias VH1S, VH2S and VH3S become emitter vias, respectively. The collector bump electrode 419a and the base bump electrode 419c described later are connected to the lands LP (collector land and base land), to which the collector bump electrode 419a and the base bump electrode 419c are to be connected, out of the lands LP of the wiring board 3.

Third Embodiment

The present embodiment relates to a semiconductor device and a manufacturing technique thereof, and more particular to a technique effectively applied to a semiconductor device including a heterojunction bipolar transistor (HBT) and a manufacturing technique thereof.

For example, some semiconductor elements use a III-V group compound semiconductor such as gallium arsenide (GaAs). The compound semiconductor is characterized in that it has higher mobility than silicon (Si) and semi-insulating crystal can be obtained. Also, the compound semiconductor can form a mixed crystal, and the heterojunction can be formed.

The semiconductor element using the heterojunction includes the heterojunction bipolar transistor (hereinafter, HBT). This HBT is a bipolar transistor using gallium arsenide as a base layer and using indium gallium phosphide (InGaP) or aluminum gallium phosphide (AlGaAs) as an emitter layer. More specifically, HBT is a bipolar transistor in which the heterojunction is formed by using different semiconductor materials to the base layer and the emitter layer.

By this heterojunction, the forbidden band width of the emitter in the base-emitter junction can be made larger than the forbidden band width of the base. Therefore, since the implantation of carriers from the emitter to the base can be made extremely larger than the implantation of carriers from the base to the emitter, the current amplification factor of the HBT characteristically becomes extremely large.

Since the current amplification factor becomes extremely large in the HBT as described above, the HBT is used for, for example, a radio-frequency amplifier device (power amplifier module) mounted in a mobile phone. In the power amplifier module, a semiconductor chip in which the HBT is formed is mounted on a wiring board.

In recent years, a lot of electronic components are incorporated in a communication terminal device such as a mobile phone, and in the power amplifier module incorporated in a transmitter of the mobile phone among these, the miniaturization and the performance improvement have been rapidly developed.

The frequencies of transmission and reception waves processed in the RF unit are as follows.

As the frequencies in the respective communication standards in Japan, 800 MHz band is used for PDC (Personal Digital Cellular), 1.5 GHz band is used for cdmaOne (Code Division Multiple Access One), 1.7 GHz band is used for CDMA2000, and 2100 MHz band is used for W-CDMA (Wideband Code Division Multiple Access).

Also, as the frequency of the GSM (Global System for Mobile Communications) system which is a global communication system centered in Europe, 900 MHz band and 1800-1900 MHz band are used, and 800 MHz band and 900 MHz band are used for D-AMPS (Digital Advanced Mobile Phone System) which is a communication system used in America and Canada.

The component which amplifies the transmission wave so as to have these respective frequencies for transmitting the radio waves from a telephone to a base station is the power amplifier. There are various communication systems and frequency application types obtained by selecting and combining the above-described frequencies according to use and area.

EDGE (Enhanced Data GSM Environment) is one of the third generation technologies (3G) and is the successor technology of GPRS. Since it is the communication system using the GSM system and the TDMA (Time Division Multiple Access) system and is based on the GSM which has been already become widespread, it can utilize the existing communication facilities.

In the field of these CDMA and EDGE, the size of the power amplifier module is 6 mm long and 6 mm wide at the present time, but it is assumed that the size of 4 mm long and 4 mm wide becomes the mainstream in the next-generation power amplifier module.

On the other hand, also in the field of GSM, there is an increasing need for the size reduction without changing the function. Under the circumstance that the power amplifier module has been more and more downsized as described above, it has become difficult to secure the wire bonding area for electrically connecting the semiconductor chip and the wiring board.

Here, the HBT is used for the power amplifier module mounted on the mobile phone as described above. This power amplifier module mounts two ICs, that is, the IC for the frequency of the GSM system and the IC for the frequency of the DCS system, and these ICs include, for example, three-stage amplifier circuits and a control circuit for controlling these amplifier circuits.

Also, out of the three-stage amplifier circuits (amplifier circuits of GSM are 402a, 402b and 402c and amplifier circuits of DCS are 403a, 403b and 403c), the HBT is used for the final-stage amplifier circuits (third-stage amplifier circuits 402c and 403c) in which the high amplification factor is required. The three-stage amplifier circuits and the control circuit included in the power amplifier module are not formed in one semiconductor chip, but formed separately in two semiconductor chips.

More specifically, the second-stage amplifier circuits and the final-stage amplifier circuits are formed in the semiconductor chip made of compound semiconductor, and the control circuit and the first-stage amplifier circuits are formed in the second semiconductor chip made of silicon. Then, these semiconductor chip and second semiconductor chip are two-dimensionally (planarly) mounted on the wiring board and electrically connected to the wiring board by wire bonding.

Here, the module formed by the conventional wire bonding will be described with reference to FIG. 68. FIG. 68 is a cross-sectional view for describing the module formed by the conventional wire bonding.

In the module, the two devices, that is, the one including the control circuit, first-stage amplifier circuits IC and a regulator IC and the other including HBTs for the second-stage amplifier circuit and the third-stage amplifier circuit of GSM and HBTs for the second-stage amplifier circuit and the third-stage amplifier circuit of DCS, are connected by the wire bonding 421, and chip components 414 such as a capacitor, a resistor, a reactance and a coil are mounted on the wiring 413 on the wiring board.

The semiconductor chip 419 in which HBTs are formed is mounted with its surface opposite to an element formation surface facing to the wiring board. In other words, the semiconductor chip is mounted in a face-up manner with its element formation surface facing upward. Therefore, the heat generated in such elements as HBTs is transmitted to the rear surface of the semiconductor chip through the inside of the semiconductor chip. Then, after the heat is transmitted to a substrate-surface electrode 416 through connection solder or high heat conduction adhesive 415, it is transmitted to a GND external wiring 412 of the rear-surface electrode of the wiring board through vias 418 formed through the board, and then dissipated therefrom.

In order to reduce the module size, conventionally, the multiple-stage amplifier circuits corresponding to both the frequencies of the GSM system and the DCS system of EDGE are formed into one HBT chip, and the control IC and the LDO (Low Drop-Out) regulator circuit are formed in an IC chip, thereby realizing the size reduction and the cost reduction.

More specifically, when a desired communication frequency is formed in one IC in the EDGE system and the W-CDMA system, the miniaturization is essential from the device design and structure.

The semiconductor chip used for a high-power amplifier is made of compound semiconductor, but the compound semiconductor is inferior to silicon in heat conductivity. More specifically, since the heat dissipation efficiency of the heat generated in the region around the emitter of HBT is low, the thickness of the semiconductor chip has to be reduced to about 80 μm in order to improve the heat dissipation efficiency.

Another reason why the thickness reduction of the semiconductor chip is necessary is that a VIA hole has to be formed in the GaAs substrate for the connection to the ground electrode on the rear surface.

The conventional VIA hole will be described with reference to FIG. 69. FIG. 69 is an explanatory diagram for describing the conventional VIA hole, in which the arrangement of transistor group called finger in the case of seeing the HBT device from the front surface is seen from the above.

In FIG. 69, the VIA hole 417 located at the center of the transistor group is formed by the wet etching process of the GaAs substrate. The GaAs substrate has to be thinly formed in view of the processing time relating to the reaction of the etching process and the optimum formation of the VIA shape.

For these reasons, the back grind by which the GaAs substrate is ground from the rear surface side so as to have a predetermined thickness is necessary. However, this process is one of the factors that increase the processing cost of the semiconductor chip.

Next, after forming the VIA hole, an emitter electrode 435 and an emitter wiring are formed, and this wiring is connected to the rear-surface electrode through the wiring on the side surface of the VIA hole. Since Au is used for the wiring material, it costs too much. Since the Au wiring and the Au rear-surface electrode are formed mainly by plating, the process cost is high, and this is another problem.

As described above, in the HBT structure having the through hole and the rear-surface electrode in the GaAs substrate, the thickness reduction of a wafer is necessary in relation to the processes for forming the through hole and the rear-surface electrode.

As a result of reducing the thickness of the GaAs substrate in a chip or wafer level, the wafer is easily broken due to the fragility of GaAs, and there is the problem that the handling in a wafer level becomes extremely difficult.

Also, for example, like in the technique described in Japanese Patent Application Laid-Open Publication No. 6-349846 (U.S. Pat. No. 3,268,064), an emitter bump is formed in a direction almost orthogonal to an emitter group having a VIA hole penetrating to the GaAs rear-surface electrode and an emitter wiring at the center of the finger shape.

However, when the bump pitch is narrow and the distance between bumps is short as shown in FIG. 69, the smaller the bump width becomes, the higher the probability of non-connection becomes due to the influence of the substrate flatness, and there is the problem that the underfill is difficult to be provided under the bumps.

Therefore, an object of the present embodiment is to provide a semiconductor device capable of achieving the cost reduction, high heat dissipation and miniaturization in relation to both an HBT semiconductor and a power amplifier module mounting the HBT semiconductor.

The configuration of the semiconductor device according to an embodiment (third embodiment) of the present invention will be described with reference to FIG. 50. FIG. 50 is a configuration diagram showing the configuration of the semiconductor device according to an embodiment (third embodiment) of the present invention, and it shows a circuit block of a radio-frequency amplifier in a power amplifier module mounted on a mobile phone or the like as a semiconductor device.

In FIG. 50, the radio-frequency amplifier includes a control circuit 401 having a LDO (regulator circuit), amplifiers 402a to 402c and amplifiers 403a to 403c. This radio-frequency amplifier can amplify the signals of two frequency bands. More specifically, the one is GSM (Global System for Mobile Communication) system utilizing the first frequency, and it is possible to amplify the signal using 880 MHz to 915 MHz as a frequency band.

Also, the other is DCS (Digital Communication System 1800) system utilizing the second frequency, and it is possible to amplify the signal using 1710 MHz to 1785 MHz as a frequency band.

Control signals are inputted to the control circuit 401 in the radio-frequency amplifier, and the control circuit 401 controls the amplifiers 402a to 402c and the amplifiers 403a to 403c so as to keep the voltage and the current to be outputted always constant based on the inputted control signal.

The control signal ($V_{control}$ (GSM)) for controlling the amplifiers 402a to 402c and the control signal ($V_{control}$ (DCS)) for controlling the amplifiers 403a to 403c can be separately inputted to this control circuit 401. When the amplifiers 402a to 402c are used, the control circuit 401 controls them based on the control signal ($V_{control}$ (GSM)), and when the amplifiers 403a to 403c are used, the control circuit 401 controls them based on the control signal ($V_{control}$ (DCS)). In this manner, the radio frequency amplifier of the present embodiment controls the amplification of the signals in two types of frequency bands.

An input power (input signal) $P_{in}$(GSM) of the GSM system is inputted to the amplifiers 402a to 402c (first circuit), and this input power $P_{in}$(GSM) is amplified through three stages.

More specifically, after the input power $P_{in}$(GSM) is first amplified by the amplifier 402a, the power amplified by the amplifier 402a is amplified by the amplifier 402b. Thereafter, the power amplified by the amplifier 402b is amplified by the final stage amplifier 402c and then outputted from the radio-frequency amplifier. As described above, the power by the GSM system can be amplified in the amplifiers 402a to 402c.

Therefore, the power consumption of the control circuit 401 and the amplifier 402a used for the first stage is several tens milliwatt, whereas the power consumption of the amplifier 402c used for the final stage is several watt. Note that a MOSFET or an HBT may be used for the amplifier 402b used for the intermediate stage, and the power consumption thereof is several hundreds milliwatt.

Similarly, an input power (input signal) $P_{in}$(DCS) of the DCS system is inputted to the amplifiers 403a to 403c (second circuit), and this is amplified through three stages.

More specifically, after the input power $P_{in}$(DCS) is amplified by the amplifier 403a, the power is further amplified by the amplifier 403b. Subsequently, the power amplified by the amplifier 403b is further amplified by the amplifier 403c and then outputted from the radio-frequency amplifier. As described above, the power by the DCS system can be amplified in the amplifiers 403a to 403c.

Note that the amplifier 402a and the amplifier 403a used for the first stage, the control circuit 401, the amplifier 402b, the amplifier 402c used for the final stage, the amplifier 403b, and the amplifier 403c used for the final stage are formed in one chip.

Next, a structure of the semiconductor device according to an embodiment (third embodiment) of the present invention will be described with reference to FIG. 51 to FIG. 53. FIG. 51 is a cross-sectional view showing the structure of the semiconductor device according to an embodiment (third embodiment) of the present invention, and it shows the structure of a power amplifier module. FIG. 52 is a plan view showing the structure of an emitter wiring layer by simplifying the element formation surface of HBT of the semiconductor device according to an embodiment (third embodiment) of the present invention, and FIG. 53 is a diagram showing the structure of the emitter wiring layer, arbitrarily-formed emitter electrode bump and signal electrode bump of HBT of the semiconductor device according to an embodiment (third embodiment) of the present invention.

In FIG. 51, as the external structure, the power amplifier module as the semiconductor device includes a wiring board 410, a sealing portion 423 formed and stacked on a front surface (main surface) of the wiring board 410, and a plurality of external wirings 411 and a GND external wiring 412 provided on a rear surface of the wiring board 410.

On the wiring board 410, a chip component 414, a semiconductor chip 419 and a control IC 428 are disposed.

In the assembly of this power amplifier module, electronic components including the semiconductor chip 419 are mounted on a multi-piece substrate in which a plurality of wiring boards 410 are laid, and thereafter, the sealing portion 423 having a predetermined height is formed with resin so as to cover the mounted electronic components.

Then, the multi-piece substrate on which the sealing portion 423 is formed is cut and divided in horizontal and vertical directions, thereby forming a plurality of power amplifier modules at a time. Therefore, the side surface of the wiring board 410 and the side surface of the sealing portion 423 are aligned with each other, and an end of the sealing portion 423 is not located at a position outside an end of the wiring board 410.

The wiring board 410 is made of, for example, a printed circuit board, and it has a structure obtained by laminating three dielectric layers (insulating layer). In this wiring board 410 and on a front surface (main surface) and a rear surface thereof, predetermined wirings are formed, and a part of the wirings formed on the front surface of the wiring board 410 and a part of the wirings formed on the rear surface of the wiring board 410 are electrically connected through the via 418 extending in the thickness direction of the wiring board 410. It goes without saying that, although the number of dielectric layers is three in the description of the present embodiment, the number is not limited to three.

Also, the wiring 413 is formed on the front surface of the wiring board 410 in the power amplifier module, and the chip component 414 is formed so as to be connected to the wiring 413. This chip component 414 is made up of, for example, a passive component such as a resistor and a capacitor, and it is electrically connected to the wiring 413 formed on the front surface of the wiring board 410 by a connection terminal 414*a*. The wiring 416 is connected through the via 418 formed in the wiring board 410 to the GND external wiring 412 formed on the rear surface of the wiring board 410.

Furthermore, the semiconductor chip 419 is mounted on the front surface of the wiring board 410, and the semiconductor chip 419 is mounted on the wiring board 410 through a collector bump electrode 419*a*, an emitter bump electrode 419*b* and a base bump electrode 419*c* with its element formation surface facing downward (in a face-down manner).

As described above, the semiconductor chip 419 is mounted on the wiring board 410 with its element formation surface facing downward (in a face-down manner). At this time, the connection bump on the ME3 layer formed of the emitter electrode of the element is made of solder, metal plating, adhesive containing metal powder or the combination thereof. The heat generating portion near the emitter electrode, the bump and the heat dissipation VIA in the upper portion of the wiring board 410 are preferably formed so as to be arranged on the straight line in the Z direction as a heat dissipation path.

Also, in the power amplifier module of the present embodiment, the resin portion 423 made of resin is formed so as to cover the chip component 414 and the semiconductor chip 419 mounted on the wiring board 410.

In the semiconductor chip 419, the amplifiers 402*a*, 402*b* and 402*c* and the amplifiers 403*a*, 403*b* and 403*c* of the circuit shown in FIG. 50 are formed. Therefore, the power consumption of the semiconductor chip 419 is high compared with conventional one, and its heating value is also relatively high.

Here, according to the calculation by simulation of the heat dissipation ratio of the heat generated in the HBT of the conventional device connected in a face-up manner shown in FIG. 68 and FIG. 69, as the actual heat dissipation path, most of the heat generated near the emitter electrode reaches the rear-surface electrode through the GaAs substrate and is further transmitted to the rear surface through the through hole penetrating through the module mounting board. Most of heat is dissipated toward the rear surface via the GaAs substrate, and heat scarcely escapes through the VIA hole penetrating through the GaAs substrate.

According to these results, since the heat dissipation is not affected even if the VIA hole of the rear surface is removed, the penetration VIA of the GaAs substrate is removed in the structure in which the flip-chip mounting is used for miniaturization in the present embodiment. The area of the VIA portion in the finger is shrunk, the ME3 wiring layer is formed directly on the emitter wiring for the heat dissipation, an emitter wiring having a shape connecting the emitter electrodes of adjacent transistor groups of the GaAs HBT to one surface and covering them is formed, and the bump is formed at an arbitrary position where the heat is efficiently diffused, whereby the bump is formed at the position where the heat dissipation is highest for the heat dissipation VIA of the module substrate.

In the present embodiment, for further reduction in the GaAs HBT group area, the VIA hole is eliminated as shown in FIG. 52. As a result, since the finger portions come close to each other by the distance of the VIA hole, heat generation density is increased and more efficient heat dissipation structure is required. For its solution, stripe bumps are formed as shown in FIG. 53.

Since the space of the heat dissipation path from the heat generating portion to the heat dissipation portion of the substrate has to be made of a material with higher heat conductivity, the stripe-shaped bumps obtained by joining adjacent spherical bumps with metal are used. The bumps are connected to the heat dissipation VIA with solder, and the finger groups 501 of the adjacent emitter electrodes 435 of the ME3 wiring layer are formed in one surface as shown in FIG. 52 so that the stripe bumps can be formed at arbitrary positions.

The bumps need to be formed so as not to prevent the mounting for connecting the signal electrode bumps 420 of minute pitch of about 30 to 50 μm to the substrate.

For example, the heat dissipation bump has a nearly rectangular shape and is connected to a plurality of vias (for example, three vias). In order to reduce the heat resistance, smaller bump height is more preferable. In the case where the underfill is permeated under the chip after the connection of the semiconductor chip 419, the voids are less likely to be formed when the bumps are directed to the same direction as shown in FIG. 53 because the underfill is readily provided under the chip.

Next, the internal structure of the semiconductor device according to an embodiment (third embodiment) of the present invention will be described with reference to FIG. 54 to FIG. 57. FIG. 54 is a diagram showing the internal structure of the semiconductor device according to an embodiment (third embodiment) of the present invention, and it is a plan view showing HBTs 25 to 27 formed in the semiconductor chip 419. FIG. 55 is a plan view showing the state in which the plurality of HBTs and the first wiring layer of the semiconductor device according to an embodiment (third embodiment) of the present invention have been formed, FIG. 56 is a plan view showing the state in which the plurality of HBTs, the first wiring layer and the second wiring layer of the semiconductor device according to an embodiment (third embodiment) of the present invention have been formed, and FIG. 57 is a plan view showing the state in which a plurality of HBT groups, the first wiring layer and a second wiring layer electrode across the plurality of HBT groups of the semiconductor device according to an embodiment (third embodiment) of the present invention have been formed.

In FIG. 54, the HBTs 25 to 27 are formed at predetermined intervals on a sub-collector layer 431 made of an n⁺ type GaAs layer isolated from other elements by a mesa isolation 500. Here, since the HBTs 25 to 27 have the same structure, the structure of the HBT 25 formed on the left side out of the HBTs 25 to 27 will be described.

The HBT 25 has a collector electrode 437 formed on the sub-collector layer 431 and a collector mesa 432 formed so as to be separate from the collector electrode 437 by a predetermined interval. The collector electrode 437 is made of, for example, gold (Au).

The collector mesa 432 is made of, for example, an n type GaAs layer, and this collector mesa 432 and the collector electrode 437 are electrically connected to each other through the sub-collector layer 431. Further, a base mesa 433 made of, for example, a p type GaAs layer is formed on the collector mesa 432.

A base electrode 436 made of gold or the like is formed in a peripheral region on the base mesa 433. More specifically, the base electrode 436 having a U shape inverted by 180 degrees is formed on the base mesa 433. Further, an emitter layer 434 is formed near the center on the base mesa 433, and the emitter electrode 435 is formed on the emitter layer 434.

For example, the emitter layer 434 is formed by a layer obtained by stacking an n type InGaP layer, a GaAs layer and an InGaAs layer, and the emitter layer 435 is made of, for example, tungsten silicide (WSi).

As described above, a hetero-semiconductor junction (heterojunction) is formed between the base mesa (p type GaAs layer) 433 and the emitter layer (n type InGaP layer) 434. Also, the HBT 25 of the present embodiment has a structure in which the collector electrode 437 is formed as the lowermost layer, the emitter electrode 435 is formed as the uppermost layer and the base electrode 436 is formed as the intermediate layer.

The HBT 25 is made up as described above, and the HBT 26 and the HBT 27 having the same structure as the HBT 25 are formed and arranged in a lateral direction.

Subsequently, the plan view in which the HBTs 25 to 27 and the first wiring layer have been formed is shown in FIG. 55. As shown in FIG. 55, each of the collector electrodes 437 of the HBTs 25 to 27 is commonly connected to a first collector wiring ME1c through contact holes 439a filled with a conductive material. More specifically, the first collector wiring ME1c electrically connects each of the collector electrodes 437 of the HBTs 25 to 27 and is formed in the first wiring layer. Also, each of the base electrodes 436 of the HBTs 25 to 27 is commonly connected to a first base wiring ME1b through contact holes 439b filled with a conductive material. This first base wiring ME1b is also formed in the first wiring layer, that is, in the same layer as the first collector wiring ME1c.

Next, the plan view in which the HBTs 25 to 27, the first wiring layer and the second wiring layer have been formed is shown in FIG. 56. As shown in FIG. 56, each of the emitter electrodes 435 of the HBTs 25 to 27 is commonly connected to an emitter wiring ME2e through contact holes 442a filled with a conductive material. More specifically, the emitter wiring ME2e extends in the direction in which the HBTs 25 to 27 are arranged and is connected to each of the emitter electrodes 435 through the contact holes 442a filled with a conductive material. The emitter wiring ME2e is formed in the second wiring layer disposed on the first wiring layer. The reason why the emitter wiring ME2e is formed in the second wiring layer is that the emitter electrode 435 is formed at the position higher than those of the base electrode 436 and the collector electrode 437. Also, the first collector wiring ME1c is connected to the second collector wiring ME2c through a contact hole 442b filled with a conductive material, and the first base wiring ME1b is connected to the second base wiring ME2b through a contact hole 442c filled with a conductive material. These second collector wiring ME2c and second base wiring ME2b are formed in the second wiring layer.

Next, the plan view in which the HBTs 25 to 27, the first wiring layer, the second wiring layer and the third wiring layer (bump electrode) have been formed is shown in FIG. 57. As shown in FIG. 57, the emitter bump electrode 419b is formed directly on the emitter wiring ME2e formed in the second wiring layer. More specifically, the emitter bump electrode 419b is formed in the third wiring layer, but the third wiring layer is formed directly on the second wiring layer without interposing a contact hole between the second wiring layer and the third wiring layer.

The emitter bump electrode 419b extends in the direction in which the HBTs 25 to 27 are arranged and is electrically connected to each of the emitter electrodes 435 through the emitter wirings ME2e formed in the second wiring layer. Since the common emitter wiring layer ME3 and the emitter bump electrode 419b are formed for the emitter electrode groups 501 whose heat capacity and heat generation density are increased because they extend in a predetermined direction, the heat generated near each of the emitter electrodes 435 can be rapidly diffused to the common emitter wiring layer ME3 and emitter bump electrode 419b. Therefore, the heat dissipation efficiency of the heat generated in the HBTs 25 to 27 can be improved.

Also, the collector bump electrode 419a (not shown) is formed directly on the second collector wiring ME2c. The base bump electrode 419c (not shown) is formed directly on the second base wiring ME2b. Since these collector bump electrode 419a, emitter bump electrode 419b and base bump electrode 419c are formed in the same third wiring layer, the element formation surface of the semiconductor chip 19 is flattened. The ME2e layer can be formed in the same process as the ME3 layer. Each of the wirings of the ME2e layer and the ME3 layer can be formed integrally or separately.

Next, the manufacturing method of the semiconductor device according to an embodiment (third embodiment) of the present invention will be described with reference to FIG. 58 to FIG. 63. FIG. 58 to FIG. 63 are cross-sectional views for describing the manufacturing method of the semiconductor device according to an embodiment (third embodiment) of the present invention.

First, FIG. 58 shows a cross-sectional view taken along the line A-A in FIG. 54. As shown in FIG. 58, the sub-collector layer 431 made of an n$^+$ type GaAs layer is formed on a semi-insulating GaAs substrate (semiconductor wafer) 430 by using the metal organic chemical vapor deposition (MOCVD) method. Then, the HBTs 25 to 27 are formed in each chip region on the sub-collector layer 431. The process of forming the HBTs 25 to 27 will be simply described below.

By performing the MOCVD method on the sub-collector layer 431, the collector layer made of an n type GaAs layer and the base layer made of a p type GaAs layer are formed so as to be stacked. Then, by performing the MOCVD method on the base layer, the n type InGaP layer, the GaAs layer and the InGaAs layer are sequentially formed.

Subsequently, for example, a tungsten silicide film is formed as a conductive film on the InGaAs layer. The tungsten silicide film can be formed by using the sputtering method. Thereafter, the tungsten silicide film is patterned by using the photolithography technique and the etching technique, thereby forming the emitter electrodes 435.

Next, the n type InGaAs layer, the GaAs layer and the InGaP layer are sequentially etched with using the emitter electrodes 435 as a mask, thereby forming the emitter layers 434. Then, the base electrodes 436 made of, for example, gold are formed on the exposed base layers.

Subsequently, the base mesas 433 are formed by using the photolithography technique and the etching technique, and thereafter, the collector mesas 432 are formed. Then, the collector electrodes 437 made of gold or the like are formed on the exposed sub-collector layer 431. In this manner, the HBTs 25 to 27 can be formed. Finally, the mesa isolation 500 is formed for the electrical isolation from other elements.

Next, as shown in FIG. 59, an insulating film 438 is formed on the element formation surface of the GaAs substrate 430 on which the HBTs 25 to 27 have been formed. The insulating film 438 is formed of silicon oxide films stacked by using the plasma chemical vapor deposition (P-CVD) method and the spin-on glass (SOG) method. More specifically, in the SOG method, after the solution obtained by dissolving silica into solvent such as alcohol is spin-coated on the element formation surface of the GaAs substrate 430, the solvent is evaporated by the heat treatment, thereby forming the silicon oxide film to be the insulating film 438.

Subsequently, by using the photolithography technique and the etching technique, the contact holes 439a are formed in the insulating film 438. The contact hole 439a is formed so as to open the upper portion of the collector electrode 437, and the collector electrode 437 is exposed at the bottom of the contact hole 439a. At this time, though not shown in FIG. 59, the contact holes 439b penetrating to the base electrodes 436 are also formed.

Next, FIG. 60 shows a cross-sectional view taken along the line A-A in FIG. 55. As shown in FIG. 60, a molybdenum film 440a, a gold film 440b and a molybdenum film 440c are sequentially formed on the insulating film 438 including the inside of the contact holes 439a by using the plating technique and the photolithography technique, thereby forming the first collector wiring ME1c. The first collector wiring ME1c is formed in the first wiring layer and commonly connects each of the collector electrodes 437.

Also, though not shown in FIG. 60, the first base wiring ME1b is also formed on the insulating film 438 including the contact holes 439b (see FIG. 55). It is also possible to form the first collector wiring ME1c and the first base wiring ME1b by, for example, the sputtering method.

Subsequently, FIG. 61 shows a cross-sectional view taken along the line A-A in FIG. 56. As shown in FIG. 61, an insulating film 441 is formed on the insulating film 438 on which the first collector wiring ME1c has been formed. Similarly to the insulating film 438, for example, the insulating film 441 is formed of silicon oxide films stacked by using the plasma chemical vapor deposition (P-CVD) method and the SOG method. Then, the contact holes 442a reaching the emitter electrodes 435 are formed in the insulating film 438 and the insulating film 441 by using the photolithography technique and the etching technique. At this time, contact holes 442b reaching the first collector wiring ME1c and contact holes 442c reaching the first base wiring ME1b as shown in FIG. 56 are also formed.

Next, as shown in FIG. 61, a molybdenum film 443a, a gold film 443b and a molybdenum film 443c are sequentially formed on the insulating film 441 including the inside of the contact holes 442a by using the plating technique and the photolithography technique, thereby forming the emitter wiring ME2e. This emitter wiring ME2e extends in the direction in which the HBTs 25 to 27 are arranged and is commonly connected to each of the emitter electrodes 435.

This emitter wiring ME2e is formed in the second wiring layer. Here, though not shown in FIG. 61, the second collector wiring ME2c is formed on the first collector wiring ME1c through the contact holes 442b filled with a conductive material and the second base wiring ME2b is formed on the first base wiring ME1b through the contact holes 442c filled with a conductive material as shown in FIG. 56. The second collector wiring ME2c and the second base wiring ME2b are also formed in the second wiring layer.

Note that it is also possible to form the emitter wring ME2e, the second collector wiring ME2c and the second base wiring ME2b by the sputtering method or others instead of the plating technique.

Next, FIG. 62 shows a cross-sectional view taken along the line A-A in FIG. 57. Here, after a silicon nitride film (not shown) to be a passivation film is formed on the insulating film 441 including the emitter wiring ME2e, the silicon nitride film is patterned by using the photolithography technique and the etching technique. The patterning is performed so as to open the bump electrode formation regions.

Subsequently, a molybdenum/gold film 445a made of molybdenum and gold is formed in the region including the upper surface of the emitter wiring ME2e by using, for example, the sputtering method. Thereafter, a gold film 445b is formed on the molybdenum/gold film 445a by using the photolithography technique and the plating technique, thereby forming the emitter bump electrode 419b, and then, the solder 46 is formed thereon as shown in FIG. 63.

This emitter bump electrode 419b is formed so as to include the emitter wiring ME2e extending in the direction in which the HBTs 25 to 27 are arranged. The ME3 layer extending in an arbitrary direction is formed so as to connect the adjacent emitter groups 501 including the emitter electrodes arranged in the direction in which the HBTs 25 to 27 are arranged.

Therefore, the emitter bump electrode 419b can be formed in an arbitrary position regardless of the direction of the emitter groups 501 in which the HBTs 25 to 27 are arranged. In the case of the present embodiment, the emitter bump electrode 419b is formed so as to extend in the direction orthogonal to the adjacent emitter groups.

Note that the collector bump electrode 419a (442a) and the base bump electrode 419c (442c) are also formed when the emitter bump electrode 419b is formed.

Next, the GaAs substrate 430 is cut and separated into individual semiconductor chips. The separated individual chip is, for example, the semiconductor chip 419 shown in FIG. 51.

Subsequently, the semiconductor chips 419 are mounted on a multi-piece substrate in which the plurality of wiring boards 410 shown in FIG. 51 are formed. In the mounting of the semiconductor chip 419 onto each of the wiring boards 410 in the multi-piece substrate, the emitter bump electrode 419b formed in the semiconductor chip 419 is connected so as to enclose the plurality of vias 418 formed in the wiring board 410. The plurality of vias 418 are connected to the GND external wiring 412 formed on the rear surface of the wiring board 410 shown in FIG. 51.

Subsequently, the chip component 414 and the semiconductor chip 419 mounted on each of the wiring boards 410 are connected by, for example, Sn3Ag0.5Cu solder paste (metal composition thereof is Sn of about 96.5 wt %, Ag of about 3 wt % and Cu of about 0.5 wt %) as shown in FIG. 51, and the component mounting surface of the multi-piece substrate is sealed with resin. Thereafter, the multi-piece substrate is cut and separated into respective wiring boards 410. In this manner, the power amplifier module as shown in FIG. 51 can be formed.

In the power amplifier module of the present embodiment, with respect to the emitter group 501, the emitter bump electrode 419b extending in the direction of the emitter group having no VIA hole at the center of one emitter group is connected to the GND external wiring 412 through a plurality of vias 418.

Therefore, the heat generated in the HBTs 25 to 27 is transmitted to the emitter bump electrode 419b extending in the direction orthogonal to the direction in which the HBTs 25 to 27 are arranged, and thereafter, it is dissipated from the GND external wiring 412 through the plurality of vias 418. Therefore, since the heat is dissipated through the plurality of vias 418, the heat dissipation efficiency can be improved.

Also, since the semiconductor chip 419 is flip-chip connected in the power amplifier module of the present embodiment, the wire bonding area of the power amplifier module can be reduced in size.

In the structure as described above, for example, the heat transmitted through the emitter bump electrode 419b is transmitted to the GND external wiring 412 through the plurality of vias 418, and therefore, the heat dissipation efficiency can be improved.

Also, in the case where the emitter bump electrode 419b is present in the circuit of the GSM system and another emitter bump electrode is present in the circuit of the DCS system, one circuit is not used when the other circuit is used. Therefore, for example, when the circuit of the GSM system is used and the heat is generated from the emitter bump electrode 419b, this heat can be efficiently transmitted to the GND external wiring 412 by using also the vias on the side of the emitter bump electrode of the circuit of the DCS system.

As general metal bumps, there are an Au stud bump, a bump formed by performing solder plating to an Au plating bump or a Cu plating bump, a bump formed by performing plating to a Cu ball and a bump formed by soldering to a Cu metal fragment.

The bumps with the shape as described above can be arbitrarily formed on the common emitter wiring layer (M3). The size of the thorough hole capable of being formed in the substrate is restricted by the diameter of the through hole, the thickness of Cu on the sidewall of the through hole, and the number of signal wirings to be disposed in the periphery. Therefore, the bump can be formed in the arbitrary position on the emitter wiring so that the bump is formed directly on the through hole of the substrate where the heat can be most efficiently dissipated.

Further, it is also possible to form the bump by metal plating after forming a single body of Mo, Ti, Pt, AuGe, W, Ni—W or others or a metal layer made of alloy or containing heterogeneous mixture on the front surface of the Au wiring of the emitter bump. On this bump, Pd and Ni solder diffusion barrier layer are formed, and the Sn-based solder plating may be formed. The electroless Ni—P plating, electroless Ni—B plating or others is used for the Ni plating, but the Ni plating is not limited to them.

Also, the type of these solders may be Sn, Sn—Cu, Sn—Bi, Sn—Ag, Sn—Ag—Cu, Sn—Zn, Sn—Pb and others, and the composition thereof is not limited. The solder paste can be used instead of the plating. As the type of the solder paste, any paste can be used as long as it is made based on Sn, or Au—Sn or AuGe solder may be used. The composition thereof is not limited. The Ag paste, the Cu paste and Au paste which are the mixture of an organic adhesive material, metal and metal oxide filler, or the mixture of an organic adhesive material and carbon nanotube may be formed.

Next, a modification example of the semiconductor device according to an embodiment (third embodiment) of the present invention will be described with reference to FIG. 64 to FIG. 67. FIG. 64 to FIG. 67 are explanatory diagrams for describing the modification example of the semiconductor device according to an embodiment (third embodiment) of the present invention.

First, in the modification example shown in FIG. 64, a series of bumps are arranged in a predetermined direction, and the length of the nearly rectangular bump is reduced compared with the example shown in FIG. 53.

In the structure like this, the underfill resin can readily flow under the chip and the voids are less likely to be formed in the underfill, and therefore, the reliability in the mounting process can be improved.

Also, in the structure of FIG. 65, the emitter electrode groups have respectively different directionalities and a series of bumps are arranged in a predetermined direction.

In this structure, the underfill resin can more readily flow under the chip and the voids are less likely to be formed in the underfill, and therefore, the reliability in the mounting process can be improved.

Further, in the case of the modification example shown in FIG. 65, for the position where the series of nearly orthogonal bumps are arranged, the bumps may be arranged in the direction of 45 degrees. Also, when the top priority is given to the heat dissipation, the bumps may be arranged at arbitrary angle in the light of the substrate design. In this case, in order to suppress the formation of the voids, the method in which the underfill is first coated and formed so as to have the effect of the temporary joint is effective.

Also, in the structure of FIG. 66, the emitter electrode groups have respectively different directionalities and a series of bumps are not arranged in a predetermined direction.

In the case of this structure, in order to suppress the formation of the voids, the method in which the underfill is first coated and formed so as to have the effect of the temporary joint is employed, whereby the time of the manufacturing process can be shortened in the mounting process design.

Also, in the case of the modification example shown in FIG. 66, when the underfill is first injected in order to suppress the formation of voids of the underfill, the method in which the opposite side of the underfill injection to the semiconductor chip is vacuumed to promote the underfill injection is employed, whereby the reliability in the process of forming the underfill can be improved.

Also, in the case of the modification example shown in FIG. 66, in order to suppress the formation of voids of the underfill, the method in which the sealing resin is used also as the underfill, that is, the opposite side of the sealing resin inlet of the mold in the mold resin sealing is vacuumed for the vacuum molding is employed, whereby the reliability of the process of forming the underfill can be improved.

Also, in FIG. 67, a solder plating 502 of a column of Au or Cu (plating, metal fragment or others) is formed on the common emitter wiring layer (ME3) to form a bump shape having a rectangular protrusion 505 which is convex upward.

By arbitrarily forming a metal protrusion on the common emitter wiring layer (ME3) by the thin-film process, warping of the substrate is absorbed in the narrow-pitch solder connection with the connection height of several microns to several tens microns, so that the high-yield connection can be ensured.

In the present embodiment, an npn type bipolar transistor has been described, but the present invention can be applied also to a pnp type bipolar transistor. Also, a bipolar transistor formed on a GaAs substrate has been described, but other compound semiconductor may be used for the substrate.

Also, in the present embodiment, the case of using a GaAs substrate and including an InGaP layer as an emitter layer has been described, but the present invention can be applied also to the HBT using a GaAs substrate and including an AlGaAs (aluminum gallium arsenide) layer as an emitter layer.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A power amplifier module, comprising:
a multilayer wiring board having a core layer, a first insulating layer formed on the core layer and a second insulating layer formed below the core layer; and
a semiconductor chip including an LDMOSFET element for power amplification, the semiconductor chip being mounted on the multilayer wiring board,
wherein the multilayer wiring board has a plurality of first vias formed in the core layer, a plurality of second vias formed in the first insulating layer, a plurality of third vias formed in the second insulating layer and a plurality of lands formed on an upper surface of the multilayer wiring board, the plurality of lands including a plurality of source lands,
the semiconductor chip has a plurality of bump electrode pads including a source pad, a drain pad and a gate pad of the LDMOSFET element on a first main surface of the semiconductor chip,
the semiconductor chip is mounted so that the first main surface faces the upper surface of the multilayer wiring board,
the source pad having a plurality of source bump electrodes, each source bump electrode is electrically and mechanically connected to a respective one of the plurality of source lands,
a plurality of second source vias out of the plurality of second vias are disposed below the plurality of source lands, each second source via being electrically connected to a respective one of the plurality of source lands,
a plurality of first source vias out of the plurality of first vias are disposed below the plurality of second source vias, each first source via being electrically connected to a respective one of the plurality of second source vias, and
a plurality of third source vias out of the plurality of third vias are disposed below the plurality of first source vias, each third source via being electrically connected to a respective one of the plurality of first source vias.

2. The power amplifier module according to claim 1, wherein each of the second source vias is arranged together with one of the first source vias and one of the third source vias on a straight line orthogonal to the upper surface of the multilayer wiring board.

3. The power amplifier module according to claim 2, wherein the LDMOSFET element is made up by connecting a plurality of unit LDMOSFET elements, which are formed in a first LDMOSFET formation region of the semiconductor chip, in parallel, and
in the semiconductor chip, the source pad is disposed on the first LDMOSFET formation region.

4. The power amplifier module according to claim 3, wherein a source terminal is formed on a lower surface of the multilayer wiring board, and
each of the source lands is electrically connected to the source terminal through the respective second source via, said one of the first source vias, and said one of the third source vias arranged together on the straight line orthogonal to the upper surface of the multilayer wiring board.

5. The power amplifier module according to claim 4, wherein the source terminal is formed so as to include all of the region just below the semiconductor chip on the lower surface of the multilayer wiring board.

6. The power amplifier module according to claim 5, wherein each of the plurality of second source vias and each of the plurality of third source vias are blind via holes, and
each of the plurality of first source vias is an inner via hole.

7. The power amplifier module according to claim 6, wherein the semiconductor chip has a plurality of drain pads, and
a plane area of the source pad is larger than a sum of plane areas of any two of said drain pads.

8. The power amplifier module according to claim 6, wherein the semiconductor chip has a plurality of drain bump electrodes, and
a shape of the source pad in plan view is rectangular, and a length of a long side of the source pad is longer than a distance between centers of adjacent ones of the drain bump electrodes.

9. The power amplifier module according to claim 1, wherein, on the first main surface of the semiconductor chip, the source pad has a rectangular shape in plan view with a long side and a short side, and
a width of the source pad is larger than a width of one of the source lands in a direction parallel to the long side.

10. The power amplifier module according to claim 1, wherein, on the first main surface of the semiconductor chip, an area of the source pad is larger than an area of the drain pad.

11. The power amplifier module according to claim 10, wherein the area of the source pad is larger than twice the area of the drain pad.

12. A power amplifier module, comprising:
a multilayer wiring board having a core layer, a first insulating layer formed on the core layer and a second insulating layer formed below the core layer; and
a semiconductor chip including an LDMOSFET element for power amplification, the semiconductor chip being mounted on the multilayer wiring board,
wherein the multilayer wiring board has a plurality of first vias formed in the core layer, a plurality of second vias formed in the first insulating layer, a plurality of third vias formed in the second insulating layer and a plurality of lands formed on an upper surface of the multilayer wiring board, the plurality of lands including a plurality of source lands,
the semiconductor chip has a plurality of bump electrodes including a plurality of source bump electrodes, a drain bump electrode and a gate bump electrode of the LDMOSFET element on a first main surface of the semiconductor chip,
the semiconductor chip is mounted so that the first main surface faces the upper surface of the multilayer wiring board,
the plurality of source bump electrodes are electrically and mechanically connected to the plurality of source lands,
a plurality of second source vias out of the plurality of second vias are disposed below the plurality of source lands, each of the second source vias being electrically connected to a respective one of the plurality of source lands,
a plurality of first source vias out of the plurality of first vias are disposed below the plurality of second source vias, each of the first source vias being electrically connected to a respective one of the plurality of second source vias, a plurality of third source vias out of the plurality of third vias are disposed below the plurality of first source vias, each of the third source vias being electrically connected to a respective one of the plurality of first source vias, each of the source bump electrodes is arranged together with one of the source lands, one of the second source vias, one of the first source vias, and one of the third source vias on a straight line orthogonal to the upper surface of the multilayer wiring board, the first and second insulating films are prepreg layers, and the first and second insulating films are made of a material different from that of the core layer.

13. The power amplifier module according to claim 12, wherein the LDMOSFET element is made up by connecting a plurality of unit LDMOSFET elements, which are formed in a first LDMOSFET formation region of the semiconductor chip, in parallel, and in the semiconductor chip, the plurality of source bump electrodes are disposed on the first LDMOSFET formation region.

14. The power amplifier module according to claim 13, wherein a source terminal is formed on a lower surface of the multilayer wiring board, the source terminal is formed so as to include all of the region just below the semiconductor chip on the lower surface of the multilayer wiring board, and each of the source lands is electrically connected to the source terminal through the respective second source via, said one of the first source vias, and said one of the third source vias arranged together on the straight line orthogonal to the upper surface of the multilayer wiring board.

15. The power amplifier module according to claim 14, wherein each of the plurality of second source vias and each of the plurality of third source vias are blind via holes, and each of the plurality of first source vias is an inner via hole.

16. The power amplifier module according to claim 12, further comprising:

a first conductor layer electrically connecting and positioned between one of the first source vias and an adjacent one of the second source vias.

17. The power amplifier module according to claim 16, further comprising:

a second conductor layer electrically connecting and positioned between one of the first source vias and an adjacent one of the third source vias.

18. The power amplifier module according to claim 17, further comprising:

a source terminal on a lower surface of the multilayer wiring board, wherein the adjacent one of the third source vias is electrically connected to the source terminal.

* * * * *